US009515271B2

(12) United States Patent
Kim et al.

(10) Patent No.: US 9,515,271 B2
(45) Date of Patent: Dec. 6, 2016

(54) ORGANIC LIGHT-EMITTING DEVICE

(71) Applicant: SAMSUNG DISPLAY CO., LTD., Yongin, Gyeonggi-Do (KR)

(72) Inventors: Seulong Kim, Yongin (KR); Younsun Kim, Yongin (KR); Dongwoo Shin, Yongin (KR); Jungsub Lee, Yongin (KR); Naoyuki Ito, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 15 days.

(21) Appl. No.: 14/709,679

(22) Filed: May 12, 2015

(65) Prior Publication Data

US 2016/0163999 A1 Jun. 9, 2016

(30) Foreign Application Priority Data

Dec. 3, 2014 (KR) ........................ 10-2014-0172381

(51) Int. Cl.

*H01L 51/00* (2006.01)
*C09K 11/02* (2006.01)
*H01L 51/50* (2006.01)

(52) U.S. Cl.

CPC ......... *H01L 51/0072* (2013.01); *C09K 11/025* (2013.01); *H01L 51/0067* (2013.01); *H01L51/0071* (2013.01); *H01L 51/508* (2013.01); *H01L 51/5012* (2013.01); *H01L 2251/301* (2013.01); *H01L 2251/308* (2013.01); *H01L 2251/558* (2013.01)

(58) Field of Classification Search

CPC ........... H01L 51/0072; H01L 51/0071; H01L 51/0067; H01L 51/5012; H01L 2251/558; H01L 2251/301; H01L 2251/308; C09K 11/025

See application file for complete search history.

(56) References Cited

U.S. PATENT DOCUMENTS

| | | | |
|---|---|---|---|
| 2011/0037062 A1 | 2/2011 | Fukumatsu et al. | |
| 2011/0260138 A1 | 10/2011 | Xia et al. | |
| 2012/0126205 A1 | 5/2012 | Kawamura et al. | |
| 2013/0200350 A1 | 8/2013 | Sawada et al. | |
| 2014/0014940 A1 | 1/2014 | Pflumm et al. | |
| 2014/0217393 A1 | 8/2014 | Kato et al. | |
| 2014/0374724 A1 | 12/2014 | Kim et al. | |
| 2015/0380662 A1* | 12/2015 | Kim .................... | H01L 51/0072 257/40 |

FOREIGN PATENT DOCUMENTS

| | | |
|---|---|---|
| JP | 2006-219393 A | 8/2006 |
| KR | 10-2010-0108924 A1 | 10/2010 |
| KR | 10-2011-0007124 A | 1/2011 |
| KR | 10-2011-0034103 A | 4/2011 |
| KR | 10-2012-0092550 A | 8/2012 |
| KR | 10-2013-0064001 A | 6/2013 |
| KR | 10-2013-0092939 A | 8/2013 |
| KR | 10-2013-0100236 A | 9/2013 |
| KR | 10-2013-0107295 A | 10/2013 |
| KR | 10-2013-0115161 A | 10/2013 |
| KR | 10-2014-0027218 A | 3/2014 |
| KR | 10-2014-0074286 A | 6/2014 |
| WO | WO 2010/114264 A2 | 10/2010 |

* cited by examiner

*Primary Examiner* — Kyoung Lee
(74) *Attorney, Agent, or Firm* — Lee & Morse, P.C.

(57) ABSTRACT

An organic light-emitting device including a first electrode; a second electrode; and an organic layer between the first electrode and the second electrode, wherein the organic layer includes an emission layer and an electron transport region, the electron transport region being between the emission layer and the second electrode; the emission layer includes a first compound represented by any one of the following Formulae 1-1 and 1-2, and the electron transport region includes a second compound represented by any one of the following Formulae 2-1 and 2-2:

<Formula 1-1>
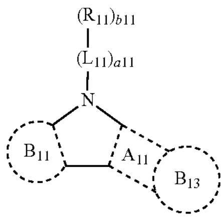
<Formula 1-2>
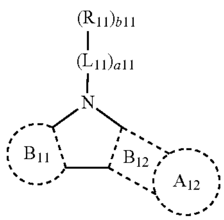
-continued
<Formula 2-1>
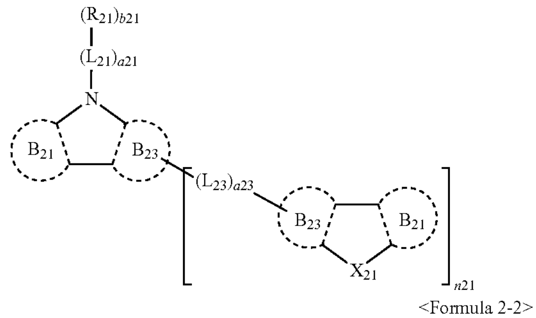
<Formula 2-2>
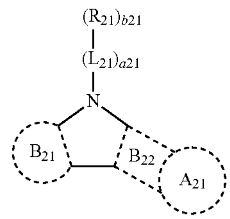
20 Claims, 1 Drawing Sheet

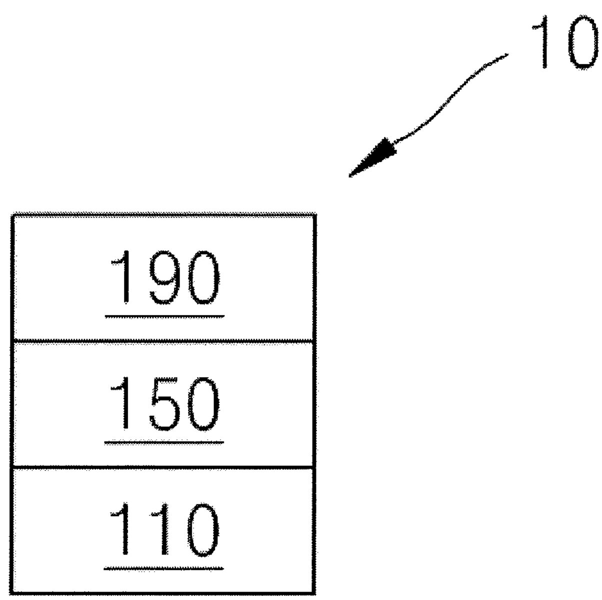
10
190
150
110

ORGANIC LIGHT-EMITTING DEVICE

CROSS-REFERENCE TO RELATED APPLICATION

Korean Patent Application No. 10-2014-0172381, filed on Dec. 3, 2014, in the Korean Intellectual Property Office, and entitled: “Organic Light-Emitting Device,” is incorporated by reference herein in its entirety.

BACKGROUND

1. Field

Embodiments relate to an organic light-emitting device.

2. Description of the Related Art

Organic light emitting devices are self-emission devices that have wide viewing angles, high contrast ratios, short response times, and excellent brightness, driving voltage, and response speed characteristics, and produce full-color images.

An organic light-emitting device may include a first electrode disposed on a substrate, and a hole transport region, an emission layer, an electron transport region, and a second electrode, which are sequentially disposed on the first electrode. Holes provided from the first electrode may move toward the emission layer through the hole transport region, and electrons provided from the second electrode may move toward the emission layer through the electron transport region. Carriers, such as holes and electrons, are recombined in the emission layer to produce excitons. These excitons change from an excited state to a ground state, thereby generating light.

SUMMARY

One or more exemplary embodiments include an organic light-emitting device.

According to one or more exemplary embodiments, an organic light-emitting device includes a first electrode, a second electrode, and an organic layer that is disposed between the first electrode and the second electrode and includes an emission layer;

the organic layer includes an emission layer and an electron transport region, and the electron transport region is disposed between the emission layer and the second electrode;

the emission layer includes a first material represented by any one of Formulae 1-1 and 1-2;

the electron transport region includes a second material represented by any one of Formulae 2-1 and 2-2:

<Formula 1-1>

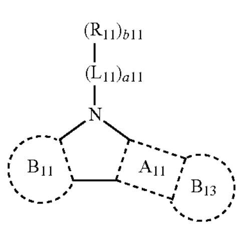

-continued

<Formula 1-2>

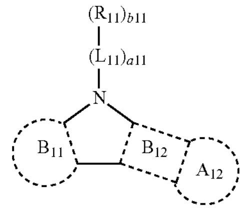

<Formula 2-1>

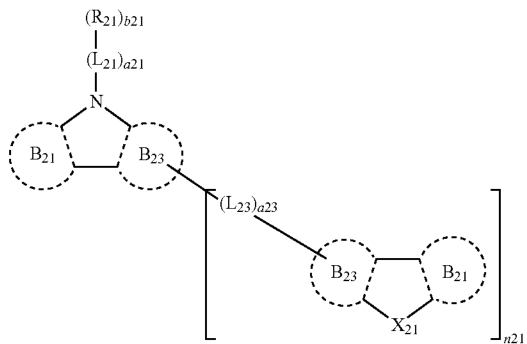

<Formula 2-2>

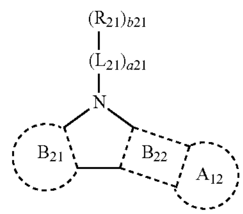

<Formula 1A-1>

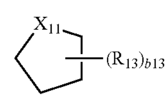

<Formula 1A-2>

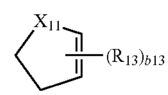

<Formula 2A-1>

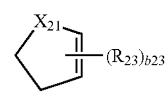

<Formula 2B-2>

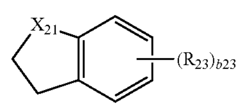

in Formulae 1-1, 1-2, 2-1, 2-2, 1A-1, 1A-2, 2A-1, and 2A-2, $A_{11}$ and $A_{12}$ may be each independently a group represented by any one of Formulae 1A-1 and 1A-2;

$A_{21}$ may be each independently a group represented by any one of Formula 2A-1 and 2A-2;

$B_{11}$ to $B_{13}$ and $B_{21}$ to $B_{23}$ may be each independently selected from a substituted or unsubstituted $C_6$-$C_{60}$ arene and a substituted or unsubstituted $C_1$-$C_{60}$ heteroarene;

$X_{11}$ is selected from N-[$(L_{12})_{a12}$-$(R_{12})_{b12}$], an oxygen atom (O), a sulfur atom (S), and $C(R_{14})(R_{15})$;

$X_{21}$ may be N-[$(L_{22})_{a22}$-$(R_{22})$], an oxygen atom (O), a sulfur atom (S), and $C(R_{24})(R_{25})$;

$L_{11}$, $L_{12}$, and $L_{21}$ to $L_{23}$ may be each independently selected from a substituted or unsubstituted $C_6$-$C_{60}$ arylene group and a substituted or unsubstituted $C_1$-$C_{60}$ heteroarylene group;

a11, a12, and a21 to a23 may be each independently selected from 0, 1, 2, and 3;

$R_{11}$, $R_{12}$, $R_{21}$, and $R_{22}$ are each independently selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

b11, b12, b21, and b22 may be each independently selected from 1, 2, and 3;

$R_{13}$ to $R_{15}$ and $R_{23}$ to $R_{25}$ may be each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_6$-$C_{60}$ aryl group, a substituted or unsubstituted $C_6$-$C_{60}$ aryloxy group, a substituted or unsubstituted $C_1$-$C_{60}$ heteroaryl group, a substituted or unsubstituted a monovalent non-aromatic condensed polycyclic group, a substituted or unsubstituted a monovalent non-aromatic condensed heteropolycyclic group, and —$Si(Q_1)(Q_2)(Q_3)$;

b13 and b23 may be each independently selected from 1 and 2;

n21 may be selected from 1, 2, and 3;

at least one substituent of the substituted $C_6$-$C_{60}$ arene, substituted $C_1$-$C_{60}$ heteroarene, substituted $C_6$-$C_{60}$ arylene group, substituted $C_1$-$C_{60}$ heteroarylene group, substituted $C_1$-$C_{60}$ alkyl group, substituted $C_1$-$C_{60}$ alkoxy group, substituted $C_3$-$C_{10}$ cycloalkyl group, substituted $C_6$-$C_{60}$ aryl group, substituted $C_6$-$C_{10}$ aryloxy group, substituted $C_1$-$C_{60}$ heteroaryl group, substituted monovalent non-aromatic condensed polycyclic group, and substituted monovalent non-aromatic condensed heteropolycyclic group may be selected from a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, a monovalent non-aromatic condensed heteropolycyclic group, and —$Si(Q_{11})(Q_{12})(Q_{13})$;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, and a monovalent non-aromatic condensed heteropolycyclic group, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, a monovalent non-aromatic condensed heteropolycyclic group, and —$Si(Q_{21})(Q_{22})(Q_{23})$; and —$Si(Q_{31})(Q_{32})(Q_{33})$, wherein $Q_1$ to $Q_3$, $Q_{11}$ to $Q_{13}$, $Q_{21}$ to $Q_{23}$ and $Q_{31}$ to $Q_{33}$ may be each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

BRIEF DESCRIPTION OF THE DRAWING

Features will be apparent to those of skill in the art by describing in detail exemplary embodiments with reference to the attached drawing in which:

FIG. 1 illustrates a schematic cross-sectional view of an organic light-emitting device according to an embodiment.

DETAILED DESCRIPTION

Example embodiments will now be described more fully hereinafter with reference to the accompanying drawing: however, they may be embodied in different forms and should not be construed as limited to the embodiments set forth herein. Rather, these embodiments are provided so that this disclosure will be thorough and complete, and will fully convey exemplary implementations to those skilled in the art.

In the drawing FIGURE, the dimensions of layers and regions may be exaggerated for clarity of illustration. Like reference numerals refer to like elements throughout.

Expressions such as "at least one of," when preceding a list of elements, modify the entire list of elements and do not modify the individual elements of the list.

As used herein, the singular forms "a," "an", and "the" are intended to include the plural forms as well, unless the context clearly indicates otherwise.

It will be further understood that the terms "includes," "comprises," and/or "comprising" used herein specify the presence of stated features or components, but do not preclude the presence or addition of one or more other features or components.

It will be understood that when a layer, region, or component is referred to as being "on" or "onto" another layer, region, or component, it may be directly or indirectly formed on the other layer, region, or component. For example, intervening layers, regions, or components may be present.

The expression "(an organic layer) includes a first material" used herein may be interpreted as a case in which "(an organic layer) includes identical first materials represented by Formula 1 or two or more different first materials represented by Formula 1."

The term "organic layer" used herein refers to a single layer and/or a plurality of layers disposed between a first electrode and a second electrode of an organic light-emitting device. A material included in the "organic layer" is not limited to an organic material.

FIG. 1 illustrates a schematic cross-sectional view of an organic light-emitting device 10 according to an embodiment.

In FIG. 1, a substrate may be additionally disposed under the first electrode 110 or above the second electrode 190. The substrate may be a glass substrate or transparent plastic substrate, each with excellent mechanical strength, thermal stability, transparency, surface smoothness, ease of handling, and water resistance.

The first electrode 110 may be formed by depositing or sputtering a material for forming the first electrode on the substrate. When the first electrode 110 is an anode, the material for the first electrode 110 may be selected from materials with a high work function to facilitate hole injection. The first electrode 110 may be a reflective electrode or a transmissive electrode. The material for the first electrode 110 may be a transparent and highly conductive material, and examples of such a material may include indium tin oxide (ITO), indium zinc oxide (IZO), tin oxide ($SnO_2$), and zinc oxide (ZnO). When the first electrode 110 is a semi-transmissive electrode or a reflective electrode, as a material for forming the first electrode 110, at least one of magnesium (Mg), aluminum (Al), aluminum-lithium (Al—Li), calcium (Ca), magnesium-indium (Mg—In), and magnesium-silver (Mg—Ag) may be used.

The first electrode 110 may have a single-layer structure, or a multi-layer structure including two or more layers. For example, the first electrode 110 may have a three-layered structure of ITO/Ag/ITO.

An organic layer 150, including an emission layer, may be disposed on the first electrode 110. The organic layer 150 may include a hole transport region disposed between the first electrode 110 and the emission layer and an electron transport region disposed between the emission layer and the second electrode 190.

The hole transport region may include at least one selected from the group of a hole injection layer (HIL), a hole transport layer (HTL), a buffer layer, and an electron blocking layer (EBL). The electron transport region may include at least one selected from the group of a hole blocking layer (HBL), an electron transport layer (ETL), and an electron injection layer (EIL).

The hole transport region may have a single-layered structure formed of a single material, a single-layered structure formed of a plurality of different materials, or a multi-layered structure having a plurality of layers formed of a plurality of different materials.

For example, the hole transport region may have a single-layered structure formed of a plurality of different materials, or a structure of hole injection layer/hole transport layer, a structure of hole injection layer/hole transport layer/buffer layer, a structure of hole injection layer/buffer layer, a structure of hole transport layer/buffer layer, a structure of hole injection layer/hole transport layer/electron blocking layer, or a structure of a hole transport layer/electron blocking layer, wherein layers of each structure are sequentially stacked from the first electrode 110 in this stated order.

When the hole transport region includes a hole injection layer, the hole injection layer may be formed on the first electrode 110 by using various methods, e.g., vacuum deposition, spin coating casting, a Langmuir-Blodgett (LB) method, inkjet printing, laser printing, or laser-induced thermal imaging.

When a hole injection layer is formed by vacuum deposition, e.g., the vacuum deposition may be performed at a deposition temperature of about 100 to about 500° C., at a vacuum degree of about $10^{-8}$ to about $10^{-3}$ torr, and/or at a deposition rate of about 0.01 to about 100 Å/sec by taking into account a compound for a hole injection layer to be deposited, and the structure of a hole injection layer to be formed.

When a hole injection layer is formed by spin coating, the spin coating may be performed at, e.g., a coating rate of about 2,000 rpm to about 5,000 rpm, and at a temperature of about 80° C. to 200° C. by taking into account a compound for a hole injection layer to be deposited and the structure of a hole injection layer to be formed.

When the hole transport region includes a hole transport layer, the hole transport layer may be formed on the first electrode 110 or the hole injection layer by using various methods, e.g., vacuum deposition, spin coating, casting, an LB method, inkjet printing, laser printing, or laser-induced thermal imaging. When the hole transport layer is formed by vacuum deposition or spin coating, deposition and coating conditions for the hole transport layer may be the same as the deposition and coating conditions for the hole injection layer.

The hole transport region may include at least one selected from the group of m-MTDATA, TDATA, 2-TNATA, NPB, β-NPB, TPD, Spiro-TPD, Spiro-NPB, methylated-NPB, TAPC, HMTPD, 4,4',4"-tris(N-carbazolyl)triphenylamine (TCTA), polyaniline/dodecylbenzenesulfonic acid (Pani/DBSA), poly(3,4-ethylenedioxythiophene)/poly(4-styrenesulfonate) (PEDOT/PSS), polyaniline/camphor sulfonicacid (Pani/CSA), (polyaniline)/poly(4-styrenesulfonate) (PANI/PSS), a compound represented by Formula 201 below, and a compound represented by Formula 202 below.

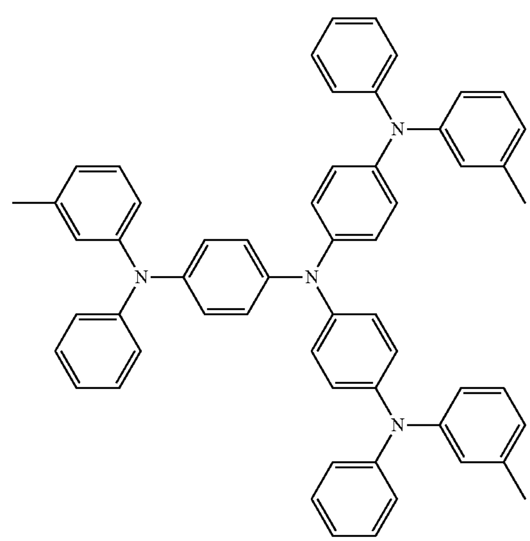

m-MTDATA

-continued
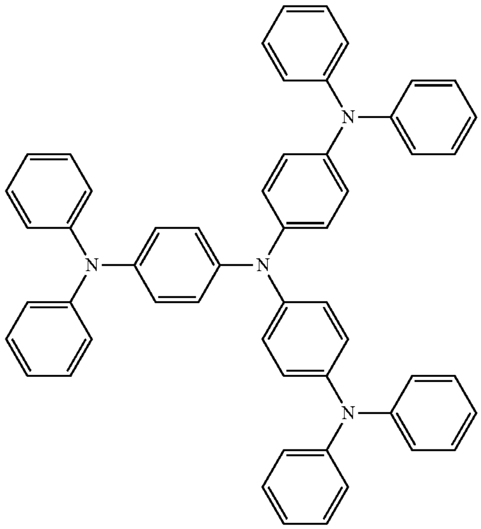
TDATA
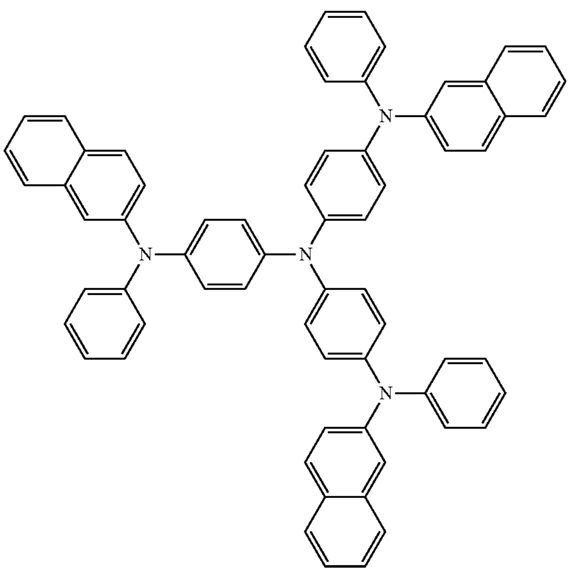
2-TNATA
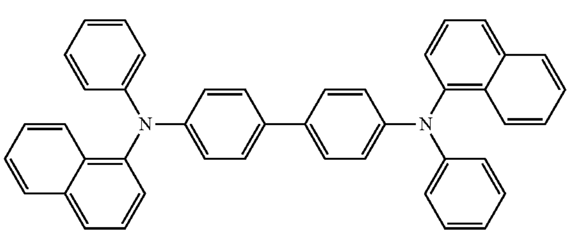
NPB
-continued
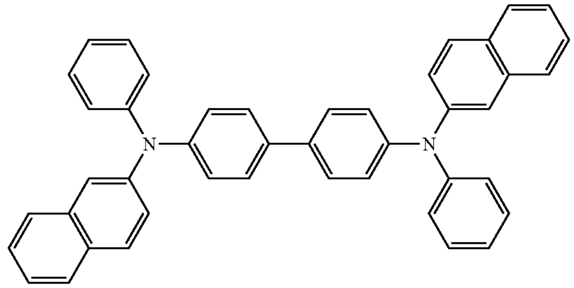
β-NPB
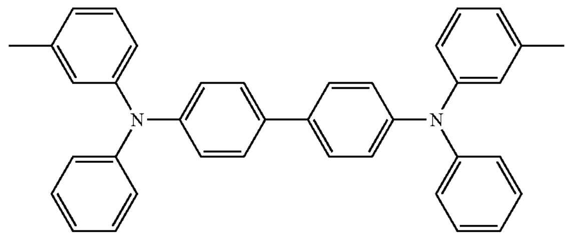
TPD
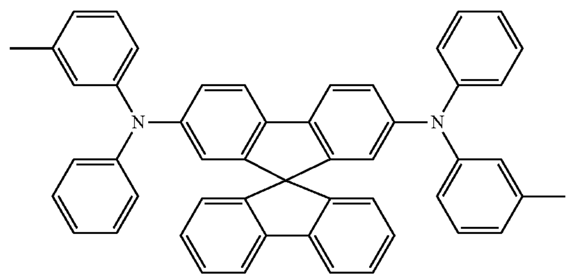
Spiro-TPD
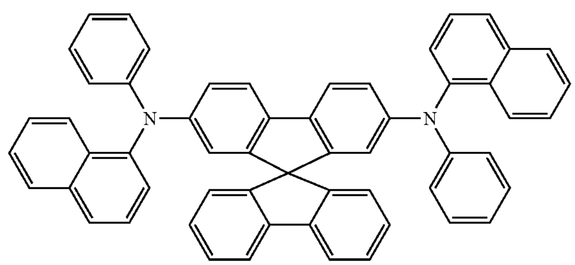
Spiro-NPB
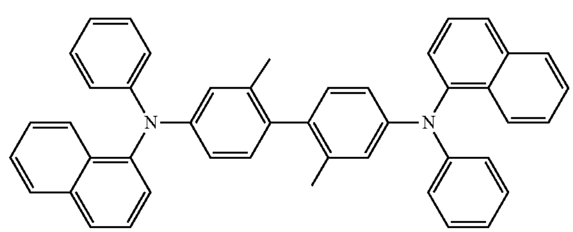
methylated NPB -continued

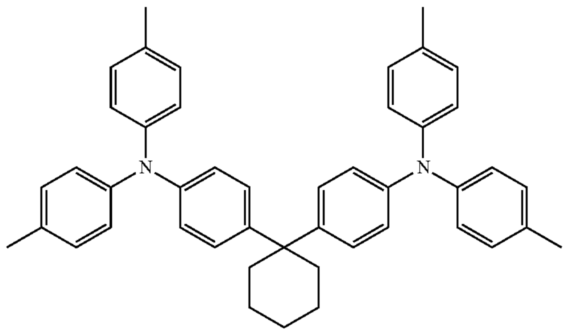

TAPC

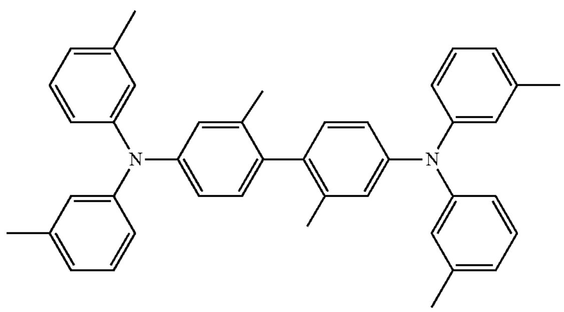

HMTPD

<Formula 201>

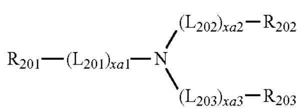

<Formula 202>

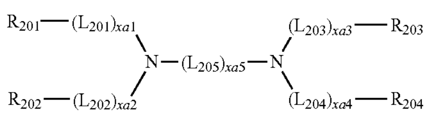

In Formulae 201 and 202, $L_{201}$ to $L_{205}$ may each independently be selected from or include, e.g., a substituted or unsubstituted $C_3$-$C_{10}$ cycloalkylene group, a substituted or unsubstituted $C_2$-$C_{10}$ heterocycloalkylene group, a substituted or unsubstituted $C_3$-$C_{10}$ cycloalkenylene group, a substituted or unsubstituted $C_2$-$C_{10}$ heterocycloalkenylene group, a substituted or unsubstituted $C_6$-$C_{60}$ arylene group, a substituted or unsubstituted $C_2$-$C_{60}$ heteroarylene group, a substituted or unsubstituted divalent non-aromatic condensed polycyclic group, and a substituted or unsubstituted divalent non-aromatic condensed heteropolycyclic group, xa1 to xa4 may each independently be selected from 0, 1, 2, and 3;

xa5 may be selected from 1, 2, 3, 4, and 5; and $R_{201}$ to $R_{204}$ may be understood by referring to the description provided herein in connection with $R_{11}$.

The compound represented by Formula 201 may be represented by Formula 201A:

<Formula 201A>

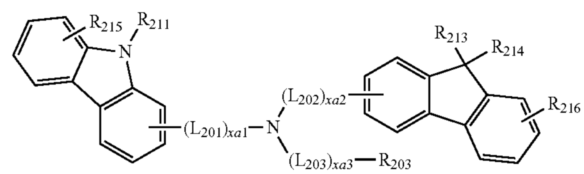

For example, the compound represented by Formula 201 may be represented by Formula 201A-1 below.

<Formula 201A-1>

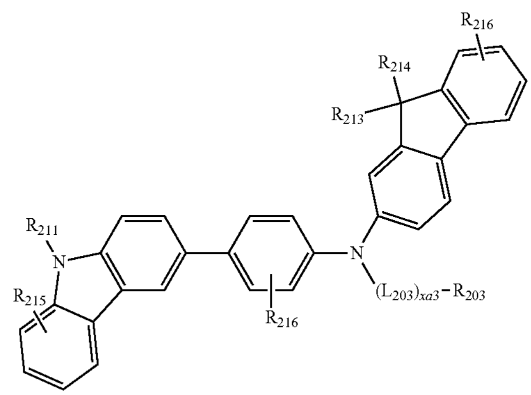

For example, the compound represented by Formula 202 may be represented by Formula 202A below.

<Formula 202A>

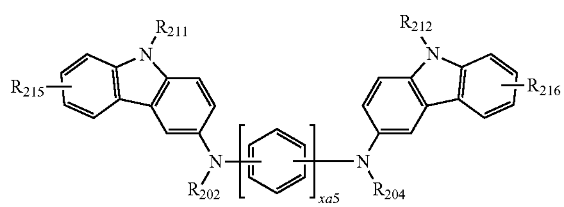

$L_{201}$ to $L_{203}$, xa1 to xa3, xa5, and $R_{202}$ to $R_{204}$ in Formulae 201A. 201A-1, and 202A are already described in detail above, and $R_{211}$ and $R_{212}$ may each independently be understood by referring to the description provided herein in connection with $R_{203}$, and $R_{213}$ to $R_{216}$ may each independently be selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic condensed heteropolycyclic group.

For example, in Formulae 201A, 201A-1, and 202A, $L_{201}$ to $L_{203}$ may each independently be selected from:

a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group; and a phenylene group, a naphthylene group, a fluorenylene group, a spiro-fluorenylene group, a benzofluorenylene group, a dibenzofluorenylene group, a phenanthrenylene group, an anthracenylene group, a pyrenylene group, a chrysenylene group, a pyridinylene group, a pyrazinylene group, a pyrimidinylene group, a pyridazinylene group, a quinolinylene group, an isoquinolinylene group, a quinoxalinylene group, a quinazolinylene group, a carbazolylene group, and a triazinylene group, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

xa1 to xa3 may each independently be 0 or 1;

$R_{202}$ to $R_{204}$, $R_{211}$, and $R_{212}$ may each independently be selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

$R_{213}$ and $R_{214}$ may each independently be selected from:

a $C_1$-$C_{20}$ alkyl group and a $C_1$-$C_{20}$ alkoxy group;

a $C_1$-$C_{20}$ alkyl group and a $C_1$-$C_{20}$ alkoxy group, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and $R_{215}$ and $R_{216}$ may each independently be selected from:

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, and a $C_1$-$C_{20}$ alkoxy group;

a $C_1$-$C_{20}$ alkyl group and a $C_1$-$C_{20}$ alkoxy group, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group;

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xa5 may be 1 or 2.

In an implementation, $R_{213}$ and $R_{214}$ in Formulae 201A and 201A-1 may bind to each other to form a saturated or unsaturated ring.

The compound represented by Formula 201 and the compound represented by Formula 202 may include compounds HT1 to HT20 illustrated below.

HT1

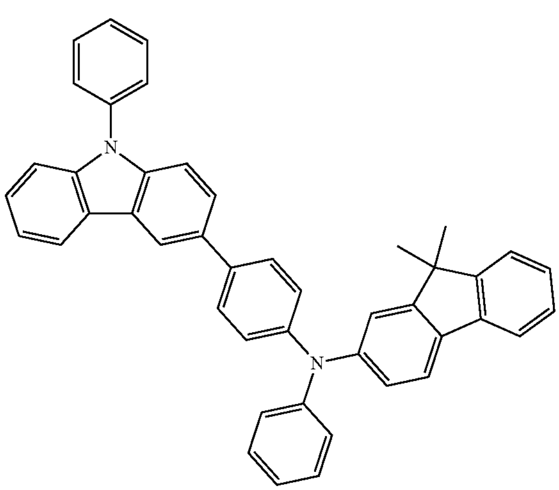

-continued

HT2

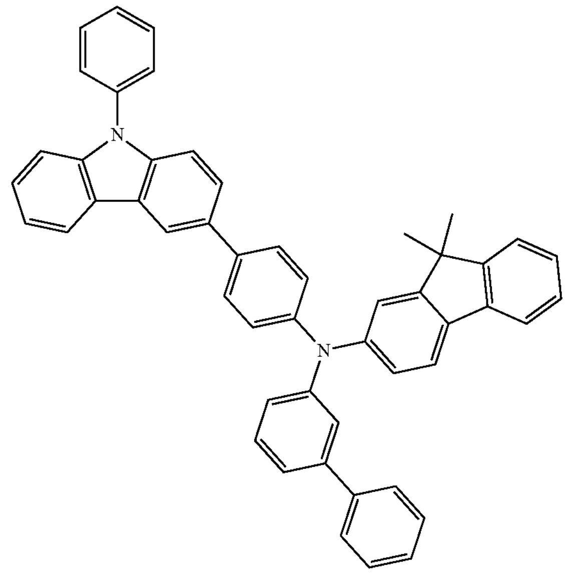

HT3

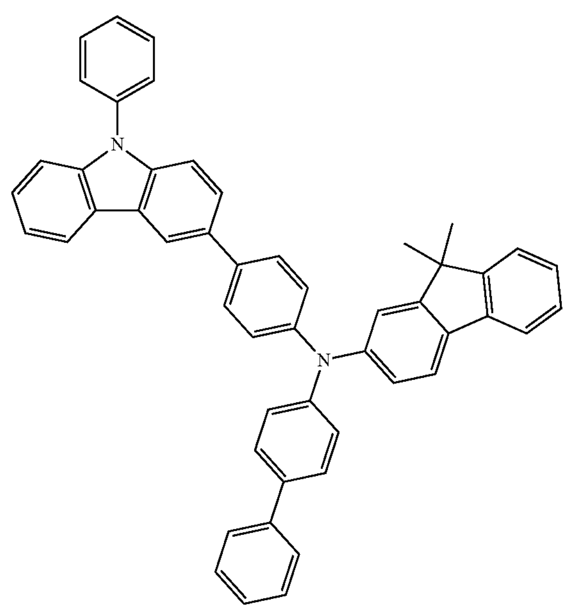

-continued
HT4
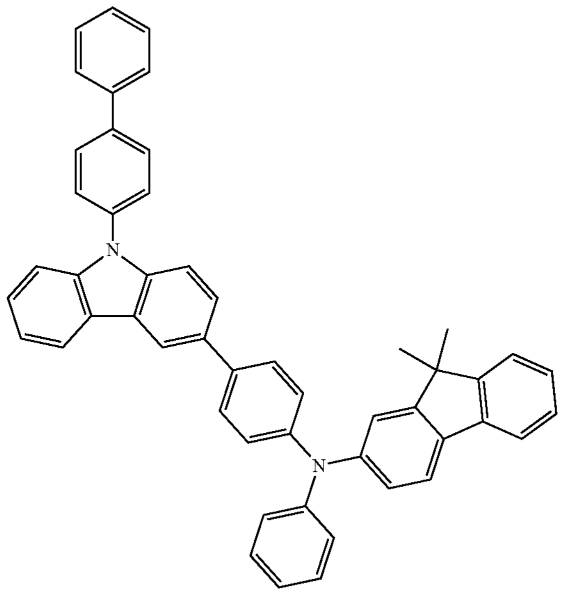
HT5
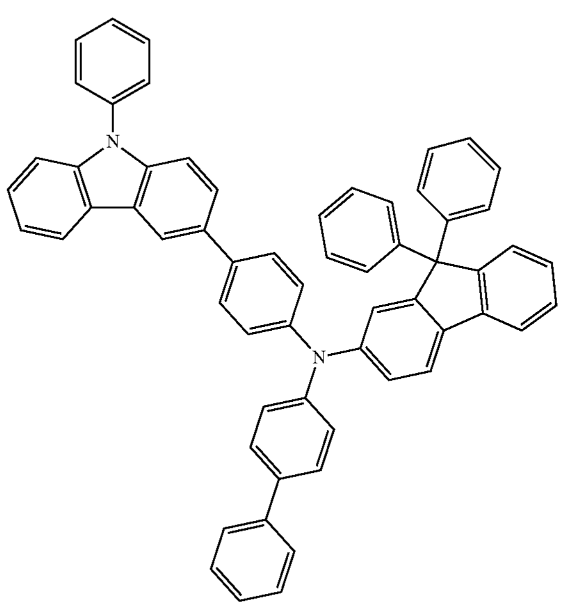
-continued
HT6
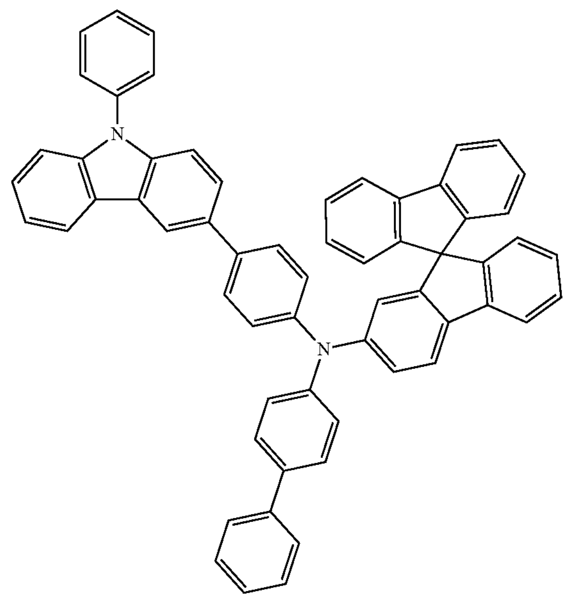
HT7
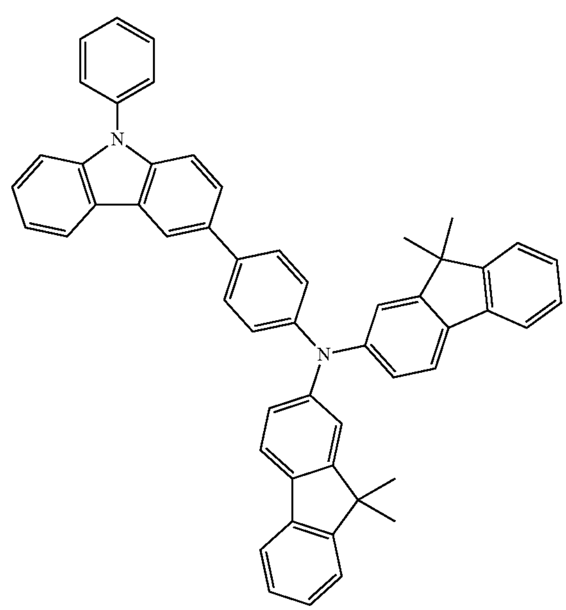

-continued
HT8
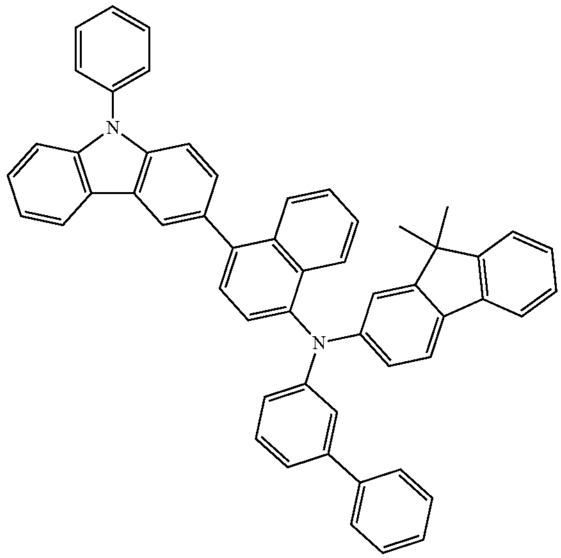
-continued
H10
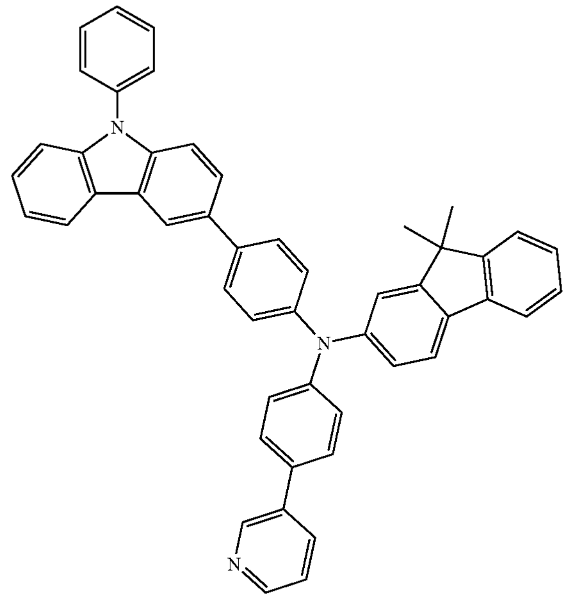
HT9
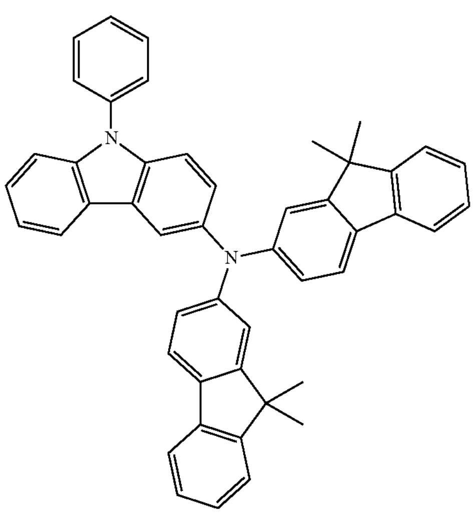
H11
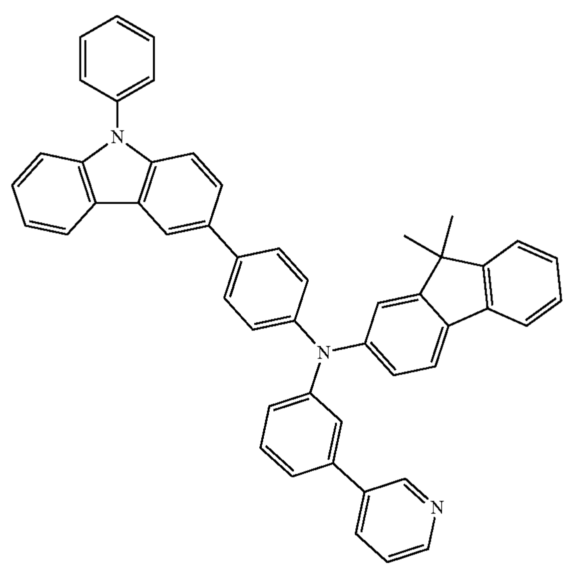

-continued
H12
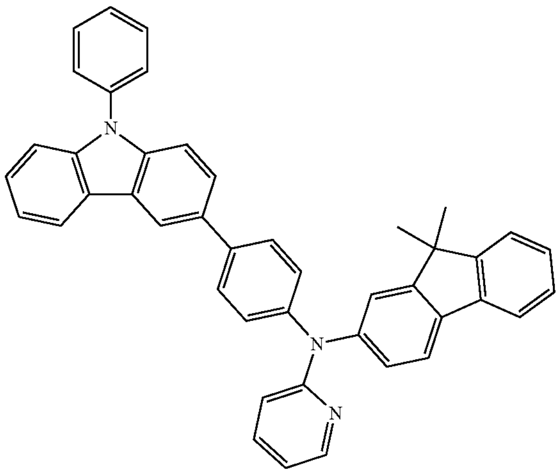
HT13
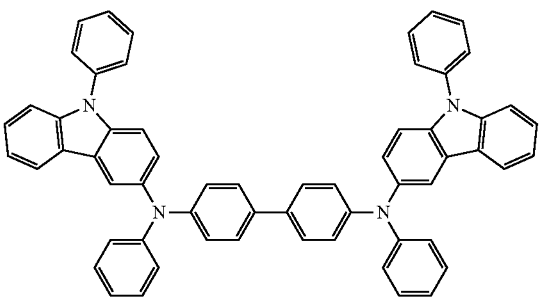
HT14
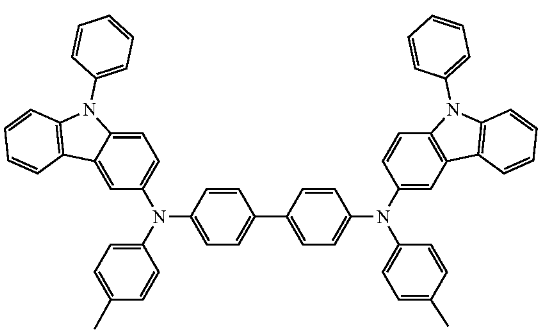
HT15
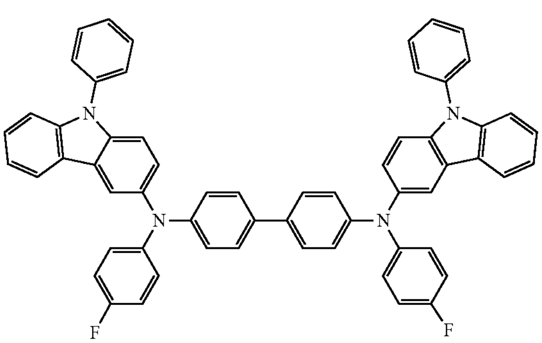
-continued
HT16
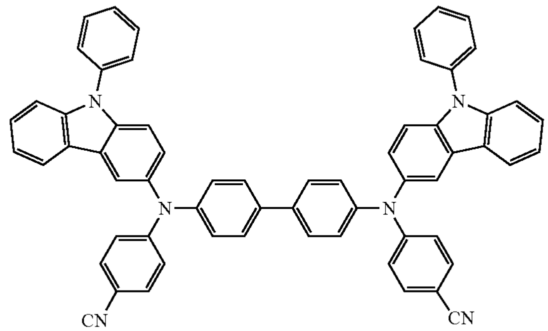
HT17
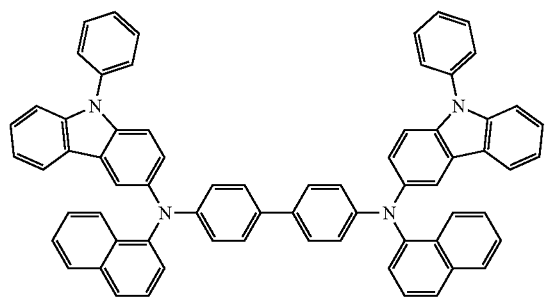
HT18
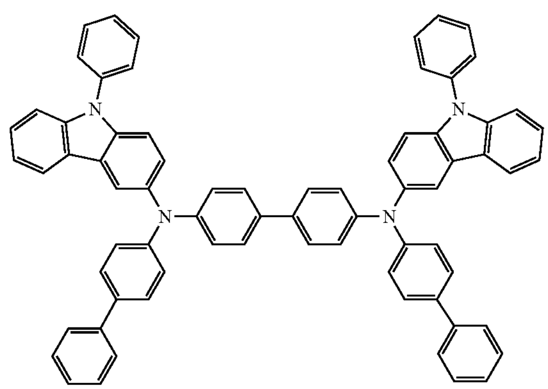
HT19
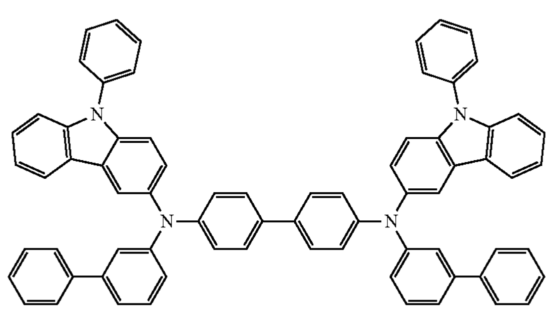

-continued

HT20

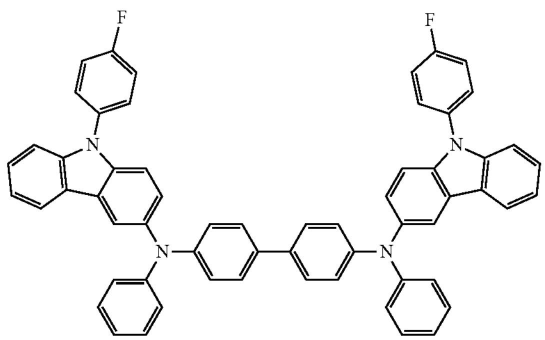

A thickness of the hole transport region may be in a range of about 100 Å to about 10,000 Å, e.g., about 100 Å to about 2,000 Å. When the hole transport region includes both a hole injection layer and a hole transport layer, a thickness of the hole injection layer may be in a range of about 100 Å to about 10,000 Å, e.g., about 100 Å to about 1,000 Å, and a thickness of the hole transport layer may be in a range of about 50 Å to about 2,000 Å, e.g., about 100 Å to about 1,500 Å. When the thicknesses of the hole transport region, the hole injection layer, and the hole transport layer are within these ranges, satisfactory hole transporting characteristics may be obtained without a substantial increase in driving voltage.

The hole transport region may further include, in addition to these materials, a charge-generation material for the improvement of conductive properties. The charge-generation material may be homogeneously or unhomogeneously dispersed in the hole transport region.

The charge-generation material may be, e.g., a p-dopant. The p-dopant may include one of a quinone derivative, a metal oxide, and a cyano group-containing compound. For example, the p-dopant may include a quinone derivative, such as tetracyanoquinonedimethane (TCNQ) or 2,3,5,6-tetrafluoro-tetracyano-1,4-benzoquinonedimethane (F4-TCNQ); a metal oxide, such as a tungsten oxide or a molybdenum oxide; and Compound HT-D1 illustrated below.

<Compound HT-D1>

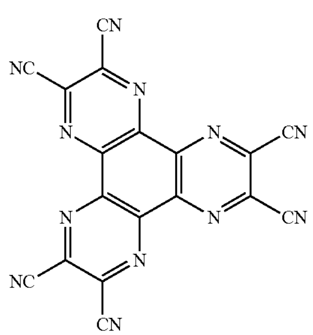

<F4-TCNQ>

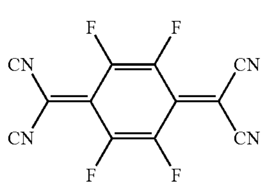

The hole transport region may further include, in addition to the hole injection layer and the hole transport layer, at least one of a buffer layer and an electron blocking layer. The buffer layer may compensate for an optical resonance distance according to a wavelength of light emitted from the emission layer, and the light-emission efficiency of a formed organic light-emitting device may be improved. For use as a material included in the buffer layer, materials that are included in the hole transport region may be used. The electron blocking layer prevents injection of electrons from the electron transport region.

For example, a material for the electron blocking layer may include mCP.

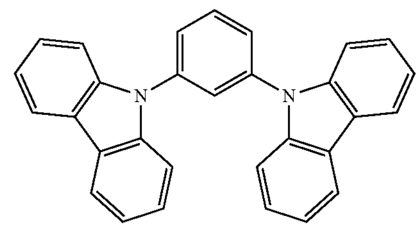

mCP

An emission layer may be formed on the first electrode 110 or the hole transport region by using various methods, e.g., vacuum deposition, spin coating, casting, an LB method, inkjet printing, laser printing, or laser-induced thermal imaging. When an emission layer is formed by vacuum deposition or spin coating, deposition and coating conditions for the emission layer may be the same as those for the hole injection layer.

When the organic light-emitting device 10 is a full-color organic light-emitting device, the emission layer may be patterned into a red emission layer, a green emission layer, or a blue emission layer, according to a sub-pixel. In some embodiments, the emission layer may have a stacked structure of a red emission layer, a green emission layer, and a blue emission layer, or may include a red-light emission material, a green-light emission material, and a blue-light emission material, which are mixed with each other in a single layer, to emit white light. In some embodiments, the emission layer may be a white emission layer, and may further include a color converting layer or a color filter to turn white light into light of a desired color.

In an implementation, the emission layer included in the organic layer 150 may include, e.g., a first material or compound represented by one of the following Formulae 1-1 and 1-2.

<Formula 1-1>

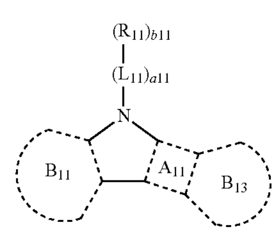

-continued

<Formula 1-2>

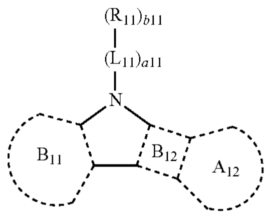

$A_{11}$ and $A_{12}$ in Formulae 1-1 and 1-2 may each independently be or may include, e.g., a group or moiety represented by any one of Formulae 1A-1 and 1A-2 below.

<Formula 1A-1>

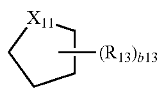

<Formula 1A-2>

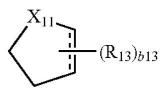

$X_{11}$, $R_{13}$, and b13 in Formulae 1A-1 and 1A-2 will be explained in detail below.

In an implementation, in Formulae 1-1 and 1-2, $A_{11}$ may be or may include, e.g., a group or moiety represented by any one of Formulae 1A-11 and 1A-12. $A_{12}$ may be or may include, e.g., a group or moiety represented by any one of Formulae 1A-21 and 1A-22.

1A-11

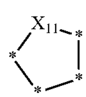

1A-12

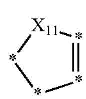

1A-21

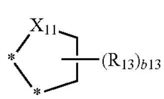

1A-22

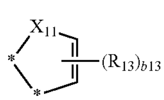

in Formulae 1A-11, 1A-12, 1A-21, and 1A-22, * indicates a carbon atom in Formulae 1-1 and 1-2.

In an implementation, $A_{11}$ in Formulae 1-1 and 1-2 may be or may include, e.g., a group or moiety represented by Formula 1A-12; and $A_{12}$ may be or may include, e.g., a group or moiety represented by Formula 1A-22.

$B_{11}$ to $B_{13}$ in Formulae 1-1 and 1-2 may each independently be selected from or include, e.g., a substituted or unsubstituted $C_6$-$C_{60}$ arene and a substituted or unsubstituted $C_1$-$C_{60}$ heteroarene.

In an implementation, at least one substituent of the substituted $C_6$-$C_{60}$ arene and substituted $C_1$-$C_{60}$ heteroarene may be selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, a monovalent non-aromatic condensed heteropolycyclic group, and —Si($Q_{11}$)($Q_{12}$)($Q_{13}$);

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, and a monovalent non-aromatic condensed heteropolycyclic group, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, a monovalent non-aromatic condensed heteropolycyclic group, and —Si($Q_{21}$)($Q_{22}$)($Q_{23}$); and —Si($Q_{31}$)($Q_{32}$)($Q_{33}$), wherein $Q_{11}$ to $Q_{13}$, $Q_{21}$ to $Q_{23}$, and $Q_{31}$ to $Q_{33}$ may each independently be selected from a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In an implementation, $B_{11}$ to $B_{13}$ in Formulae 1-1 and 1-2 may each independently be selected from or include, e.g., a benzene, a naphthalene, a phenanthrene, an anthracene, a triphenylene, a pyridine, a pyrimidine, a quinoline, and an isoquinoline; and a benzene, a naphthalene, a phenanthrene, an anthracene, a triphenylene, a pyridine, a pyrimidine, a quinoline, and an isoquinoline, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, and a $C_6$-$C_{60}$ aryl group.

In an implementation, $B_{11}$ to $B_{13}$ in Formulae 1-1 and 1-2 may each independently be selected from or include, e.g., a benzene, a naphthalene, a phenanthrene, an anthracene, and a pyridine; and a benzene, a naphthalene, a phenanthrene, an anthracene, and a pyridine, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a methyl group, an ethyl group, an n-propyl group, an iso-propyl group, an n-butyl group, a sec-butyl group, an iso-butyl group, a tert-butyl group, a methoxy group, an ethoxy group, a tert-butoxy group, a phenyl group, and a naphthyl group.

In an implementation, $B_{11}$ to $B_{13}$ in Formulae 1-1 and 1-2 may each independently be selected from or may include, e.g., a group or moiety represented by one of the following Formulae 8-1 to 8-3.

8-1

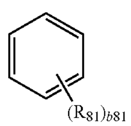

8-2

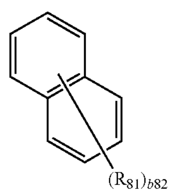

8-3

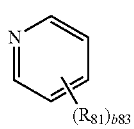

In Formulae 8-1 to 8-3, $R_{81}$ may be selected from, e.g., a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a methyl group, an ethyl group, an n-propyl group, an iso-propyl group, an n-butyl group, a sec-butyl group, an iso-butyl group, a tert-butyl group, a methoxy group, an ethoxy group, a tert-butoxy group, a phenyl group, and a naphthyl group;

b81 may be selected from 1, 2, 3, and 4;

b82 may be selected from 1, 2, 3, 4, 5, and 6; and b83 may be selected from 1, 2, and 3.

In an implementation, $B_{11}$ to $B_{13}$ in Formulae 1-1 and 1-2 may each independently be or include, e.g., a group or moiety represented by any one of Formulae 8-1 to 8-3, $R_{81}$ in Formulae 8-1 to 8-3 may be selected from a hydrogen and a phenyl group; b81 may be selected from 1, 2, 3, and 4; b82 may be selected from 1, 2, 3, 4, 5, and 6; and b83 may be selected from 1, 2, and 3.

In an implementation. $B_{11}$ to $B_{13}$ in Formulae 1-1 and 1-2 may each independently be or include, e.g., a group or moiety represented by one of the following Formulae 9-1 to 9-5; and $B_{12}$ may be or include, e.g., a group or moiety represented by one of the following Formulae 9-11 to 9-19.

9-1

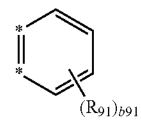

9-2

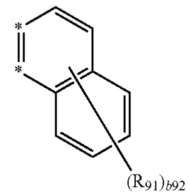

9-3

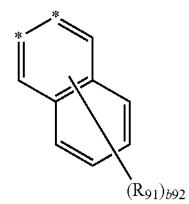

9-4

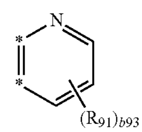

9-5

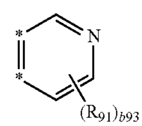

9-11

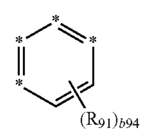

9-12

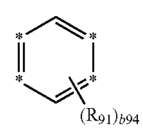

9-13

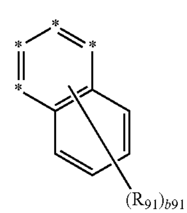

9-14

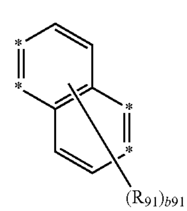

-continued 9-15

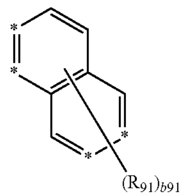

9-16

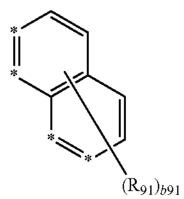

9-17

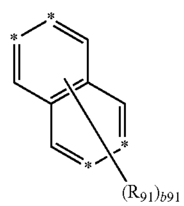

9-18

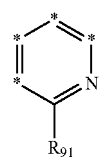

9-19

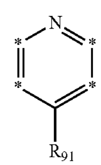

In Formulae 9-1 to 9-5 and 9-11 to 9-19:

$R_{91}$ may be selected from a hydrogen and a phenyl group;

b91 may be selected from 1, 2, 3, and 4;

b92 may be selected from 1, 2, 3, 4, 5, and 6;

b93 may be selected from 1, 2, and 3;

b94 may be selected from 1 and 2; and

* indicates a carbon atom in Formulae 1-1, 1-2, 2-1, and 2-2.

$X_{11}$ in Formulae 1A-1 and 1A-2 may be selected from, e.g., N-[$(L_{12})_{a12}$-$(R_{12})_{b12}$], an oxygen atom (O), a sulfur atom (S), and $C(R_{14})(R_{15})$.

$L_{11}$ and $L_{12}$ in Formulae 1-1, 1-2, 1A-1, and 1A-2 may each independently be selected from or include, e.g., a substituted or unsubstituted $C_6$-$C_{60}$ arylene group and a substituted or unsubstituted $C_1$-$C_{60}$ heteroarylene group.

In an implementation, at least one substituent of the substituted $C_6$-$C_{60}$ arylene group and substituted $C_1$-$C_{60}$ heteroarylene group may be selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, a monovalent non-aromatic condensed heteropolycyclic group, and —$Si(Q_{11})(Q_{12})(Q_{13})$;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, and a monovalent non-aromatic condensed heteropolycyclic group, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, a monovalent non-aromatic condensed heteropolycyclic group, and —$Si(Q_{21})(Q_{22})(Q_{23})$; and —$Si(Q_{31})(Q_{32})(Q_{33})$, wherein $Q_{11}$ to $Q_{13}$, $Q_{21}$ to $Q_{23}$, and $Q_{31}$ to $Q_{33}$ may be each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In an implementation, $L_{11}$ and $L_{12}$ in Formulae 1-1, 1-2, 1A-1, and 1A-2 may each independently be selected from, e.g., a phenylene group, a naphthylene group, a phenanthrenylene group, an anthracenylene group, a triphenylenylene group, a pyrenylene group, a chrysenylene group, a pyrrolylene group, a thiophenylene group, a furanylene group, an imidazolylene group, a pyridinylene group, a pyrazinylene group, a pyrimidinylene group, a pyridazinylene group, an indolylene indolylene group, a quinolinylene group, an isoquinolinylene group, a benzoquinolinylene group, a phenanthridinylene group, an acridinylene group, a phenanthrolinylene group, a benzofuranylene group, a benzothiophenylene group, a triazolylene group, a tetrazolylene group, a triazinylene group, a dibenzofuranylene group, and a dibenzothiophenylene group; and a phenylene group, a naphthylene group, a phenanthrenylene group, an anthracenylene group, a triphenylenylene group, a pyrenylene group, a chrysenylene group, a pyrrolylene group, a thiophenylene group, a furanylene group, an imidazolylene group, a pyridinylene group, a pyrazinylene group, a pyrimidinylene group, a pyridazinylene group, an indolylene group, a quinolinylene group, an isoquinolinylene group, a benzoquinolinylene group, a phenanthridinylene group, an acridinylene group, a phenanthrolinylene group, a benzofuranylene group, a benzothiophenylene group, a triazolylene group, a tetrazolylene group, a triazinylene group, a dibenzofuranylene group, and a dibenzothiophenylene group, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, and an imidazopyridinyl group.

In an implementation, $L_{11}$ and $L_{12}$ in Formulae 1-1, 1-2, 1A-1, and 1A-2 may each independently be selected from, e.g., a phenylene group, a naphthylene group, a pyridinylene group, a quinolinylene group, and an isoquinolinylene group; and a phenylene group, a naphthylene group, a pyridinylene group, a quinolinylene group, and an isoquinolinylene group, each substituted with at least one selected from the group of a deuterium, —F, –Cl, —Br, —I, a cyano group, a nitro group, a $C_1$-$C_{20}$ alkyl group, a phenyl group, and a naphthyl group.

In an implementation, $L_{11}$ and $L_{12}$ in Formulae 1-1, 1-2, 1A-1, and 1A-2 may each independently be selected from, e.g., a group represented by one of the following Formulae 3-1 to 3-10.

3-1

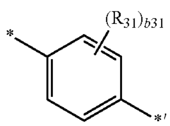

-continued 3-2

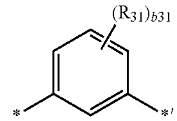

3-3

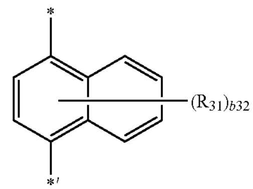

3-4

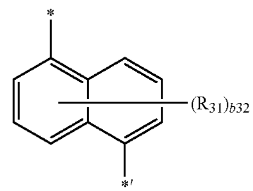

3-5

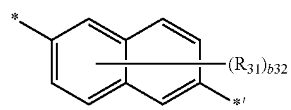

3-6

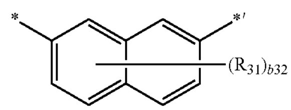

3-7

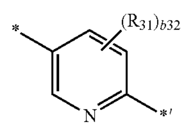

3-8

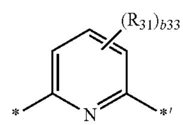

3-9

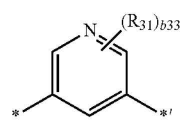

3-10

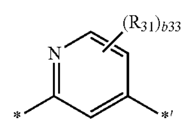

In Formulae 3-1 to 3-10, $R_{31}$ may be selected from, e.g., a hydrogen, a deuterium, —F, —Cl, —Br, —I, a cyano group, a nitro group, a $C_1$-$C_{20}$ alkyl group, a phenyl group, and a naphthyl group;

b31 may be selected from 1, 2, 3, and 4;

b32 may be selected from 1, 2, 3, 4, 5, and 6;

b33 may be selected from 1, 2, and 3; and

* and *' indicate binding sites to a neighboring atom.

In an implementation, $L_{11}$ and $L_{12}$ in Formulae 1-1, 1-2, 1A-1, and 1A-2 may each independently be selected from, e.g., a group represented by one of the following Formulae 4-1 to 4-6.

4-1

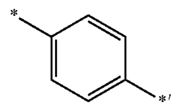

4-2

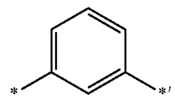

4-3

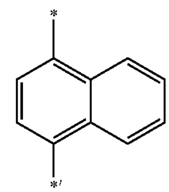

4-4

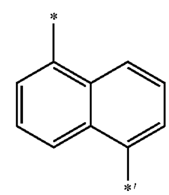

4-5

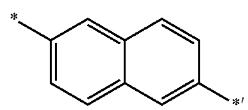

4-6

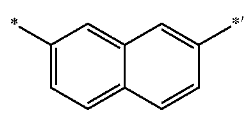

In Formulae 4-1 to 4-6, * and *' indicate binding sites to a neighboring atom.

a11 in Formulae 1-1 and 1-2 indicates the number of $L_{11}$s, and may be selected from 0, 1, 2, and 3. For example, a11 in Formula 1-1 and 1-2 may be selected from 0 and 1. When a11 is 0, $-(L_{11})_{a11}-$ indicates a single bond. When a11 is selected from 2 and 3, a plurality of $R_{11}$s may be identical or different. a12 may be understood by referring to the description of a11 and the formulae related thereto.

a12 in Formulae 1-1, 1-2, 1A-1, and 1A-2 may be selected from 0, 1, 2, and 3. For example, a12 in Formulae 1-1 and 1-2 may be selected from 0 and 1.

$R_{11}$ and $R_{12}$ in Formulae 1-1, 1-2, 1A-1, and 1A-2 may each independently be selected from or include, e.g., a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

In an implementation, at least one substituent of the substituted $C_6$-$C_{60}$ aryl group, substituted $C_1$-$C_{60}$ heteroaryl group, substituted monovalent non-aromatic condensed polycyclic group, and substituted monovalent non-aromatic condensed heteropolycyclic group may be selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, a monovalent non-aromatic condensed heteropolycyclic group, and —Si($Q_{11}$)($Q_{12}$)($Q_{13}$);

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, and a monovalent non-aromatic condensed heteropolycyclic group, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, a monovalent non-aromatic condensed heteropolycyclic group, and —Si($Q_{21}$)($Q_{22}$)($Q_{23}$); and —Si($Q_{31}$)($Q_{32}$)($Q_{33}$), wherein $Q_{11}$ to $Q_{13}$, $Q_{21}$ to $Q_{23}$, and $Q_{31}$ to $Q_{33}$ may be each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In an implementation, $R_{11}$ and $R_{12}$ in Formulae 1-1, 1-2, 1A-1, and 1A-2 may each independently be selected from, e.g., a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a firanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, a benzofuranyl group, a benzothiophenyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, a pyridobenzofuranyl group, a pyrimidobenzofuranyl group, a pyridobenzothiophenyl group, and a pyrimidobenzothiophenyl group; and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, a pyridobenzofuranyl group, a pyrimidobenzofuranyl group, a pyridobenzothiophenyl group, and a pyrimidobenzothiophenyl group, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and —Si($Q_{31}$)($Q_{32}$)($Q_{33}$); and $Q_{31}$ to $Q_{33}$ may be each independently selected from a $C_1$-$C_{60}$ alkyl group and a $C_6$-$C_{60}$ aryl group.

In an implementation, $R_{11}$ and $R_{12}$ in Formulae 1-1, 1-2, 1A-1, and 1A-2 may be each independently selected from a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an oxazolyl group, a pyridinyl group, a pyrazinyl group, a pyrimidinyl group, an indolyl group, a quinolinyl group, an isoquinolinyl group, a carbazolyl group, a benzoquinolinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a triazolyl group, a triazinyl group, a dibenzofuranyl group, a dibenzothiophenyl group, an imidazopyridinyl group, an imidazopyrimidinyl group, a pyridobenzofuranyl group, a pyrimidobenzofuranyl group, a pyridobenzothiophenyl group, and a pyrimidobenzothiophenyl group; and a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an oxazolyl group, a pyridinyl group, a pyrazinyl group, a pyrimidinyl group, an indolyl group, a quinolinyl group, an isoquinolinyl group, a carbazolyl group, a benzoquinolinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a triazolyl group, a triazinyl group, a dibenzofuranyl group, a dibenzothiophenyl group, an imidazopyridinyl group, an imidazopyrimidinyl group, a pyridobenzofuranyl group, a pyrimidobenzofuranyl group, a pyridobenzothiophenyl group, and a pyrimidobenzothiophenyl group, each substituted with at least one selected from the group of a deuterium, —F, —Cl, —Br, —I, a cyano group, a nitro group, a $C_1$-$C_{20}$ alkyl group, a phenyl group and a naphthyl group, and —Si($Q_{31}$)($Q_{32}$)($Q_{33}$); and $Q_{31}$ to $Q_{33}$ may each independently be selected from a methyl group, an ethyl group, an n-propyl group, an iso-propyl group, an n-butyl group, an iso-butyl group, a sec-butyl group, a tert-butyl group, and a phenyl group.

In an implementation, $R_1$ and $R_{12}$ in Formulae 1-1, 1-2, 1A-1, and 1A-2 may each independently be selected from, e.g., a phenyl group, a naphthyl group, a fluorenyl group, a phenanthrenyl group, an anthracenyl group, a triphenylenyl group, a pyridinyl group, a pyrazinyl group, a pyrimidinyl group, a quinolinyl group, an isoquinolinyl group, a carbazolyl group, a benzoquinolinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a triazolyl group, a triazinyl group, a dibenzofuranyl group, a dibenzothiophenyl group, an imidazopyridinyl group, an imidazopyrimidinyl group, a pyridobenzofuranyl group, a pyrimidobenzofuranyl group, a pyridobenzothiophenyl group, and a pyrimidobenzothiophenyl group; and a phenyl group, a naphthyl group, a phenanthrenyl group, an anthracenyl group, a triphenylenyl group, a pyridinyl group, a pyrazinyl group, a pyrimidinyl group, a quinolinyl group, an isoquinolinyl group, a carbazolyl group, a benzoquinolinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a triazolyl group, a triazinyl group, a dibenzofuranyl group, a dibenzothiophenyl group, an imidazopyridinyl group, an imidazopyrimidinyl group, a pyridobenzofuranyl group, a pyrimidobenzofuranyl group, a pyridobenzothiophenyl group, and a pyrimidobenzothiophenyl group, each substituted with at least one selected from the group of a deuterium, —F, —Cl, —Br, —I, a cyano group, a nitro group, a $C_1$-$C_{20}$ alkyl group, a phenyl group, a naphthyl group, and —Si($Q_{31}$)($Q_{32}$)($Q_{33}$); and $Q_{31}$ to $Q_{33}$ may each independently be selected from a methyl group, an ethyl group, an n-propyl group, an iso-propyl group, an n-butyl group, an iso-butyl group, a sec-butyl group, and a tert-butyl group.

In an implementation, $R_{11}$ and $R_{12}$ in Formulae 1-1, 1-2, 1A-1, and 1A-2 may each independently be, e.g., a group represented by one of the following Formulae 5-1 to 5-34 and 5-36 to 5-57.

5-1

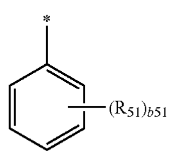

5-2

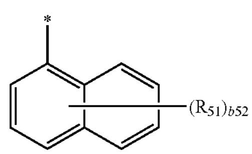

5-3

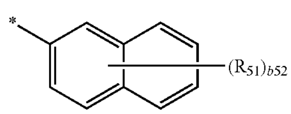

5-4

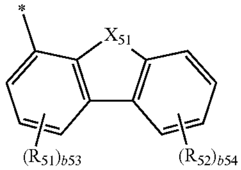

5-5

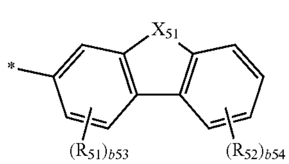

-continued 5-6

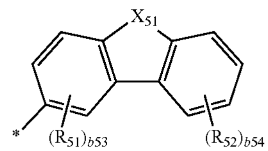

5-7

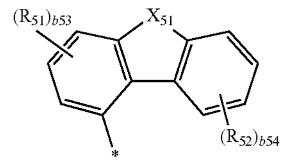

5-8

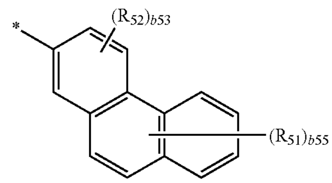

5-9

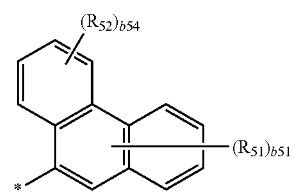

5-10

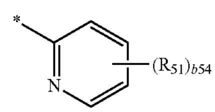

5-11

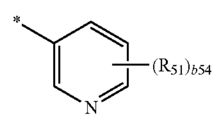

5-12

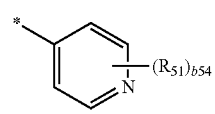

5-13

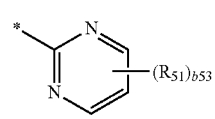

5-14

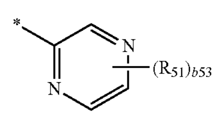

5-15

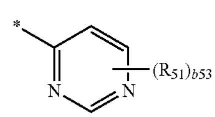

5-16

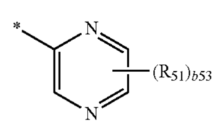

-continued
5-17
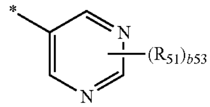
5-18
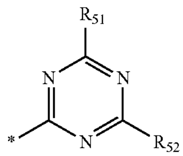
5-19
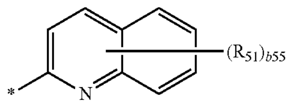
5-20
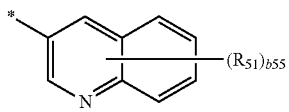
5-21
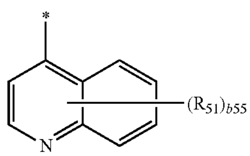
5-22
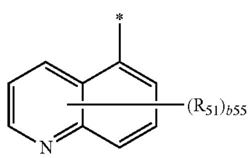
5-23
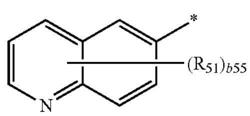
5-24
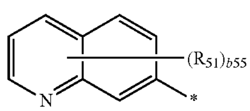
5-25
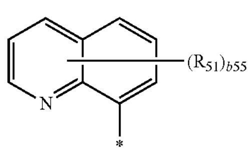
5-26
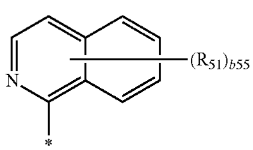
5-27
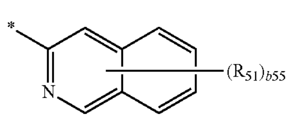
-continued
5-28
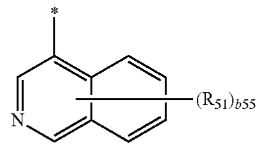
5-29
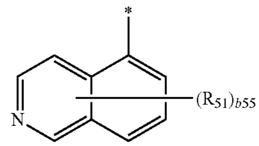
5-30
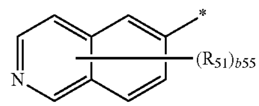
5-31
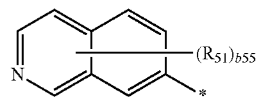
5-32
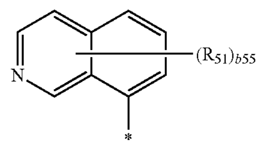
5-33
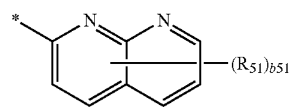
5-34
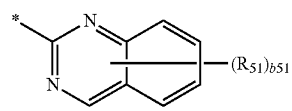
5-36
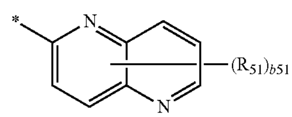
5-37
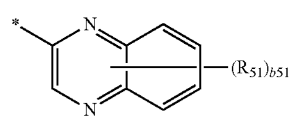
5-38
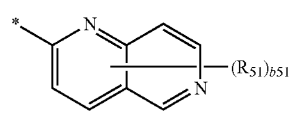
5-39
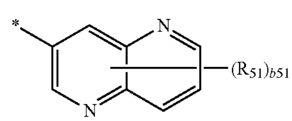
5-40
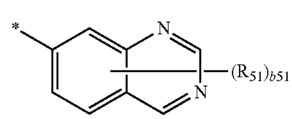

-continued 5-41

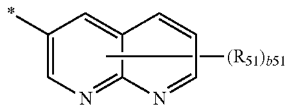

5-42

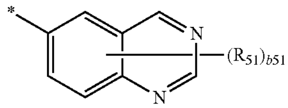

5-43

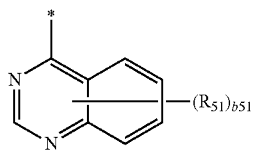

5-44

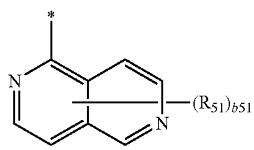

5-45

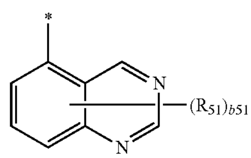

5-46

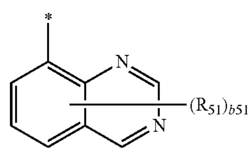

5-47

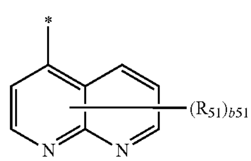

5-48

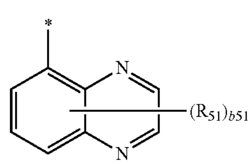

5-49

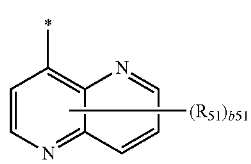

5-50

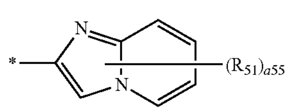

5-51

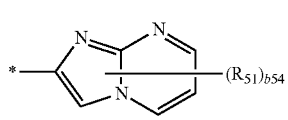

-continued 5-52

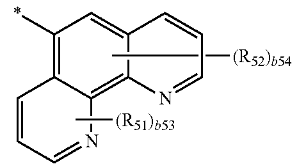

5-53

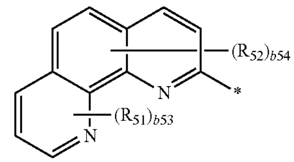

5-54

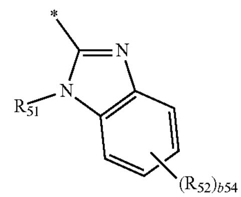

5-55

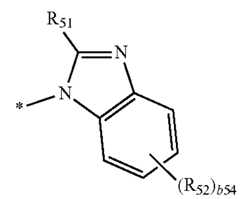

5-56

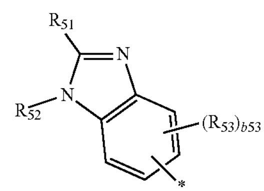

5-57

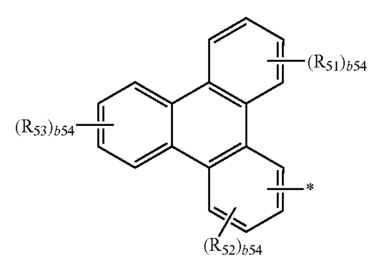

In Formulae 5-1 to 5-34 and 5-36 to 5-57, $X_{51}$ may be selected from, e.g., O, S, and $C(R_{54})(R_{55})$;

$R_{51}$ to $R_{55}$ may each independently be selected from, e.g., a hydrogen, a deuterium, —F, —Cl, —Br, —I, a cyano group, a nitro group, a $C_1$-$C_{20}$ alkyl group, a phenyl group, a naphthyl group, and $—Si(CH_3)_3$;

b51 may be selected from 1, 2, 3, 4, and 5;

b52 may be selected from 1, 2, 3, 4, 5, 6, and 7;

b53 may be selected from 1, 2, and 3;

b54 may be selected from 1, 2, 3, and 4;

b55 may be selected from 1, 2, 3, 4, 5, and 6; and

* indicates a binding site to a neighboring atom.

In an implementation, $R_{11}$ and $R_{12}$ in Formulae 1-1, 1-2, 1A-1, and 1A-2 may each independently be, e.g., a group represented by one of the following Formulae 6-1 to 6-194.

6-1
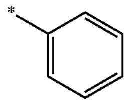
6-2
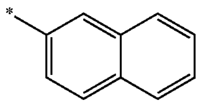
6-3
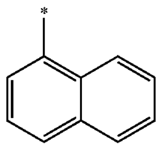
6-4
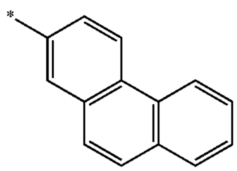
6-5
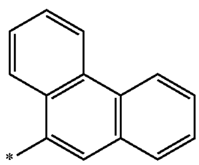
6-6
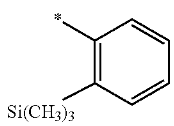
6-7
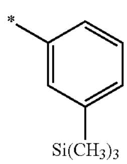
6-8
6-9
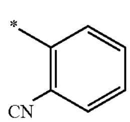
6-10
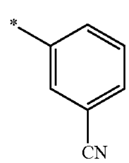
6-11
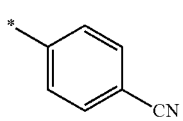
-continued
6-12
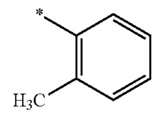
6-13
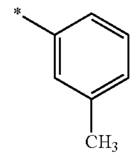
6-14
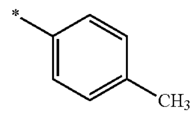
6-15
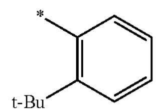
6-16
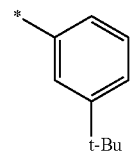
6-17
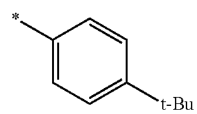
6-18
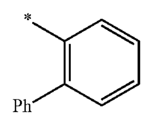
6-19
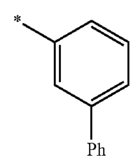
6-20
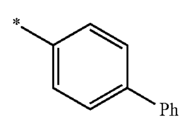
6-21
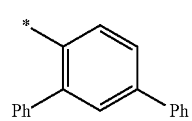
6-22
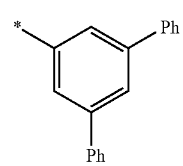

-continued
6-23
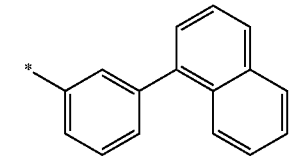
6-24
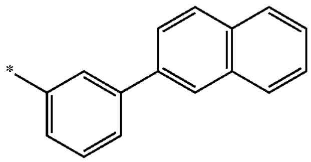
6-25
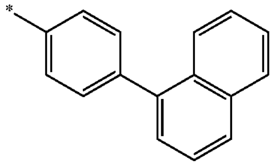
6-26
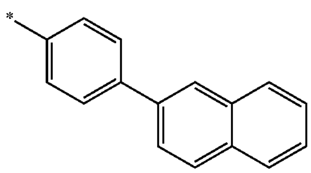
6-27
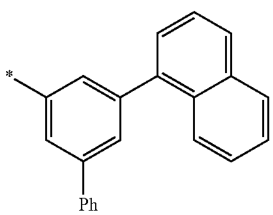
6-28
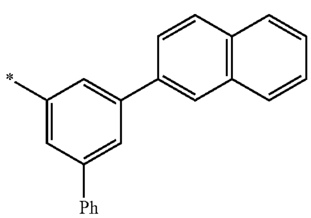
6-29
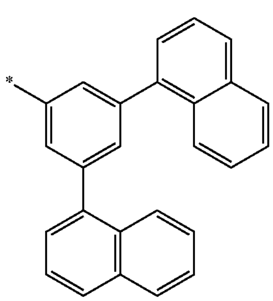
-continued
6-30
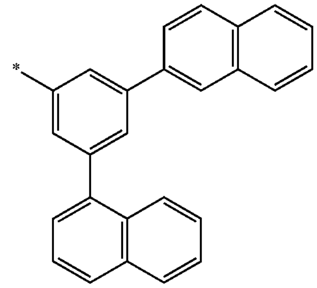
6-31
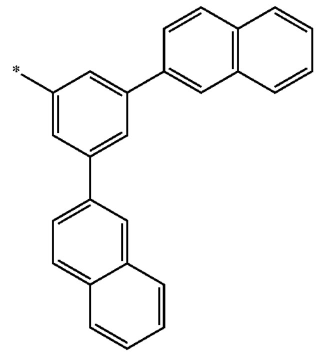
6-32
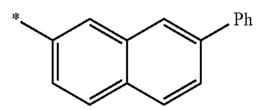
6-33
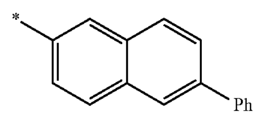
6-34
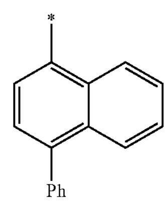
6-35
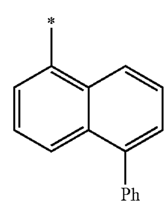
6-36
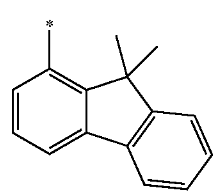

6-37
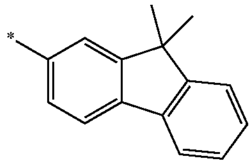
6-38
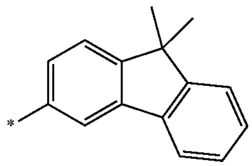
6-39
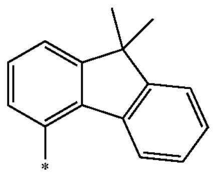
6-40
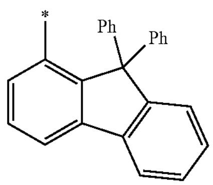
6-41
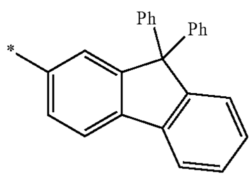
6-42
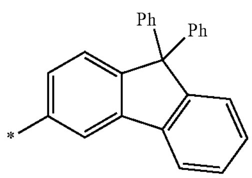
6-43
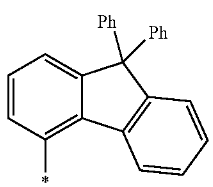
6-44
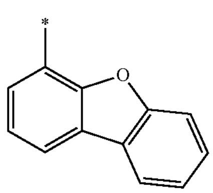
6-45
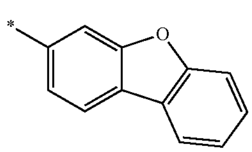
6-46
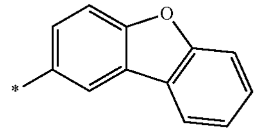
6-47
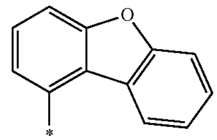
6-48
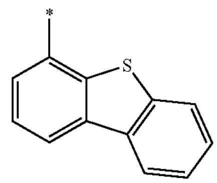
6-49
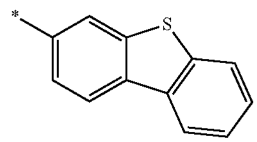
6-50
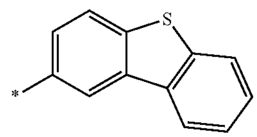
6-51
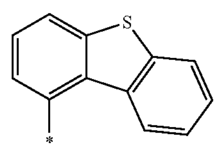
6-52
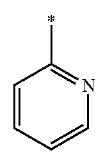
6-53
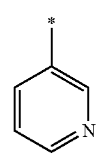
6-54
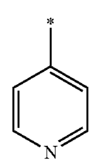
6-55
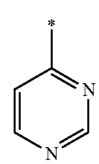

-continued
6-56
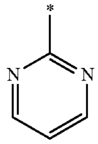
6-57
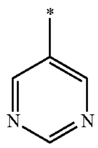
6-58
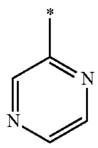
6-59
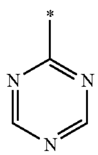
6-60
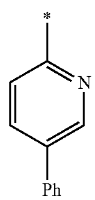
6-61
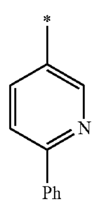
6-62
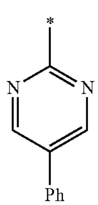
6-63
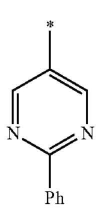
-continued
6-64
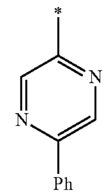
6-65
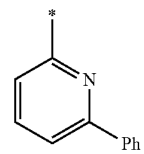
6-66
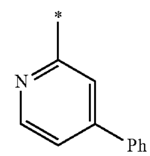
6-67
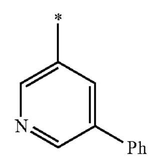
6-68
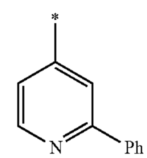
6-69
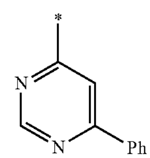
6-70
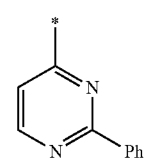
6-71
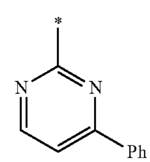
6-72
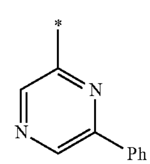

-continued
6-73
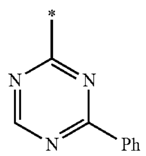
6-74
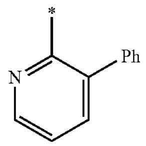
6-75
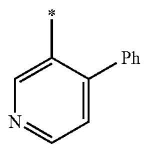
6-76
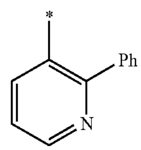
6-77
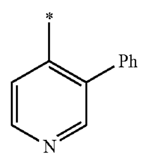
6-78
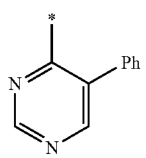
6-79
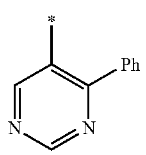
6-80
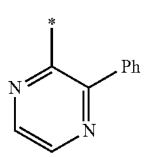
6-81
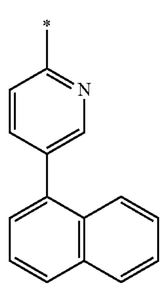
-continued
6-82
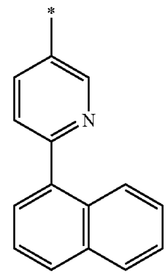
6-83
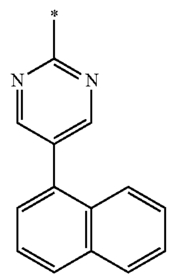
6-84
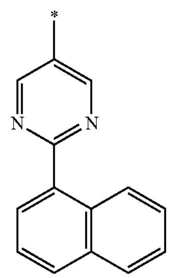
6-85
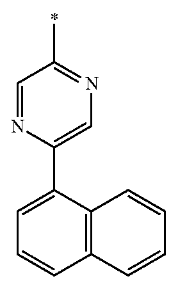
6-86
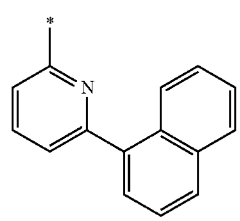
6-87
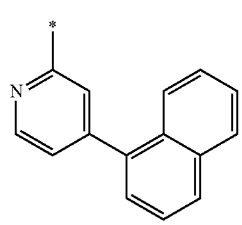

-continued
6-88
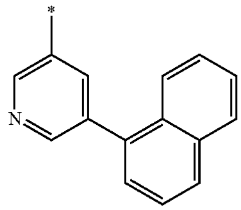
6-89
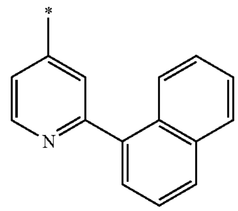
6-90
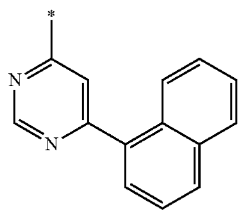
6-91
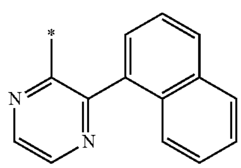
6-92
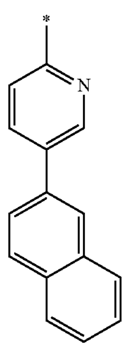
6-93
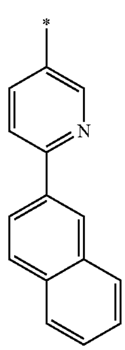
-continued
6-94
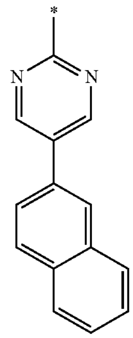
6-95
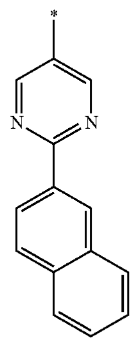
6-96
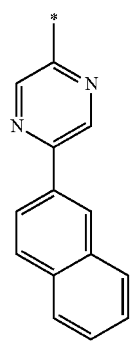
6-97
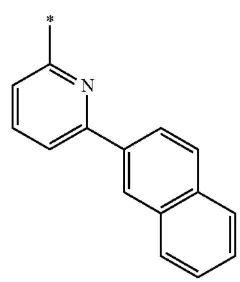
6-98
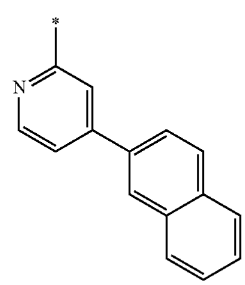

-continued
6-99
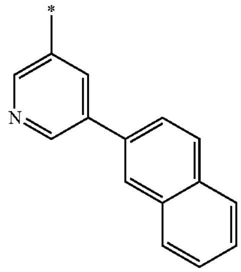
6-100
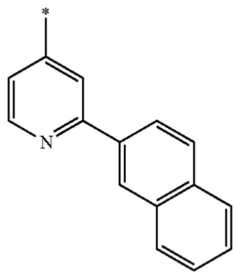
6-101
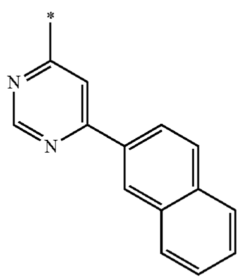
6-102
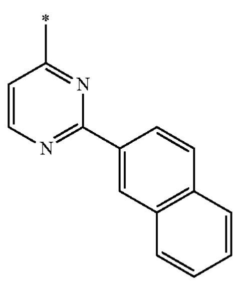
6-103
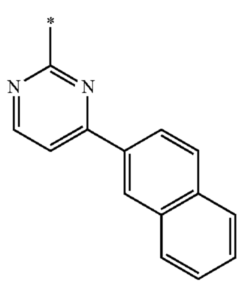
-continued
6-104
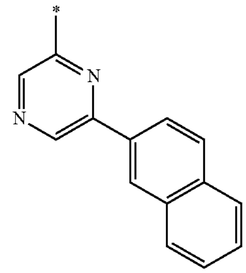
6-105
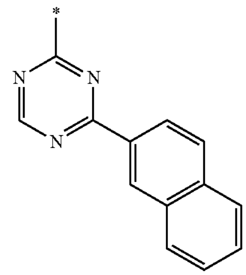
6-106
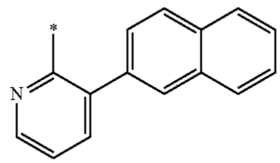
6-107
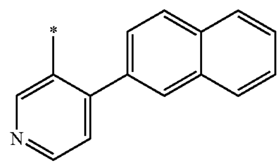
6-108
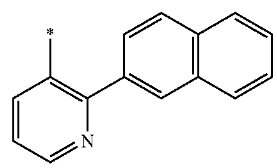
6-109
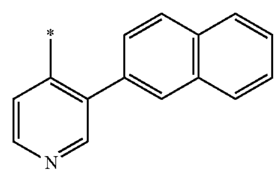
6-110
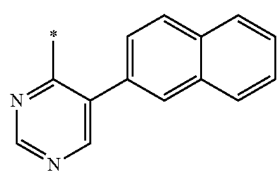
6-111
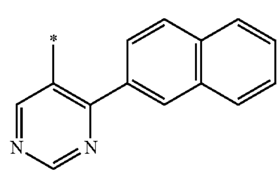

-continued
6-112
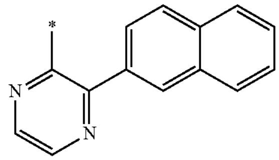
6-113
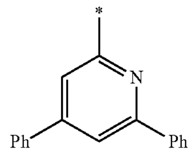
6-114
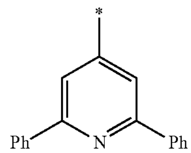
6-115
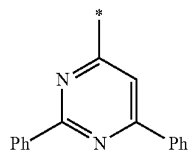
6-116
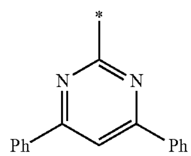
6-117
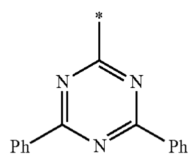
6-118
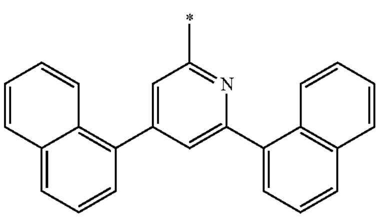
6-119
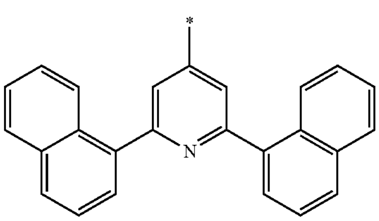
6-120
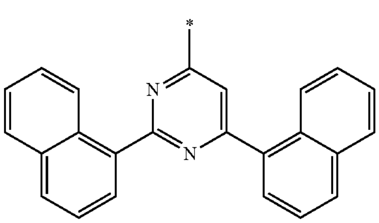
-continued
6-121
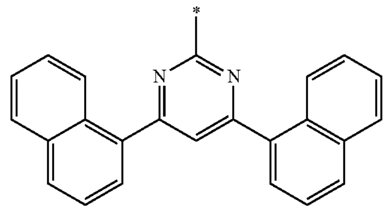
6-122
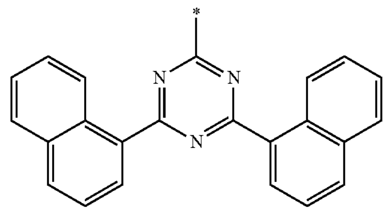
6-123
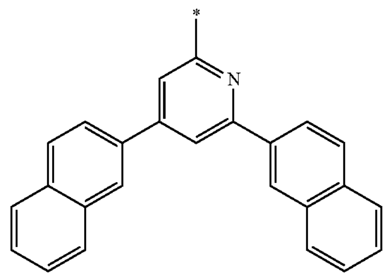
6-124
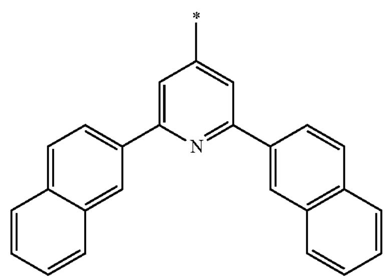
6-125
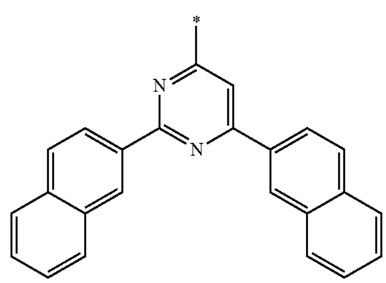
6-126
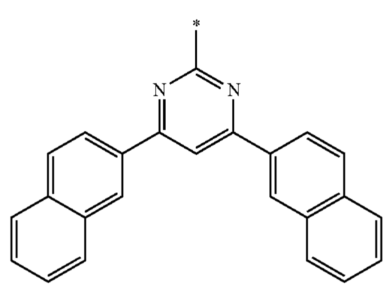

6-127
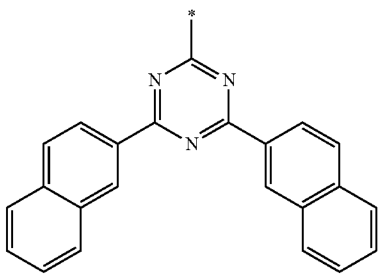
6-128
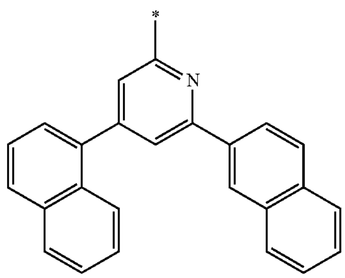
6-129
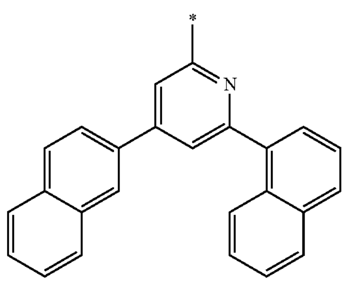
6-130
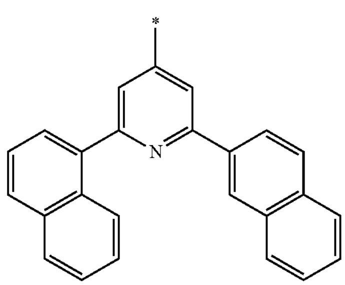
6-131
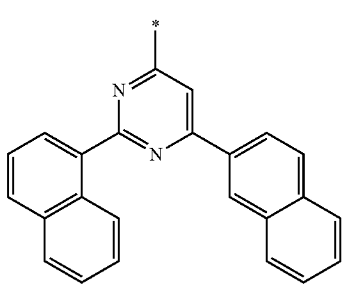
6-132
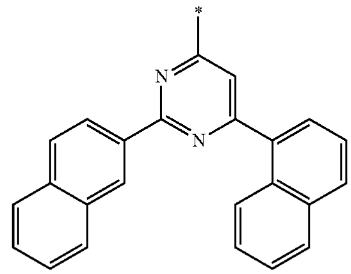
6-133
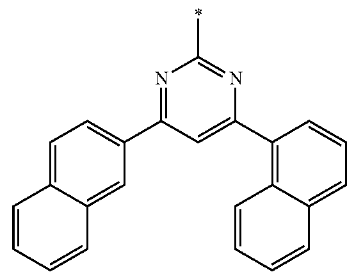
6-134
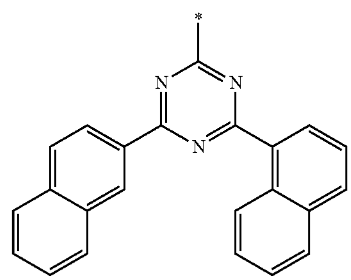
6-135
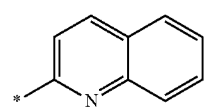
6-136
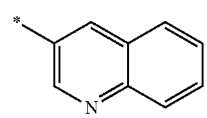
6-137
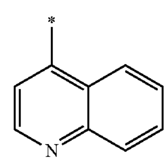
6-138
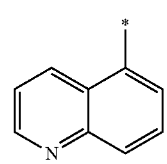
6-139
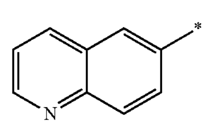
6-140
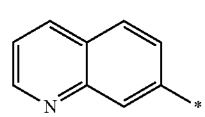

-continued
6-141
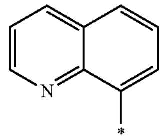
6-142
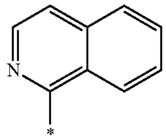
6-143
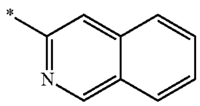
6-144
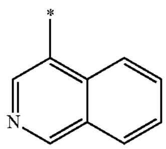
6-145
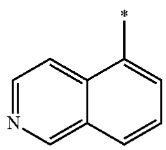
6-146
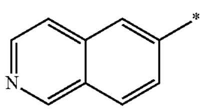
6-147
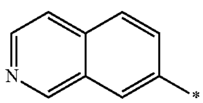
6-148
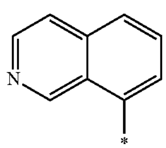
6-149
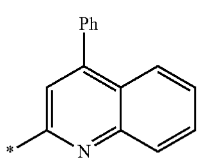
6-150
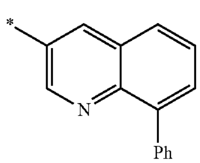
6-151
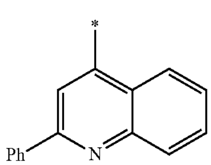
-continued
6-152
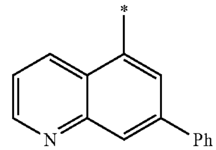
6-153
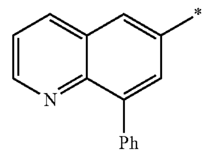
6-154
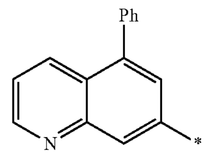
6-155
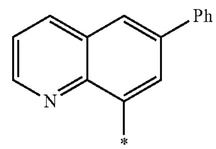
6-156
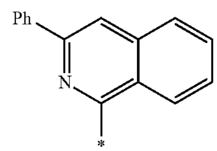
6-157
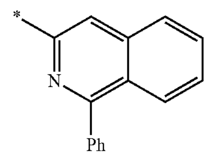
6-158
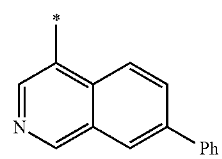
6-159
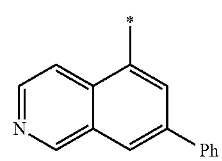
6-160
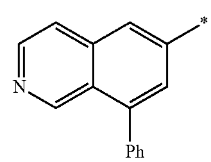
6-161
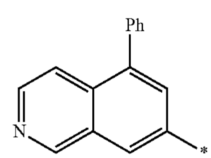

-continued
6-162
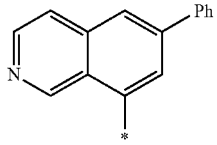
6-163
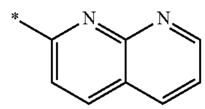
6-164
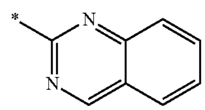
6-165
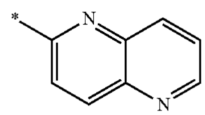
6-166
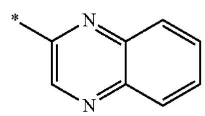
6-167
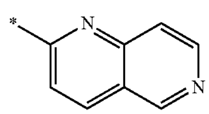
6-168
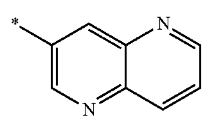
6-169
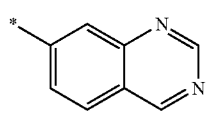
6-170
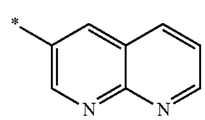
6-171
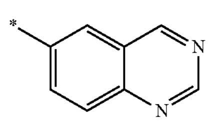
6-172
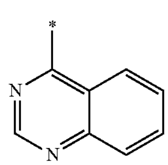
6-173
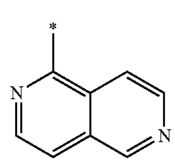
-continued
6-174
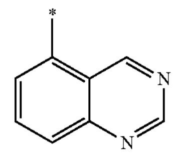
6-175
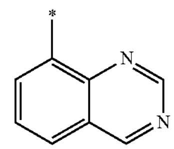
6-176
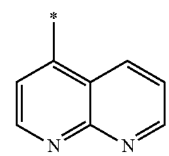
6-177
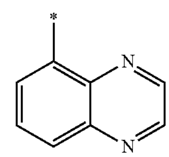
6-178
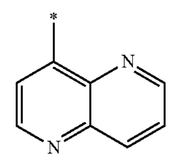
6-179
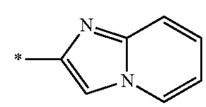
6-180
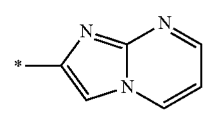
6-181
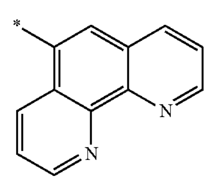
6-182
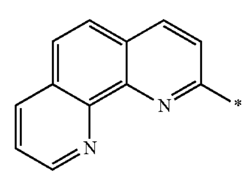
6-183
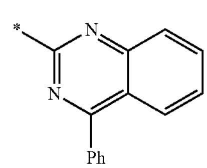

-continued 6-184

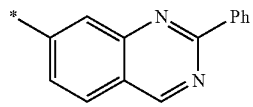

6-185

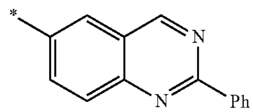

6-186

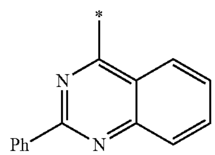

6-187

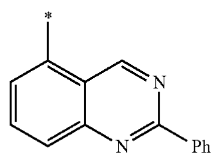

6-188

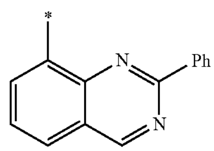

6-189

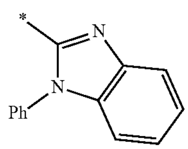

6-190

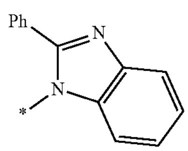

6-191

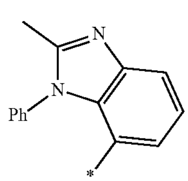

6-192

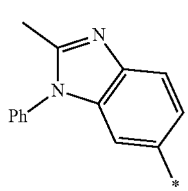

6-193

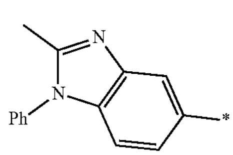

-continued 6-194

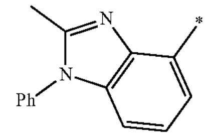

In 6-1 to 6-194, t-Bu indicates a tert-butyl group;

Ph indicates a phenyl group; and

* indicates a binding site to a neighboring atom.

b11 in Formulae 1-1 and 1-2 may be selected from 1, 2, and 3. For example, b11 in Formulae 1-1 and 1-2 may be 1. When b11 is 2 or more, a plurality of $R_1$ s may be identical or different. b12 may be understood by referring to the description of b11 and the formulae related thereto.

b12 in Formulae 1-1 and 1-2 may be selected from 1, 2, and 3. For example, b12 in Formulae 1-1 and 1-2 may be 1. When b12 is 2 or more, a plurality of $R_{12}$s may be identical or different.

In an implementation, $R_{13}$ to $R_{15}$ in Formulae 1-1, 1-2, 1A-1, and 1A-2 may each independently be selected from or include, e.g., a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_1$-$C_{60}$ alkoxy group, a substituted or unsubstituted $C_3$-$C_{60}$ cycloalkyl group, a substituted or unsubstituted $C_6$-$C_{60}$ aryl group, a substituted or unsubstituted $C_6$-$C_{60}$ aryloxy group, a substituted or unsubstituted $C_1$-$C_{60}$ heteroaryl group, a substituted or unsubstituted a monovalent non-aromatic condensed polycyclic group, a substituted or unsubstituted a monovalent non-aromatic condensed heteropolycyclic group, and —Si($Q_1$)($Q_2$)($Q_3$).

In an implementation, at least one substituent of the substituted $C_1$-$C_{60}$ alkyl group, substituted $C_1$-$C_{60}$ alkoxy group, substituted $C_3$-$C_{10}$ cycloalkyl group, substituted $C_6$-$C_{60}$ aryl group, substituted $C_6$-$C_{60}$ aryloxy group, substituted $C_1$-$C_{60}$ heteroaryl group, substituted monovalent non-aromatic condensed polycyclic group, and substituted monovalent non-aromatic condensed heteropolycyclic group may be selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, a monovalent non-aromatic condensed heteropolycyclic group, and —Si($Q_{11}$)($Q_{12}$)($Q_{13}$);

a $C_3$-$C_{o0}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_6$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, and a monovalent non-aromatic condensed heteropolycyclic group, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, a monovalent non-aromatic condensed heteropolycyclic group, and —Si($Q_{21}$)($Q_{22}$)($Q_{23}$); and —Si($Q_{31}$)($Q_{32}$)($Q_{33}$).

$Q_1$ to $Q_3$, $Q_{11}$ to $Q_{13}$, $Q_{21}$ to $Q_{23}$, and $Q_{31}$ to $Q_{33}$ may each independently be selected from, e.g., a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

In an implementation, $R_{13}$ to $R_{15}$ in Formulae 1-1, 1-2, 1A-1, and 1A-2 may each independently be selected from, e.g., a hydrogen, a deuterium, —F, —Cl, —Br, —I, a cyano group, a nitro group, a methyl group, an ethyl group, an n-propyl group, an iso-a propyl group, an n-butyl group, a sec-butyl group, an iso-butyl group, a tert-butyl group, an n-pentyl group, an n-hexyl group, an n-heptyl group, an n-octyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, and a dibenzocarbazolyl group.

In an implementation, $R_{13}$ to $R_{15}$ in Formulae 1-1, 1-2, 1A-1, and 1A-2 may each independently be selected from, e.g., a hydrogen, a deuterium, —F, —Cl, —Br, —I, a cyano group, a nitro group, a methyl group, an ethyl group, an n-propyl group, an iso-propyl group, an n-butyl group, a sec-butyl group, an iso-butyl group, a tert-butyl group, an n-pentyl group, an n-hexyl group, an n-heptyl group, an n-octyl group, a phenyl group, and a naphthyl group.

b13 in Formulae 1A-1 and 1A-2 indicates the number of $R_{13}$s, and may be selected from 1 and 2. When b13 is 2 or more, a plurality of $R_{13}$s may be identical or different.

In an implementation, the first material may be represented by, e.g., one of the following Formulae 1-11 to 1-14.

1-11

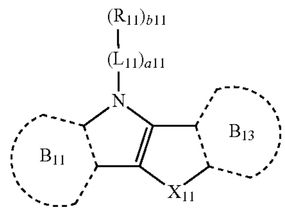

1-12

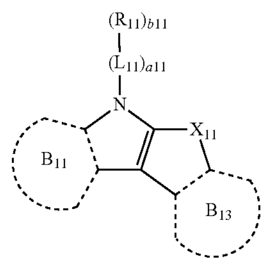

1-13

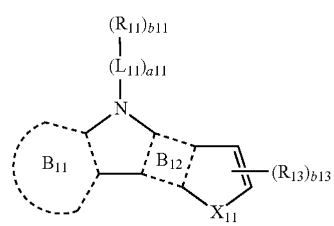

1-14

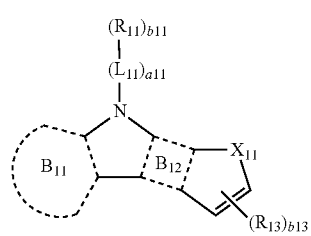

$B_{11}$ to $B_{13}$, $L_1$, a11, $R_{11}$, $R_{13}$, b11, b13, and $X_{11}$ in Formulae 1-11 to 1-14 may be the same as those already described above.

In an implementation, the first material may include, e.g., one of the following Compounds 101 to 174.

-continued
101
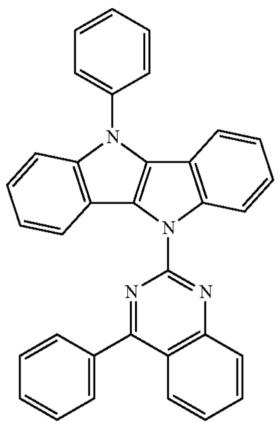
102
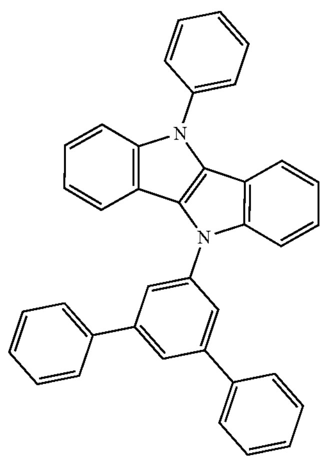
103
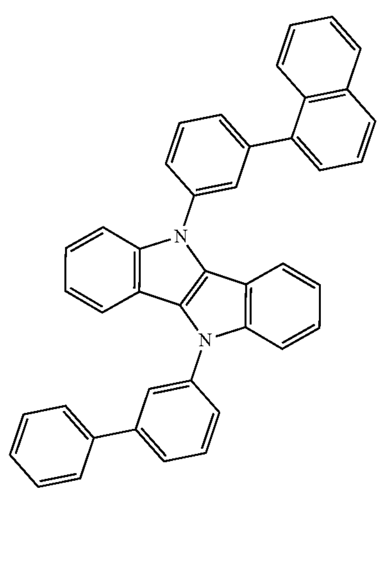
104
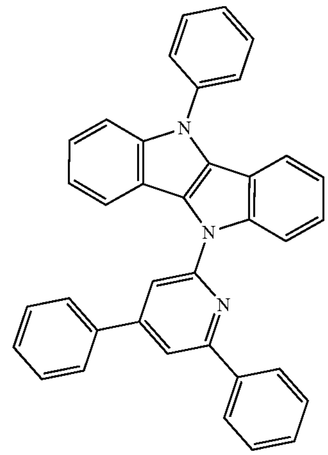
105
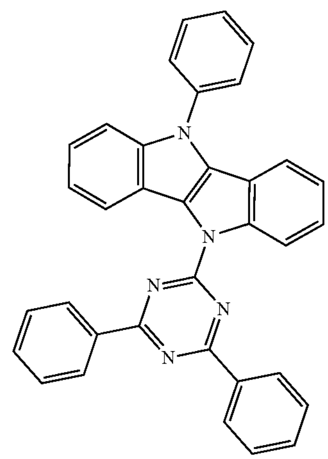
106
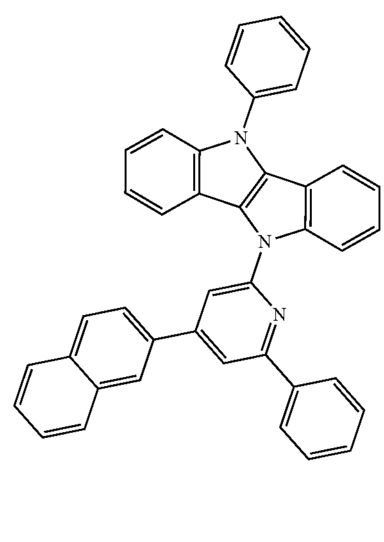

-continued
107
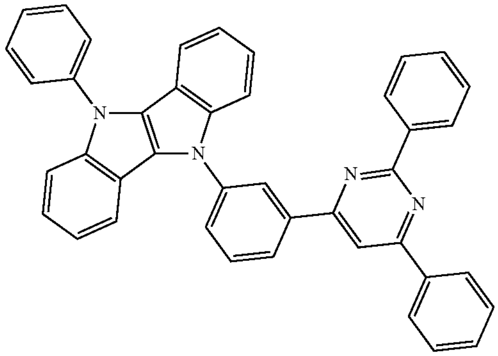
108
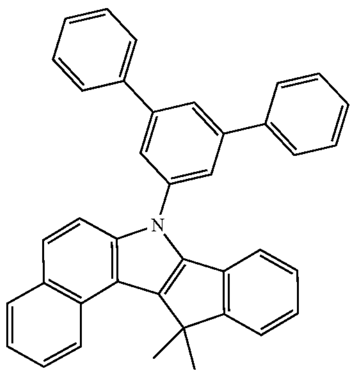
109
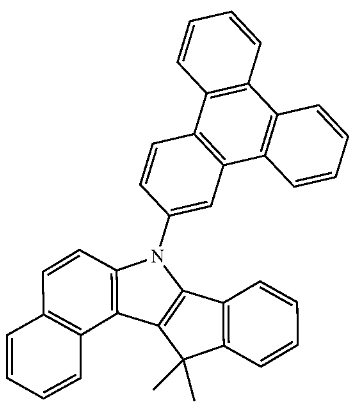
110
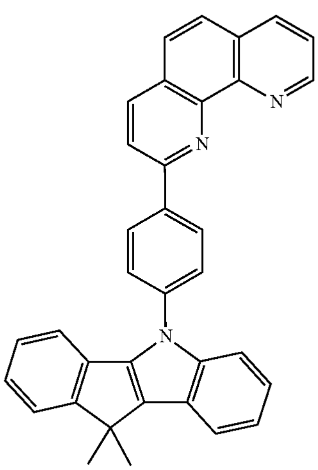
-continued
111
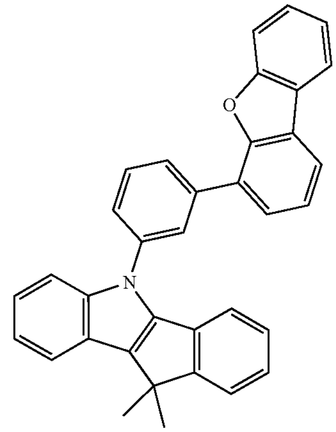
112
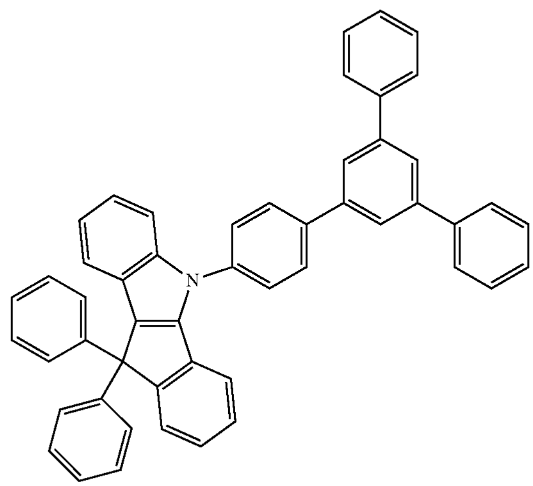
113
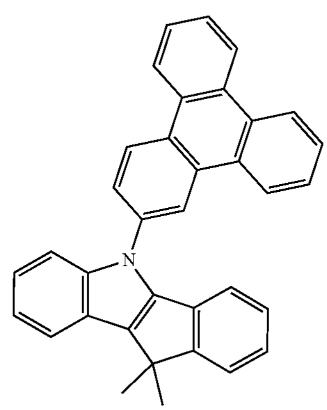

-continued
114
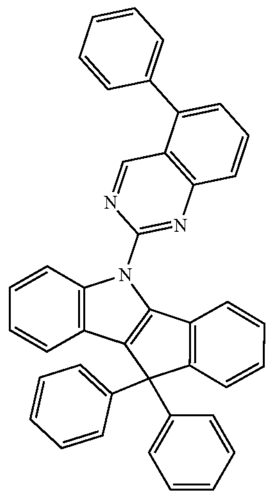
115
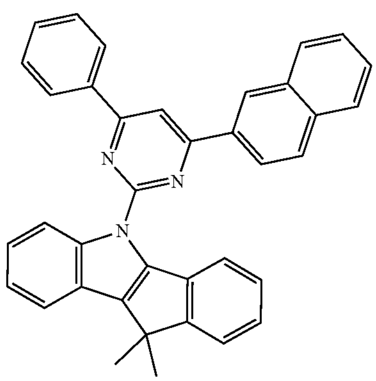
116
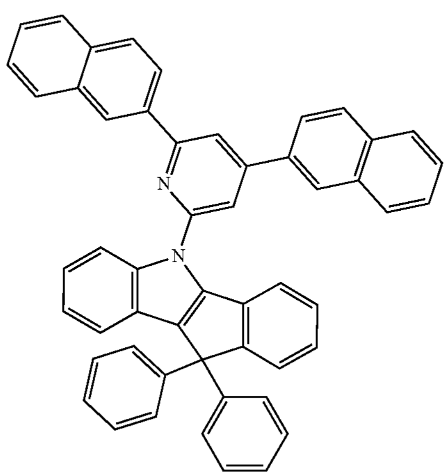
-continued
117
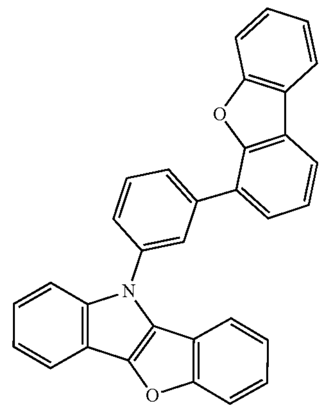
118
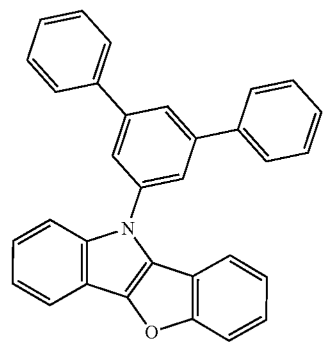
119
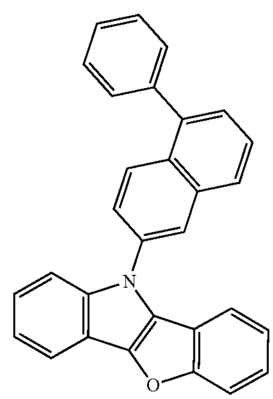
120
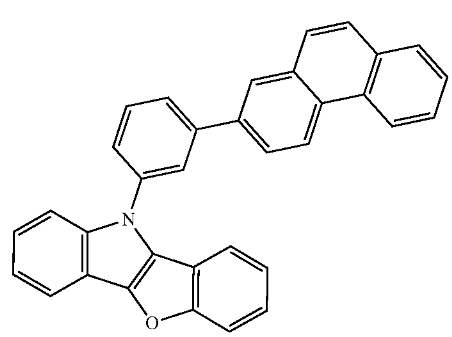

-continued
121
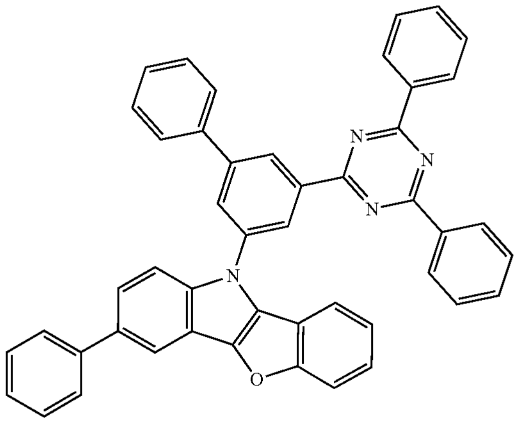
122
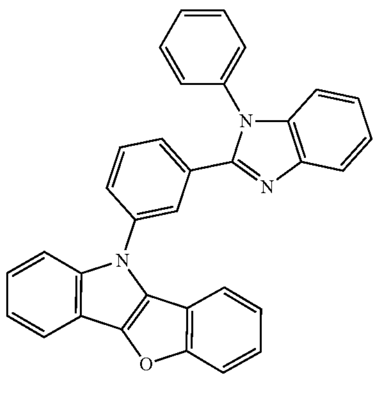
123
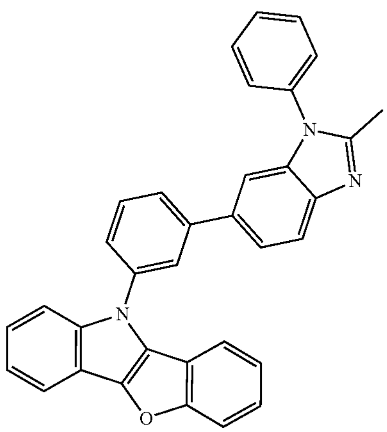
124
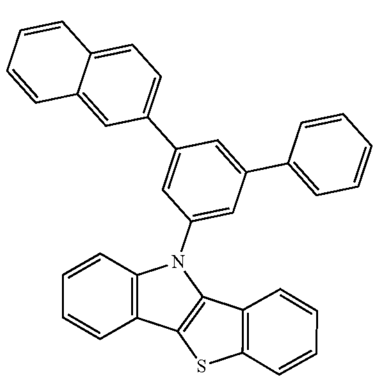
-continued
125
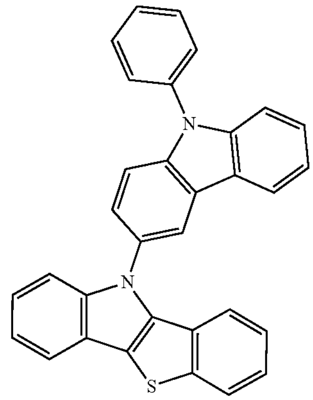
126
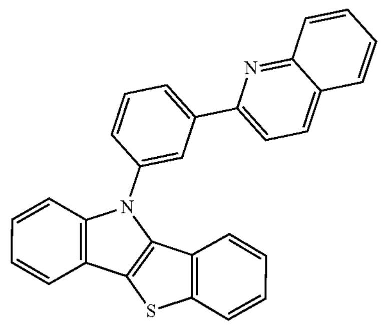
127
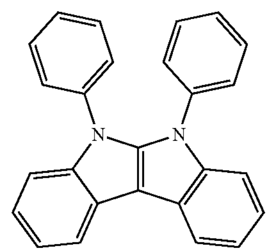
128
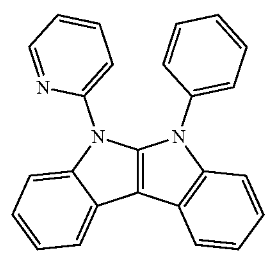
129
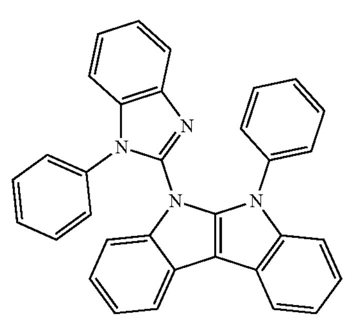

-continued
130
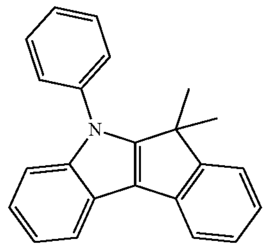
131
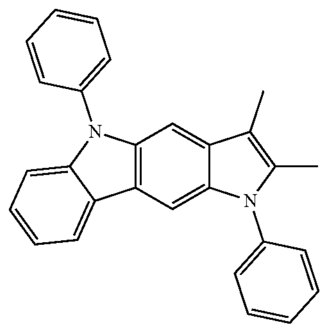
132
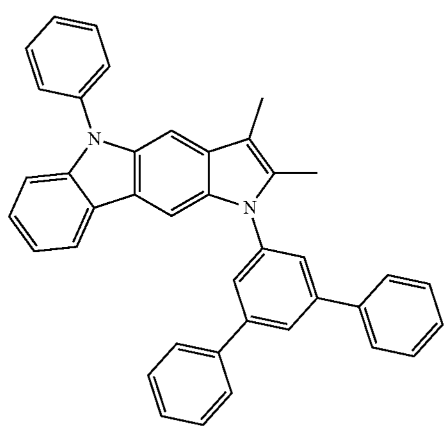
133
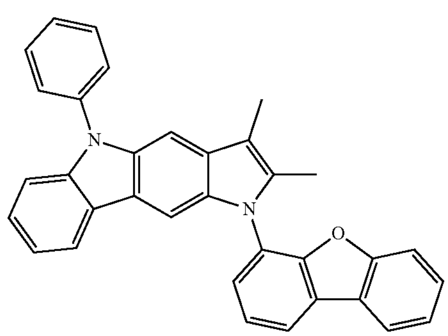
-continued
134
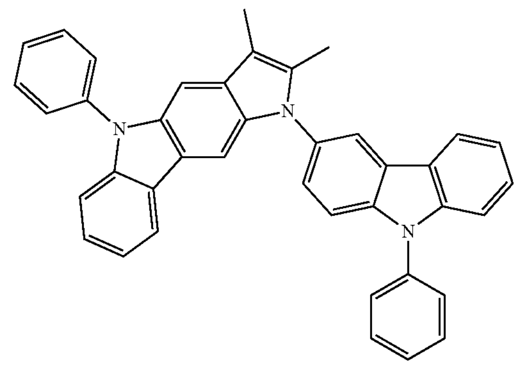
135
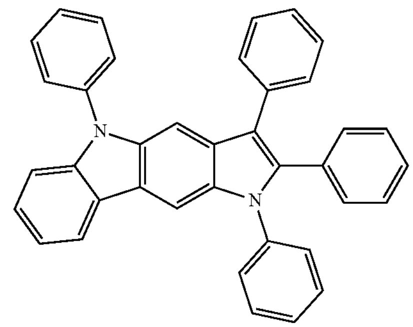
136
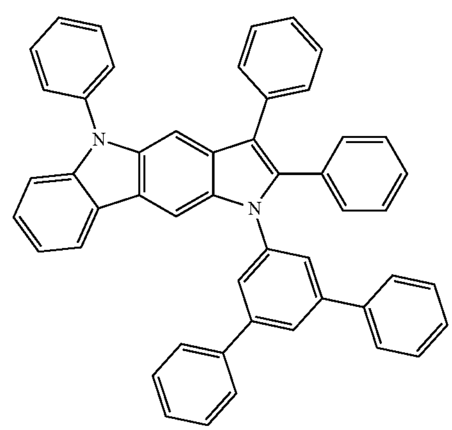
137
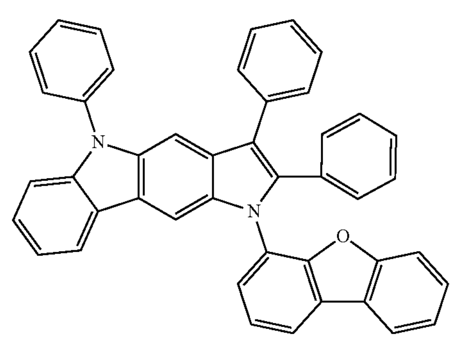

-continued
138
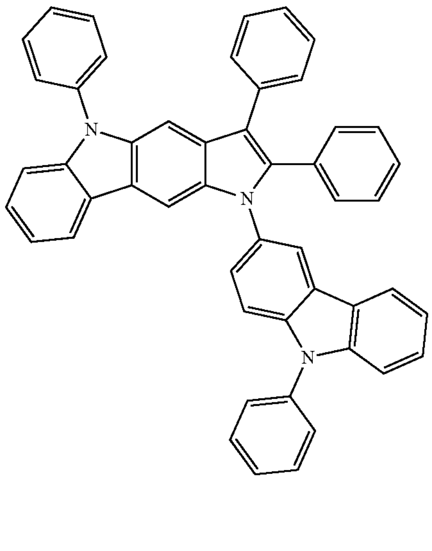
139
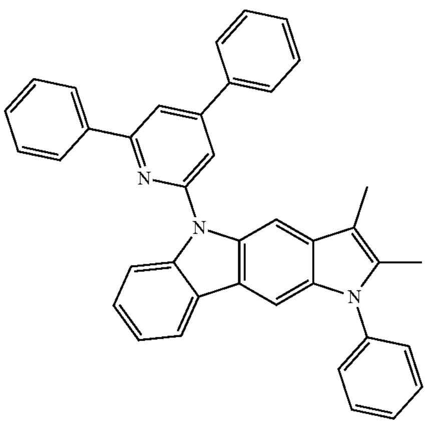
140
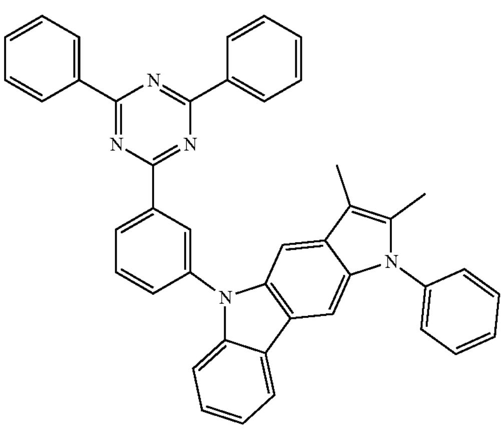
-continued
141
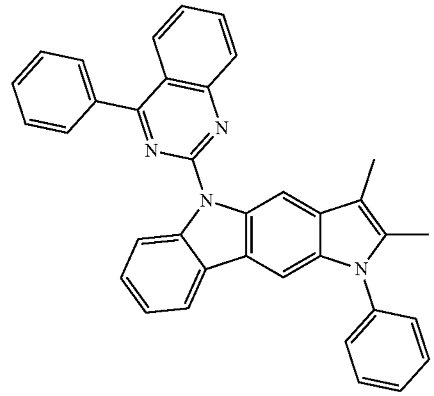
142
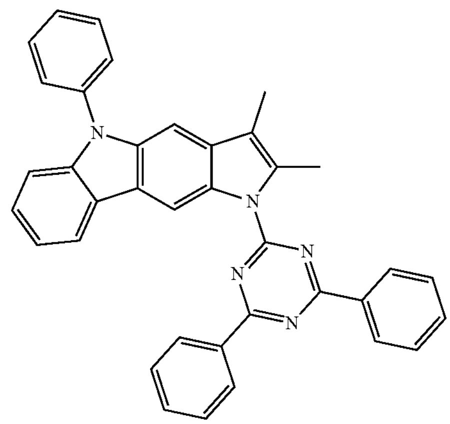
143
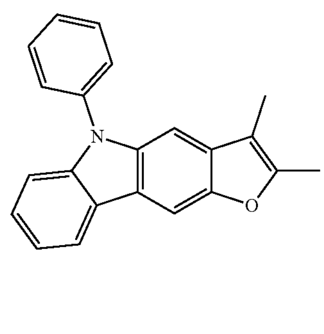
144
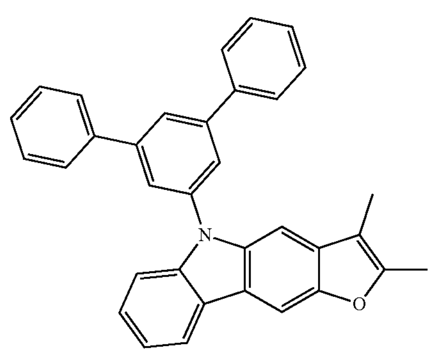

-continued
145
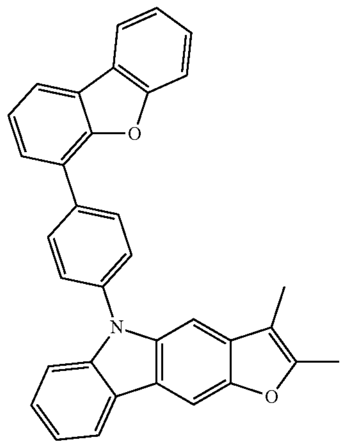
146
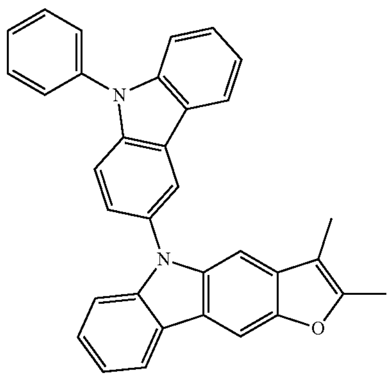
147
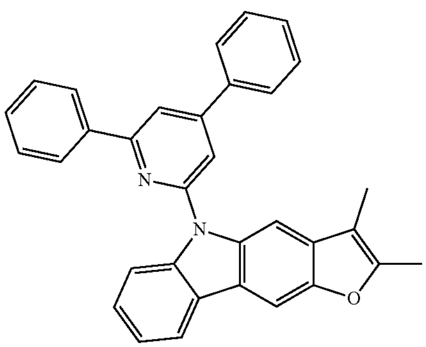
148
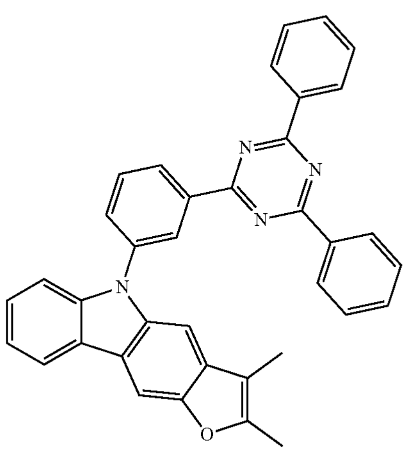
-continued
149
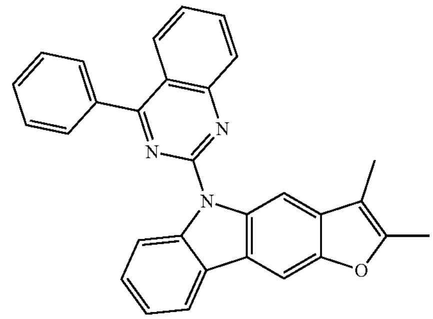
150
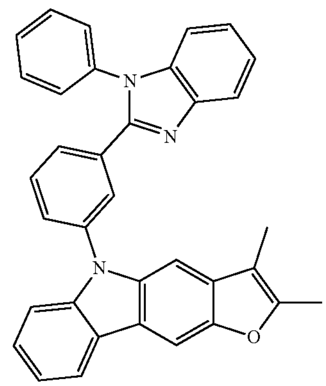
151
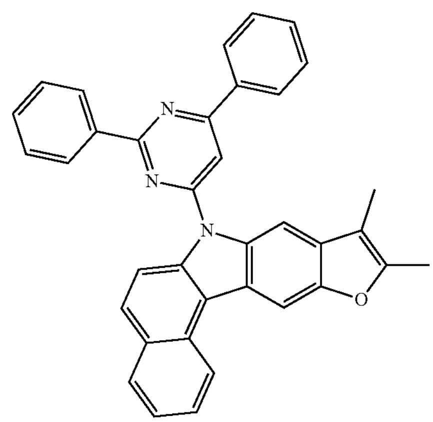
152
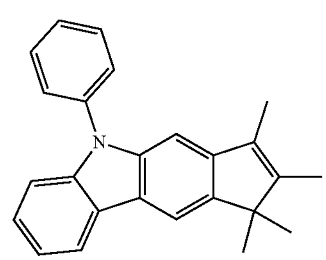

-continued
153
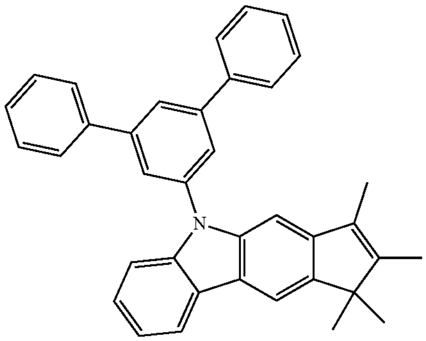
154
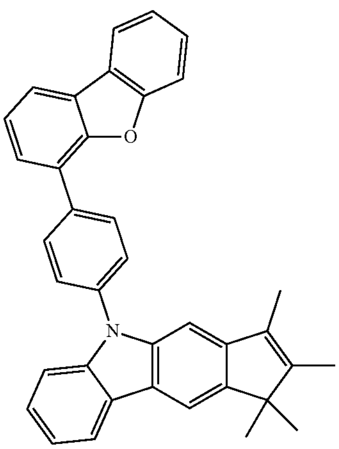
155
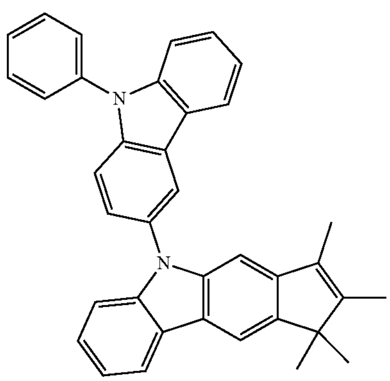
156
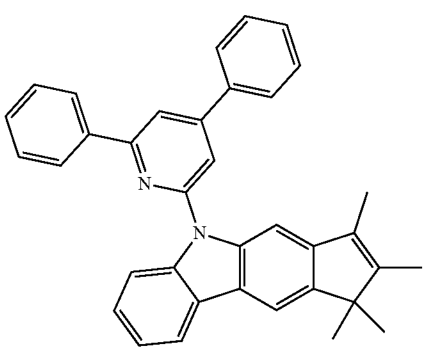
-continued
157
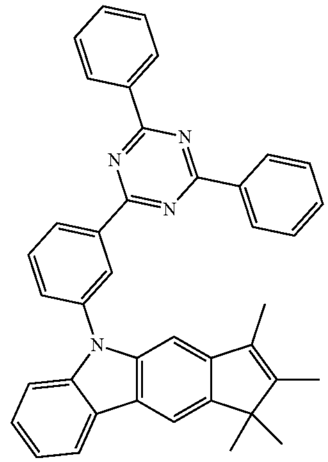
158
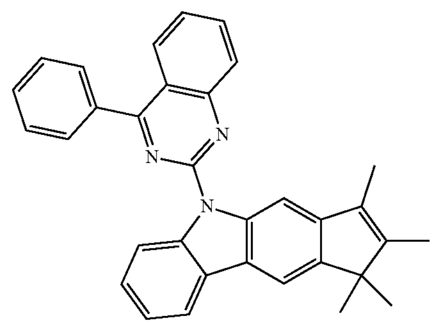
159
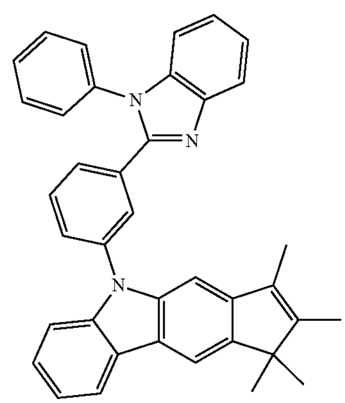
160
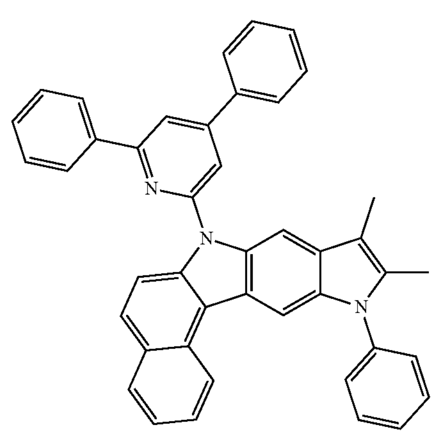

-continued
161
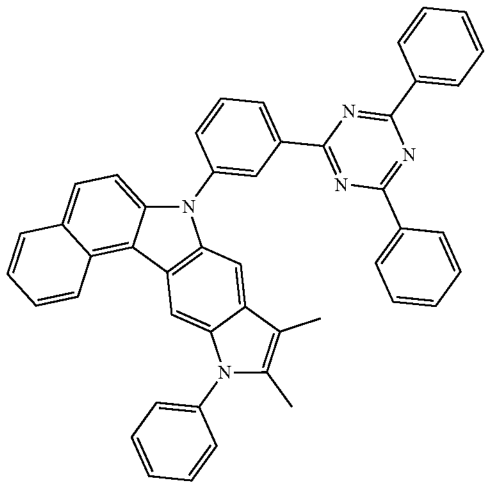
162
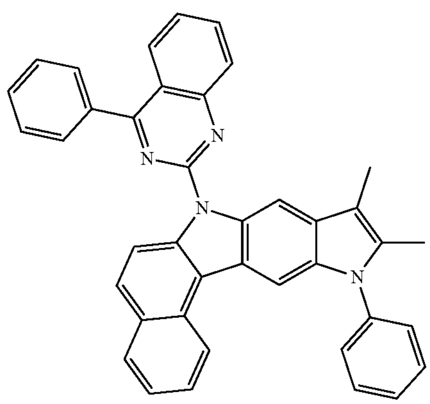
163
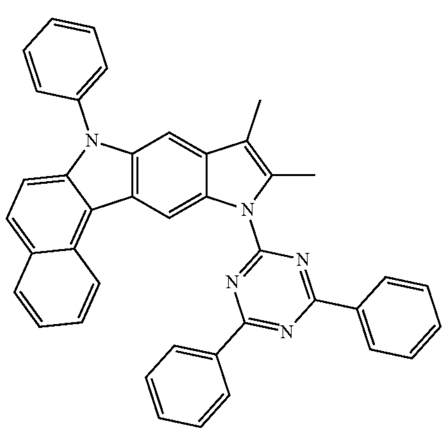
-continued
164
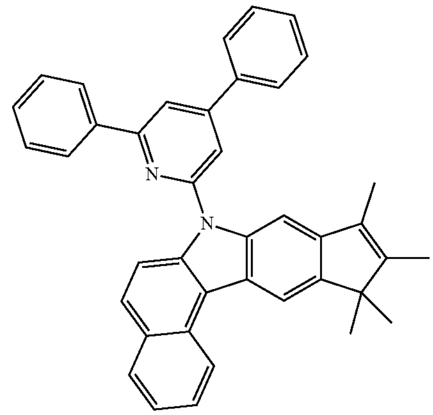
165
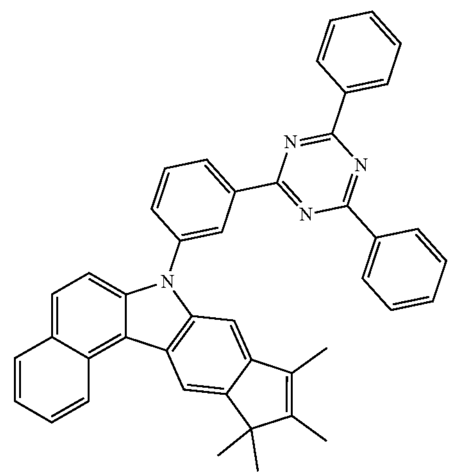
166
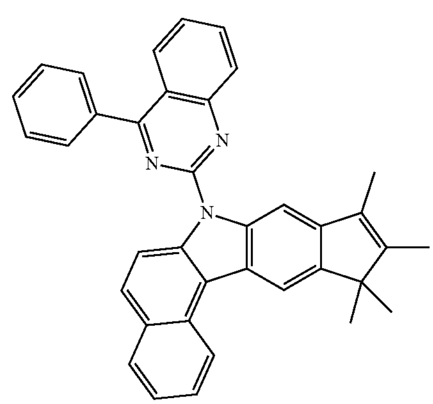

-continued

167

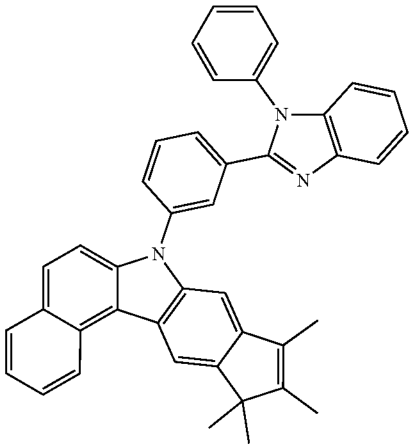

168

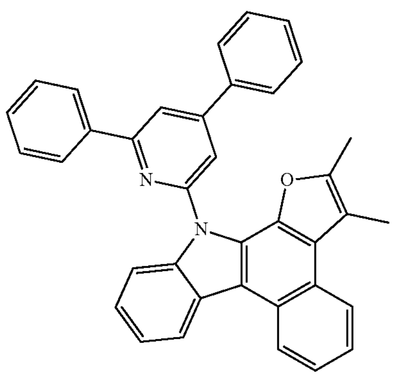

169

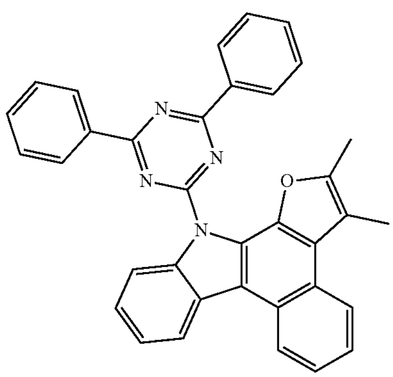

170

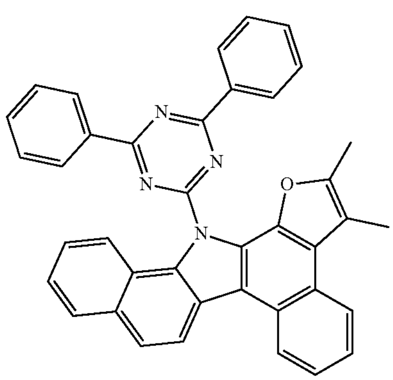

-continued

171

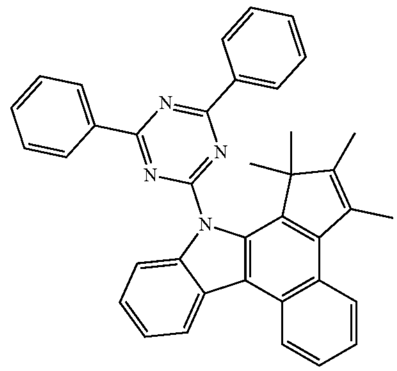

172

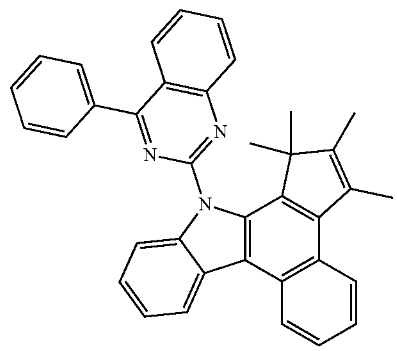

173

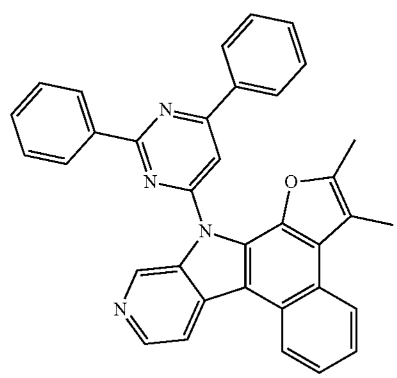

174

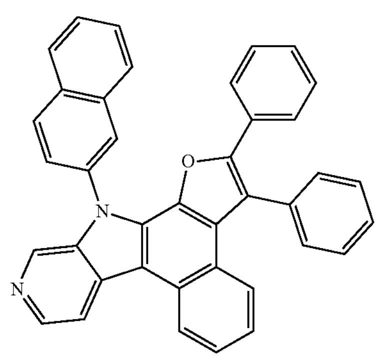

The first material may act as or be, e.g., a host. The emission layer may further include, in addition to the first material, a dopant.

The dopant may include at least one selected from the group of a fluorescent dopant and a phosphorescent dopant.

For example, the phosphorescent dopant may include an organometallic compound including one selected from iridium (Ir), platinum (Pt), osmium (Os), titanium (Ti), zirconium (Zr), hafnium (Hf), europium (Eu), terbium (Tb), thulium (Tm), rhodium (Rh), and copper (Cu).

In an implementation, the phosphorescent dopant may include an organometallic compound represented by Formula 401 below.

<Formula 401>

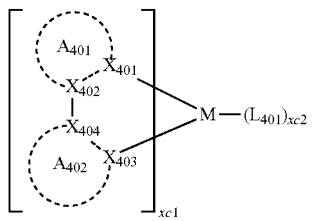

In Formula 401,

M may be selected from iridium (Ir), platinum (Pt), osmium (Os), titanium (Ti), zirconium (Zr), hafnium (Hf), europium (Eu), terbium (Tb), thulium (Tm), rhodium (Rh), and copper (Cu);

$X_{401}$ to $X_{404}$ may each independently be nitrogen or carbon;

rings $A_{401}$ and $A_{402}$ may each independently be selected from or include a substituted or unsubstituted benzene group, a substituted or unsubstituted naphthalene group, a substituted or unsubstituted fluorenene group, a substituted or unsubstituted spiro-fluorenene group, a substituted or unsubstituted indene group, a substituted or unsubstituted pyrrol group, a substituted or unsubstituted thiophene group, a substituted or unsubstituted furan group, a substituted or unsubstituted imidazole group, a substituted or unsubstituted pyrazole group, a substituted or unsubstituted thiazole group, a substituted or unsubstituted isothiazole group, a substituted or unsubstituted oxazole group, a substituted or unsubstituted isoxazole group, a substituted or unsubstituted pyridine group, a substituted or unsubstituted pyrazine group, a substituted or unsubstituted pyrimidine group, a substituted or unsubstituted pyridazine group, a substituted or unsubstituted quinoline group, a substituted or unsubstituted isoquinoline group, a substituted or unsubstituted benzoquinoline group, a substituted or unsubstituted quinoxaline group, a substituted or unsubstituted quinazoline group, a substituted or unsubstituted carbazol group, a substituted or unsubstituted benzoimidazole group, a substituted or unsubstituted benzofuran group, a substituted or unsubstituted benzothiophene group, a substituted or unsubstituted isobenzothiophene group, a substituted or unsubstituted benzoxazole group, a substituted or unsubstituted isobenzoxazole group, a substituted or unsubstituted triazole group, a substituted or unsubstituted oxadiazole group, a substituted or unsubstituted triazine group, a substituted or unsubstituted dibenzofuran group, and a substituted or unsubstituted dibenzothiophene group.

In an implementation, at least one substituent of the substituted benzene group, substituted naphthalene group, substituted fluorenene group, substituted spiro-fluorenene group, substituted indene group, substituted pyrrol group, substituted thiophene group, substituted furan group, substituted imidazole group, substituted pyrazole group, substituted thiazole group, substituted isothiazole group, substituted oxazole group, substituted isoxazole group, substituted pyridine group, substituted pyrazine group, substituted pyrimidine group, substituted pyridazine group, substituted quinoline group, substituted isoquinoline group, substituted benzoquinoline group, substituted quinoxaline group, substituted quinazoline group, substituted carbazol group, substituted benzoimidazole group, substituted benzofuran group, substituted benzothiophene group, substituted isobenzothiophene group, substituted benzoxazole group, substituted isobenzoxazole group, substituted triazole group, substituted oxadiazole group, substituted triazine group, substituted dibenzofuran group, and substituted dibenzothiophene group may be selected from:

a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof a $C_1$-$C_{60}$ alkyl group, a $C_2$-$C_{60}$ alkenyl group, a $C_2$-$C_{60}$ alkynyl group, and a $C_1$-$C_{60}$ alkoxy group:

a $C_1$-$C_{60}$ alkyl group, a $C_2$-$C_{60}$ alkenyl group, a $C_2$-$C_{60}$ alkynyl group, and a $C_1$-$C_6$ alkoxy group, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic condensed heteropolycyclic group, —$N(Q_{401})(Q_{402})$, —$Si(Q_{403})(Q_{404})(Q_{405})$, and —$B(Q_{406})(Q_{407})$;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, and a monovalent non-aromatic condensed heteropolycyclic group, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{60}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic condensed heteropolycyclic group, –$N(Q_{411})(Q_{412})$, —$Si(Q_{413})(Q_{414})(Q_{415})$, and —$B(Q_{416})(Q_{417})$; and —$N(Q_{421})(Q_{422})$, —$Si(Q_{423})(Q_{424})(Q_{425})$, and —$B(Q_{426})(Q_{427})$, $L_{401}$ may be an organic ligand;

xc1 is 1, 2, or 3; and xc2 is 0, 1, 2, or 3.

$L_{401}$ may be a monovalent, divalent, or trivalent organic ligand. For example, $L_{401}$ may be selected from a halogen ligand (for example, Cl or F), a diketone ligand (for example, acetylacetonate, 1,3-diphenyl-1,3-propandionate, 2,2,6,6-tetramethyl-3,5-heptandionate, or hexafluoroacetonate), a carboxylic acid ligand (for example, picolinate, dimethyl-3-pyrazolecarboxylate, or benzoate), a carbon monooxide ligand, an isonitrile ligand, a cyano ligand, and a phosphorous ligand (for example, phosphine and phosphate).

When $A_{401}$ in Formula 401 has two or more substituents, the substituents of $A_{401}$ may bind to each other to form a saturated or unsaturated ring.

When $A_{402}$ in Formula 401 has two or more substituents, the substituents of $A_{402}$ may bind to each other to form a saturated or unsaturated ring.

When xc1 in Formula 401 is two or more, a plurality of ligands

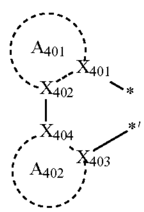

in Formula 401 may be identical or different. When xc1 in Formula 401 is two or more. $A_{401}$ and $A_{402}$ may be respectively directly connected to $A_{401}$ and $A_{402}$ of other neighboring ligands with or without a linker (for example, a $C_1$-$C_5$ alkylene or —N(R')— (wherein R' may be a $C_1$-$C_{10}$ alkyl group or a $C_6$-$C_{20}$ aryl group) or —C(=O)—) therebetween.

The phosphorescent dopant may include at least one selected from the group of Compounds PD1 to PD74 and $Ir(pq)_2acac$ (herein, Compound PD1 is $Ir(ppy)_3$, Compound PD2 is FIrPic, and PD17 is $Ir(pq)_2acac$).

PD1

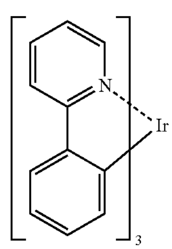

PD2

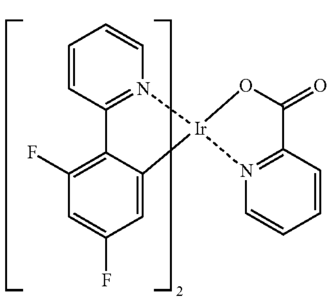

-continued

PD3

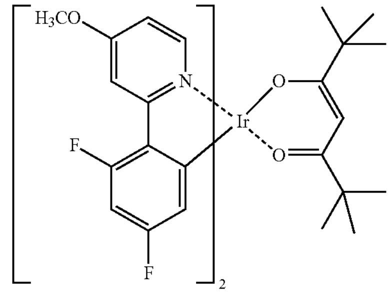

PD4

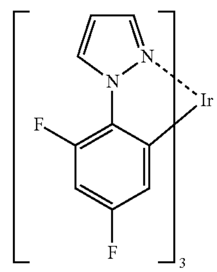

PD5

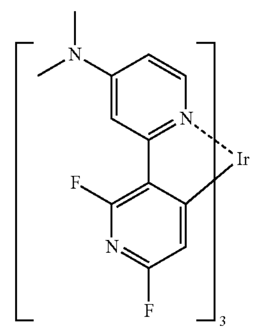

PD6

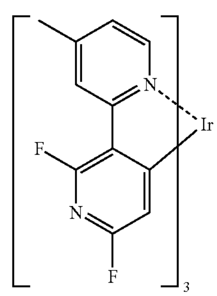

PD7

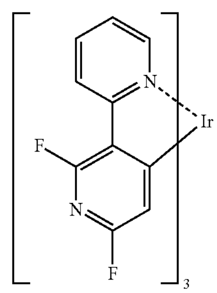

PD8
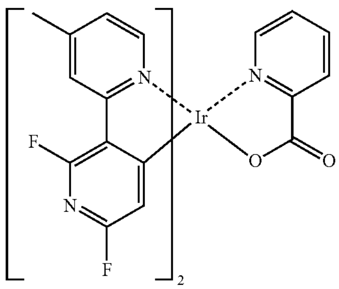
PD9
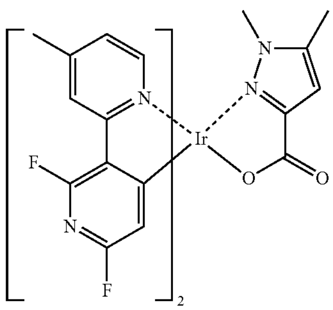
PD10
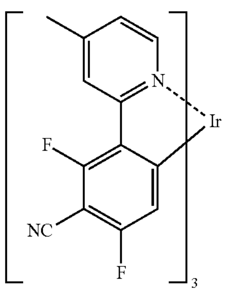
PD11
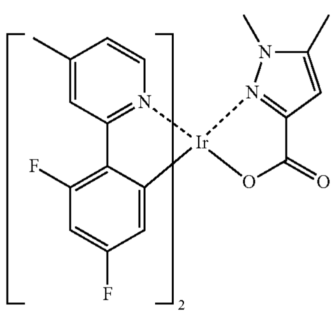
PD12
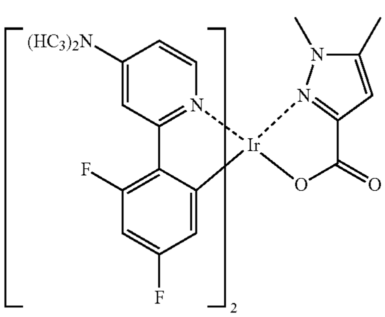
PD13
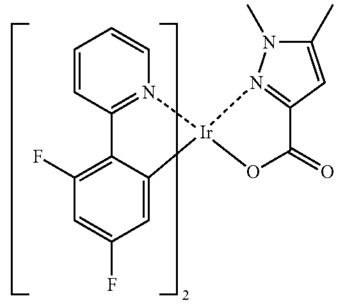
PD14
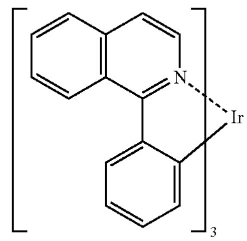
PD15
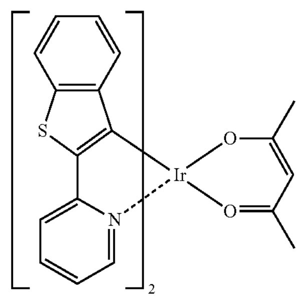
PD16
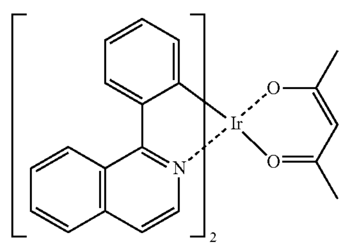
PD17
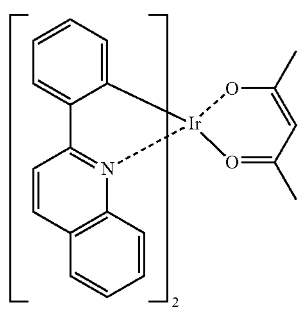

-continued
PD18
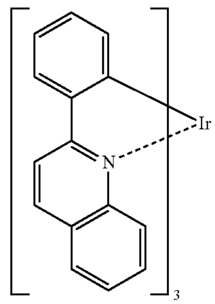
PD19
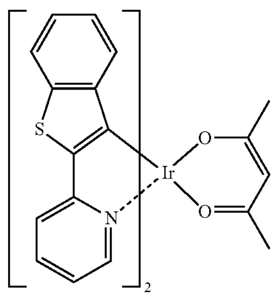
PD20
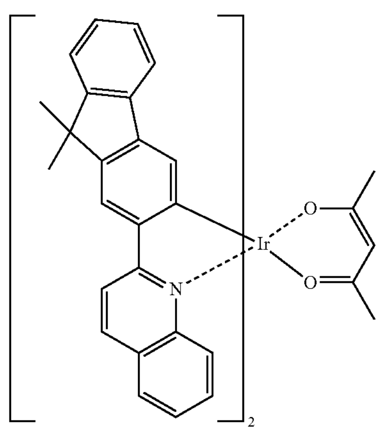
PD21
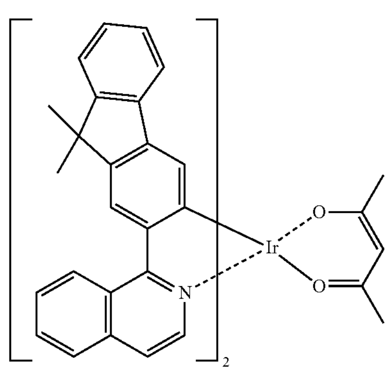
PD22
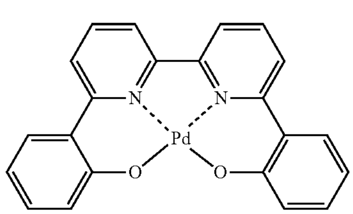
-continued
PD23
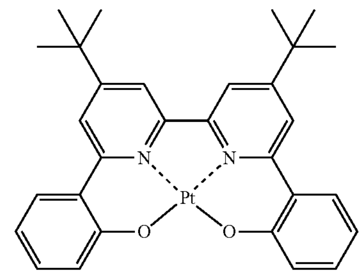
PD24
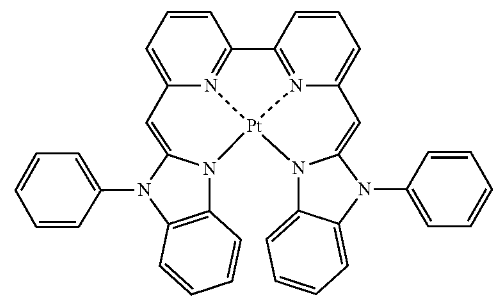
PD25
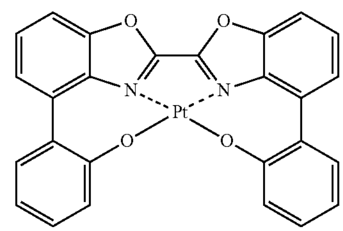
PD26
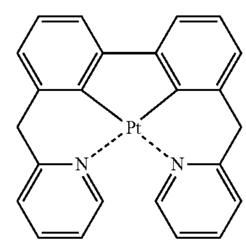
PD27
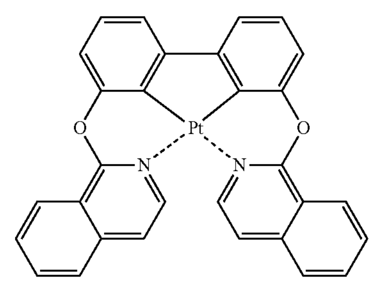
PD28
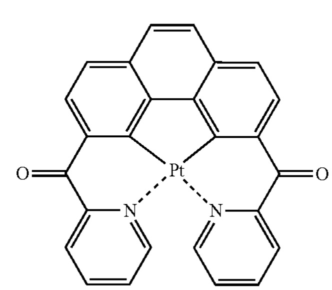

PD29
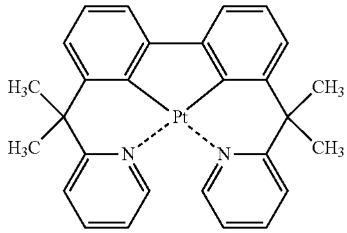
PD30
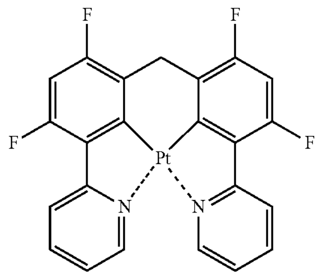
PD31
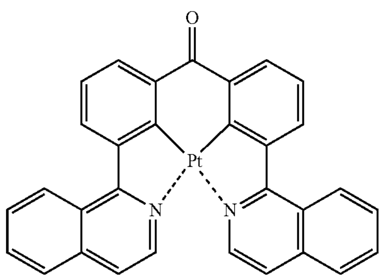
PD32
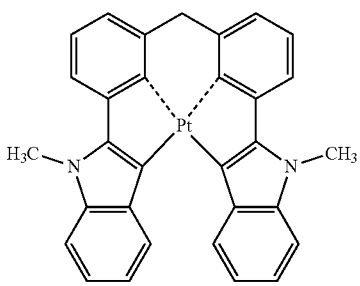
PD33
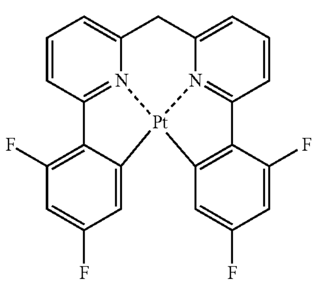
PD34
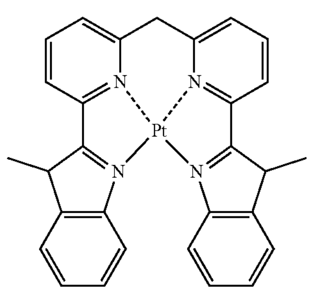
PD35
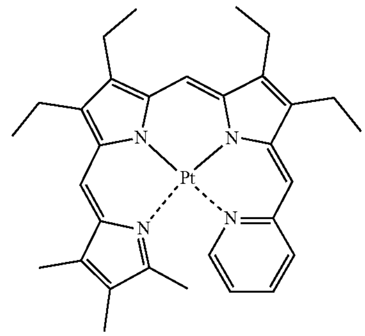
PD36
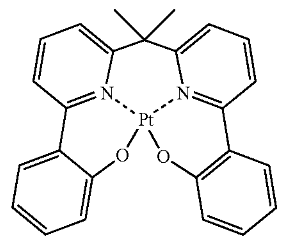
PD37
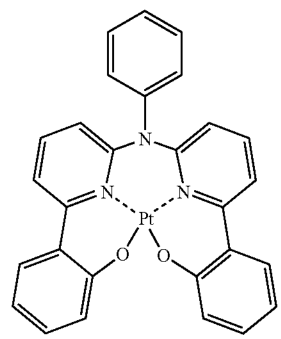
PD38
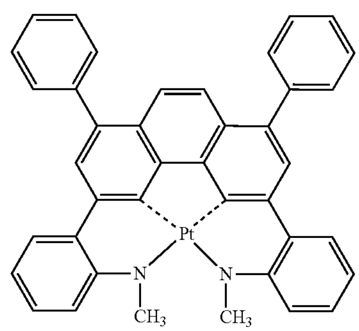
PD39
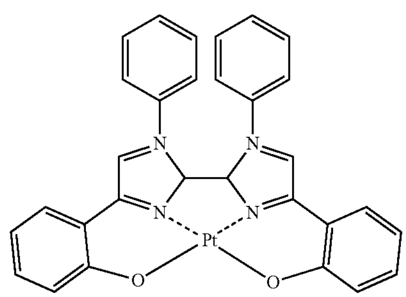

PD40
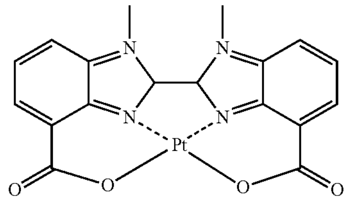
PD41
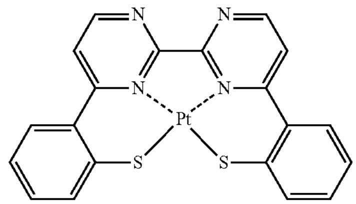
PD42
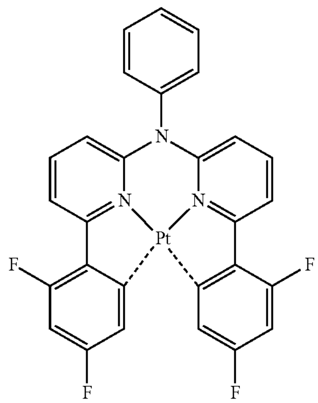
PD43
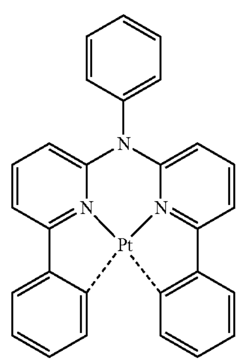
PD44
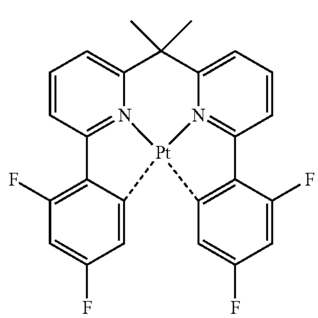
PD45
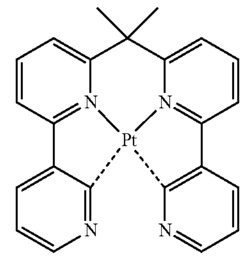
PD46
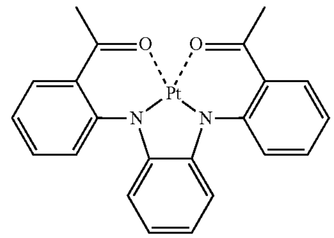
PD47
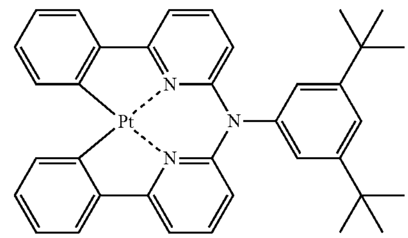
PD48
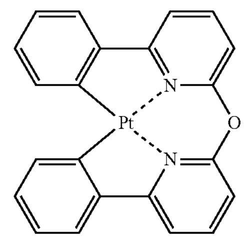
PD49
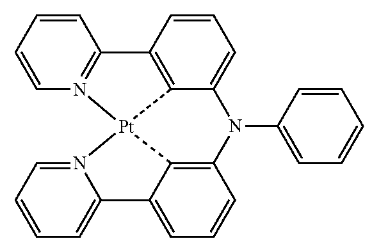
PD50
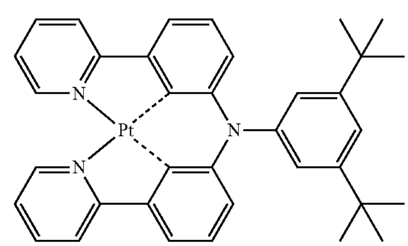

PD51
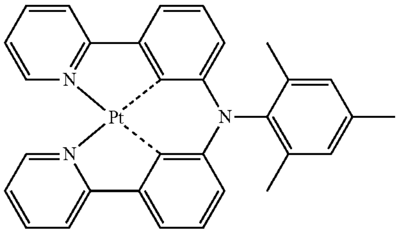
PD52
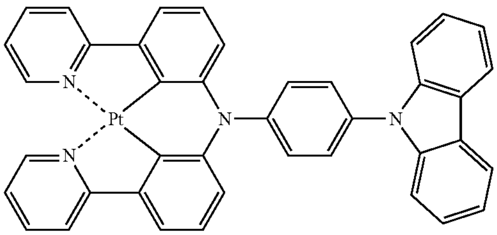
PD53
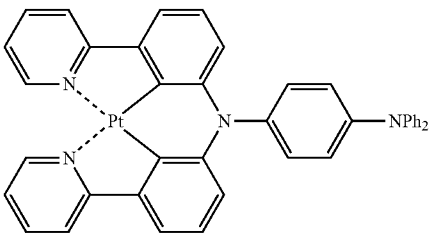
PD54
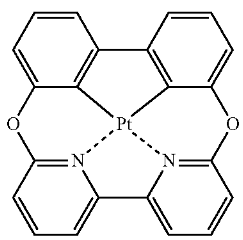
PD55
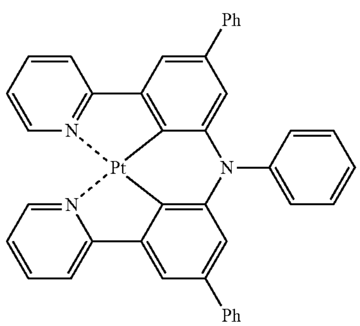
PD56
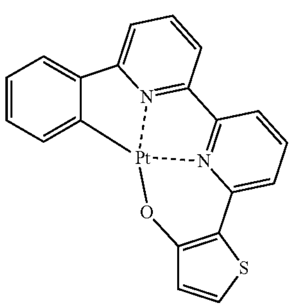
PD57
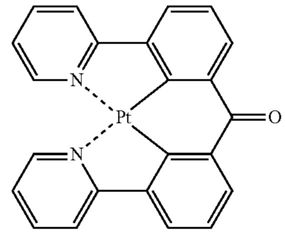
PD58
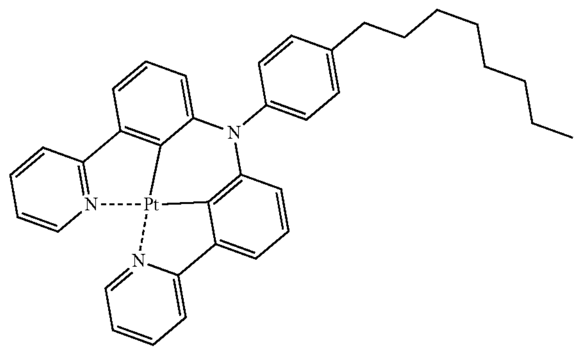
PD59
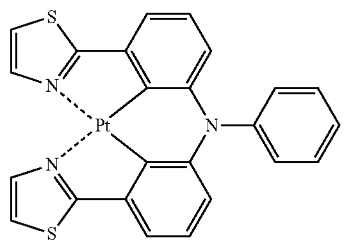
PD60
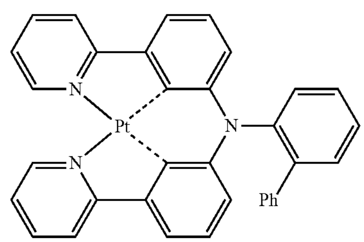
PD61
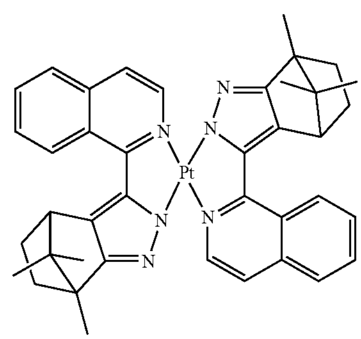

PD62
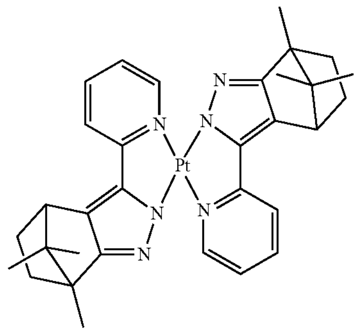
PD63
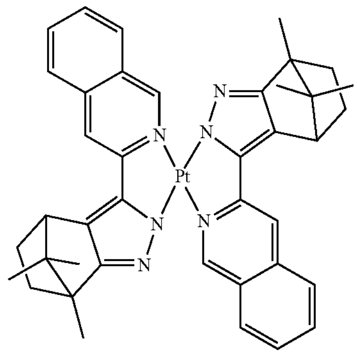
PD64
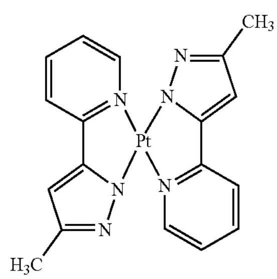
PD65
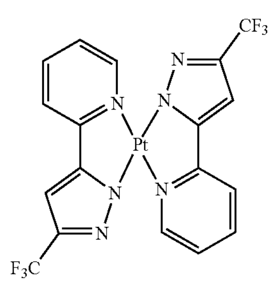
PD66
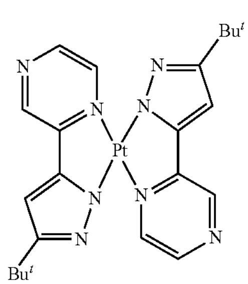
PD67
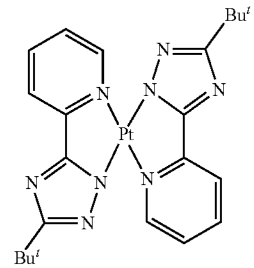
PD68
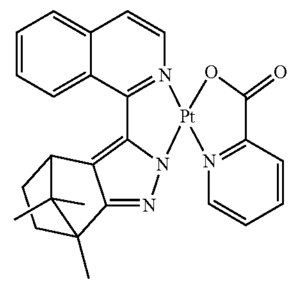
PD69
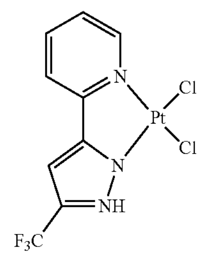
PD70
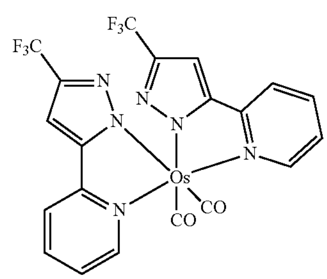
PD71
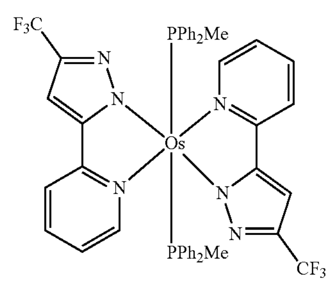

-continued
PD72
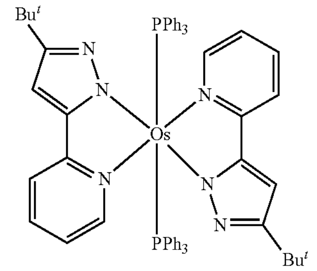
PD73
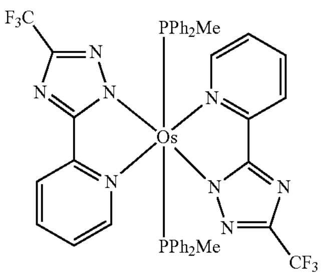
PD74
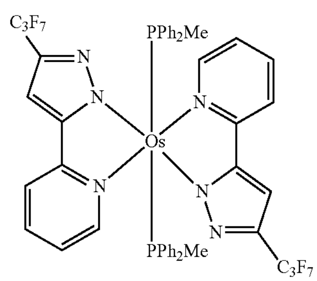
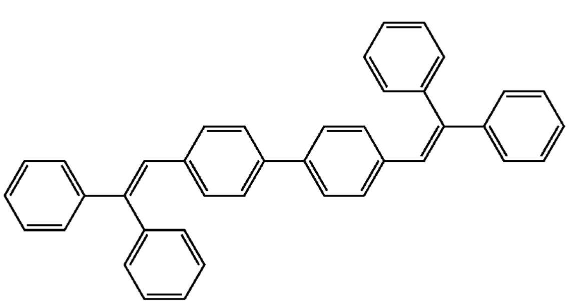
DPVBi
-continued
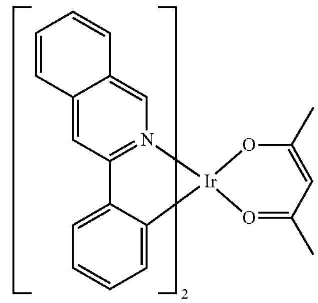
Ir(pq)$_2$acac
In an implementation, the phosphorescent dopant may include PtOEP.
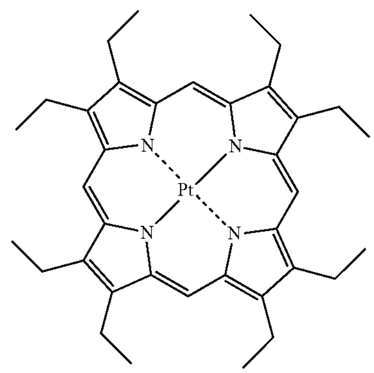
PtOEP
In an implementation, the fluorescent dopant may include at least one selected from the group of DPAVBi, BDAVBi, TBPe, DCM, DCJTB, Coumarin 6, and C545T.

-continued

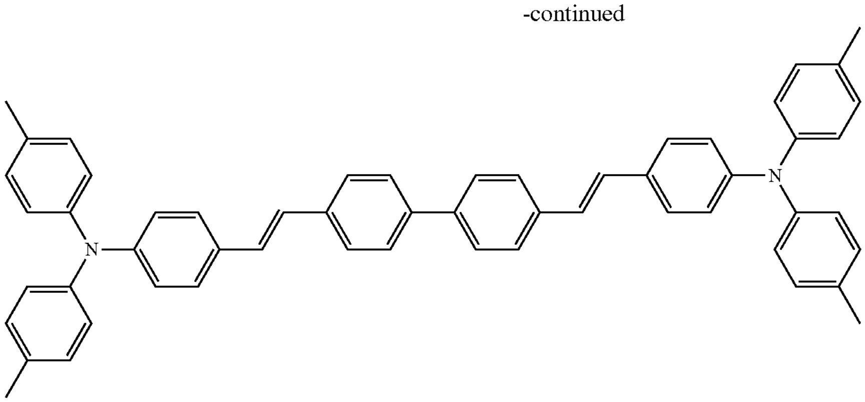

DPAVBi

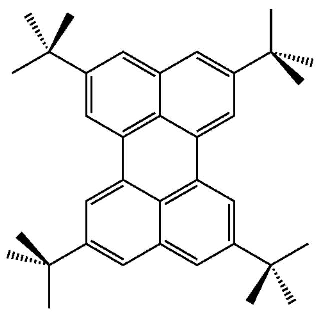

TBPe

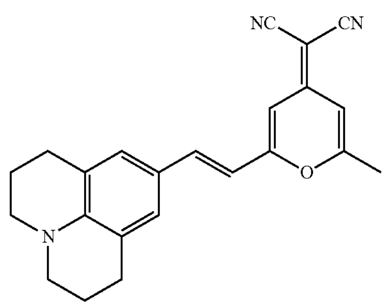

DCM

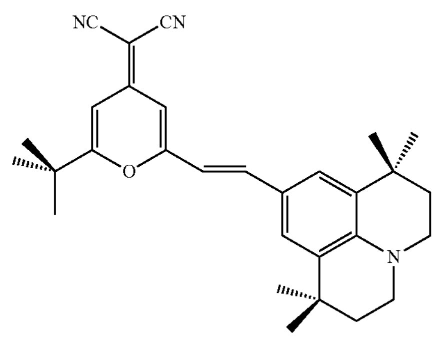

DCJTB

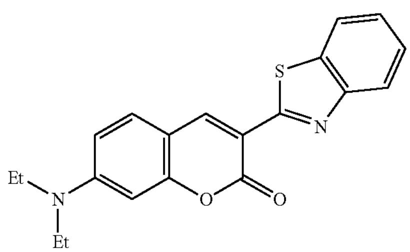

Coumarin 6

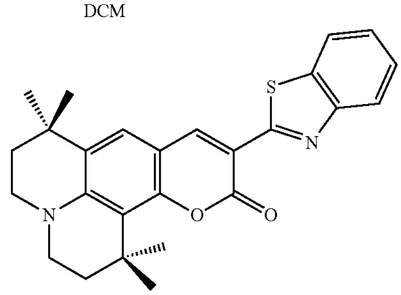

C545T

In an implementation, the fluorescent dopant may include a compound represented by Formula 501 below.

<Formula 501>

$$Ar_{501}-\left[(L_{503})_{xd3}-N\begin{matrix}(L_{501})_{xd1}-R_{501}\\(L_{502})_{xd2}-R_{502}\end{matrix}\right]_{xd4}$$

In Formula 501.

$Ar_{501}$ may be selected from:

a naphthalene, a heptalene, a fluorenene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene; and a naphthalene, a heptalene, a fluorenene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from the group of a deuterium, —F, —Cl, —Br, —I, a hydroxyl, a cyano, a nitro, an amino, an amidino, a hydrazine, a hydrazone, a carboxylic acid and a salt thereof, a sulfonic acid and a salt thereof, a phosphoric acid and a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, and —Si($Q_{501}$)($Q_{502}$)($Q_{503}$) ($Q_{501}$ to $Q_{503}$ may be each independently selected from a hydrogen, a $C_1$-$C_{60}$ alkyl group, a $C_2$-$C_{60}$ alkenyl group, a $C_6$-$C_{60}$ aryl group, and a $C_1$-$C_{60}$ heteroaryl group);

Descriptions of $L_{501}$ to $L_{503}$ may be the same as the descriptions provided herein in connection with $L_{201}$;

$R_{501}$ and $R_{502}$ may each independently be selected from a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, a triazinyl group, a dibenzofuranyl group, and a dibenzothiophenyl group; and a phenyl, a naphthyl, a fluorenyl, a spiro-fluorenyl, a benzofluorenyl, a dibenzofluorenyl, a pyridinyl, a pyrazinyl, a pyrimidinyl, a pyridazinyl, a quinolinyl, an isoquinolinyl, a quinoxalinyl, a quinazolinyl, a carbazolyl, and a triazinyl, each substituted with at least one selected from the group of a deuterium, a halogen atom, a hydroxyl, a cyano, a nitro, an amino, an amidino, a hydrazine, a hydrazone, a carboxylic acid or a salt thereof, a sulfonic acid or a salt thereof, a phosphoric acid or a salt thereof, a $C_1$-$C_{20}$ alkyl, a $C_1$-$C_{20}$ alkoxy, a phenyl, a naphthyl, a fluorenyl, a spiro-fluorenyl, a benzofluorenyl, a dibenzofluorenyl, a phenanthrenyl, an anthracenyl, a pyrenyl, a chrysenyl, a pyridinyl, a pyrazinyl, a pyrimidinyl, a pyridazinyl, a quinolinyl, an isoquinolinyl, a quinoxalinyl, a quinazolinyl, a carbazolyl, a triazinyl, a dibenzofuranyl, and a dibenzothiophenyl; and xd1 to xd3 may be each independently selected from 0, 1, 2, and 3; and xd4 may be selected from 1, 2, 3, and 4.

In an implementation, the fluorescent dopant may include at least one of Compounds FD1 to FD8:

FD1

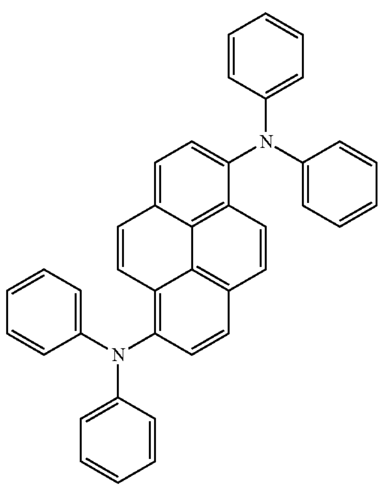

FD2

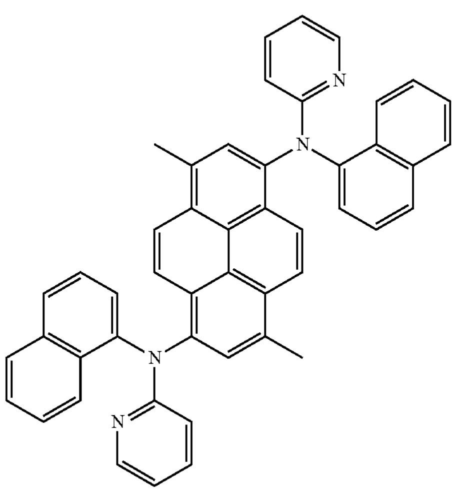

-continued

FD3

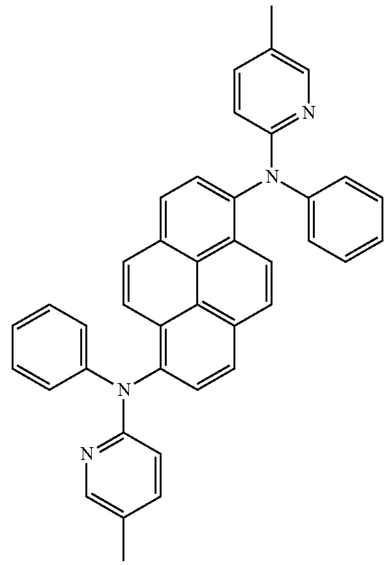

FD4

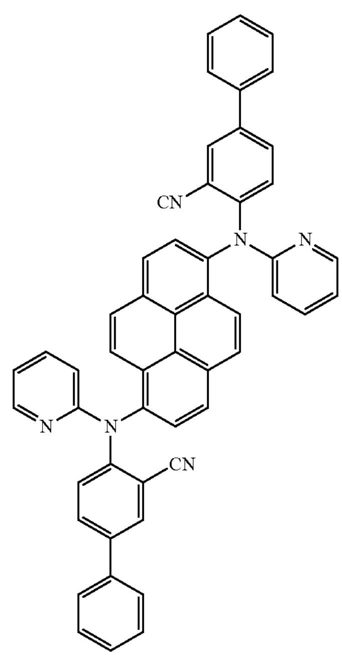

-continued

FD5

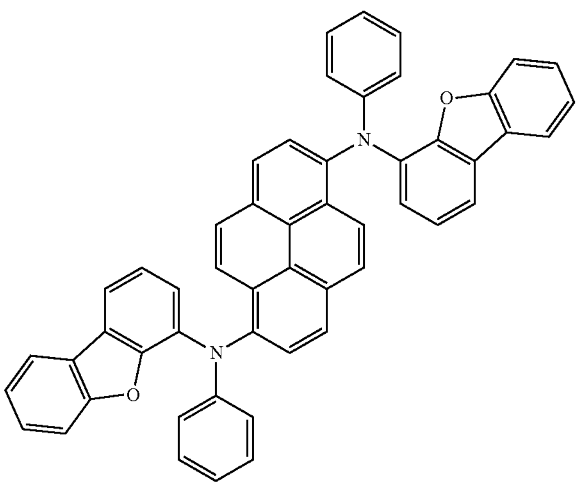

FD6

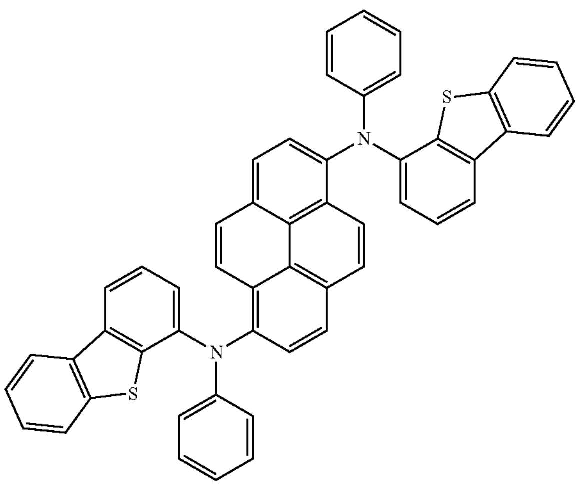

FD7

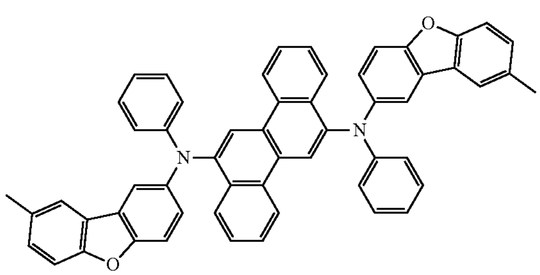

FD8

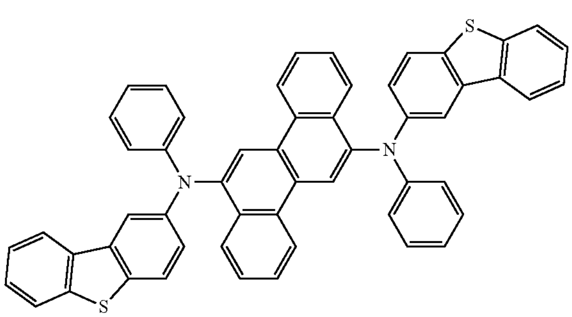

The amount of the dopant in the emission layer may be, e.g., about 0.01 to about 15 parts by weight, based on 100 parts by weight of the host.

A thickness of the emission layer may be about 100 Å to about 1,000 Å, e.g., about 200 Å to about 600 Å. When the thickness of the emission layer is within this range, excellent light-emission characteristics may be obtained without a substantial increase in driving voltage.

The electron transport region may include at least one selected from the group of a hole blocking layer, a first electron transport layer, a second electron transport layer, and an electron injection layer.

The electron transport region may have a single-layered structure formed of a single material, a single-layered structure formed of a plurality of different materials, or a multi-layered structure having a plurality of layers formed of a plurality of different materials.

For example, the electron transport region may have a structure of first electron transport layer/electron injection layer, a structure of first electron transport layer/second electron transport layer/electron injection layer, or a structure of hole blocking layer/first electron transport layer/electron injection layer, wherein layers of each structure are sequentially stacked from the emission layer in this stated order.

In an implementation, the electron transport region may include, e.g., a second material or compound represented by one of the following Formulae 2-1 and 2-2.

<Formula 2-1>

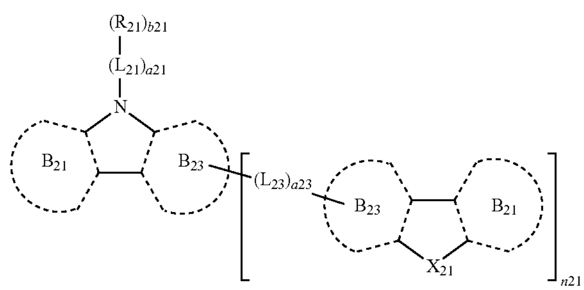

<Formula 2-2>

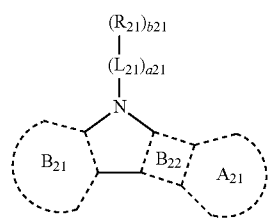

$A_{21}$ in Formulae 2-1 and 2-2 may be or may include, e.g., a group or moiety represented by one of the following Formula 2A-1 and 2A-2.

<Formula 2A-1>

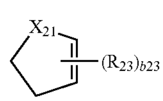

<Formula 2A-2>

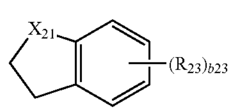

$X_{21}$, $R_{23}$, and b23 in Formulae 2A-1 and 2A-2 will be explained in detail below.

In an implementation, $A_{21}$ in Formulae 2-1 and 2-2 may be or may include, e.g., a group or moiety represented by one of the following Formulae 2A-11 and 2A-12.

2A-11

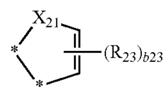

2A-12

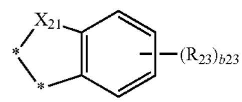

In Formulae 2A-11 and 2A-12, * indicates a carbon atom in Formulae 2-1 and 2-2.

$B_{21}$ to $B_{23}$ in Formulae 2-1 and 2-2 may be understood by referring to the description of $B_{11}$.

$X_{21}$ in Formulae 2-1 and 2-2 may be selected from, e.g., N-[$(L_{22})_{a22}$-$(R_{22})_{b22}$], an oxygen atom (O), a sulfur atom (S), and $C(R_{24})(R_{25})$.

$L_{21}$ to $L_{23}$ in Formulae 2-1, 2-2, 2A-1, and 2A-2 may be understood by referring to the description of $L_{11}$.

a21 to a23 in Formulae 2-1, 2-2, 2A-1, and 2A-2 may be understood by referring to the description of a11.

$R_{21}$ and $R_{22}$ in Formulae 2-1, 2-2, 2A-1, and 2A-2 may be understood by referring to the description of $R_{11}$.

b21 and b22 in Formulae 2-1, 2-2, 2A-1, and 2A-2 may be understood by referring to the description of b11.

$R_{23}$ to $R_{25}$ in Formulae 2-1, 2-2, 2A-1, and 2A-2 may be understood by referring to the description of $R_{13}$.

b23 in Formulae 2-1, 2-2, 2A-1, and 2A-2 may be understood by referring to the description of b13.

In an implementation, n21 in Formula 2-1 may be selected from 1, 2, and 3. For example, n21 in Formula 2-1 may be 1.

In an implementation, the second material may be represented by one of the following Formulae 2-11 to 2-15.

2-11

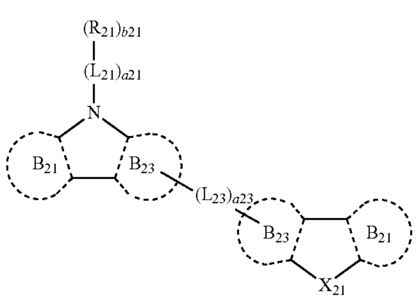

2-12

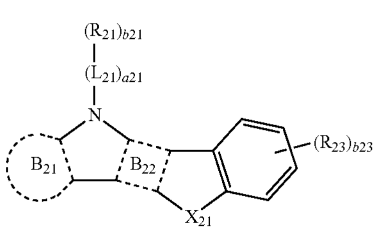

-continued 2-13

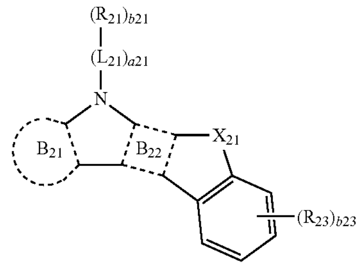

2-14

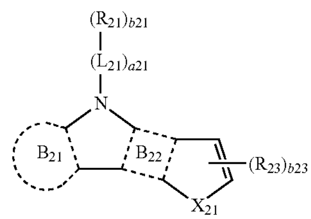

2-15

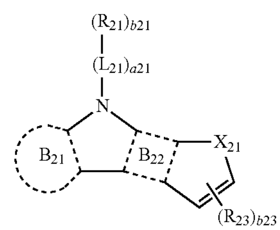

$B_{21}$ to $B_{23}$, $L_{21}$, $L_{23}$, a21, a23, $R_{21}$, $R_{23}$, $b_{21}$, $b_{23}$, and $X_{21}$ in Formulae 2-11 to 2-15 may be the same as those already described above.

In an implementation, the second material may be, e.g., one of the following Compounds 201 to 298.

201

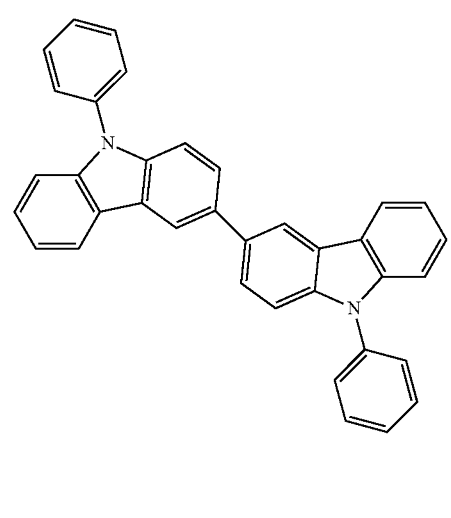

-continued
202
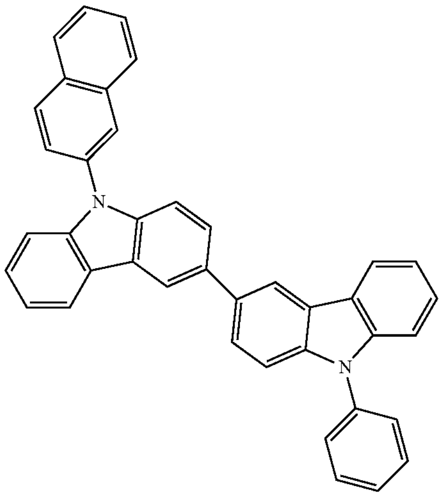
203
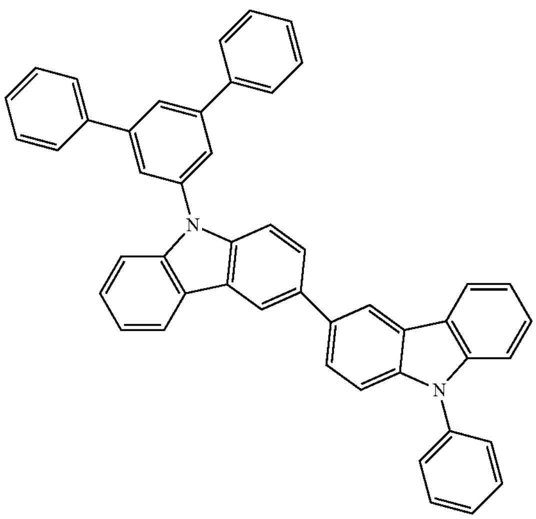
204
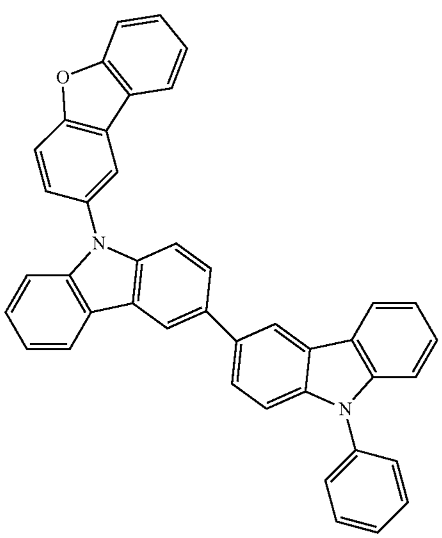
-continued
205
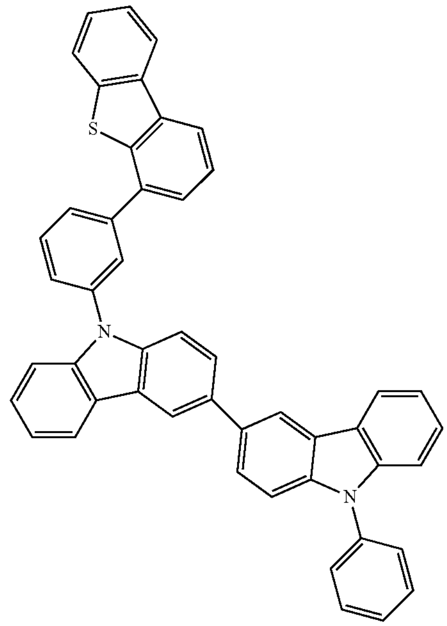
206
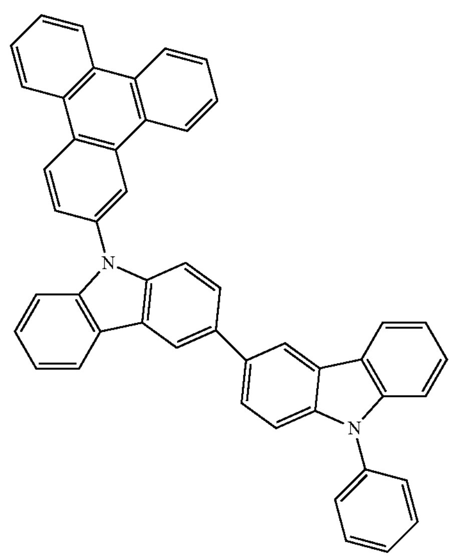

207
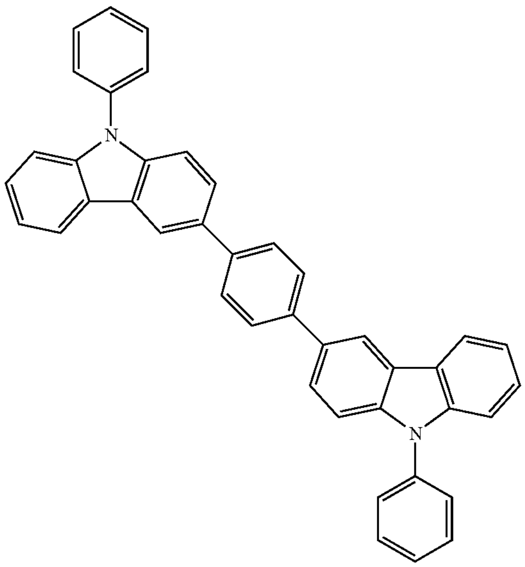
208
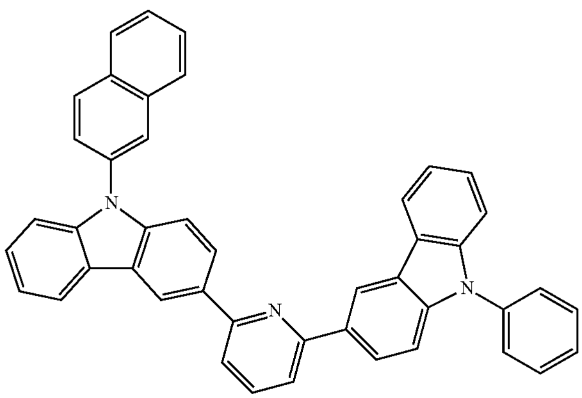
209
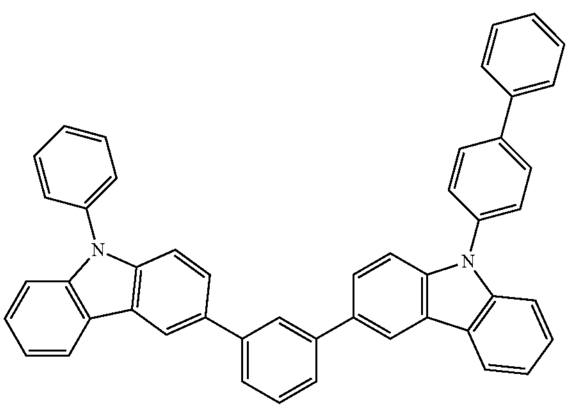
210
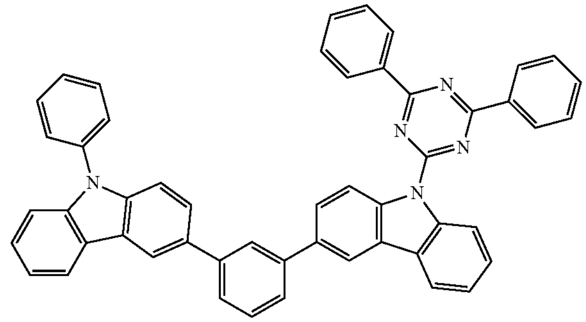
211
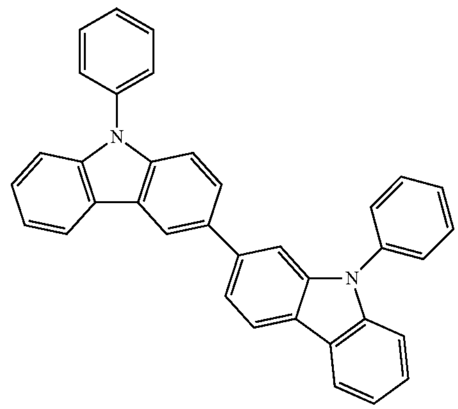
212
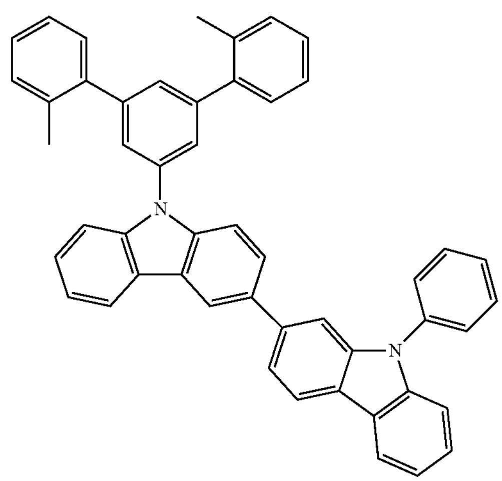

-continued
213
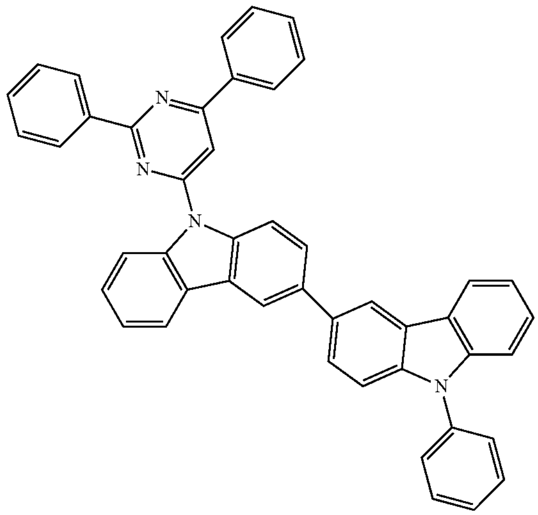
214
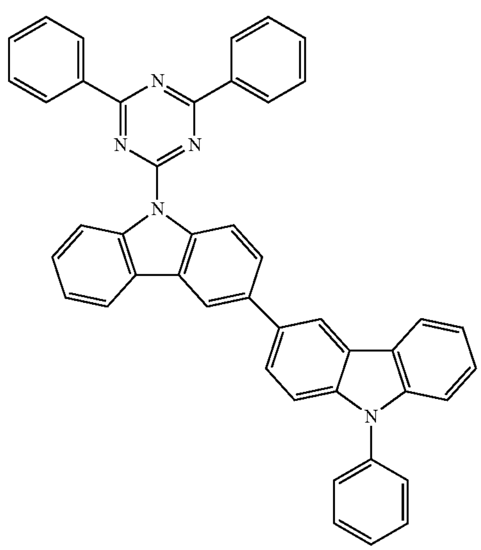
-continued
215
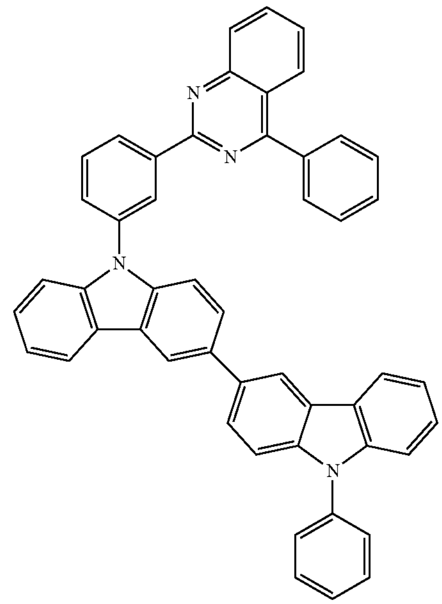
216
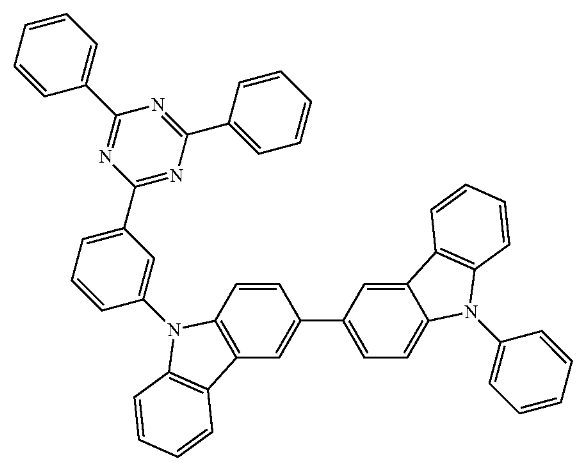
217
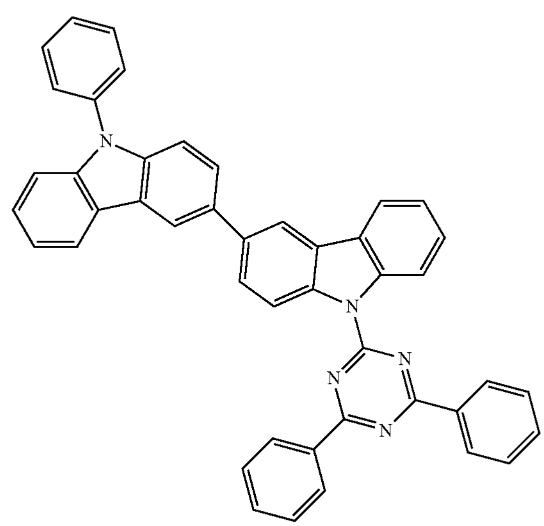

-continued
218
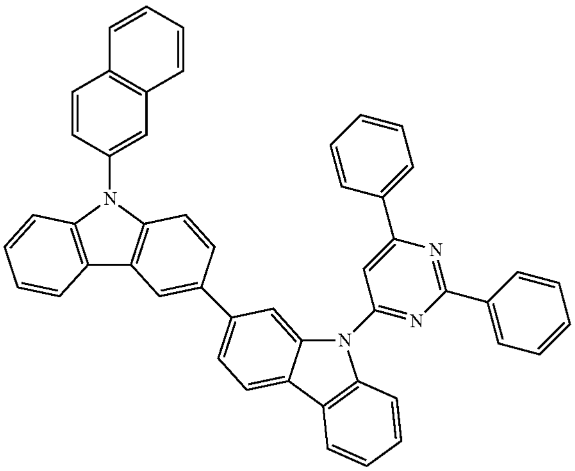
219
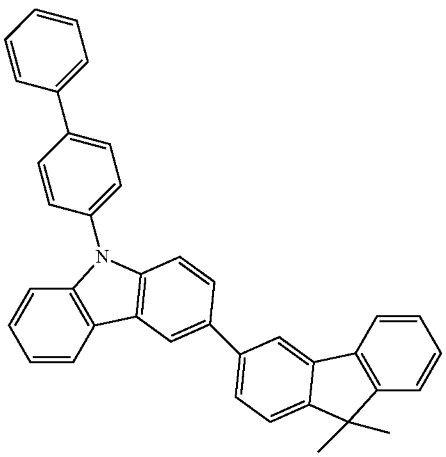
220
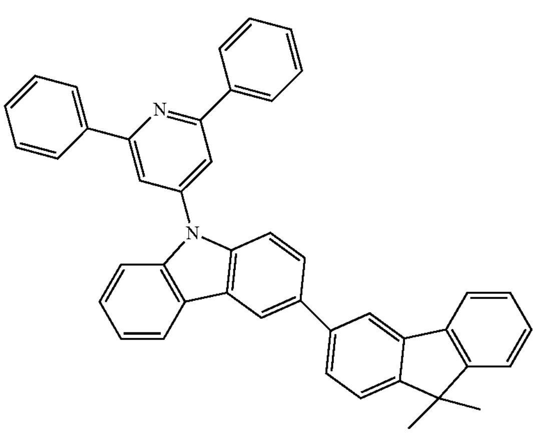
-continued
221
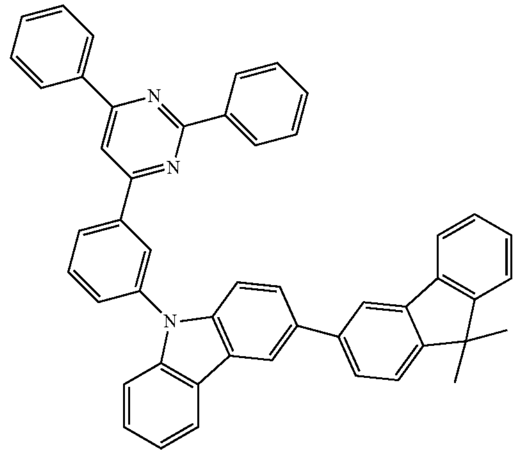
222
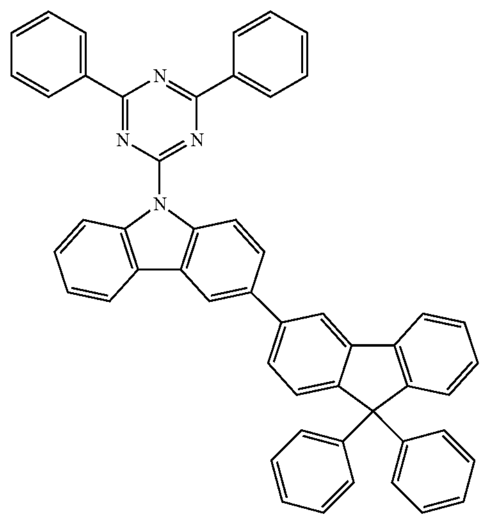
223
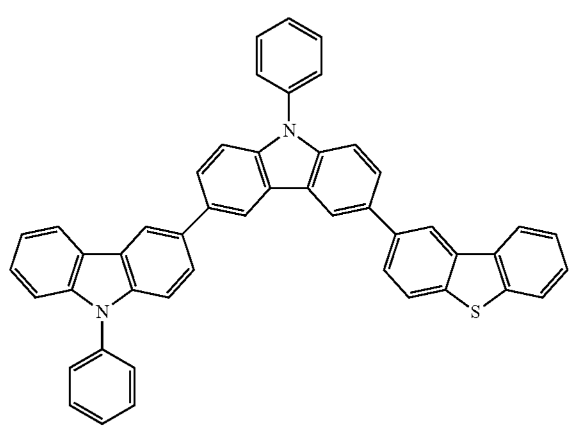

-continued
224
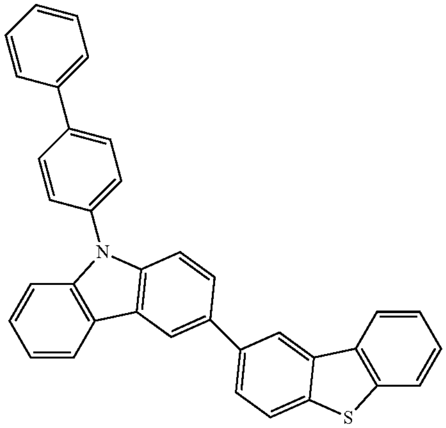
225
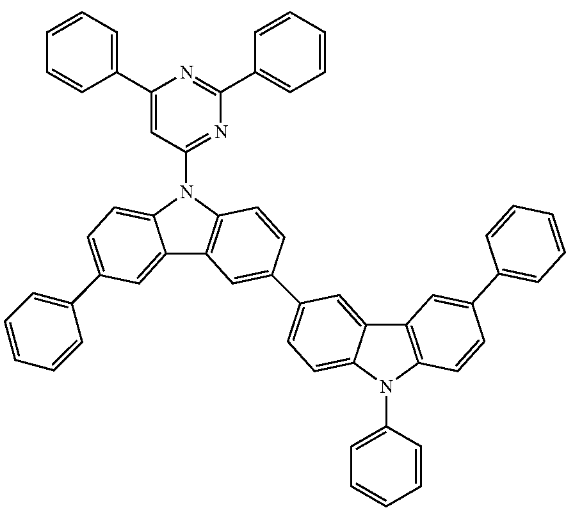
226
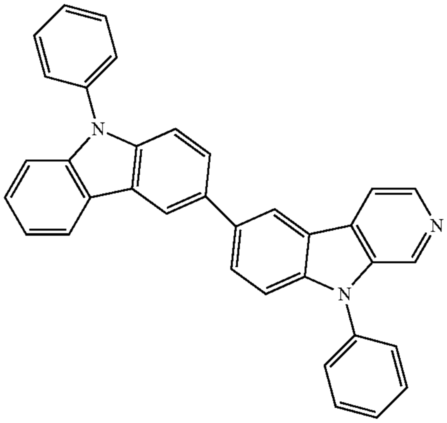
-continued
227
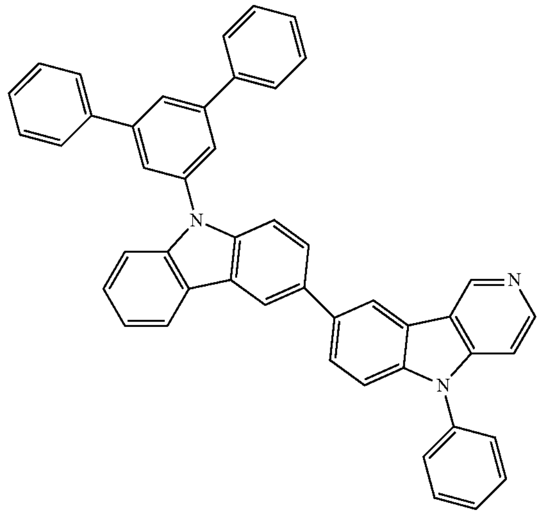
228
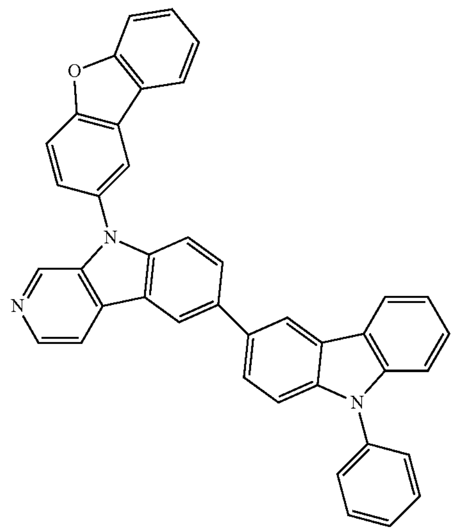
229
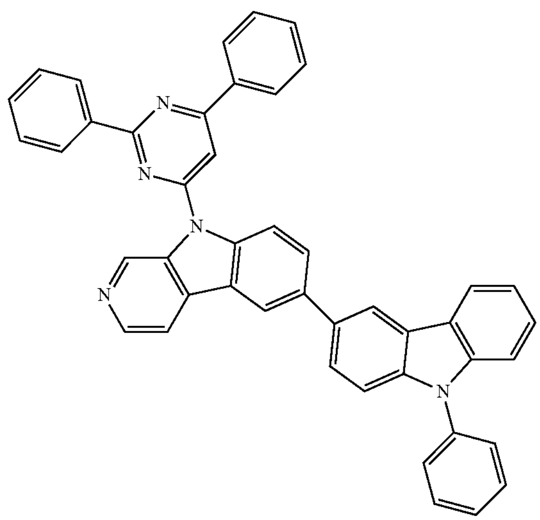

-continued
230
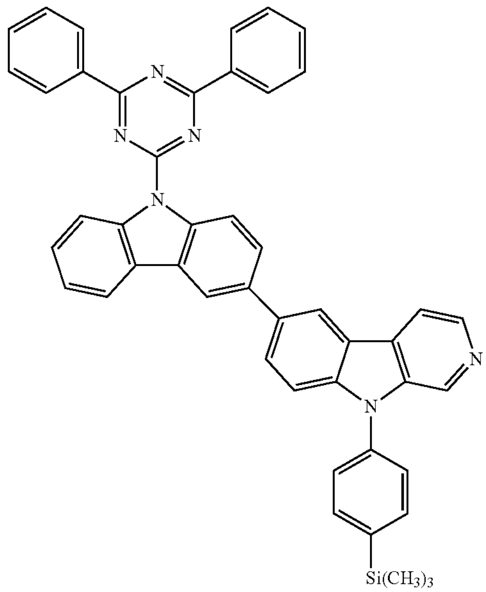
231
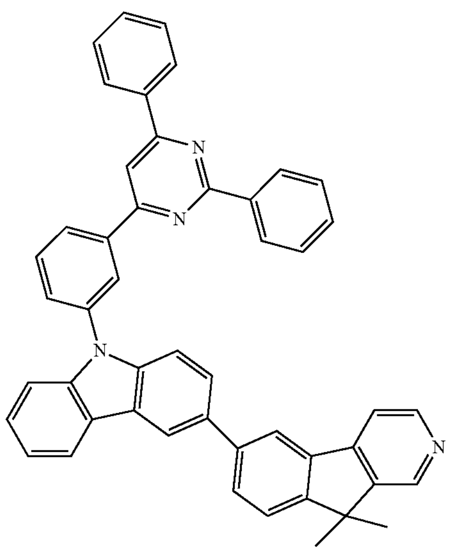
232
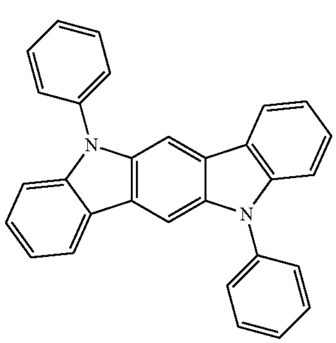
-continued
233
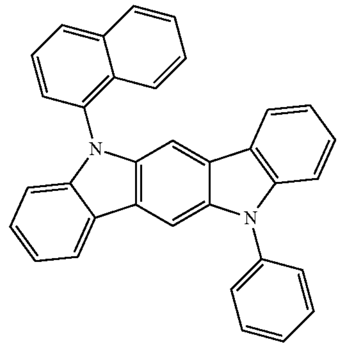
234
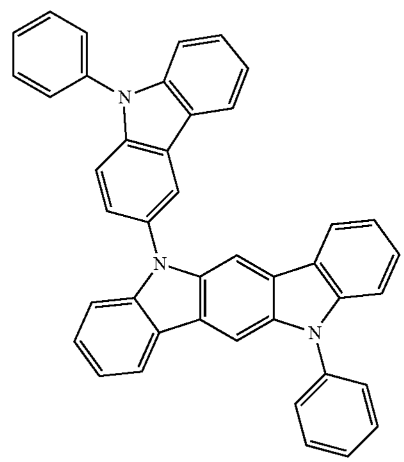
235
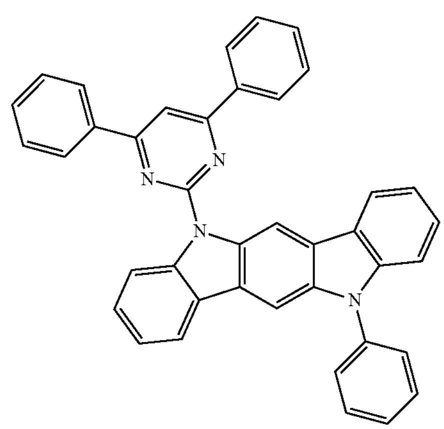

-continued
236
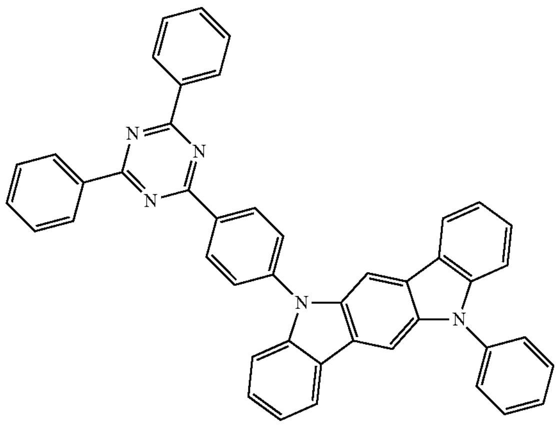
237
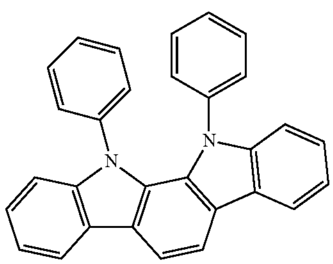
238
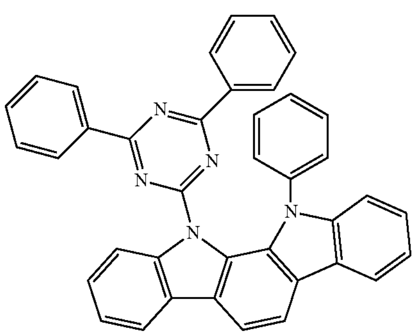
239
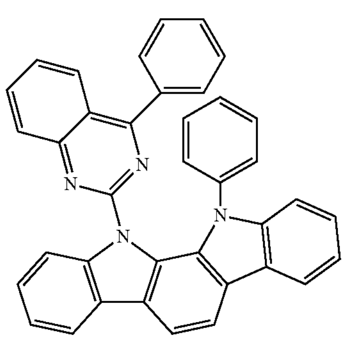
-continued
240
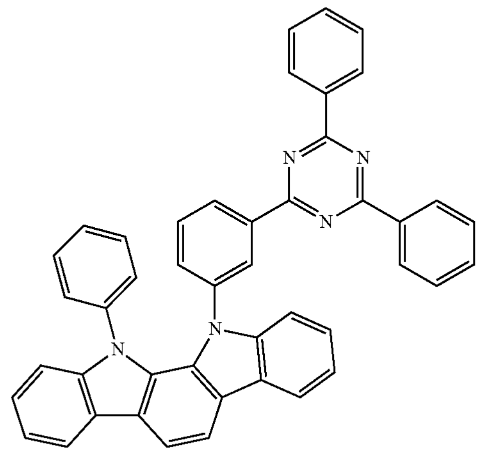
241
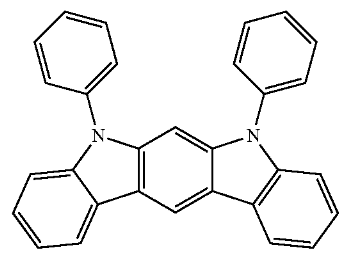
242
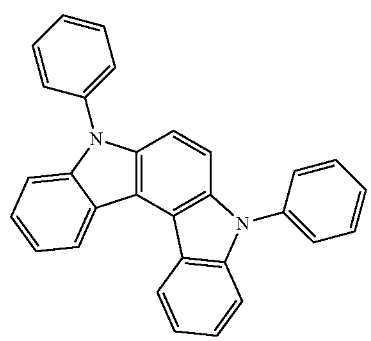
243
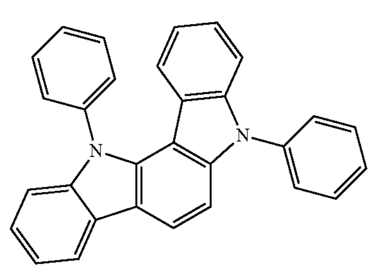

-continued
244
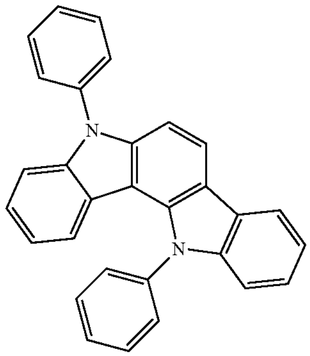
245
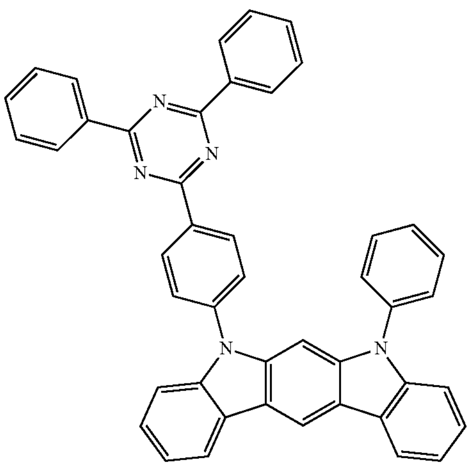
246
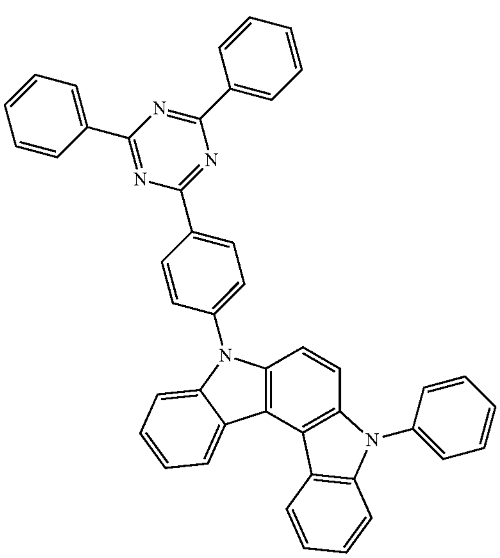
-continued
247
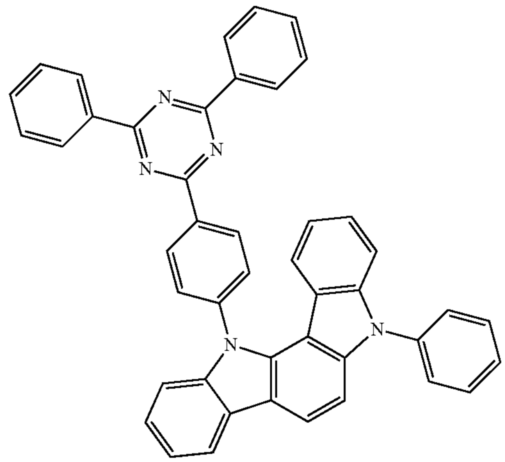
248
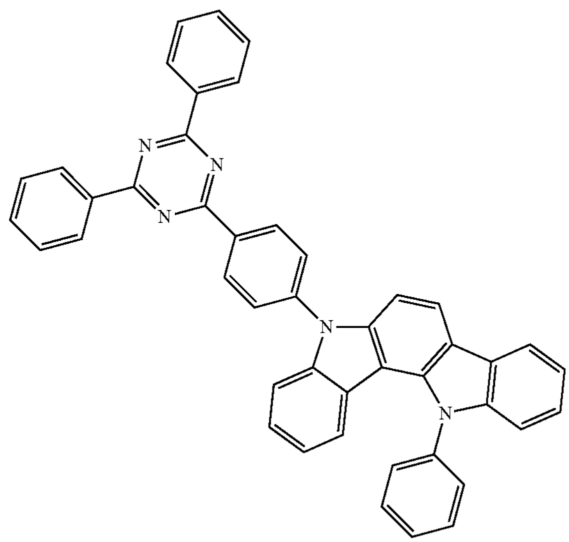
249
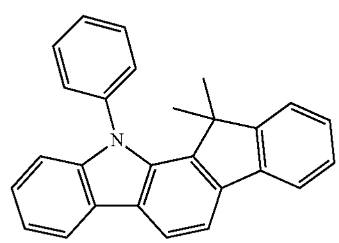
250
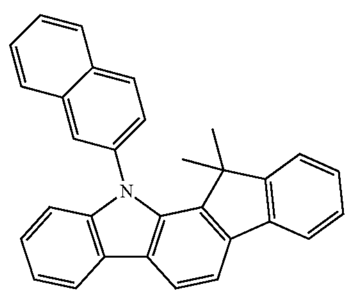

-continued
251
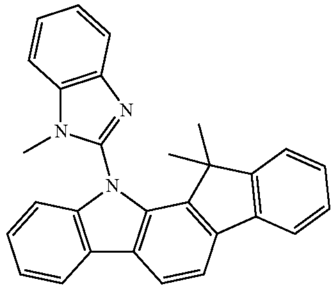
252
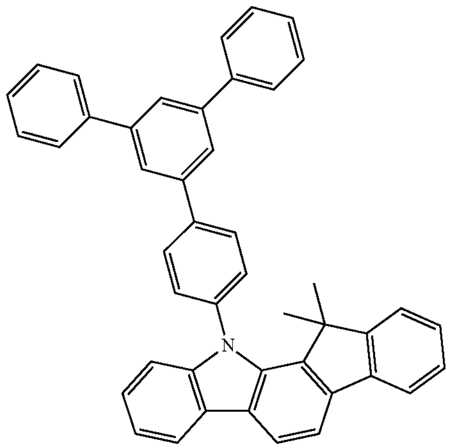
253
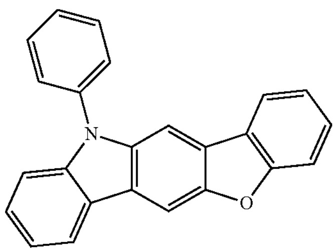
254
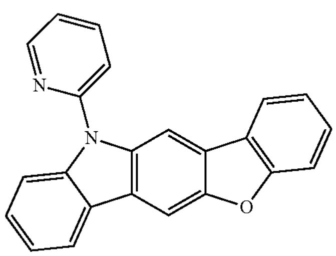
255
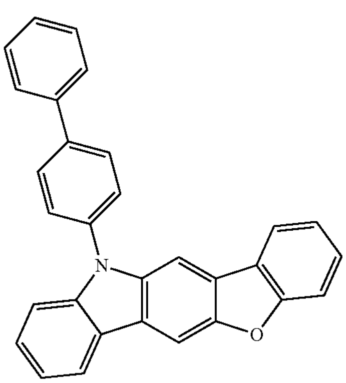
-continued
256
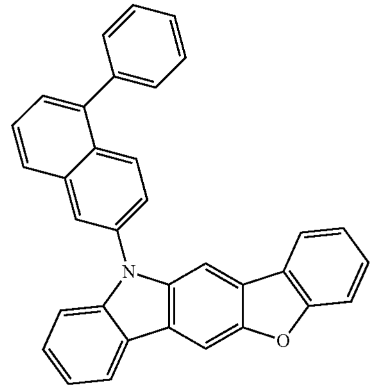
257
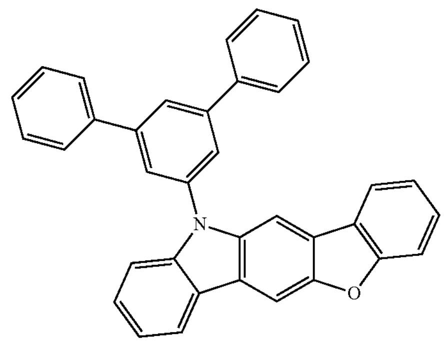
258
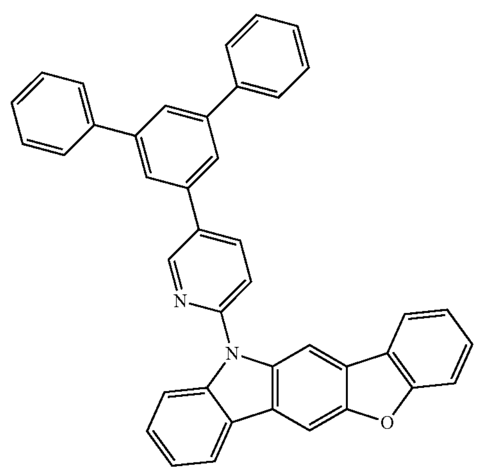

-continued
259
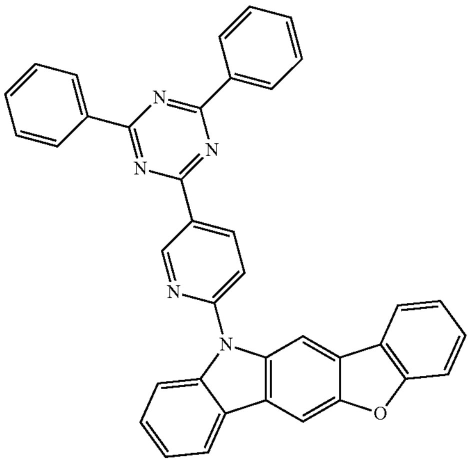
260
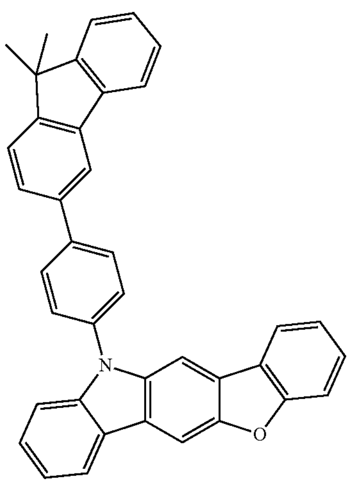
261
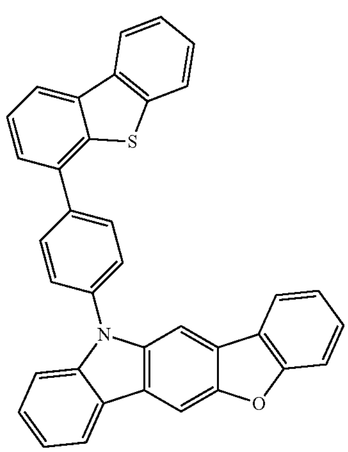
-continued
262
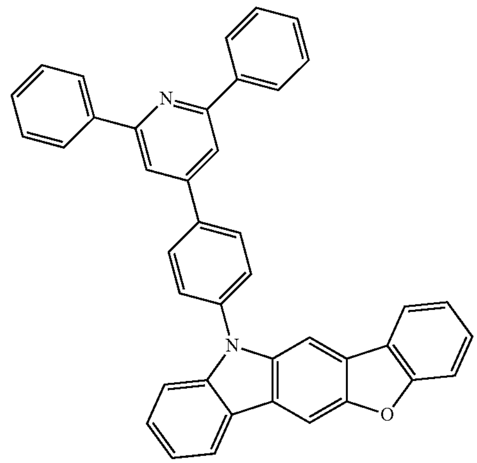
263
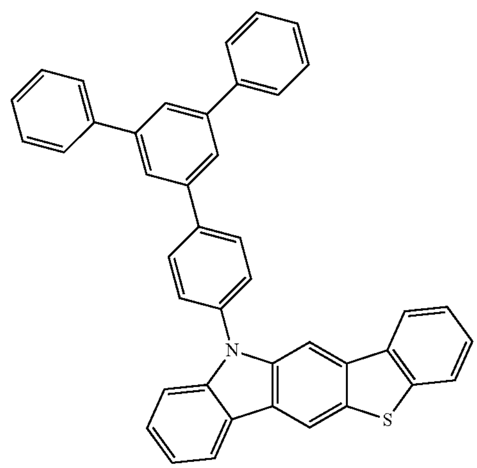
264
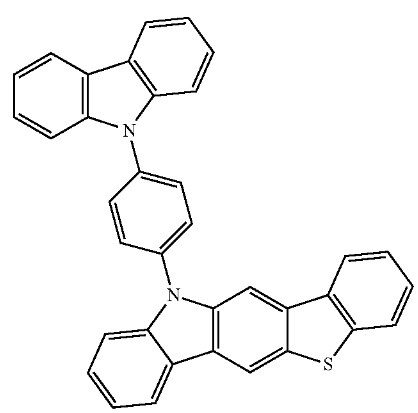

-continued
265
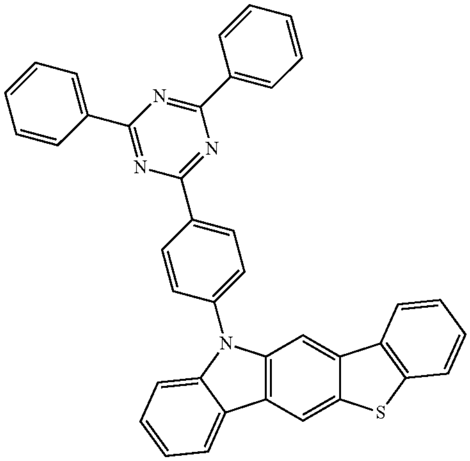
266
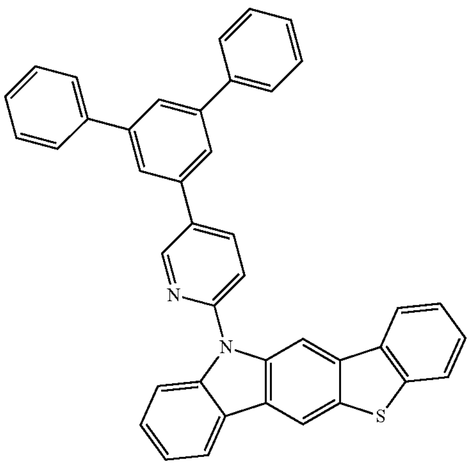
267
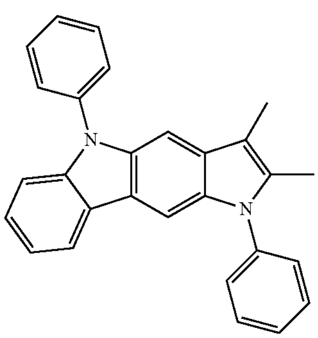
-continued
268
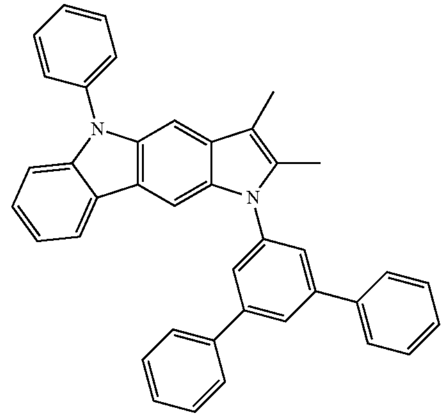
269
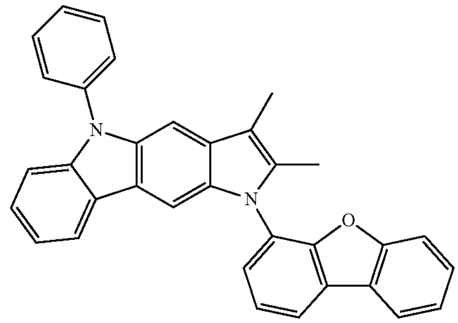
270
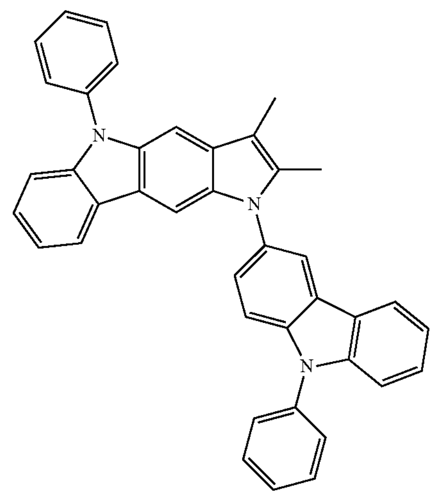
271
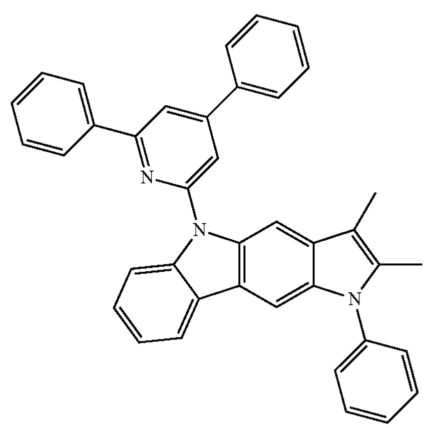

-continued
272
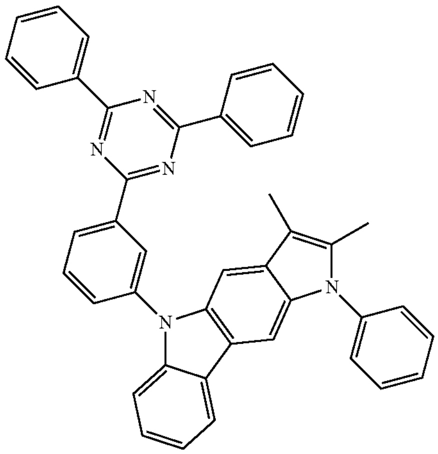
273
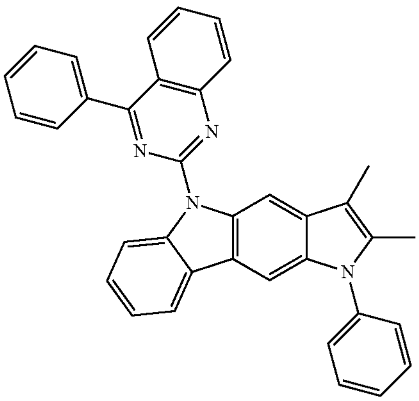
274
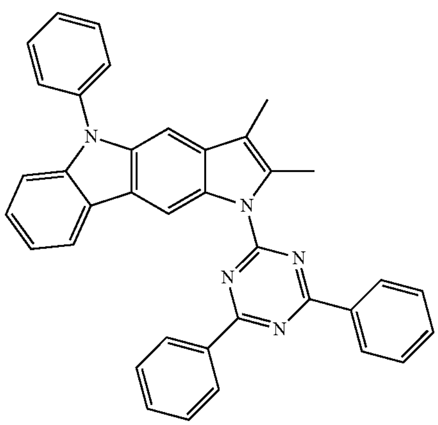
275
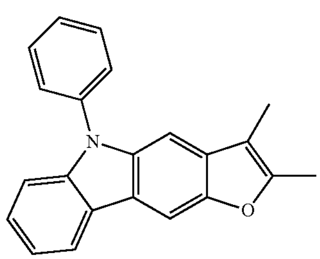
-continued
276
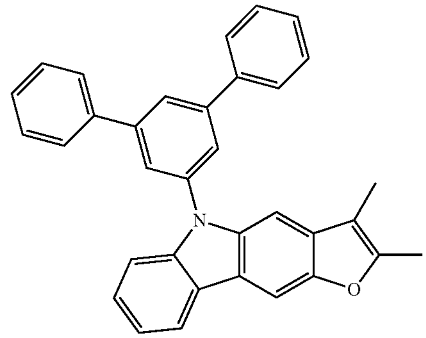
277
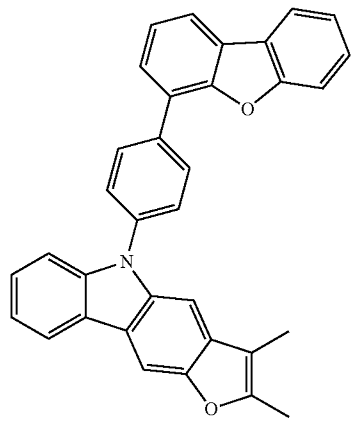
278
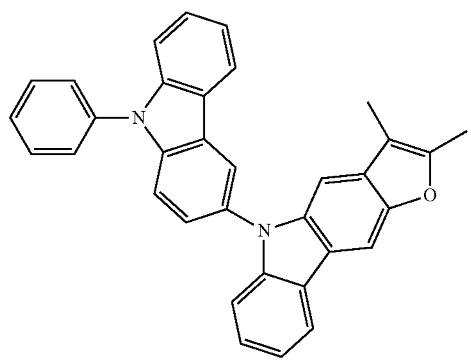
279
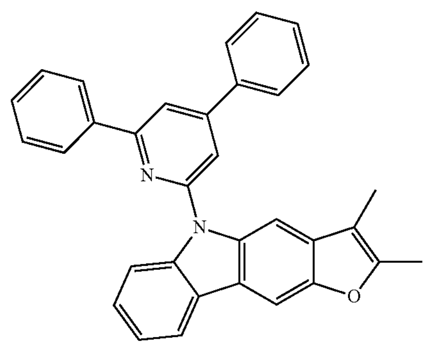

-continued
280
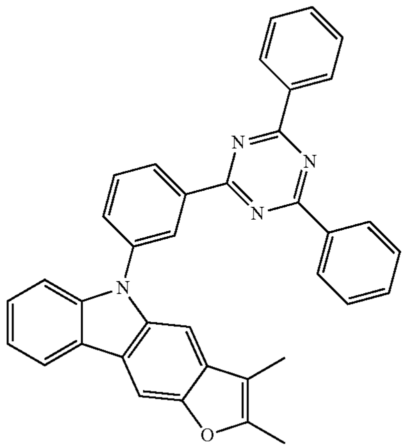
281
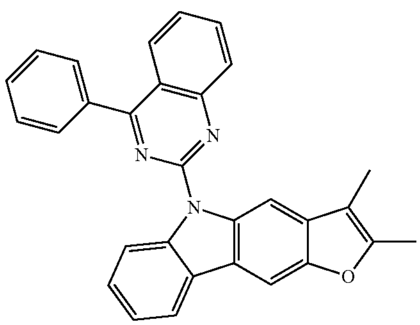
282
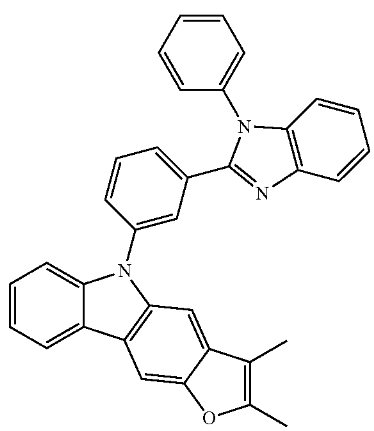
283
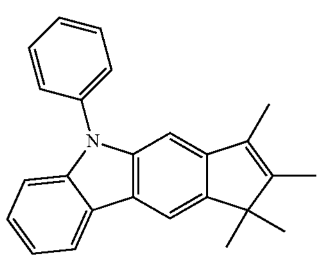
-continued
284
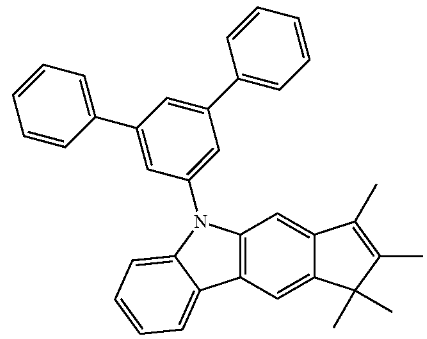
285
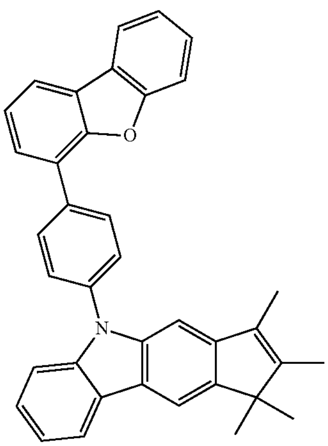
286
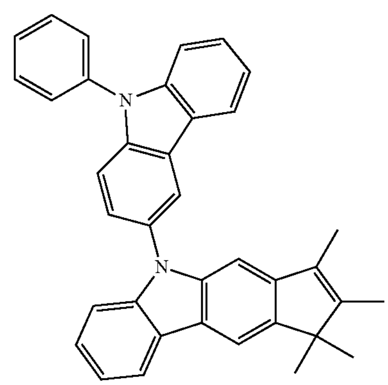
287
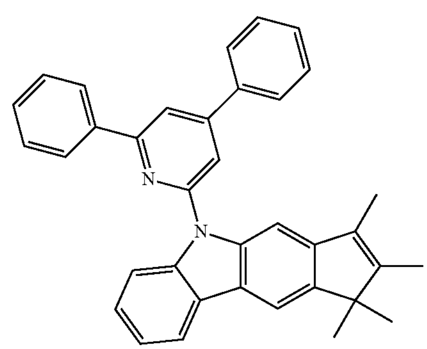

-continued
288
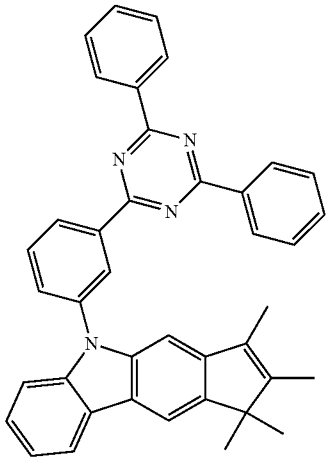
289
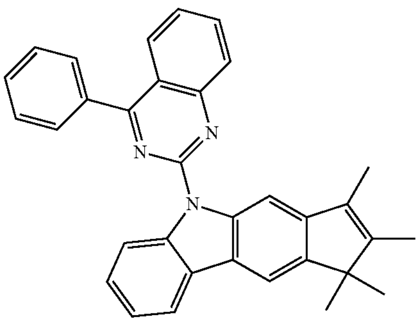
290
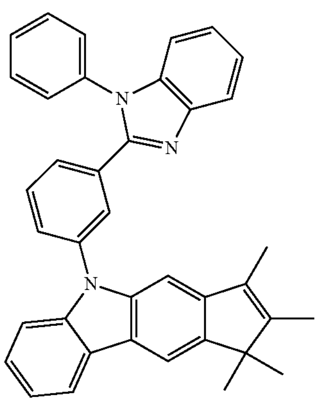
291
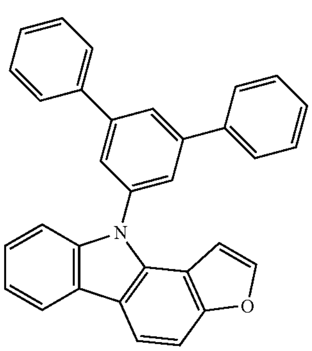
-continued
292
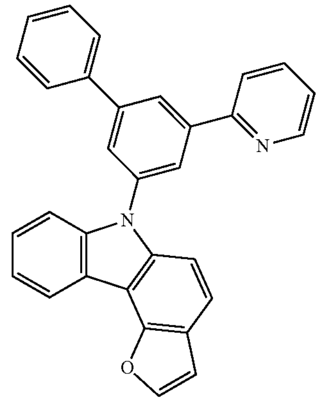
293
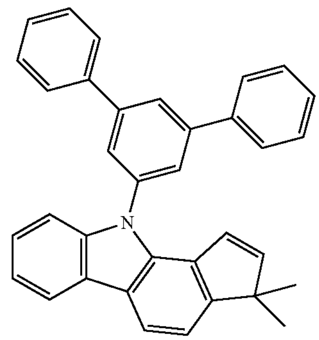
294
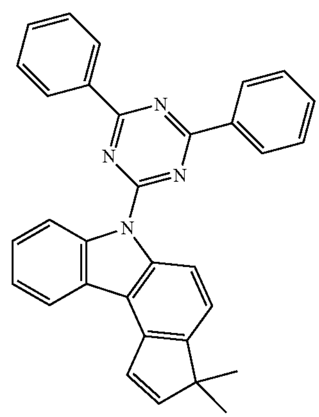
295
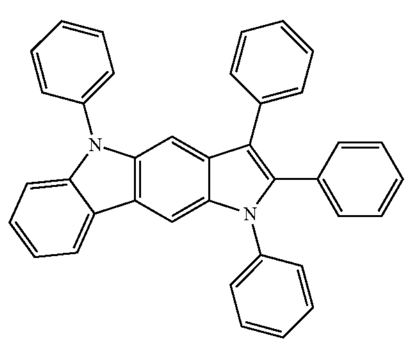

-continued

296

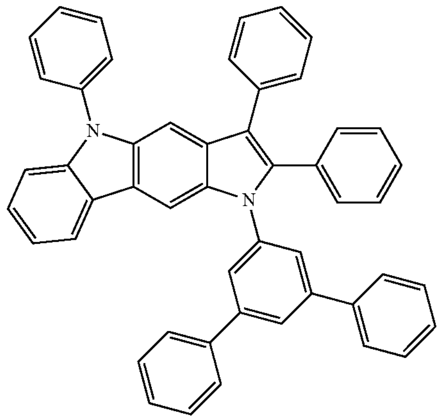

297

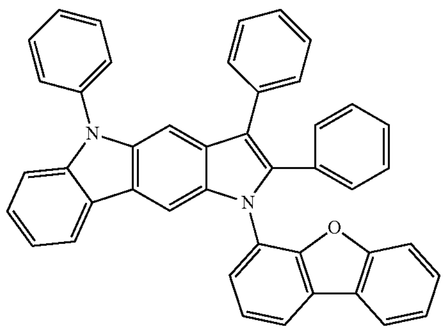

298

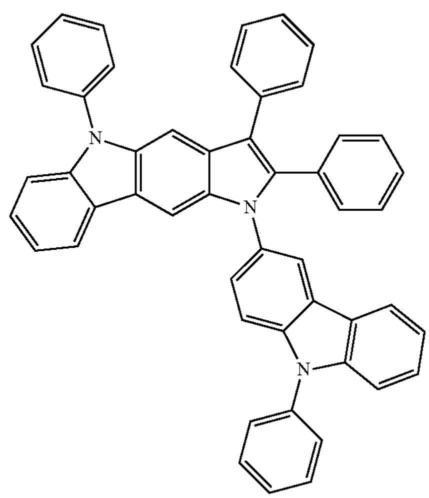

The electron transport region may include a first electron transport layer and a second electron transport layer. In an implementation, the first electron transport layer may include at least one second material. The emission layer may be located adjacent to, e.g., directly adjacent to, the first electron transport layer.

The first electron transport layer may be formed on the emission layer by using various methods, e.g., vacuum deposition, spin coating casting, an LB method, inkjet printing, laser printing, or laser-induced thermal imaging. When the first electron transport layer is formed by vacuum deposition or spin coating, deposition and coating conditions for the first electron transport layer may be the same as the deposition and coating conditions for the hole injection layer.

A thickness of the first electron transport layer may be about 50 Å to about 1,000 Å, e.g., about 50 Å to about 300 Å. When the thickness of the first electron transport layer is within the range described above, the first electron transport layer may have satisfactory electron transport characteristics without a substantial increase in driving voltage.

The electron transport region may include a second material that has high hole transport properties, and when electrons are provided from the electron transport region to the emission layer, the electron transport region may have a high energy barrier. Accordingly, in an organic light-emitting device having such a structure, electrons may act as major carriers that deliver charges. Thus, the organic light-emitting device may have an excellent charge balance and a longer lifespan than one in the related art.

The first material and the second material may each include an indole structure or moiety, and the first and second materials may have high T1 energy levels. Accordingly, various compounds may be applicable to an organic light-emitting device including the first material and the second material.

The first material and the second material may have a common structure, and an interface of an organic layer including the first material and an organic layer including the second material may be stabilized. Accordingly, an organic light-emitting device including the first material and the second material may have a longer lifespan than one in the related art.

By controlling charge transport abilities of the first material and the second material, charges in an organic light-emitting device may be balanced, and due to the charge balance, the organic light-emitting device may have higher efficiency and a longer lifespan than one in the related art.

The electron transport region may include a hole blocking layer. The hole blocking layer may be formed, when the emission layer includes a phosphorescent dopant, to help prevent diffusion of excitons or holes into an electron transport layer.

When the electron transport region includes a hole blocking layer, the hole blocking layer may be formed on the emission layer by using various methods, e.g., vacuum deposition, spin coating casting, an LB method, inkjet printing, laser printing, or laser-induced thermal imaging. When the hole blocking layer is formed by vacuum deposition or spin coating, deposition and coating conditions for the hole blocking layer may be determined by referring to the deposition and coating conditions for the hole injection layer.

The hole blocking layer may include, e.g., at least one selected from the group of BCP, Bphen, and TmPyPB.

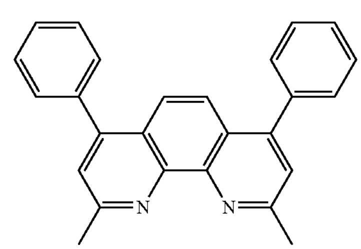

BCP

-continued

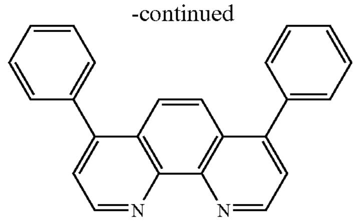

BPhen

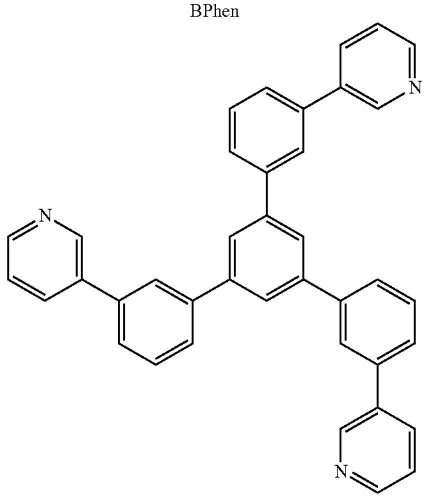

TmPyPB

A thickness of the hole blocking layer may be about 20 Å to about 1,000 Å, e.g., about 30 Å to about 300 Å. When the thickness of the hole blocking layer is within these ranges, the hole blocking layer may have excellent hole blocking characteristics without a substantial increase in driving voltage.

The electron transport region may include the second electron transport layer. The second electron transport layer may be formed on the first electron layer by using various methods, e.g., vacuum deposition, spin coating casting, an LB method, inkjet printing, laser printing, or laser-induced thermal imaging. When a second electron transport layer is formed by vacuum deposition or spin coating, deposition and coating conditions for the second electron transport layer may be the same as the deposition and coating conditions for the hole injection layer.

The second electron transport layer may include, e.g., at least one selected from the group of BCP, Bphen, $Alq_3$, Balq, TAZ, and NTAZ.

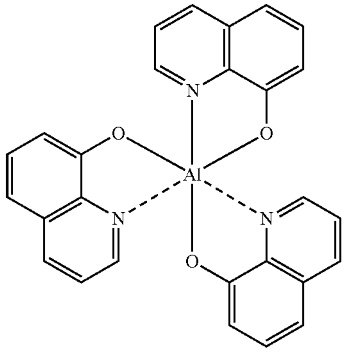

$Alq_3$

-continued

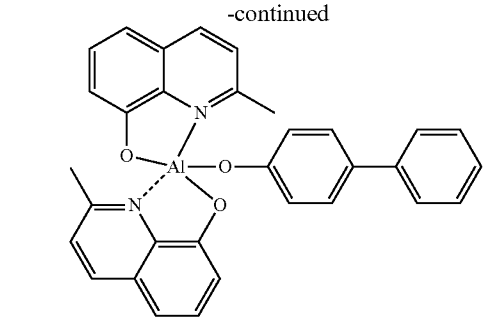

BAlq

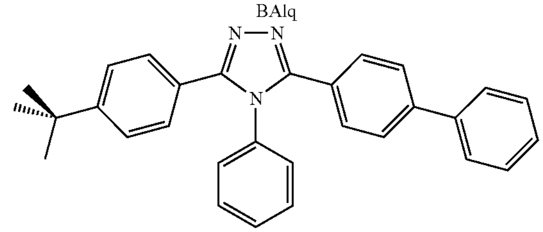

TAZ

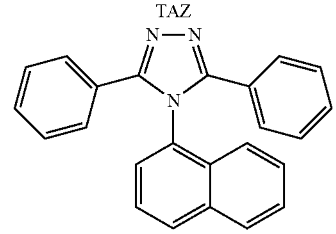

NTAZ

In an implementation, the second electron transport layer may further include at least one compound represented by Formula 601 below.

$Ar_{601}$-$[(L_{601})_{xe1}$-$E_{601}]_{xe2}$ <Formula 601>

$Ar_{601}$ in Formula 601 may be selected from:

a naphthalene, a heptalene, a fluorenene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene;

a naphthalene, a heptalene, a fluorenene, a spiro-fluorene, a benzofluorene, a dibenzofluorene, a phenalene, a phenanthrene, an anthracene, a fluoranthene, a triphenylene, a pyrene, a chrysene, a naphthacene, a picene, a perylene, a pentaphene, and an indenoanthracene, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_2$-$C_{60}$ heteroaryl group, a monovalent non-aromatic condensed polycyclic group, a monovalent non-aromatic condensed heteropolycyclic group, and —$Si(Q_{301})(Q_{302})(Q_{303})$ ($Q_{301}$ to $Q_{303}$ may be each independently selected from a hydrogen, a $C_1$-$C_{60}$ alkyl group, a $C_2$-$C_{60}$ alkenyl group, a $C_6$-$C_{60}$ aryl group, a $C_2$-$C_{60}$ heteroaryl group, a monovalent non-aromatic condensed polycyclic group, and a monovalent non-aromatic condensed heteropolycyclic group);

a description of $L_{601}$ may be understood by referring to the description provided in connection with $L_{201}$;

$E_{601}$ may be selected from:

a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group; and a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, and a dibenzocarbazolyl group;

xe1 may be selected from 0, 1, 2, and 3; and xe2 may be selected from 1, 2, 3, and 4.

In an implementation, the second electron transport layer may further include at least one compound represented by Formula 602 below.

<Formula 602>

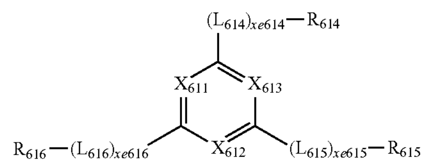

In Formula 602, $X_{611}$ may be N or C-$(L_{611})_{xe611}$-$R_{611}$, $X_{612}$ may be N or C-$(L_{612})_{xe612}$-$R_{612}$, $X_{613}$ may be N or C-$(L_{613})_{xe613}$-$R_{613}$, and at least one selected from the group of $X_{611}$ to $X_{613}$ may be N;

$L_{611}$ to $L_{616}$ may be understood by referring to the description provided herein in connection with $L_{201}$;

$R_{611}$ to $R_{616}$ may each independently be selected from:

a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and a phenyl group, a naphthyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a phenyl group, a naphthyl group, an azulenyl group, a fluorenyl group, a spiro-fluorenyl group, a benzofluorenyl group, a dibenzofluorenyl group, a phenanthrenyl group, an anthracenyl group, a pyrenyl group, a chrysenyl group, a pyridinyl group, a pyrazinyl group, a pyrimidinyl group, a pyridazinyl group, a quinolinyl group, an isoquinolinyl group, a quinoxalinyl group, a quinazolinyl group, a carbazolyl group, and a triazinyl group; and xe611 to xe616 may be each independently selected from 0, 1, 2, and 3.

The compound represented by Formula 601 and the compound represented by Formula 602 may include at least one of Compounds ET1 to ET15 illustrated below.

-continued
ET1
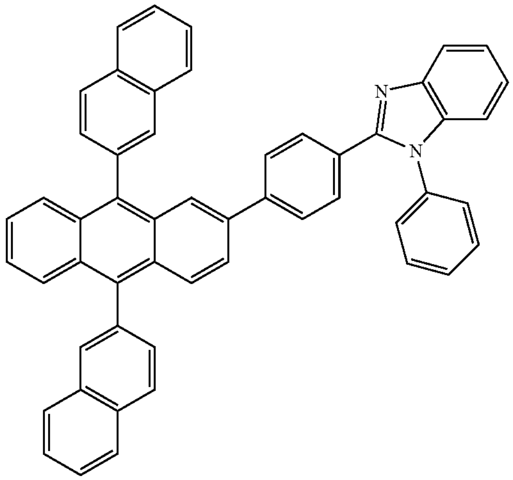
ET2
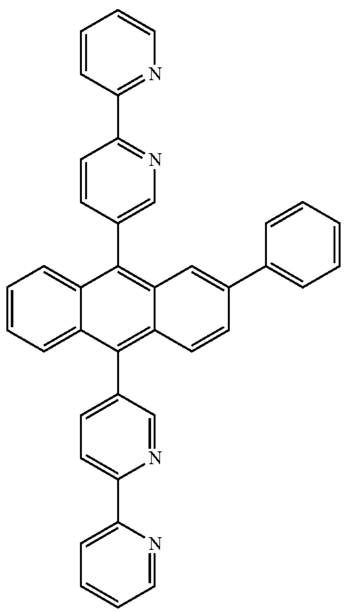
ET3
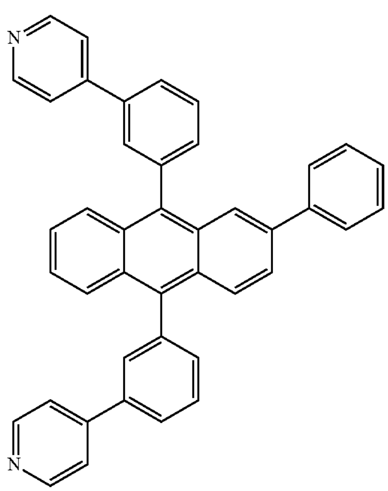
ET4
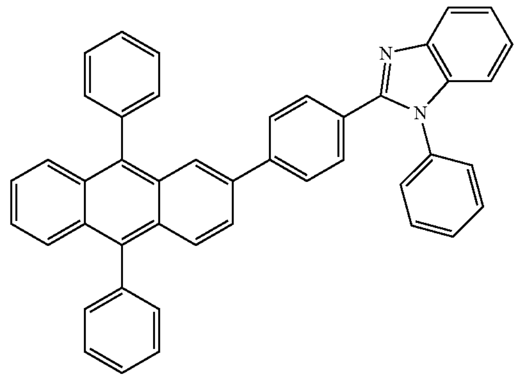
ET5
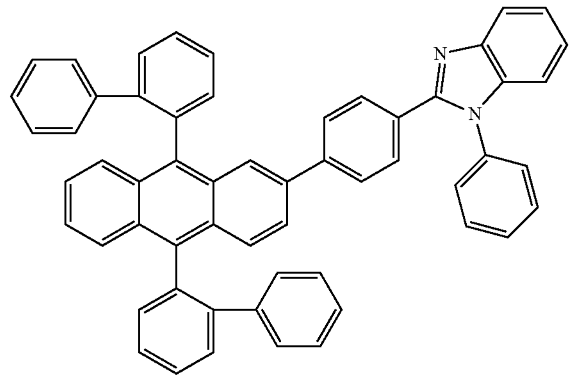
ET6
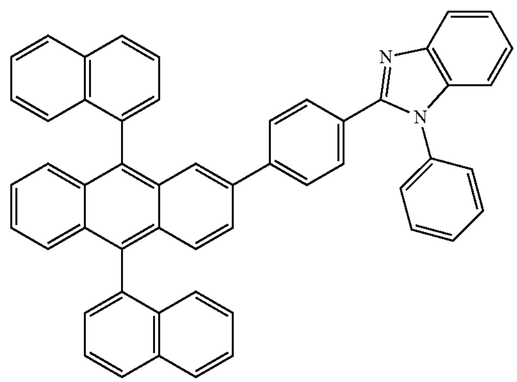
ET7
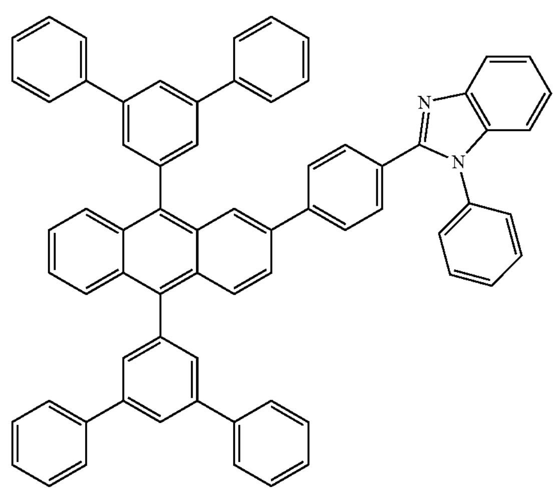

-continued
ET8
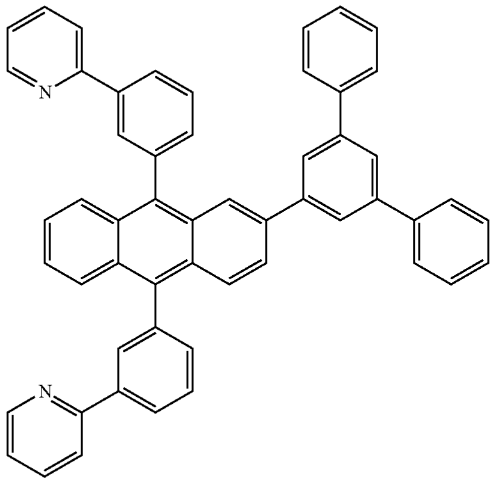
ET9
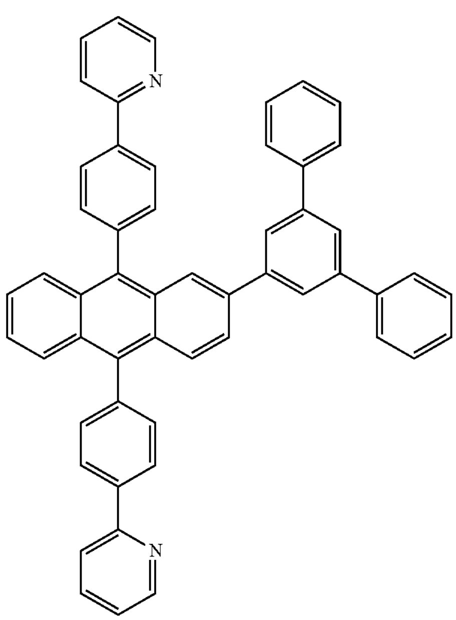
-continued
ET10
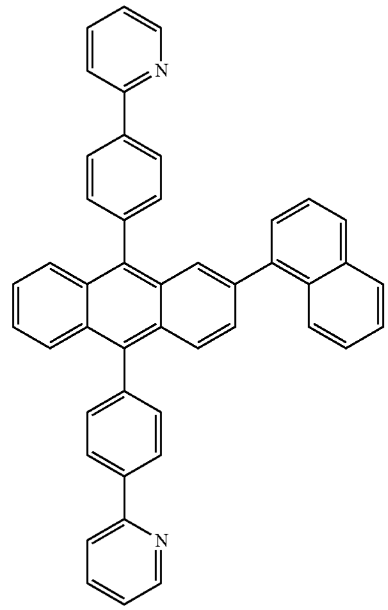
ET11
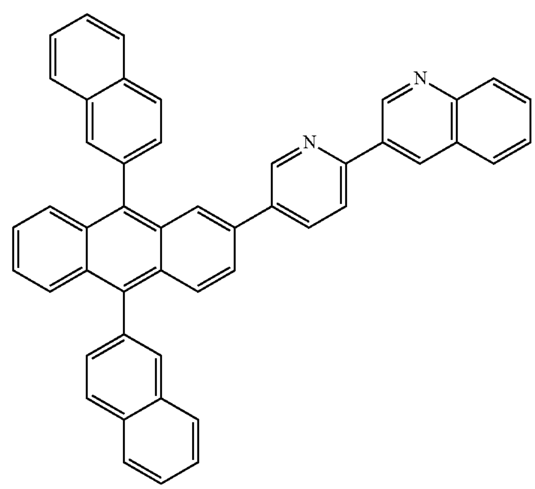
ET12
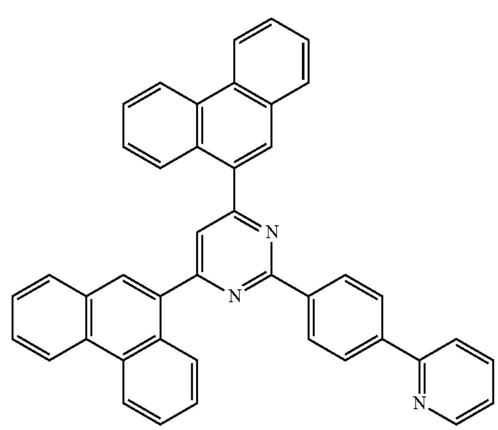

-continued

ET13

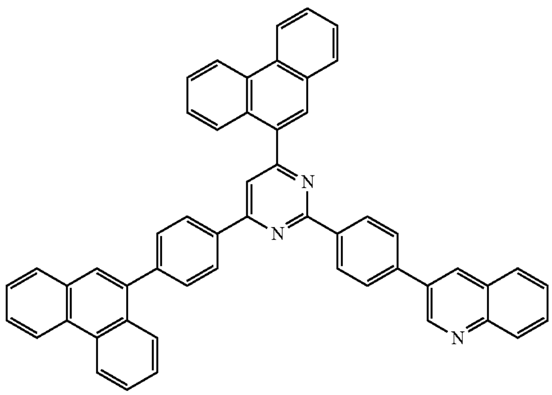

ET14

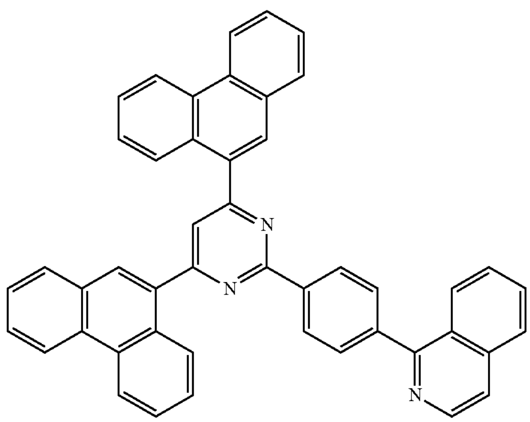

ET15

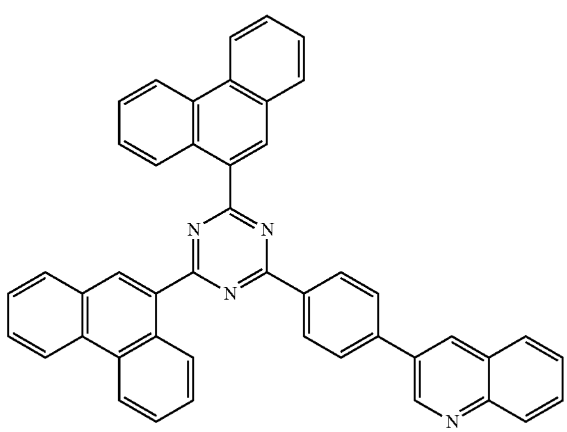

A thickness of the second electron transport layer may be about 100 Å to about 1,000 Å, e.g., about 150 Å to about 500 Å. When the thickness of the second electron transport layer is within the range described above, the second electron transport layer may have satisfactory electron transport characteristics without a substantial increase in driving voltage.

In an implementation, the electron transport layer may further include, in addition to the materials described above, a metal-containing material.

The metal-containing material may include a Li complex. The Li complex may include, for example, Compound ET-D1 (lithium quinolate, LiQ) or ET-D2.

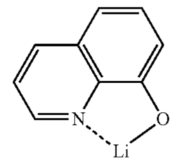

ET-D1

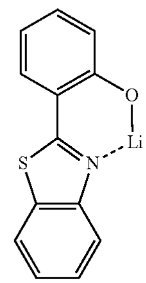

ET-D2

The electron transport region may include an electron injection layer that facilitates electron injection from the second electrode 190.

The electron injection layer may be formed on the electron transport layer by using various methods, e.g., vacuum deposition, spin coating casting, an LB method, inkjet printing, laser printing, or laser-induced thermal imaging. When an electron injection layer is formed by vacuum deposition or spin coating, deposition and coating conditions for the electron injection layer may be the same as those for the hole injection layer.

The electron injection layer may include at least one selected from the group of LiF, NaCl, CsF, $Li_2O$, BaO, and LiQ.

A thickness of the electron injection layer may be about 1 Å to about 100 Å, e.g., about 3 Å to about 90 Å. When the thickness of the electron injection layer is within the range described above, the electron injection layer may have satisfactory electron injection characteristics without a substantial increase in driving voltage.

The second electrode 190 may be disposed on the electron transport region described above. The second electrode 190 may be a cathode that is an electron injection electrode, and in this regard, a metal for forming the second electrode 190 may be a material having a low work function, and such a material may include a metal, an alloy, an electrically conductive compound, or a mixture thereof. Examples of the material for the second electrode 190 may include lithium (Li), magnesium (Mg), aluminum (Al), aluminum-lithium (Al—Li), calcium (Ca), magnesium-indium (Mg—In), or magnesium-silver (Mg—Ag). In an implementation, the material for forming the second electrode 190 may be ITO or IZO. The second electrode 190 may be a reflective electrode or a transmissive electrode.

An organic light-emitting device according to an embodiment may be included in a flat panel display device including a thin film transistor. The thin film transistor may include a gate electrode, source and drain electrodes, a gate insulating film, and an active layer, and one of the source and drain electrodes may electrically contact a first electrode of the organic light-emitting device. The active layer may include crystalline silicon, amorphous silicon, organic semiconductor, oxide semiconductor, or the like.

A $C_1$-$C_{60}$ alkyl group used herein refers to a linear or branched aliphatic hydrocarbon monovalent group having 1 to 60 carbon atoms, and detailed examples thereof are a methyl group, an ethyl group, a propyl group, an isobutyl group, a sec-butyl group, a tert-butyl group, a pentyl group, an iso-amyl group, and a hexyl group. A $C_1$-$C_{60}$ alkylene group used herein refers to a divalent group having the same structure as the $C_1$-$C_{60}$ alkyl group.

A $C_1$-$C_{60}$ alkoxy group used herein refers to a monovalent group represented by —$OA_{101}$ (wherein $A_{101}$ is the $C_1$-$C_{60}$ alkyl group), and detailed examples thereof are a methoxy group, an ethoxy group, and an isopropyloxy group.

A $C_2$-$C_{60}$ alkenyl group used herein refers to a hydrocarbon group formed by substituting at least one carbon double bond in the middle or at the terminal of the $C_2$-$C_{60}$ alkyl group, and detailed examples thereof are an ethenyl group, a prophenyl group, and a butenyl group. A $C_2$-$C_{60}$ alkenylene group used herein refers to a divalent group having the same structure as the $C_2$-$C_{60}$ alkenyl group.

A $C_2$-$C_{60}$ alkynyl group used herein refers to a hydrocarbon group having at least one carbon triple bond in the middle or at the terminal of the $C_2$-$C_{60}$ alkyl group, and detailed examples thereof are an ethynyl group and a propynyl group. A $C_2$-$C_{60}$ alkynylene group used herein refers to a divalent group having the same structure as the $C_2$-$C_{60}$ alkynyl group.

A $C_3$-$C_{10}$ cycloalkyl group used herein refers to a monovalent hydrocarbon monocyclic group having 3 to 10 carbon atoms, and detailed examples thereof are a cyclopropyl group, a cyclobutyl group, a cyclopentyl group, a cyclohexyl group, and a cycloheptyl group. A $C_3$-$C_{10}$ cycloalkylene group used herein refers to a divalent group having the same structure as the $C_3$-$C_{10}$ cycloalkyl group.

A $C_1$-$C_{10}$ heterocycloalkyl group used herein refers to a monovalent monocyclic group having at least one heteroatom selected from N, O, P, and S as a ring-forming atom and 1 to 10 carbon atoms, and detailed examples thereof are a tetrahydrofuranyl group and a tetrahydrothiophenyl group. A $C_3$-$C_{10}$ heterocycloalkylene group used herein refers to a divalent group having the same structure as the $C_3$-$C_{10}$ heterocycloalkyl group.

A $C_3$-$C_{10}$ cycloalkenyl group used herein refers to a monovalent monocyclic group that has 3 to 10 carbon atoms and at least one double bond in the ring thereof and does not have aromaticity, and detailed examples thereof are a cyclopentenyl group, a cyclohexenyl group, and a cycloheptenyl group. A $C_3$-$C_{10}$ cycloalkenylene group used herein refers to a divalent group having the same structure as the $C_3$-$C_{10}$ cycloalkenyl group.

A $C_1$-$C_{10}$ heterocycloalkenyl group used herein refers to a monovalent monocyclic group that has at least one heteroatom selected from N, O, P, and S as a ring-forming atom, 1 to 10 carbon atoms, and at least one double bond in its ring. Detailed examples of the $C_3$-$C_{10}$ heterocycloalkenyl group are a 2,3-hydrofuranyl group and a 2,3-hydrothiophenyl group. A $C_3$-$C_{10}$ heterocycloalkenylene group used herein refers to a divalent group having the same structure as the $C_3$-$C_{10}$ heterocycloalkenyl group.

A $C_6$-$C_{60}$ aryl group used herein refers to a monovalent group having a carbocyclic aromatic system having 6 to 60 carbon atoms, and a $C_6$-$C_{60}$ arylene group used herein refers to a divalent group having a carbocyclic aromatic system having 6 to 60 carbon atoms. Detailed examples of the $C_6$-$C_{60}$ aryl group are a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group each include two or more rings, the rings may be fused to each other.

A $C_1$-$C_{60}$ heteroaryl group used herein refers to a monovalent group having a carboncyclic aromatic system that has at least one heteroatom selected from N, O, P, and S as a ring-forming atom, and 1 to 60 carbon atoms. A $C_1$-$C_{60}$ heteroarylene group used herein refers to a divalent group having a carbocyclic aromatic system that has at least one heteroatom selected from N, O, P, and S as a ring-forming atom, and 2 to 60 carbon atoms. Examples of the $C_1$-$C_{60}$ heteroaryl group are a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group and the $C_1$-$C_{60}$ heteroarylene group each include two or more rings, the rings may be fused to each other.

A $C_6$-$C_{60}$ aryloxy group used herein indicates —$OA_{102}$ (wherein $A_{102}$ is the $C_6$-$C_{60}$ aryl group), and a $C_6$-$C_{60}$ arylthio group indicates —$SA_{103}$ (wherein $A_{103}$ is the $C_6$-$C_{60}$ aryl group).

A monovalent non-aromatic condensed polycyclic group used herein refers to a monovalent group (for example, having 8 to 60 carbon atoms) that has two or more rings condensed to each other, only carbon atoms as a ring forming atom, and non-aromaticity in the entire molecular structure. A detailed example of the monovalent non-aromatic condensed polycyclic group is a fluorenyl group. A divalent non-aromatic condensed polycyclic group used herein refers to a divalent group having the same structure as the monovalent non-aromatic condensed polycyclic group.

A monovalent non-aromatic condensed heteropolycyclic group used herein refers to a monovalent group (for example, having 2 to 60 carbon atoms) that has two or more rings condensed to each other, has a heteroatom selected from N, O, P, and S, other than carbon atoms, as a ring forming atom, and has non-aromaticity in the entire molecular structure. An example of the monovalent non-aromatic condensed heteropolycyclic group is a carbazolyl group. A divalent non-aromatic condensed heteropolycyclic group used herein refers to a divalent group having the same structure as the monovalent non-aromatic condensed heteropolycyclic group.

Hereinafter, an organic light-emitting device according to an embodiment is described in detail with reference to Examples. However, embodiments are not limited to Examples.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

EXAMPLE

Example 1

A glass substrate with an ITO anode thereon was cut to a size of 50 mm×50 mm×0.5 mm, sonicated in acetone isopropyl alcohol and pure water, each for 15 minutes, and then, washed by exposure to UV ozone for 30 minutes.

Compound HT3 was deposited on the ITO anode to form a hole transport layer having a thickness of 600 Å, thereby completing the formation of a hole transport region.

On the hole transport region, Compound 101 and PD17 were co-deposited at a weight ratio of 95:5 to form an emission layer having a thickness of 300 Å.

Compound 201 was deposited on the emission layer to form a first electron transport layer having a thickness of 100 Å, Alq3 was deposited on the first electron transport layer to form a second electron transport layer having a thickness of 300 Å, and LiF was vacuum-deposited on the second electron transport layer to form an electron injection layer having a thickness of 10 Å, thereby completing the manufacture of an electron transport region.

An Al cathode having a thickness of 2,000 Å was formed on the electron transport region, thereby completing the manufacture of an organic light-emitting device.

Examples 2 to 16

Organic light-emitting devices were manufactured in the same manner as in Example 1, except that compounds shown in Table 1 were used.

TABLE 1

| | Host for emission layer | First electron transport layer |
|---|---|---|
| Example 1 | Compound 101 | Compound 201 |
| Example 2 | Compound 110 | Compound 201 |
| Example 3 | Compound 151 | Compound 201 |
| Example 4 | Compound 142 | Compound 201 |
| Example 5 | Compound 101 | Compound 217 |
| Example 6 | Compound 110 | Compound 217 |
| Example 7 | Compound 151 | Compound 217 |
| Example 8 | Compound 142 | Compound 217 |
| Example 9 | Compound 101 | Compound 240 |
| Example 10 | Compound 110 | Compound 240 |
| Example 11 | Compound 151 | Compound 240 |
| Example 12 | Compound 142 | Compound 240 |
| Example 13 | Compound 101 | Compound 272 |
| Example 14 | Compound 110 | Compound 272 |
| Example 15 | Compound 151 | Compound 272 |
| Example 16 | Compound 142 | Compound 272 |

Comparative Example 1

An organic light-emitting device was manufactured in the same manner as in Example 101, except that in forming the emission layer, CBP was used instead of Compound 101, and in forming the first electron transport layer, $Alq_3$ was used instead of Compound 201.

Comparative Example 2

An organic light-emitting device was manufactured in the same manner as in Example 1, except that in forming the emission layer, CBP was used instead of Compound 101.

Comparative Example 3

An organic light-emitting device was manufactured in the same manner as in Example 1, except that in forming the first electron transport layer, BCP was used instead of Compound 201.

Comparative Example 4

An organic light-emitting device was manufactured in the same manner as in Example 1-1, except that in forming the emission layer, Compound A below was used instead of Compound 101, and in forming the first electron transport layer, Compound B was used instead of Compound 201.

<Compound A>

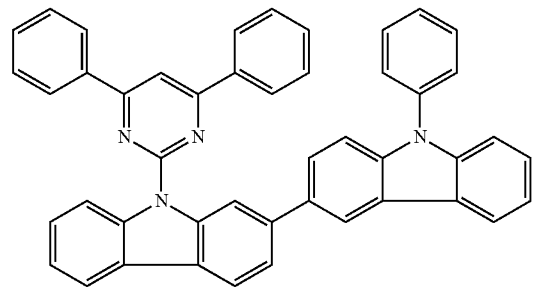

<Compound B>

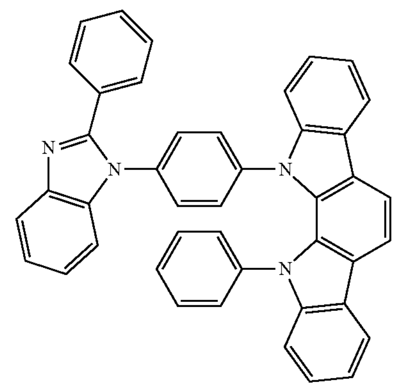

Evaluation Example 1

The efficiency and lifespan ($T_{90}$) data of the organic light-emitting devices manufactured according to Examples 1 to 16 and Comparative Examples 1 to 4 were evaluated by using an IVL meter (PhotoResearch PR650, Keithley 238), and results thereof are shown in Table 2 below. $T_{90}$ data (@300 nit) indicates the amount of time that elapsed until brightness was reduced to 90% of the initial brightness (100%) of a device when the device was driven.

TABLE 2

| | Host for emission layer | First electron transport layer | Efficiency (cd/A) | $T_{90}$ (hr) |
|---|---|---|---|---|
| Example 1 | Compound 101 | Compound 201 | 19.7 | 220 |
| Example 2 | Compound 110 | Compound 201 | 20.8 | 253 |
| Example 3 | Compound 151 | Compound 201 | 20.2 | 211 |
| Example 4 | Compound 142 | Compound 201 | 21.1 | 240 |
| Example 5 | Compound 101 | Compound 217 | 22.4 | 237 |
| Example 6 | Compound 110 | Compound 217 | 23.3 | 276 |
| Example 7 | Compound 151 | Compound 217 | 22.9 | 229 |
| Example 8 | Compound 142 | Compound 217 | 23.8 | 187 |
| Example 9 | Compound 101 | Compound 240 | 20.1 | 230 |
| Example 10 | Compound 110 | Compound 240 | 22.1 | 244 |
| Example 11 | Compound 151 | Compound 240 | 21.5 | 223 |
| Example 12 | Compound 142 | Compound 240 | 23.3 | 192 |
| Example 13 | Compound 101 | Compound 272 | 21.7 | 262 |
| Example 14 | Compound 110 | Compound 272 | 24.1 | 287 |
| Example 15 | Compound 151 | Compound 272 | 22.0 | 229 |
| Example 16 | Compound 142 | Compound 272 | 23.9 | 258 |
| Comparative Example 1 | CBP | Alq3 | 15.0 | 107 |
| Comparative Example 2 | CBP | Compound 201 | 18.1 | 135 |

TABLE 2-continued

| | Host for emission layer | First electron transport layer | Efficiency (cd/A) | $T_{90}$ (hr) |
|---|---|---|---|---|
| Comparative Example 3 | Compound 101 | BCP | 17.7 | 122 |
| Comparative Example 4 | Compound A | Compound B | 20.1 | 151 |

From Table 2, it may be that the organic light-emitting devices of Examples 1 to 16 exhibited better efficiency and longer lifespans than the organic light-emitting devices of Comparative Examples 1 to 4.

Organic light-emitting devices according to embodiments may have high efficiency and long lifespan characteristics.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting device, comprising:

a first electrode;

a second electrode; and an organic layer between the first electrode and the second electrode, wherein:

the organic layer includes an emission layer and an electron transport region, the electron transport region being between the emission layer and the second electrode;

the emission layer includes a first compound represented by any one of the following Formulae 1-1 and 1-2:

<Formula 1-1>

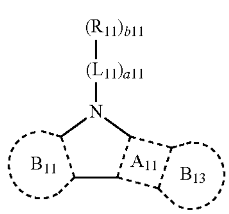

<Formula 1-2>

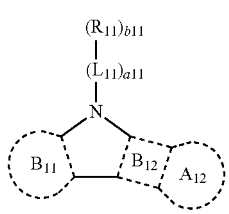

the electron transport region includes a second compound represented by any one of the following Formulae 2-1 and 2-2:

<Formula 2-1>

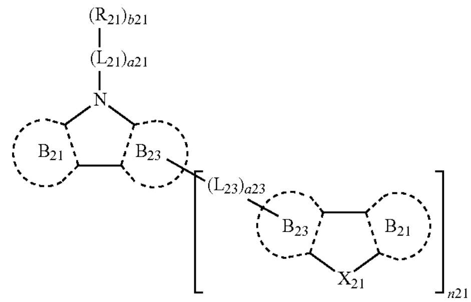

<Formula 2-2>

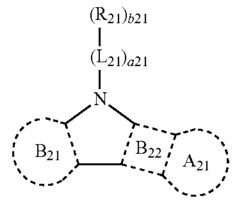

wherein, in Formulae 1-1, 1-2, 2-1, and 2-2, $A_{11}$ and $A_{12}$ are each independently a group represented by any one of Formulae 1A-1 and 1A-2;

<Formula 1A-1>

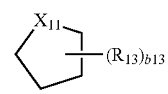

<Formula 1A-2>

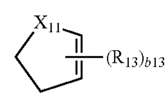

$A_{21}$ is a group represented by any one of Formula 2A-1 and 2A-2;

<Formula 2A-1>

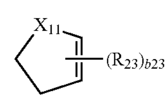

<Formula 2B-2>

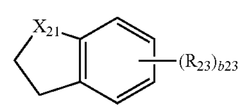

$B_{11}$ to $B_{13}$ and $B_{21}$ to $B_{23}$ are each independently selected from a substituted or unsubstituted $C_6$-$C_{60}$ arene and a substituted or unsubstituted $C_1$-$C_{60}$ heteroarene;

$X_{11}$ is selected from N-[$(L_{12})_{a12}$-$(R_{12})_{b12}$], an oxygen atom (O), a sulfur atom (S), and $C(R_{14})(R_{15})$;

$X_{21}$ is N-[$(L_{22})_{a22}$-$(R_{22})$], an oxygen atom (O), a sulfur atom (S), and $C(R_{24})(R_{25})$;

$L_{11}$, $L_{12}$, and $L_{21}$ to $L_{23}$ are each independently selected from a substituted or unsubstituted $C_6$-$C_{60}$ arylene group and a substituted or unsubstituted $C_1$-$C_{60}$ heteroarylene group;

a11, a12, and a21 to a23 are each independently selected from 0, 1, 2, and 3;

$R_{11}$, $R_{12}$, $R_{21}$, and $R_{22}$ are each independently selected from a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group;

b11, b12, b21, and b22 are each independently selected from 1, 2, and 3;

$R_{13}$ to $R_{15}$ and $R_{23}$ to $R_{25}$ are each independently selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a substituted or unsubstituted $C_1$-$C_{60}$ alkyl group, a substituted or unsubstituted $C_1$-$C_{60}$ alkoxy group, a substituted or unsubstituted $C_3$-$C_{10}$ cycloalkyl group, a substituted or unsubstituted $C_6$-$C_{60}$ aryl group, a substituted or unsubstituted $C_6$-$C_{60}$ aryloxy group, a substituted or unsubstituted $C_1$-$C_{60}$ heteroaryl group, a substituted or unsubstituted a monovalent non-aromatic condensed polycyclic group, a substituted or unsubstituted a monovalent non-aromatic condensed heteropolycyclic group, and —$Si(Q_1)(Q_2)(Q_3)$;

b13 and b23 are each independently selected from 1 and 2;

n21 is selected from 1, 2, and 3;

at least one substituent of the substituted $C_6$-$C_{60}$ arene, substituted $C_1$-$C_{60}$ heteroarene, substituted $C_6$-$C_{60}$ arylene group, substituted $C_1$-$C_{60}$ heteroarylene group, substituted $C_1$-$C_{60}$ alkyl group, substituted $C_1$-$C_{60}$ alkoxy group, substituted $C_3$-$C_{10}$ cycloalkyl group, substituted $C_6$-$C_{60}$ aryl group, substituted $C_6$-$C_{60}$ aryloxy group, substituted $C_1$-$C_{60}$ heteroaryl group, substituted monovalent non-aromatic condensed polycyclic group, and substituted monovalent non-aromatic condensed heteropolycyclic group is selected from:

a deuterium, —F, —Cl, —Br, —I, a hydroxyl group, a cyano group, a nitro group, an amino group, an amidino group, a hydrazine group, a hydrazone group, a carboxylic acid group or a salt thereof, a sulfonic acid group or a salt thereof, a phosphoric acid group or a salt thereof, a $C_1$-$C_{60}$ alkyl group, a $C_2$-$C_{60}$ alkenyl group, a $C_2$-$C_{60}$ alkynyl group, and a $C_1$-$C_{60}$ alkoxy group;

a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, a monovalent non-aromatic condensed heteropolycyclic group, and —$Si(Q_{11})(Q_{12})(Q_{13})$;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group;

a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{10}$ heteroaryl group, a monovalent non-aromatic condensed polycyclic group, and a monovalent non-aromatic condensed heteropolycyclic group, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_2$-$C_{10}$ heterocycloalkyl group, a $C_3$-$C_{10}$ cycloalkenyl group, a $C_2$-$C_{10}$ heterocycloalkenyl group, a $C_6$-$C_{60}$ aryl group, a $C_6$-$C_{60}$ aryloxy group, a $C_6$-$C_{60}$ arythio group, a $C_1$-$C_{60}$ heteroaryl group, a monovalent non-aromatic condensed polycyclic group, a monovalent non-aromatic condensed heteropolycyclic group, and —$Si(Q_{21})(Q_{22})(Q_{23})$; and —$Si(Q_{31})(Q_{32})(Q_{33})$, wherein $Q_1$ to $Q_3$, $Q_{11}$ to $Q_{13}$, $Q_{21}$ to $Q_{23}$, and $Q_{31}$ to $Q_{33}$ are each independently selected from a $C_1$-$C_{60}$ alkyl group, a $C_6$-$C_{60}$ aryl group, a $C_1$-$C_{60}$ heteroaryl group, a monovalent non-aromatic condensed polycyclic group, and a monovalent non-aromatic condensed heteropolycyclic group.

2. The organic light-emitting device as claimed in claim 1, wherein:

the electron transport region includes a first electron transport layer and a second electron transport layer; and the first electron transport layer includes the second compound.

3. The organic light-emitting device as claimed in claim 2, wherein the emission layer is adjacent to the first electron transport layer.

4. The organic light-emitting device as claimed in claim 1, wherein:

$A_{11}$ is represented by any one of the following Formulae 1A-11 and 1A-12; and $A_{12}$ is represented by any one of the following Formulae 1A-21 and 1A-22;

1A-11

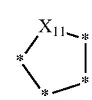

1A-12

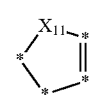

1A-21

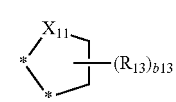

1A-22

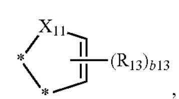

in Formulae 1A-11, 1A-12, 1A-21, and 1A-22, * indicates a carbon atom in Formulae 1-1 and 1-2.

5. The organic light-emitting device as claimed in claim 1, wherein:

$A_{21}$ is represented by any one of the following Formulae 2A-11 and 2A-12;

2A-11

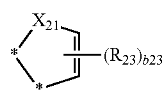

2A-12

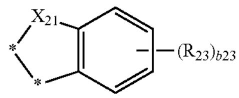

and in Formulae 2A-11 and 2A-12, * indicates a carbon atom in Formulae 2-1 and 2-2.

6. The organic light-emitting device as claimed in claim 1, wherein $B_{11}$ to $B_{13}$ and $B_{21}$ to $B_{23}$ are each independently selected from:

a benzene, a naphthalene, a phenanthrene, an anthracene, a triphenylene, a pyridine, a pyrimidine, a quinoline, and an isoquinoline; and a benzene, a naphthalene, a phenanthrene, an anthracene, a triphenylene, a pyridine, a pyrimidine, a quinoline, and an isoquinoline, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, and a $C_6$-$C_{60}$ aryl group.

7. The organic light-emitting device as claimed in claim 1, wherein $B_{11}$ to $B_{13}$ and $B_{21}$ to $B_{23}$ are each independently represented by one of the following Formulae 8-1 to 8-3:

8-1

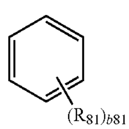

8-2

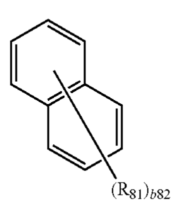

8-3

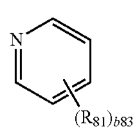

wherein, in Formulae 8-1 to 8-3, $R_{81}$ is selected from a hydrogen, a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a methyl group, an ethyl group, an n-propyl group, an iso-propyl group, an n-butyl group, a sec-butyl group, an iso-butyl group, a tert-butyl group, a methoxy group, an ethoxy group, a tert-butoxy group, a phenyl group, and a naphthyl group;

b81 is selected from 1, 2, 3, and 4;

b82 is selected from 1, 2, 3, 4, 5, and 6; and b83 is selected from 1, 2, and 3.

8. The organic light-emitting device as claimed in claim 1, wherein $L_{11}$, $L_{12}$, and $L_{21}$ to $L_{23}$ are each independently selected from:

a phenylene group, a naphthylene group, a phenanthrenylene group, an anthracenylene group, a triphenylenylene group, a pyrenylene group, a chrysenylene group, a pyrrolylene group, a thiophenylene group, a furanylene group, an imidazolylene group, a pyridinylene group, a pyrazinylene group, a pyrimidinylene group, a pyridazinylene group, an indolylene indolylene group, a quinolinylene group, an isoquinolinylene group, a benzoquinolinylene group, a phenanthridinylene group, an acridinylene group, a phenanthrolinylene group, a benzofuranylene group, a benzothiophenylene group, a triazolylene group, a tetrazolylene group, a triazinylene group, a dibenzofuranylene group, and a dibenzothiophenylene group; and a phenylene group, a naphthylene group, a phenanthrenylene group, an anthracenylene group, a triphenylenylene group, a pyrenylene group, a chrysenylene group, a pyrrolylene group, a thiophenylene group, a furanylene group, an imidazolylene group, a pyridinylene group, a pyrazinylene group, a pyrimidinylene group, a pyridazinylene group, an indolylene group, a quinolinylene group, an isoquinolinylene group, a benzoquinolinylene group, a phenanthridinylene group, an acridinylene group, a phenanthrolinylene group, a benzofuranylene group, a benzothiophenylene group, a triazolylene group, a tetrazolylene group, a triazinylene group, a dibenzofuranylene group, and a dibenzothiophenylene group, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzoimidazolyl group, a benzofuranyl group, a benzothiophenyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, a thiadiazolyl group, and an imidazopyridinyl group.

9. The organic light-emitting device as claimed in claim 1, wherein $Li_{11}$, $L_{12}$, and $L_{21}$ to $L_{23}$ are each independently a group represented by one of the following Formulae 3-1 to 3-10:

3-1

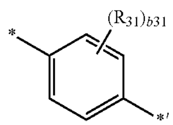

3-2

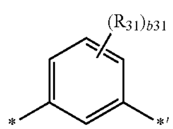

3-3

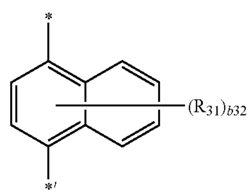

3-4

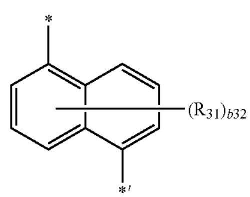

3-5

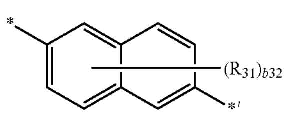

3-6

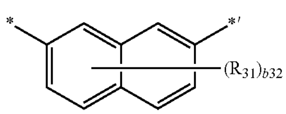

3-7

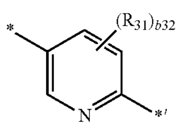

3-8

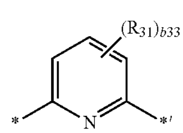

-continued 3-9

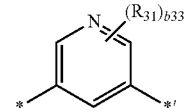

3-10

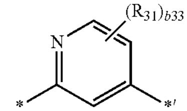

wherein, in Formulae 3-1 to 3-10, $R_{31}$ is selected from a hydrogen, a deuterium, —F, —Cl, —Br, —I, a cyano group, a nitro group, a $C_1$-$C_{20}$ alkyl group, a phenyl group, and a naphthyl group;

b31 is selected from 1, 2, 3, and 4;

b32 is selected from 1, 2, 3, 4, 5, and 6;

b33 is selected from 1, 2, and 3; and

* and *' indicate binding sites to a neighboring atom.

10. The organic light-emitting device as claimed in claim 1, wherein a11, a12, and a21 to a23 are each independently 0 or 1.

11. The organic light-emitting device as claimed in claim 1, wherein $R_{11}$, $R_{12}$, $R_{21}$, and $R_{22}$ are each independently selected from:

a phenyl group, a pentalenyl group, an indenyl group, a naphthyl group, a azulenyl group, a heptalenyl group, an indacenyl group, an acenaphthyl group, a fluorenyl group, a spiro-fluorenyl group, a benzofluorenyl group, a dibenzofluorenyl group, phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, a ovalenyl group, a pyrrolyl group, a thiophenyl group, a furanyl group, a imidazolyl group, a pyrazolyl group, a thiazolyl group, an isothiazolyl group, a oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzoimidazolyl group, a benzofuranyl group, a benzothiophenyl group, an benzothiazolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, a pyridobenzofuranyl group, a pyrimidobenzofuranyl group, a pyridobenzothiophenyl group, and a pyrimidobenzothiophenyl group; and a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a phenanthridinyl group, an acridinyl group, a phenanthrolinyl group, a phenazinyl group, a benzimidazolyl group, a benzofuranyl group, a benzothiophenyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a dibenzosilolyl group, a benzocarbazolyl group, a dibenzocarbazolyl group, an imidazopyridinyl group, an imidazopyrimidinyl group, a pyridobenzofuranyl group, a pyrimidobenzofuranyl group, a pyridobenzothiophenyl group, and a pyrimidobenzothiophenyl group, each substituted with at least one selected from the group of a deuterium, —F, —Cl, —Br, —I, a hydroxyl group, a cyano group, a nitro group, an amino group, an amidino group, a hydrazine group, a hydrazone group, a carboxylic acid or a salt thereof, a sulfonic acid or a salt thereof, a phosphoric acid or a salt thereof, a $C_6$-$C_{20}$ alkyl group, a $C_1$-$C_{20}$ alkoxy group, a phenyl group, a pentalenyl group, an indenyl group, a naphthyl group, an azulenyl group, a heptalenyl group, an indacenyl group, an acenaphthyl group, a fluorenyl group, a spiro-fluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a pyrrolyl group, a thiophenyl group, a furanyl group, an imidazolyl group, a pyrazolyl group, a thiazolyl group, an isothiazolyl group, an oxazolyl group, an isoxazolyl group, a pyridinyl group, a pyrazinyl group, a pyrimidinyl group, a pyridazinyl group, an isoindolyl group, an indolyl group, an indazolyl group, a purinyl group, a quinolinyl group, an isoquinolinyl group, a carbazolyl group, a benzoquinolinyl group, a phthalazinyl group, a naphthyridinyl group, a quinoxalinyl group, a quinazolinyl group, a cinnolinyl group, a carbazolyl group, a phenanthridinyl group, an acridinyl group, a phenanthrolinyl group, a phenazinyl group, a benzimidazolyl group, a benzofuranyl group, a benzothiophenyl group, a benzothiazolyl group, an isobenzothiazolyl group, a benzoxazolyl group, an isobenzoxazolyl group, a triazolyl group, a tetrazolyl group, an oxadiazolyl group, a triazinyl group, a dibenzofuranyl group, a dibenzothiophenyl group, a benzocarbazolyl group, a dibenzocarbazolyl group, and —Si($Q_{31}$)($Q_{32}$)($Q_{33}$); in which $Q_{31}$ to $Q_{33}$ are each independently selected from a $C_1$-$C_{60}$ alkyl group and a $C_6$-$C_{60}$ aryl group.

12. The organic light-emitting device as claimed in claim 1, wherein $R_{11}$, $R_{12}$, $R_{21}$, and $R_{22}$ are each independently selected from:

a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an oxazolyl group, a pyridinyl group, a pyrazinyl group, a pyrimidinyl group, an indolyl group, a quinolinyl group, an isoquinolinyl group, a carbazolyl group, a benzoquinolinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a triazolyl group, a triazinyl group, a dibenzofuranyl group, a dibenzothiophenyl group, an imidazopyridinyl group, an imidazopyrimidinyl group, a pyridobenzofuranyl group, a pyrimidobenzofuranyl group, a pyridobenzothiophenyl group, and a pyrimidobenzothiophenyl group; and a phenyl group, a naphthyl group, a fluorenyl group, a spiro-fluorenyl group, a benzofluorenyl group, a dibenzofluorenyl group, a phenanthrenyl group, an anthracenyl group, a triphenylenyl group, a pyrenyl group, a chrysenyl group, a pyrrolyl group, a thiophenyl group, a furanyl group, an imidazolyl group, a pyrazolyl group, a thiazolyl group, an oxazolyl group, a pyridinyl group, a pyrazinyl group, a pyrimidinyl group, an indolyl group, a quinolinyl group, an isoquinolinyl group, a carbazolyl group, a benzoquinolinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a triazolyl group, a triazinyl group, a dibenzofuranyl group, a dibenzothiophenyl group, an imidazopyridinyl group, an imidazopyrimidinyl group, a pyridobenzofuranyl group, a pyrimidobenzofuranyl group, a pyridobenzothiophenyl group, and a pyrimidobenzothiophenyl group, each substituted with at least one selected from the group of a deuterium, —F, —Cl, —Br, —I, a cyano group, a nitro group, a $C_1$-$C_{20}$ alkyl group, a phenyl group, a naphthyl group, and —Si($Q_{31}$)($Q_{32}$)($Q_{33}$); in which $Q_{31}$ to $Q_{33}$ are each independently selected from a methyl group, an ethyl group, an n-propyl group, an iso-propyl group, an n-butyl group, an iso-butyl group, a sec-butyl group, a tert-butyl group, and a phenyl group.

13. The organic light-emitting device as claimed in claim 1, wherein $R_{11}$, $R_{12}$, $R_{21}$, and $R_{22}$ are each independently selected from:

a phenyl group, a naphthyl group, a fluorenyl group, a phenanthrenyl group, an anthracenyl group, a triphenylenyl group, a pyridinyl group, a pyrazinyl group, a pyrimidinyl group, a quinolinyl group, an isoquinolinyl group, a carbazolyl group, a benzoquinolinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a triazolyl group, a triazinyl group, a dibenzofuranyl group, a dibenzothiophenyl group, an imidazopyridinyl group, an imidazopyrimidinyl group, a pyridobenzofuranyl group, a pyrimidobenzofuranyl group, a pyridobenzothiophenyl group, and a pyrimidobenzothiophenyl group; and a phenyl group, a naphthyl group, a phenanthrenyl group, an anthracenyl group, a triphenylenyl group, a pyridinyl group, a pyrazinyl group, a pyrimidinyl group, a quinolinyl group, an isoquinolinyl group, a carbazolyl group, a benzoquinolinyl group, a naphthyridinyl group, a quinoxalinyl group, a quinazolinyl group, a phenanthridinyl group, an acridinyl group, a phenanthrolinyl group, a phenazinyl group, a benzimidazolyl group, a benzofuranyl group, a benzothiophenyl group, a triazolyl group, a triazinyl group, a dibenzofuranyl group, a dibenzothiophenyl group, an imidazopyridinyl group, an imidazopyrimidinyl group, a pyridobenzofuranyl group, a pyrimidobenzofuranyl group, a pyridobenzothiophenyl group, and a pyrimidobenzothiophenyl group, each substituted with at least one selected from the group of a deuterium, —F, —Cl, —Br, —I, a cyano group, a nitro group, a $C_1$-$C_{20}$ alkyl group, a phenyl group, a naphthyl group, and —Si($Q_{31}$)($Q_{32}$)($Q_{33}$); in which $Q_{31}$ to $Q_{33}$ are each independently selected from a methyl group, an ethyl group, an n-propyl group, an iso-propyl group, an n-butyl group, an iso-butyl group, a sec-butyl group, and a tert-butyl group.

14. The organic light-emitting device as claimed in claim 1, wherein $R_{11}$, $R_{12}$, $R_{21}$, and $R_{22}$ are each independently a group represented by one of the following Formulae 5-1 to 5-34 and 5-36 to 5-57:

5-1

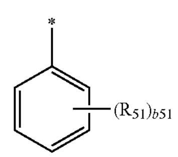

5-2

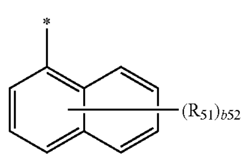

5-3

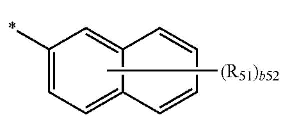

5-4

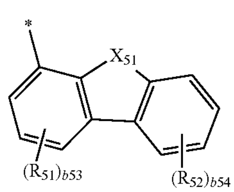

5-5

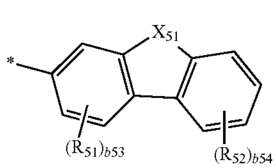

-continued 5-6

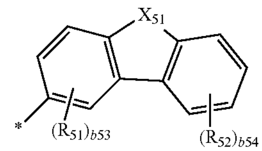

5-7

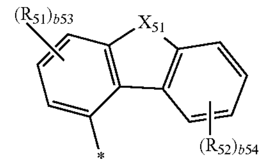

5-8

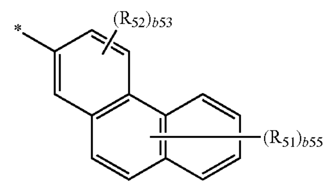

5-9

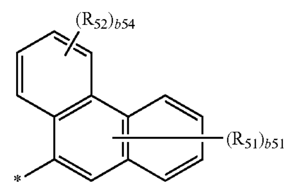

5-10

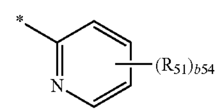

5-11

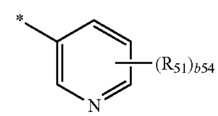

5-12

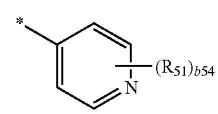

5-13

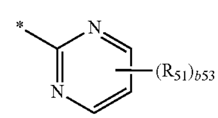

5-14

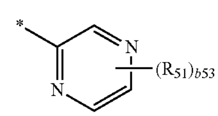

5-15

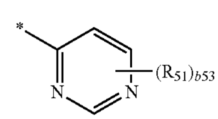

5-16

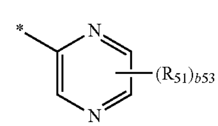

-continued
5-17
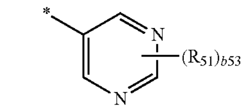
5-18
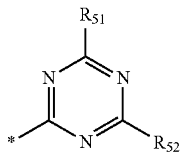
5-19
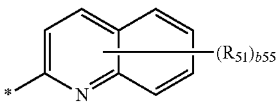
5-20
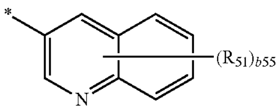
5-21
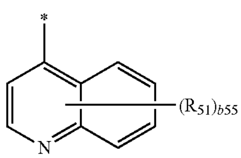
5-22
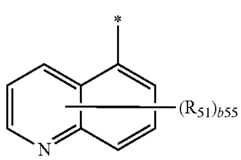
5-23
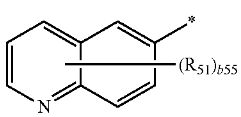
5-24
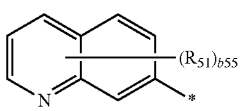
5-25
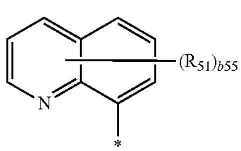
5-26
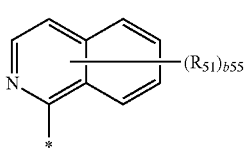
5-27
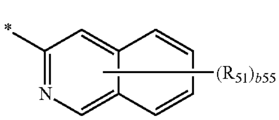
-continued
5-28
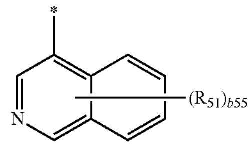
5-29
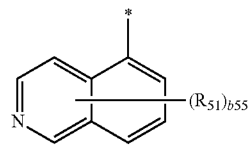
5-30
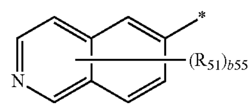
5-31
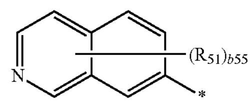
5-32
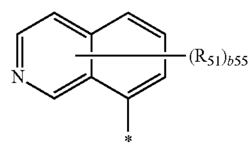
5-33
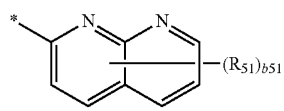
5-34
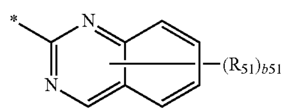
5-36
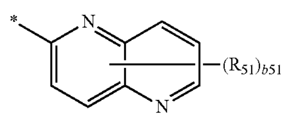
5-37
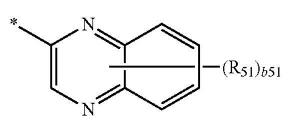
5-38
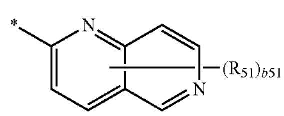
5-39
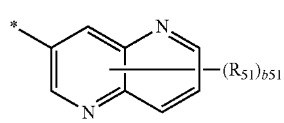
5-40
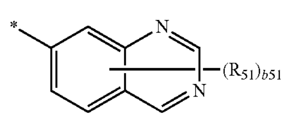
5-41
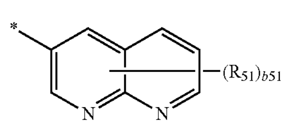

-continued 5-42

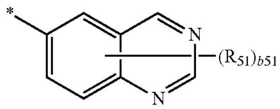

5-43

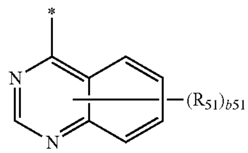

5-44

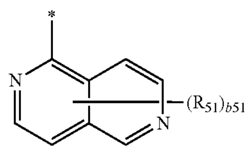

5-45

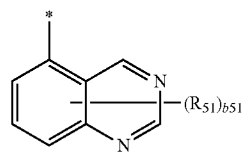

5-46

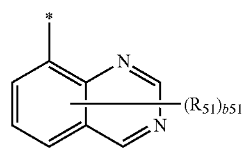

5-47

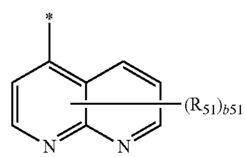

5-48

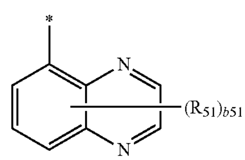

5-49

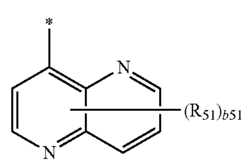

5-50

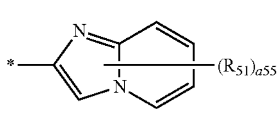

5-51

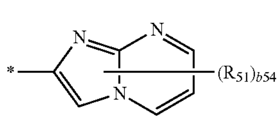

-continued 5-52

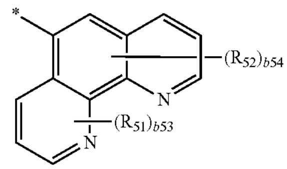

5-53

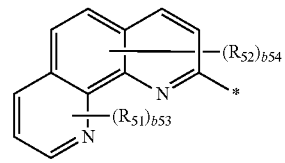

5-54

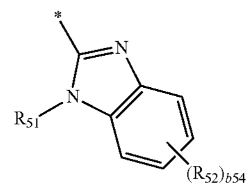

5-55

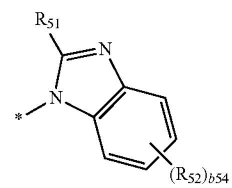

5-56

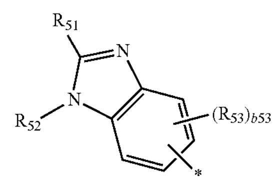

5-57

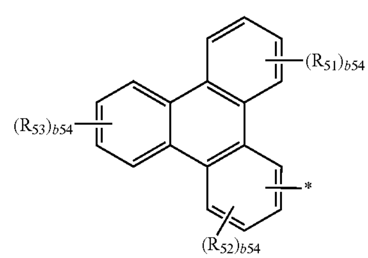

wherein, in Formulae 5-1 to 5-34 and 5-36 to 5-57, $X_{51}$ is selected from O, S, and $C(R_{54})(R_{55})$;

$R_{51}$ to $R_{55}$ are each independently selected from a hydrogen, a deuterium, —F, —Cl, —Br, —I, a cyano group, a nitro group, a $C_1$-$C_{20}$ alkyl group, a phenyl group, a naphthyl group, and $—Si(CH_3)_3$;

b51 is selected from 1, 2, 3, 4, and 5;

b52 is selected from 1, 2, 3, 4, 5, 6, and 7;

b53 is selected from 1, 2, and 3;

b54 is selected from 1, 2, 3, and 4;

b55 is selected from 1, 2, 3, 4, 5, and 6; and

* indicates a binding site to a neighboring atom.

15. The organic light-emitting device as claimed in claim 1, wherein $R_{11}$, $R_{12}$, $R_{21}$, and $R_{22}$ are each independently a group represented by one of the following Formulae 6-1 to 6-194:

6-1
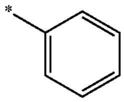
6-2
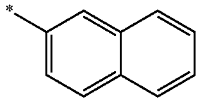
6-3
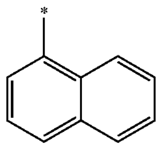
6-4
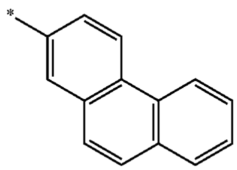
6-5
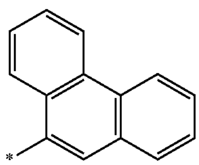
6-6
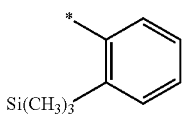
6-7
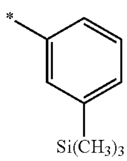
6-8
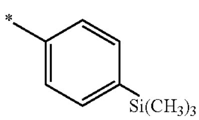
6-9
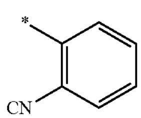
6-10
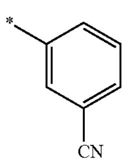
6-11
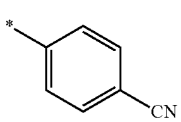
-continued
6-12
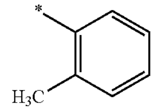
6-13
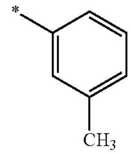
6-14
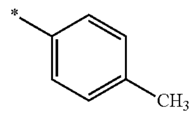
6-15
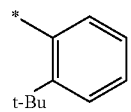
6-16
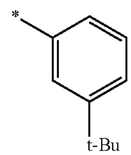
6-17
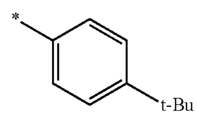
6-18
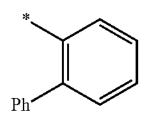
6-19
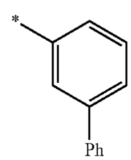
6-20
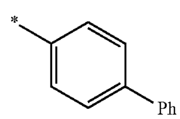
6-21
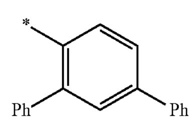
6-22
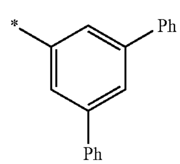

-continued
6-23
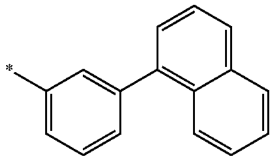
6-24
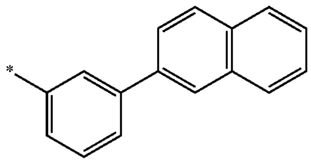
6-25
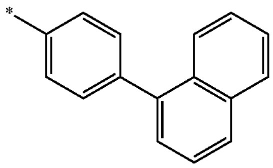
6-26
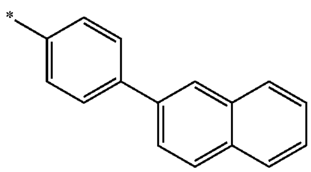
6-27
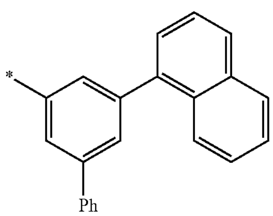
6-28
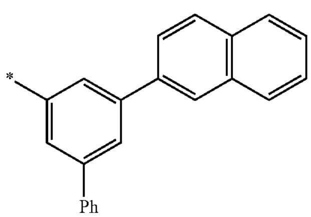
6-29
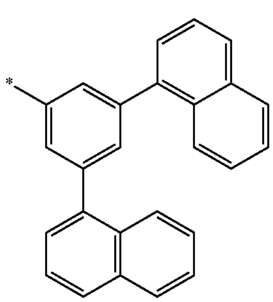
-continued
6-30
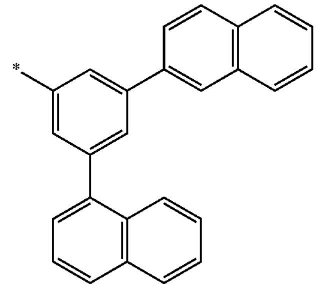
6-31
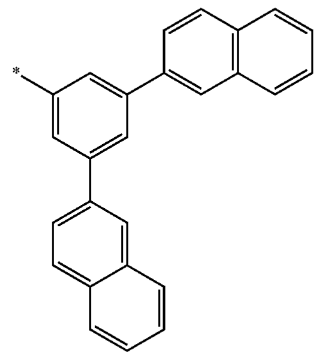
6-32
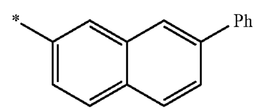
6-33
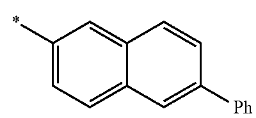
6-34
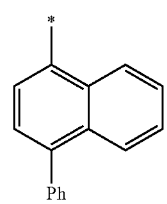
6-35
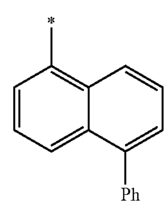
6-36
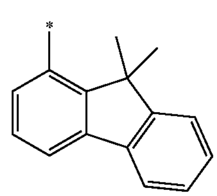

-continued
6-37
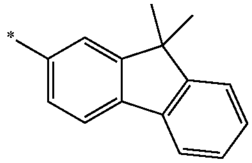
6-38
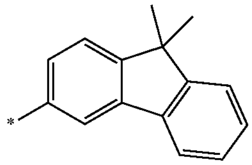
6-39
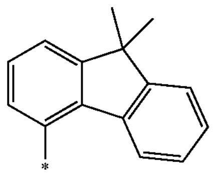
6-40
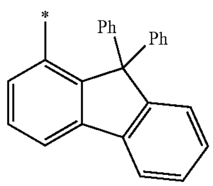
6-41
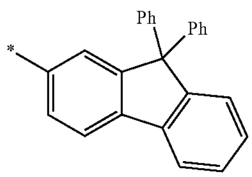
6-42
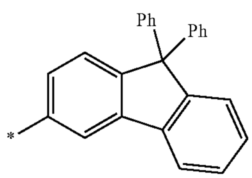
6-43
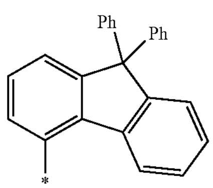
6-44
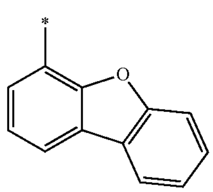
6-45
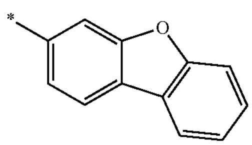
-continued
6-46
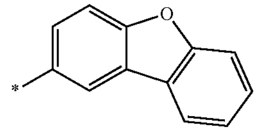
6-47
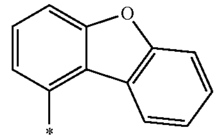
6-48
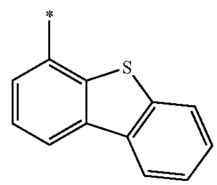
6-49
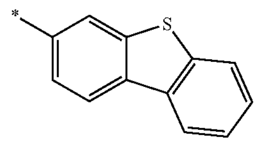
6-50
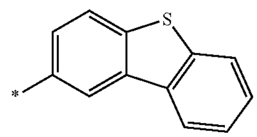
6-51
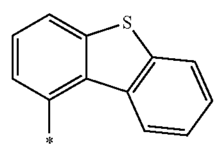
6-52
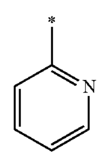
6-53
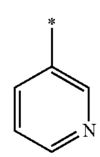
6-54
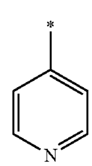
6-55
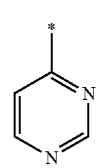

-continued
6-56
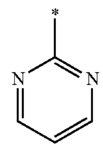
6-57
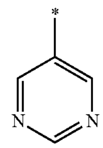
6-58
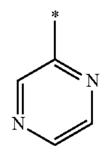
6-59
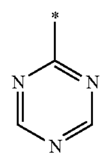
6-60
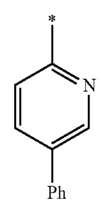
6-61
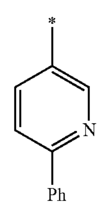
6-62
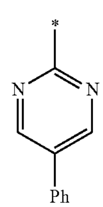
6-63
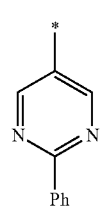
-continued
6-64
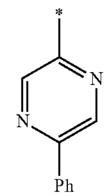
6-65
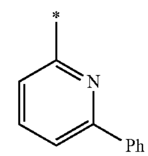
6-66
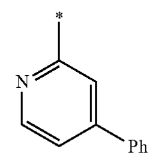
6-67
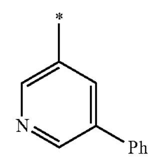
6-68
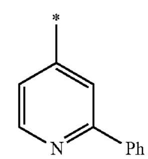
6-69
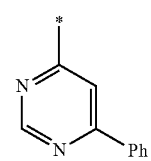
6-70
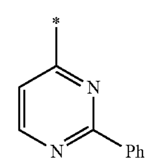
6-71
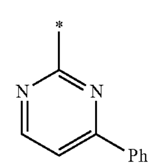
6-72
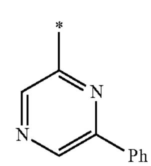

-continued
6-73
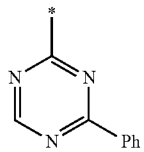
6-74
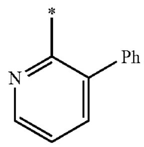
6-75
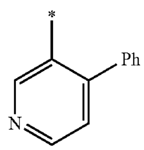
6-76
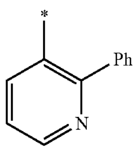
6-77
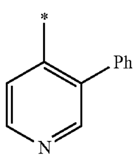
6-78
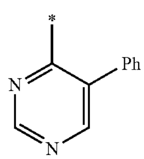
6-79
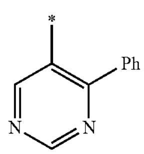
6-80
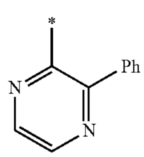
6-81
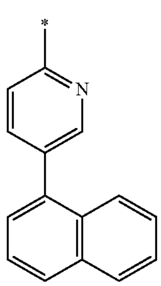
-continued
6-82
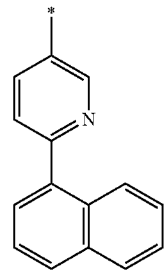
6-83
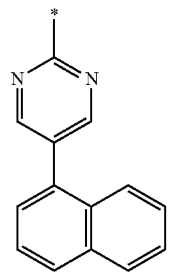
6-84
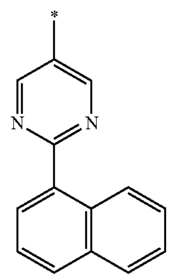
6-85
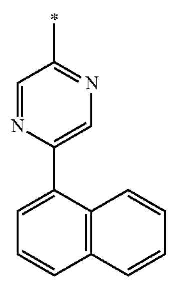
6-86
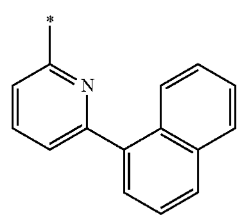
6-87
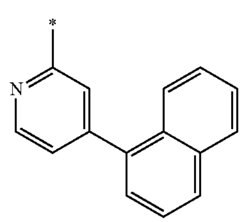

6-88
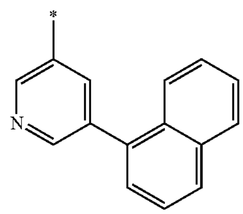
6-89
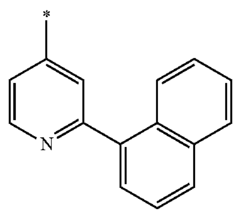
6-90
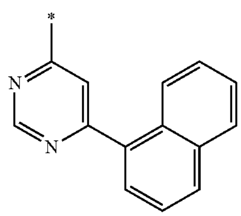
6-91
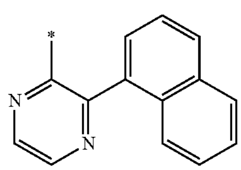
6-92
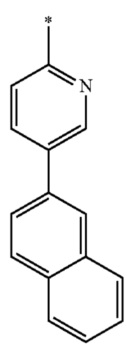
6-93
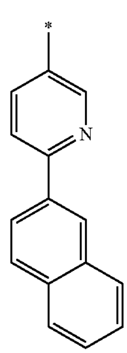
6-94
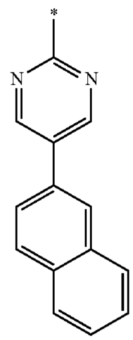
6-95
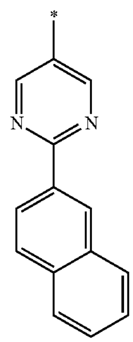
6-96
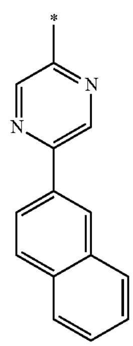
6-97
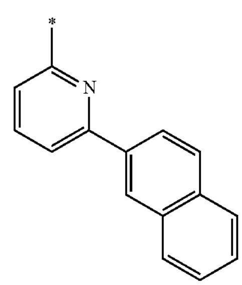
6-98
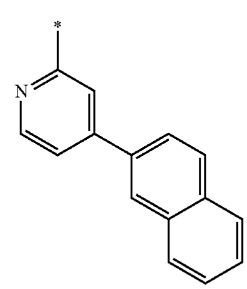

-continued
6-99
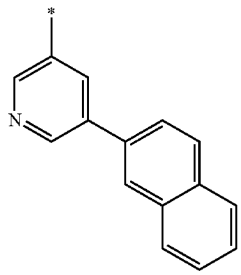
6-100
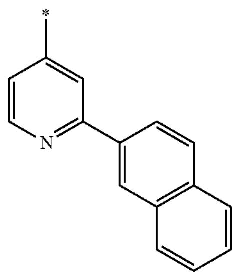
6-101
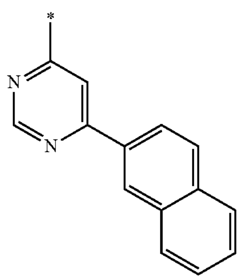
6-102
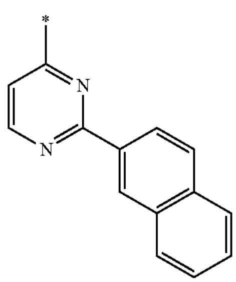
6-103
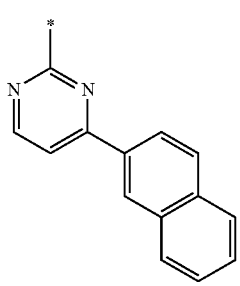
-continued
6-104
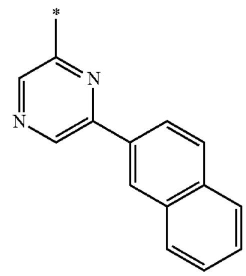
6-105
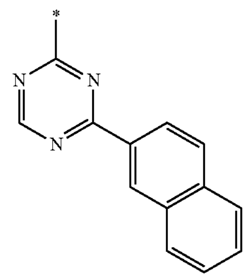
6-106
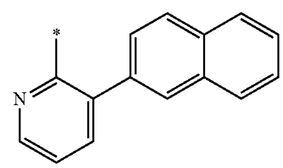
6-107
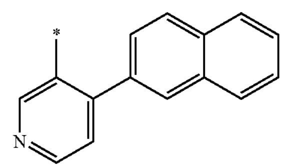
6-108
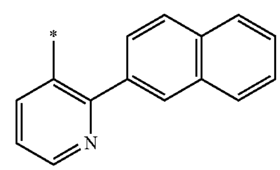
6-109
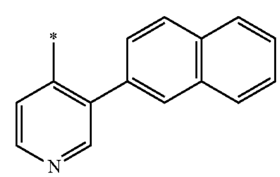
6-110
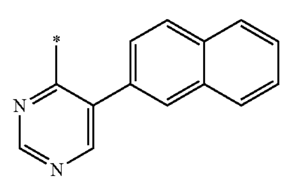
6-111
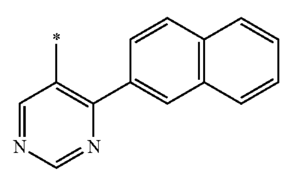

-continued
6-112
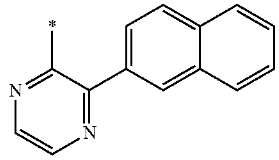
6-113
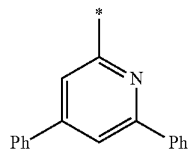
6-114
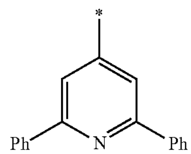
6-115
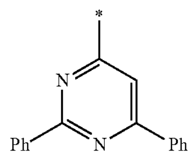
6-116
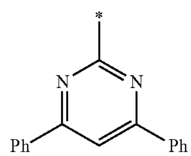
6-117
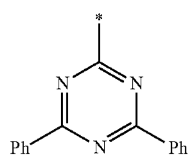
6-118
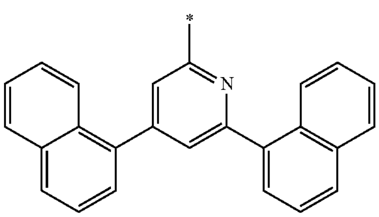
6-119
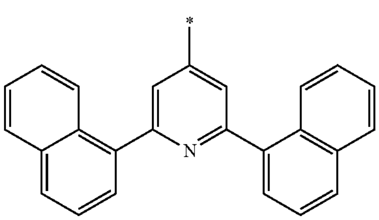
6-120
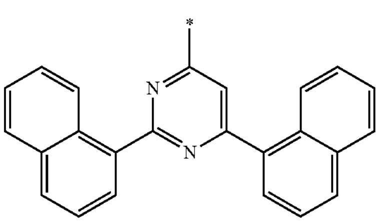
-continued
6-121
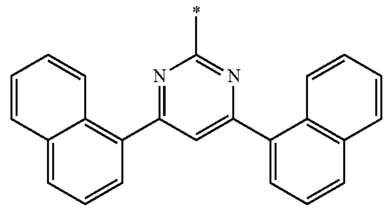
6-122
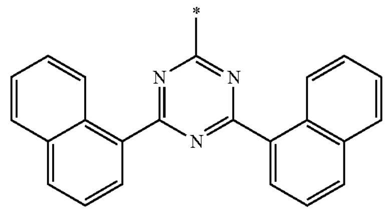
6-123
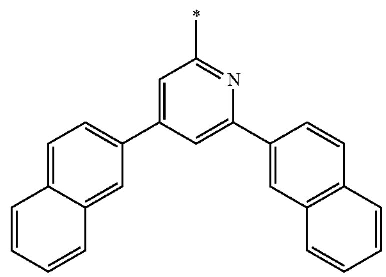
6-124
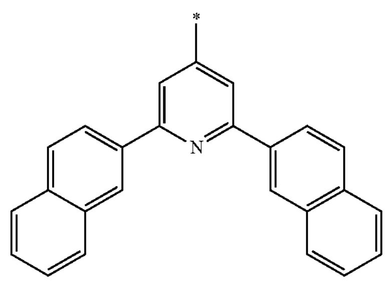
6-125
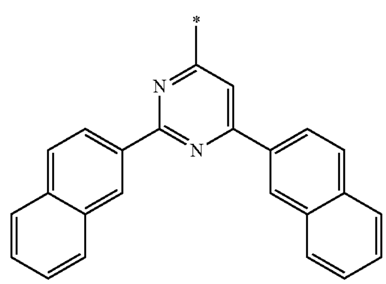
6-126
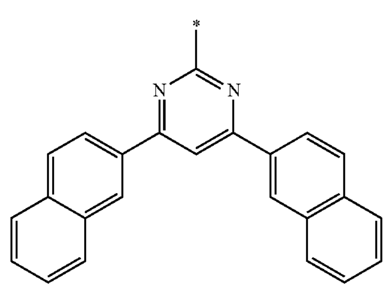

-continued
6-127
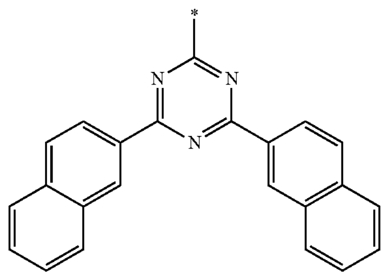
6-128
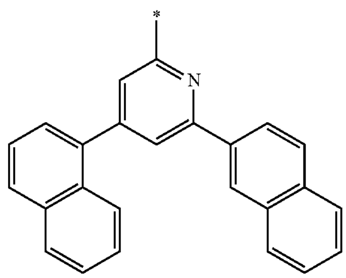
6-129
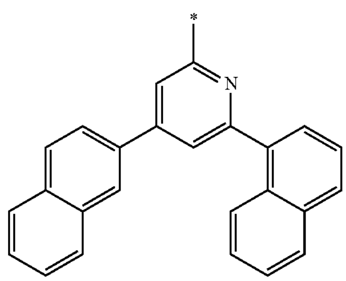
6-130
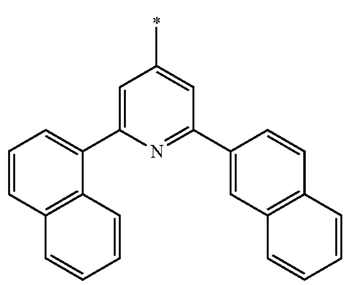
6-131
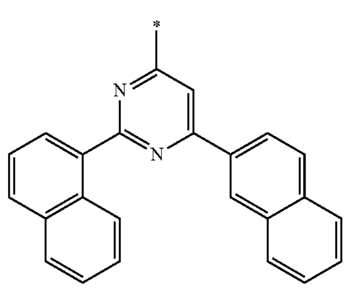
-continued
6-132
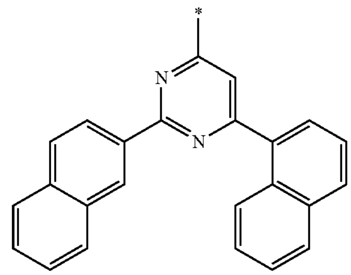
6-133
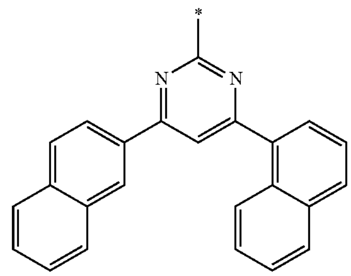
6-134
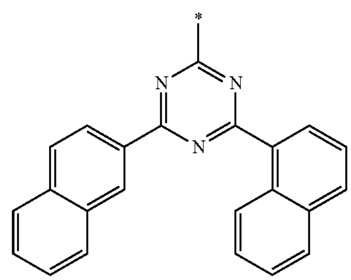
6-135
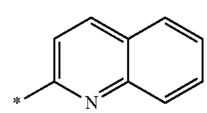
6-136
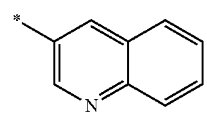
6-137
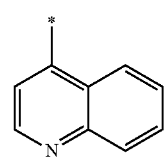
6-138
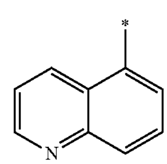
6-139
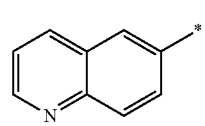
6-140
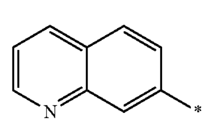

-continued
6-141
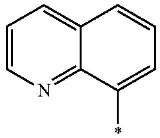
6-142
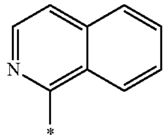
6-143
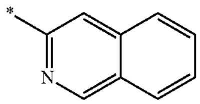
6-144
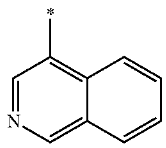
6-145
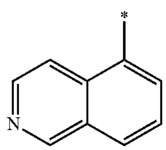
6-146
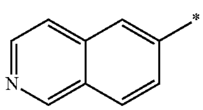
6-147
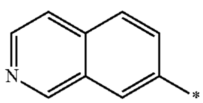
6-148
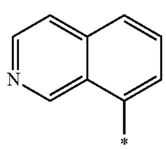
6-149
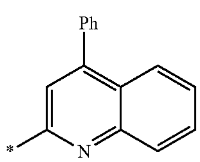
6-150
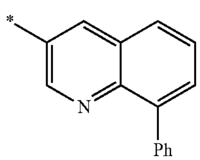
6-151
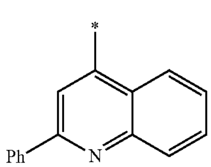
-continued
6-152
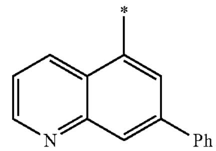
6-153
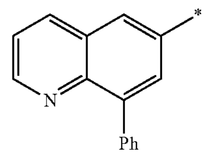
6-154
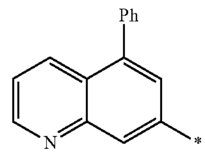
6-155
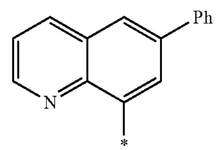
6-156
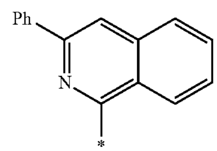
6-157
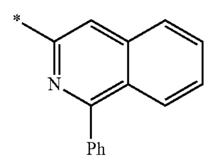
6-158
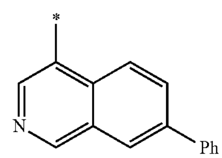
6-159
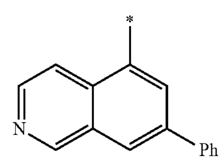
6-160
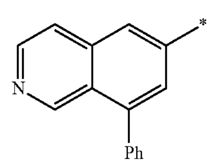
6-161
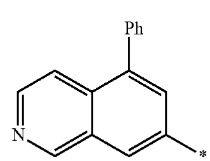

-continued
6-162
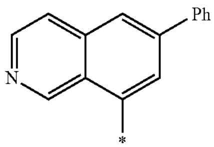
6-163
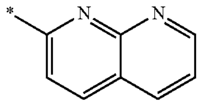
6-164
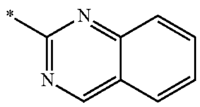
6-165
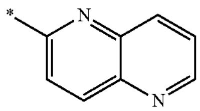
6-166
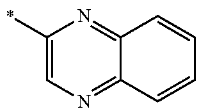
6-167
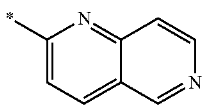
6-168
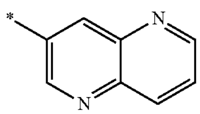
6-169
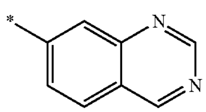
6-170
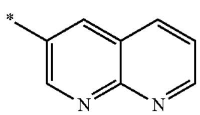
6-171
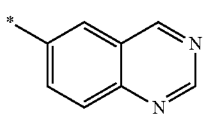
6-172
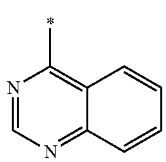
6-173
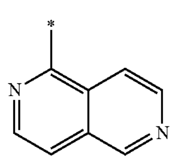
-continued
6-174
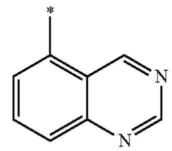
6-175
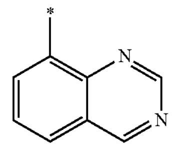
6-176
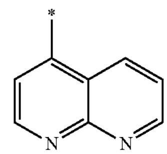
6-177
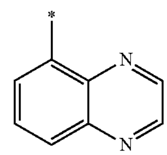
6-178
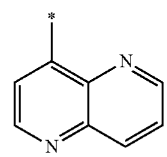
6-179
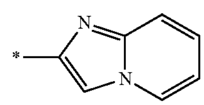
6-180
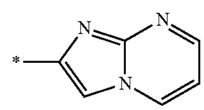
6-181
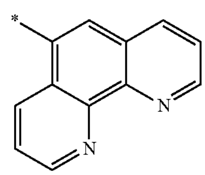
6-182
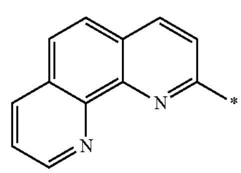
6-183
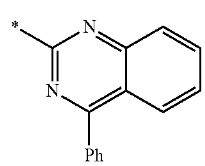

-continued 6-184

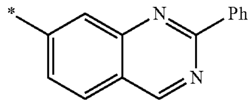

6-185

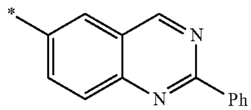

6-186

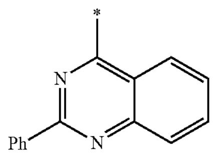

6-187

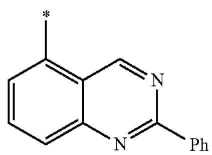

6-188

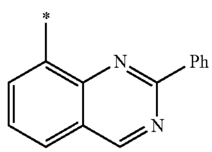

6-189

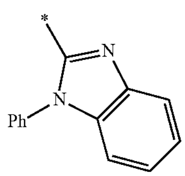

6-190

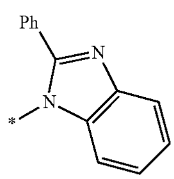

6-191

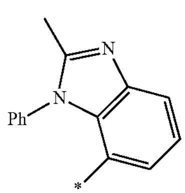

6-192

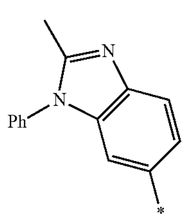

-continued 6-193

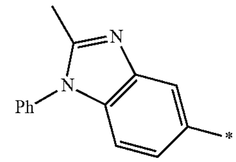

6-194

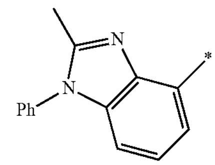

wherein, in Formulae 6-1 to 6-194, t-Bu indicates a tert-butyl group;

Ph indicates a phenyl group; and

* indicates a binding site to a neighboring atom.

16. The organic light-emitting device as claimed in claim 1, wherein b11, b12, b21, and b22 are 1.

17. The organic light-emitting device as claimed in claim 1, wherein $R_{13}$ to $R_{15}$ and $R_{23}$ to $R_{25}$ are each independently selected from a hydrogen, a deuterium, —F, —Cl, —Br, —I, a cyano group, a nitro group, a methyl group, an ethyl group, an n-propyl group, an iso-propyl group, an n-butyl group, a sec-butyl group, an iso-butyl group, a tert-butyl group, an n-pentyl group, an n-hexyl group, an n-heptyl group, an n-octyl group, a phenyl group, and a naphthyl group.

18. The organic light-emitting device as claimed in claim 1, wherein n21 is 1.

19. The organic light-emitting device as claimed in claim 1, wherein:

the first compound is represented by one of the following Formulae 1-11 to 1-14; and 1-11

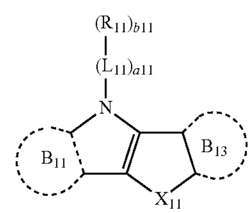

1-12

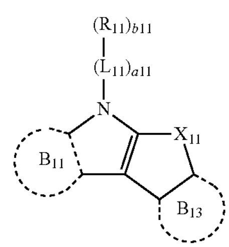

1-13

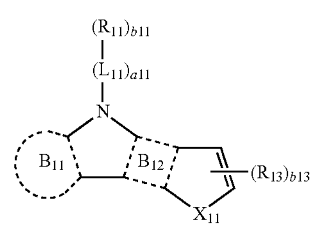

-continued 1-14

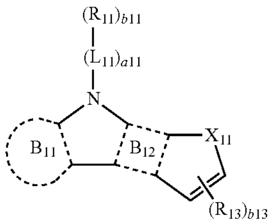

the second compound is represented by one of the following Formulae 2-11 to 2-15:

2-11

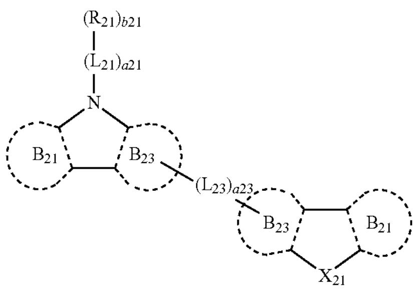

2-12

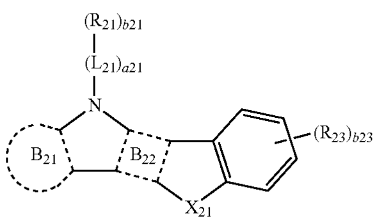

2-13

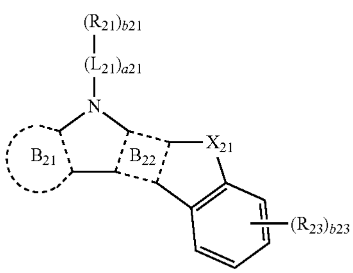

2-14

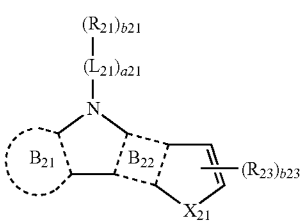

2-15

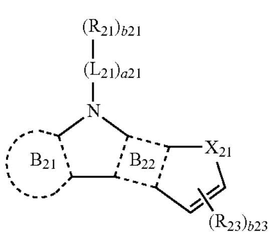

wherein, in Formulae 1-11 to 1-14 and 2-11 to 2-15, $B_1$ to $B_{13}$, $L_1$, a11, $R_{11}$, $R_{13}$, b11, b13, $X_{11}$, $B_{21}$ to $B_{23}$, $L_{21}$, $L_{23}$, a21, a23, $R_{21}$, $R_{23}$, $b_{21}$, $b_{23}$, and $X_{21}$ are defined the same as $B_{11}$ to $B_{13}$, $L_{11}$, a11, $R_{11}$, $R_{13}$, b11, b13, $X_{11}$, $B_{21}$ to $B_{23}$, $L_{21}$, $L_{23}$, a21, a23, $R_{21}$, $R_{23}$, $b_{21}$, $b_{23}$, and $X_{21}$ of Formulae 1-1, 1-2, 2-1, and 2-2.

20. The organic light-emitting device as claimed in claim 1, wherein:

the first compound is one of the following Compounds 101 to 174; and the second compound is one of the following Compounds 201 to 298:

101

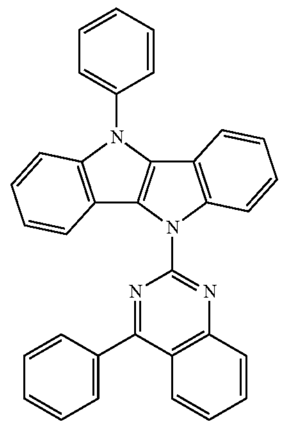

102

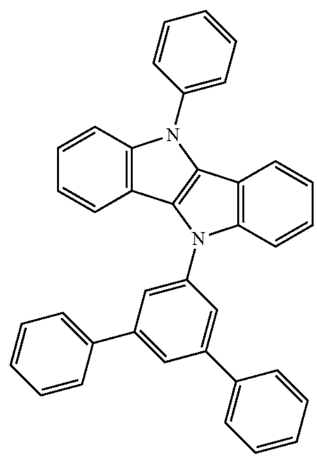

103

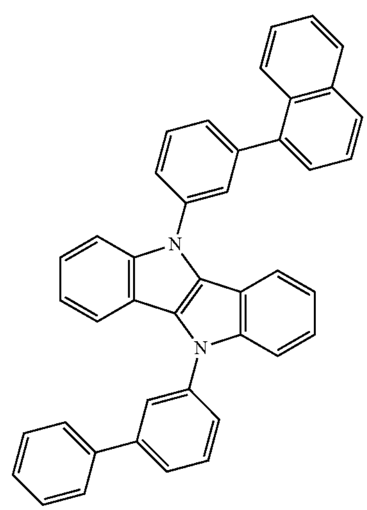

-continued
104
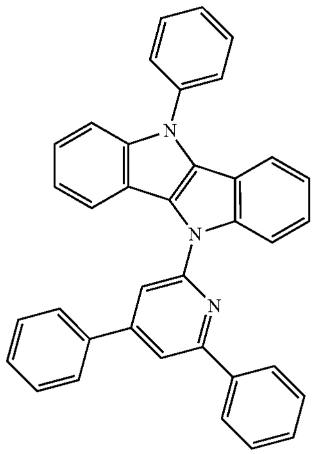
105
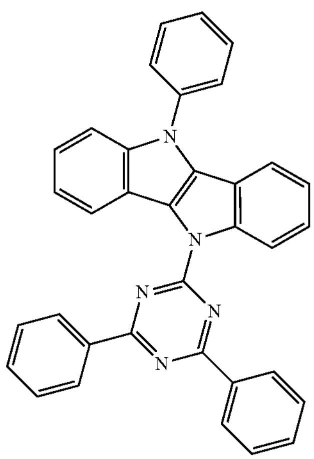
106
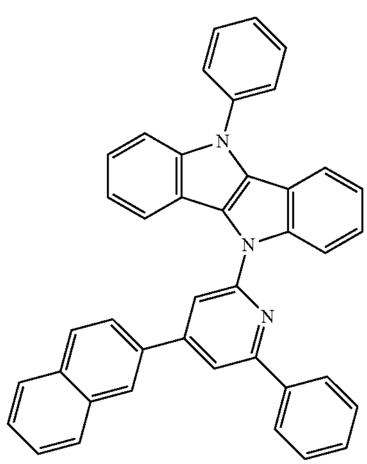
-continued
107
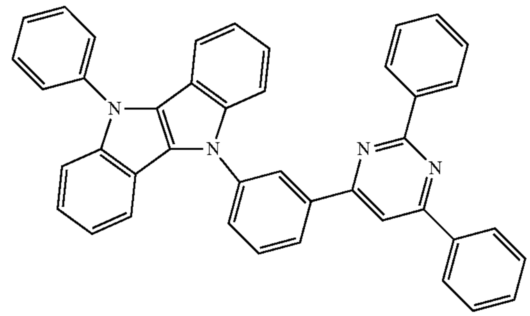
108
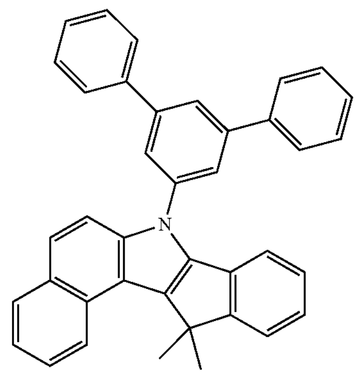
109
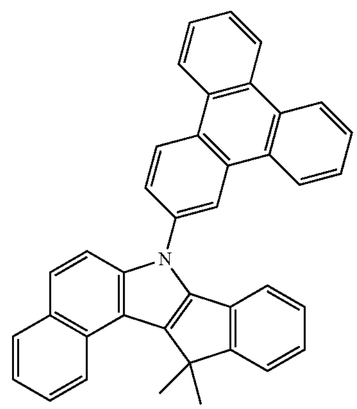
110
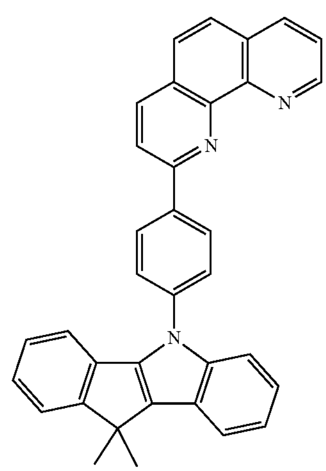

-continued
111
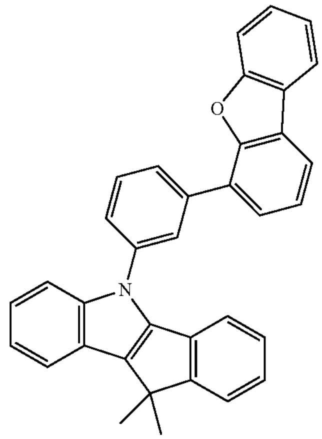
112
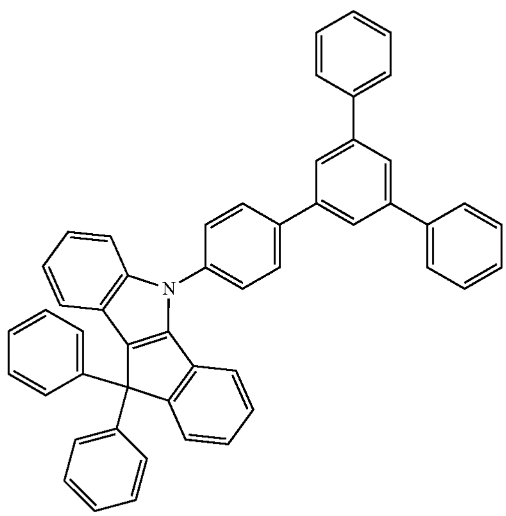
113
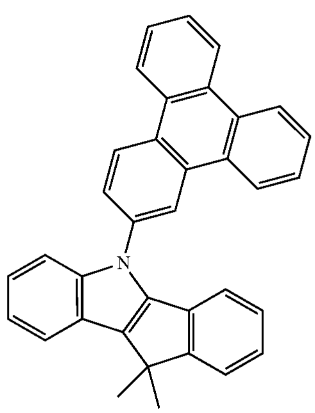
-continued
114
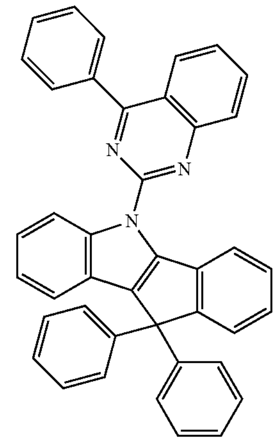
115
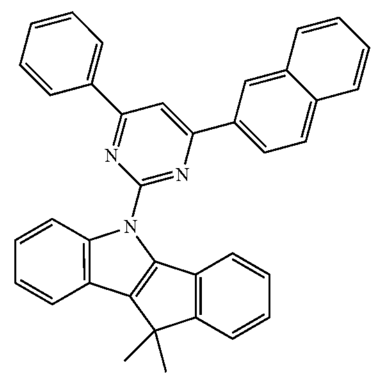
116
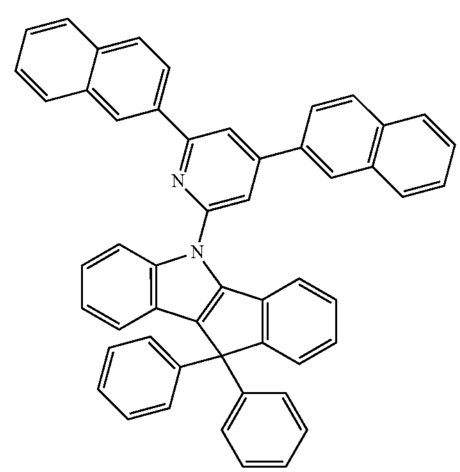

117
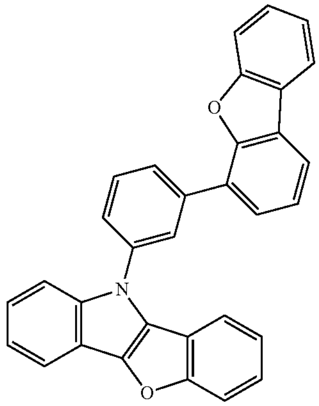
118
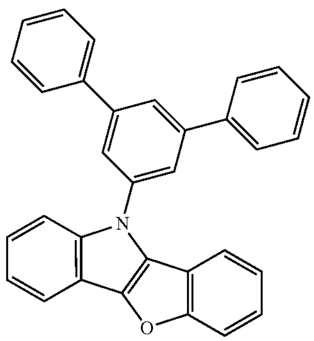
119
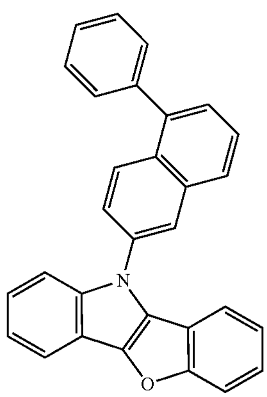
120
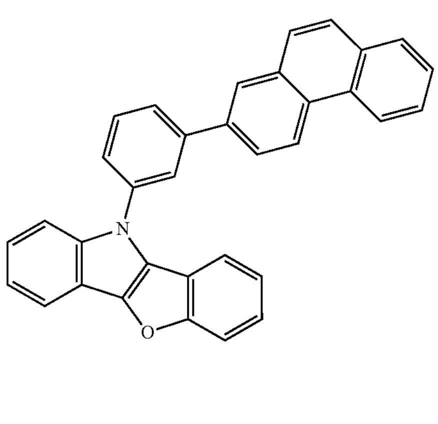
121
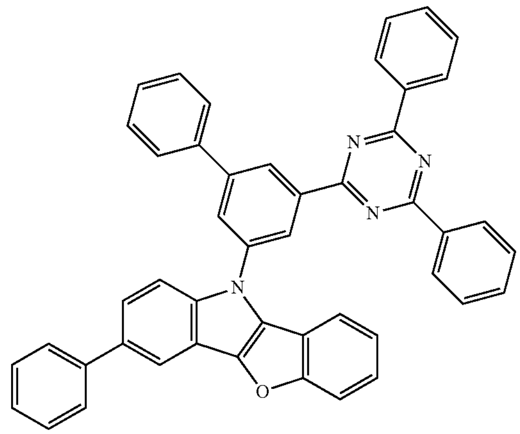
122
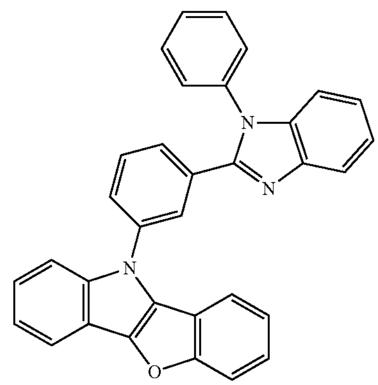
123
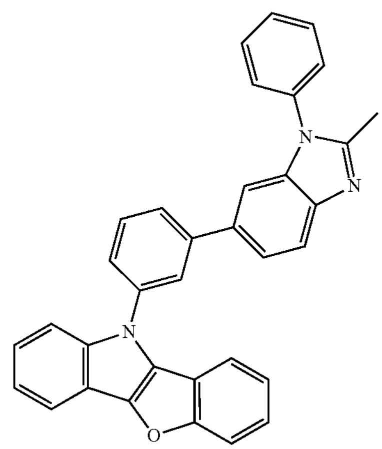
124
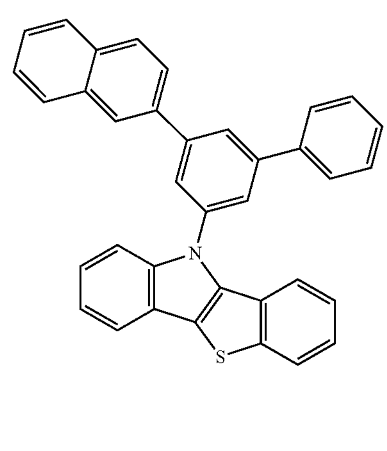

-continued
125
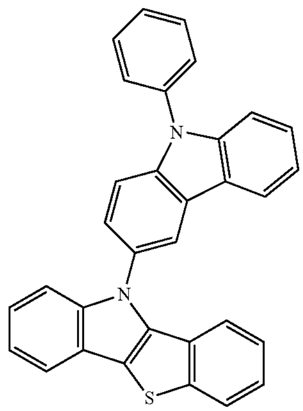
126
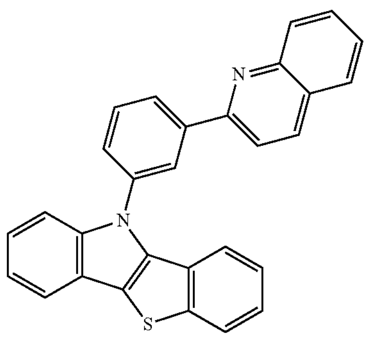
127
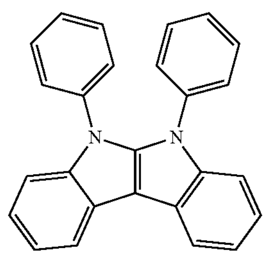
128
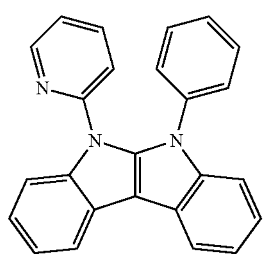
129
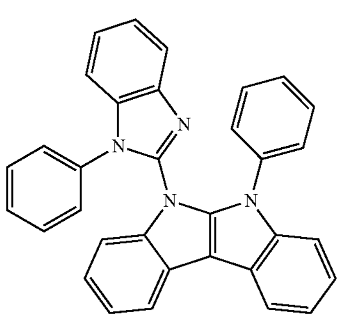
-continued
130
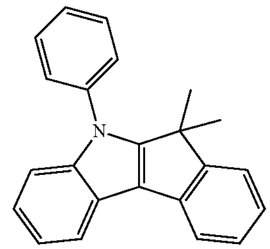
131
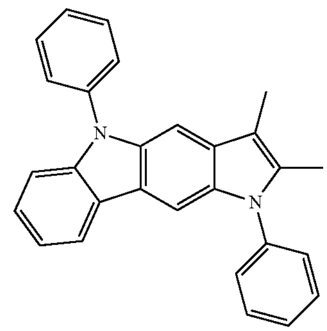
132
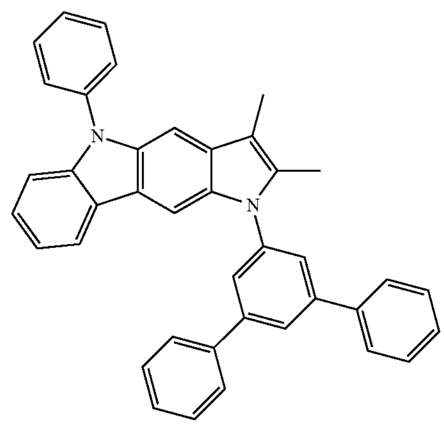
133
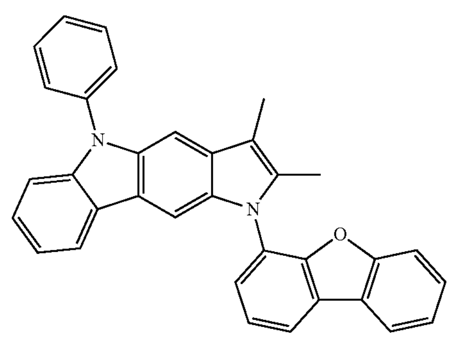

-continued
134
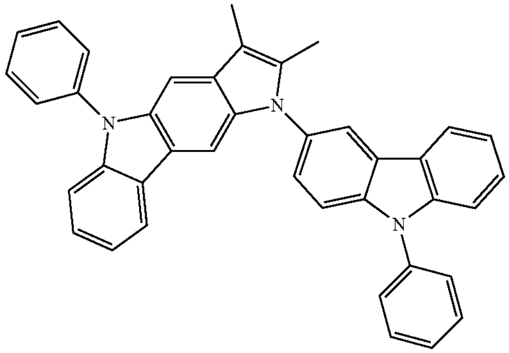
135
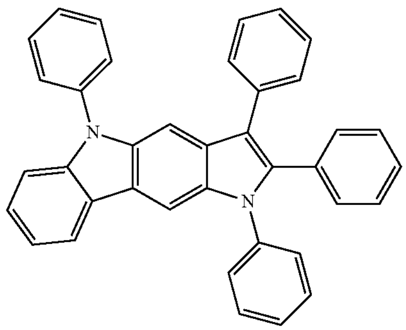
136
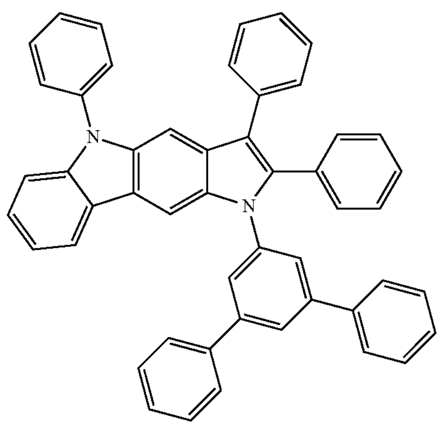
137
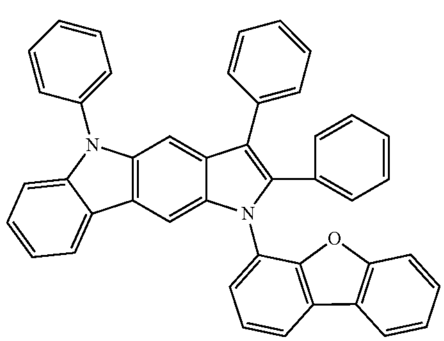
-continued
138
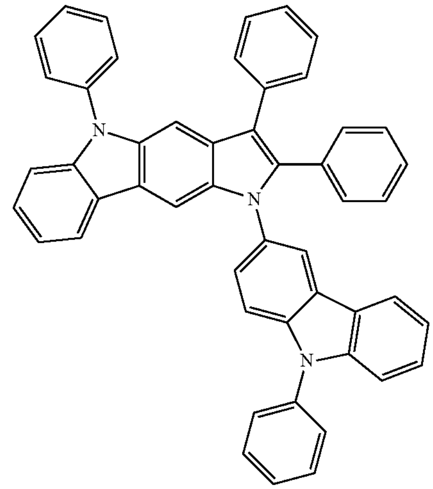
139
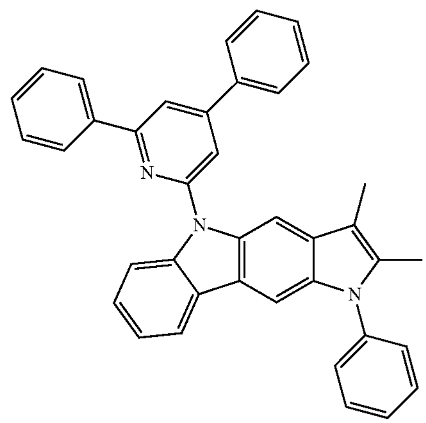
140
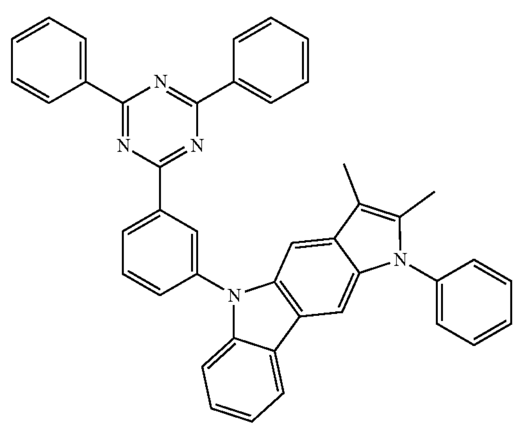

-continued
141
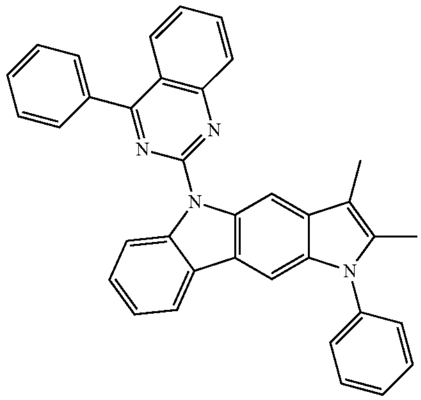
142
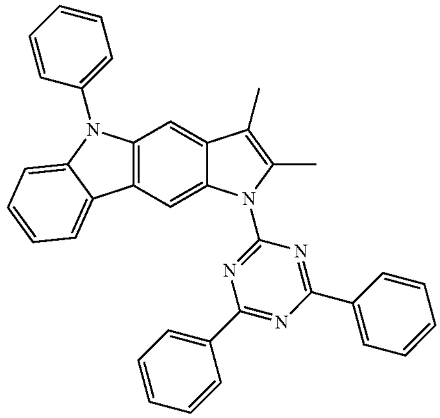
143
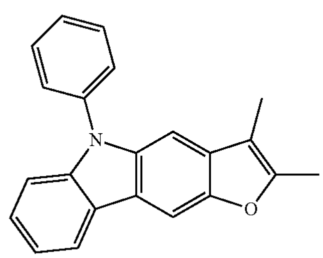
144
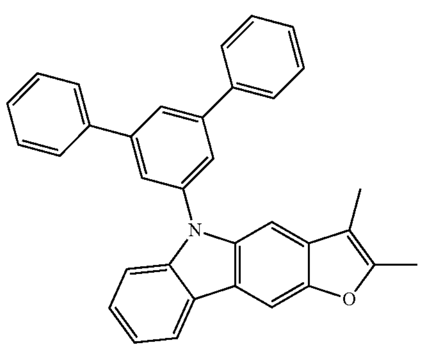
-continued
145
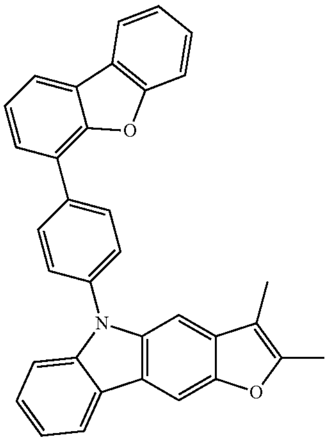
146
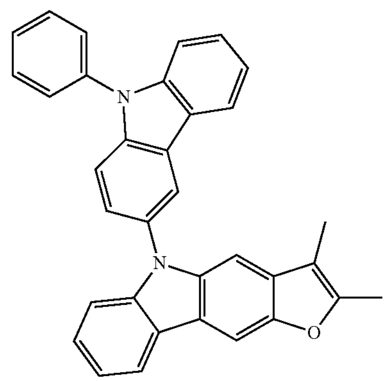
147
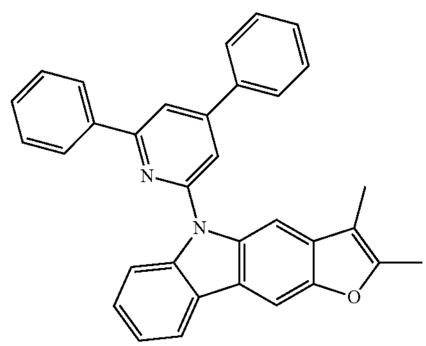
148
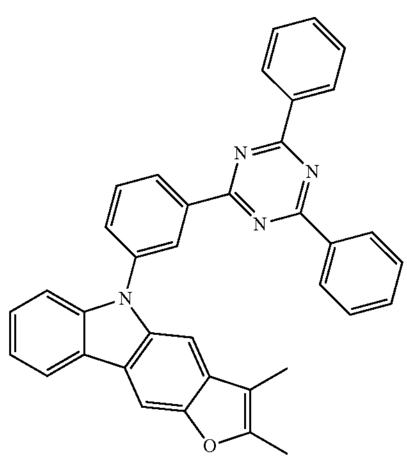

-continued
149
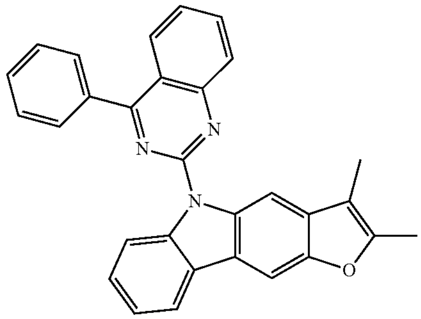
150
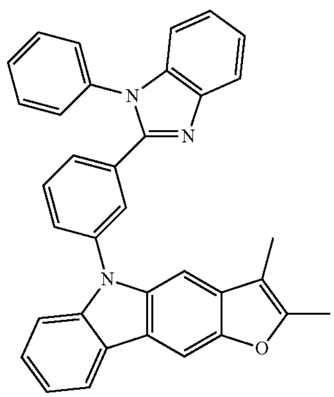
151
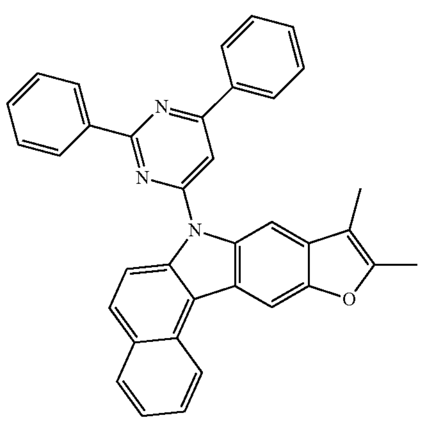
152
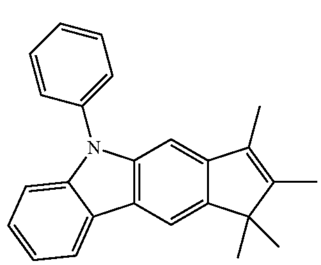
-continued
153
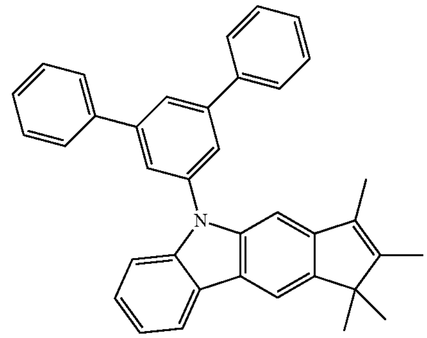
154
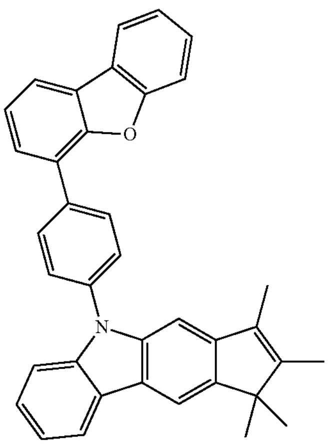
155
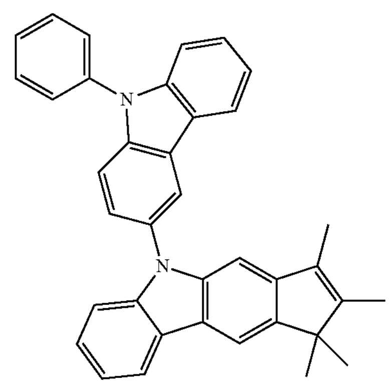
156
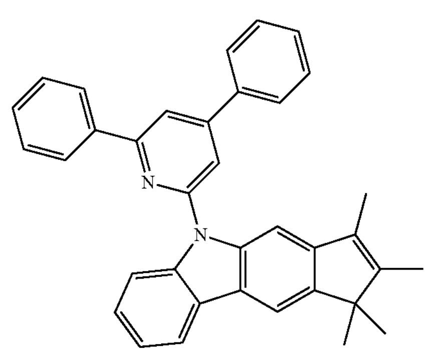

-continued
157
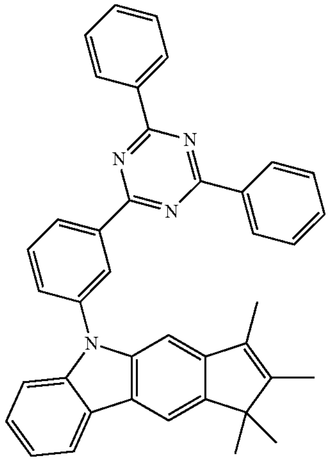
158
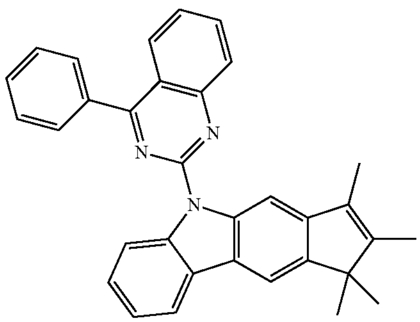
159
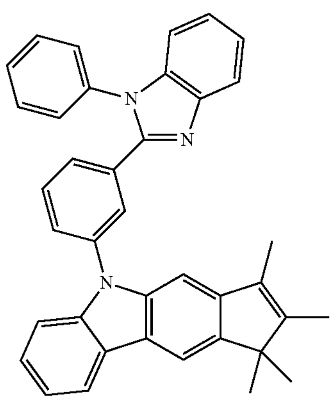
160
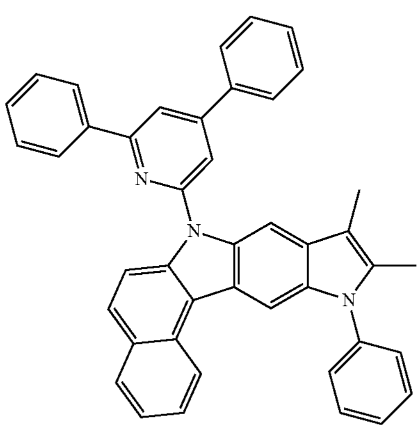
-continued
161
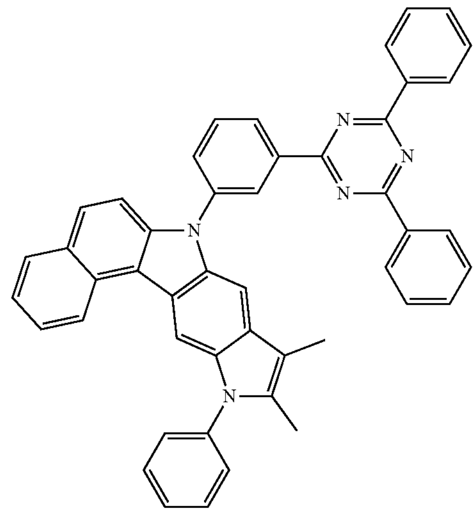
162
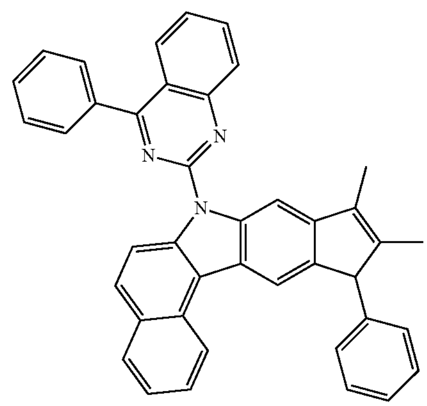
163
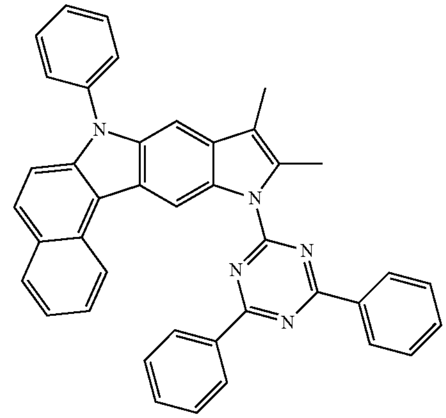

-continued
164
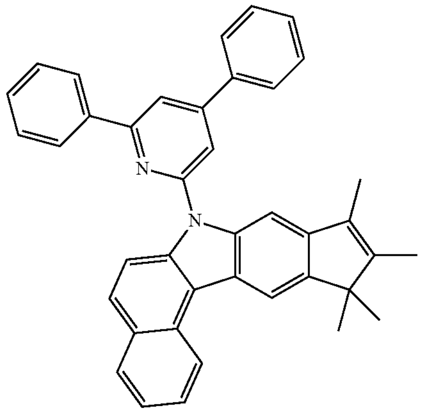
165
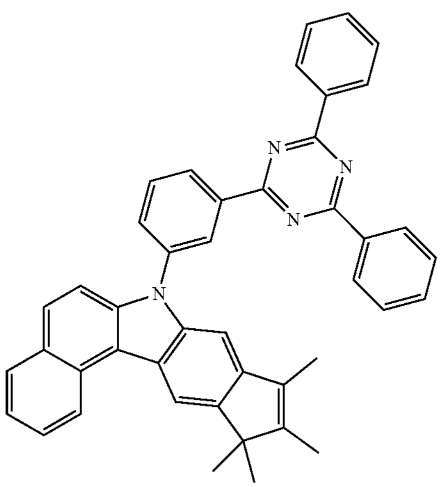
166
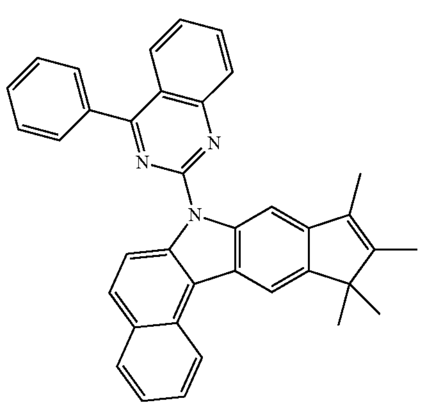
-continued
167
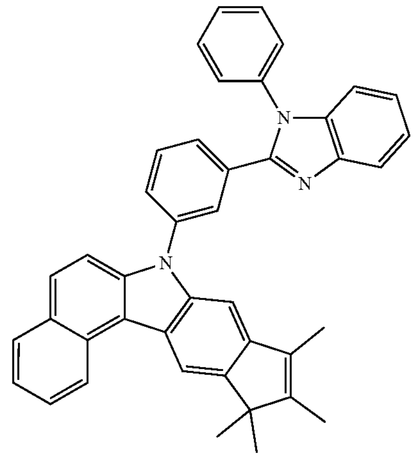
168
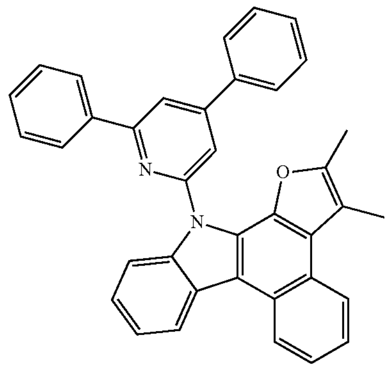
169
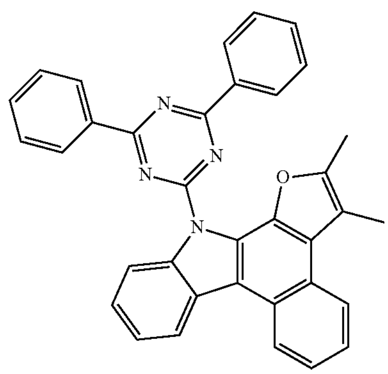
170
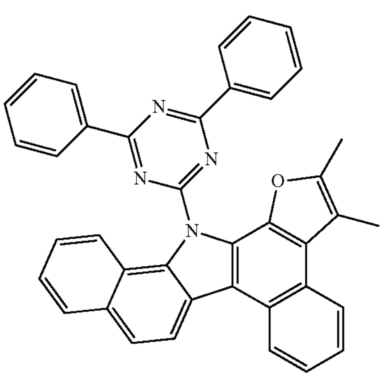

171
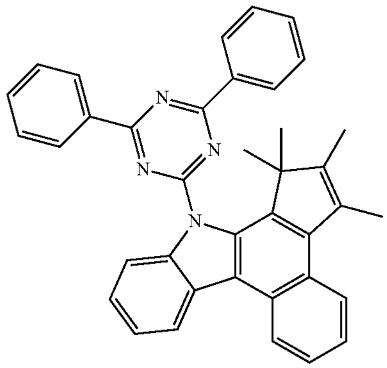
172
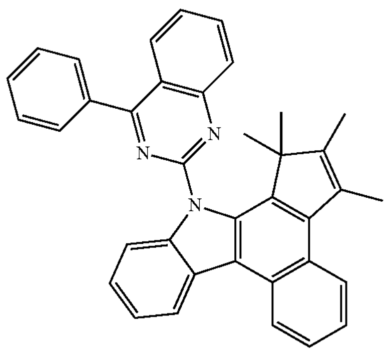
173
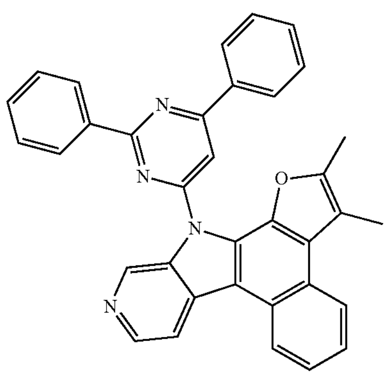
174
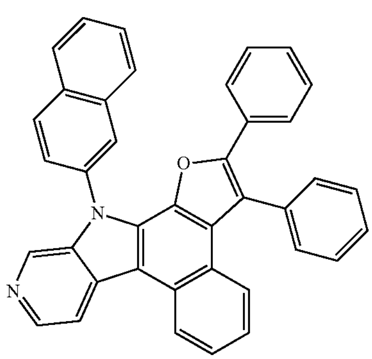
201
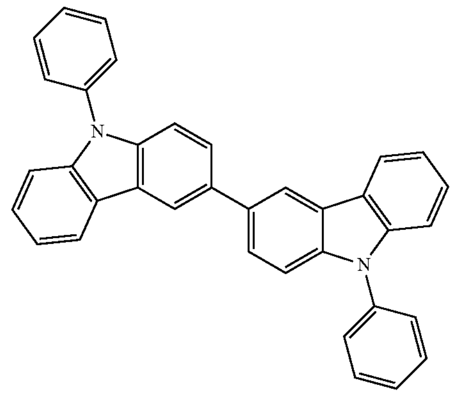
202
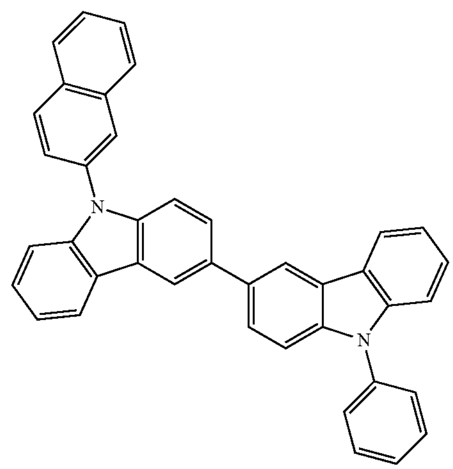
203
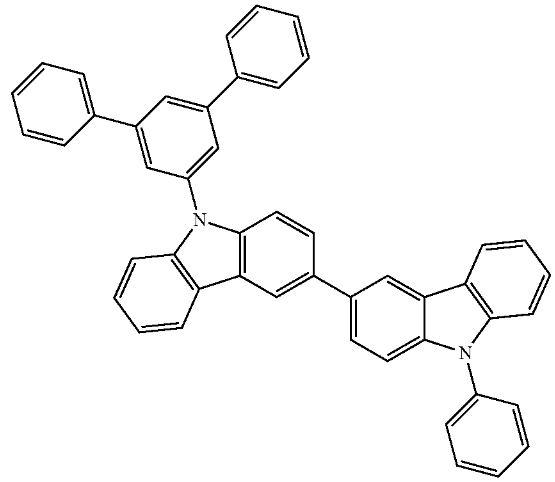

-continued
204
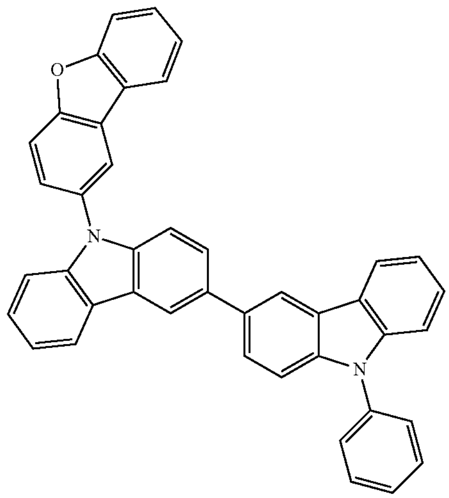
205
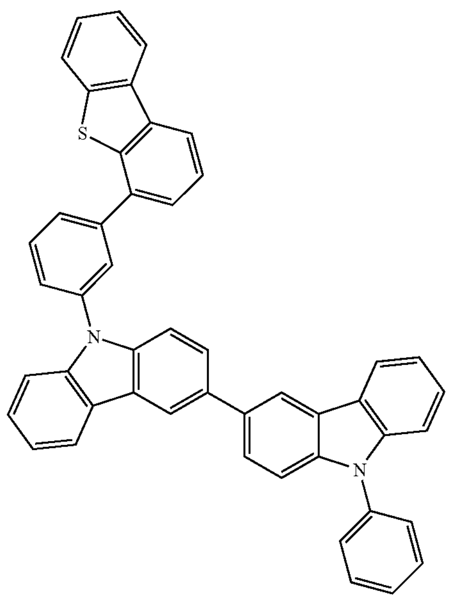
206
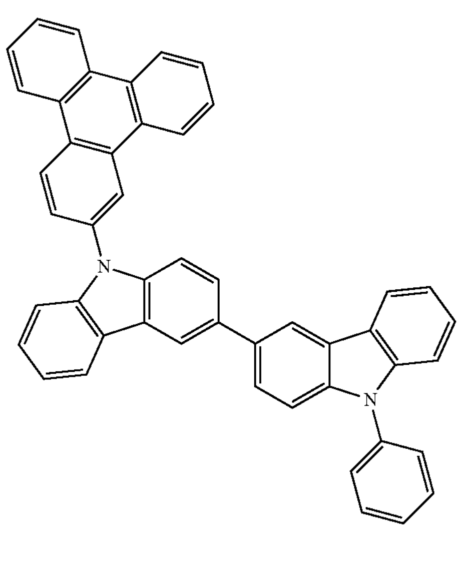
-continued
207
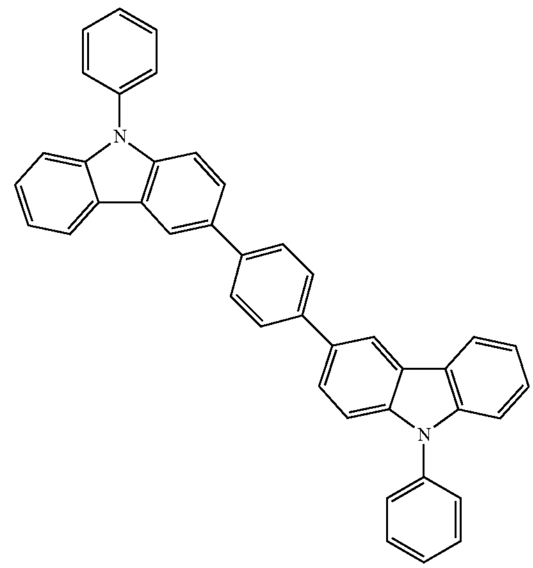
208
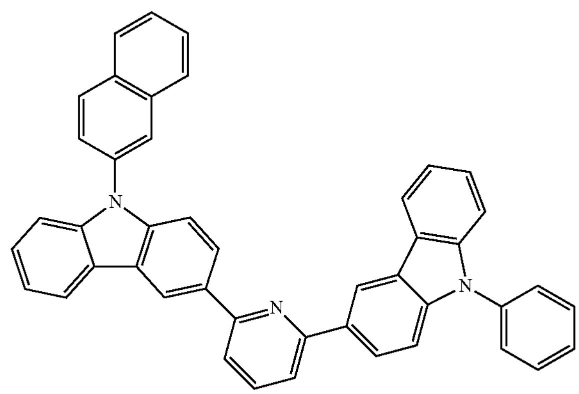
209
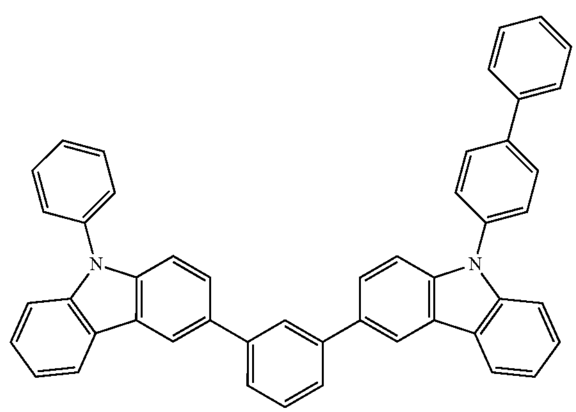

-continued
210
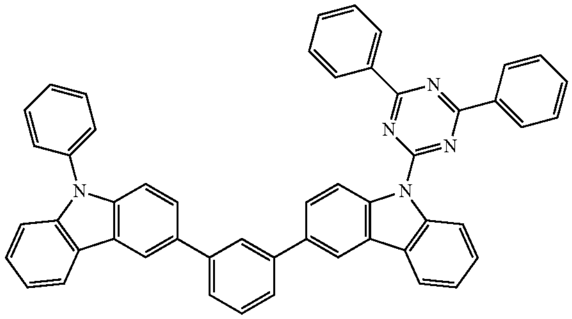
211
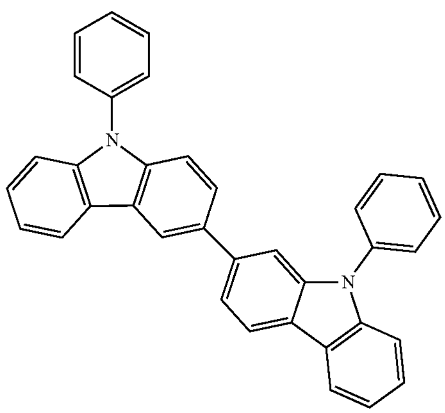
212
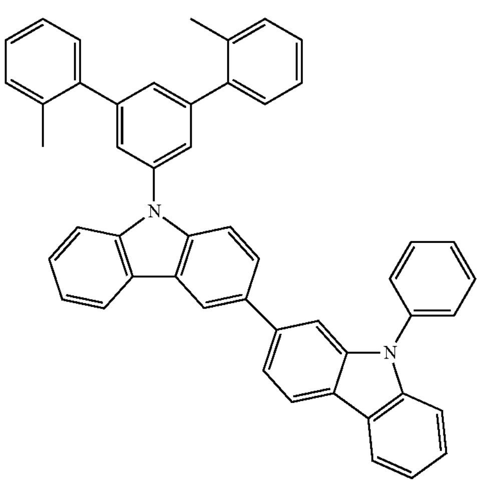
-continued
213
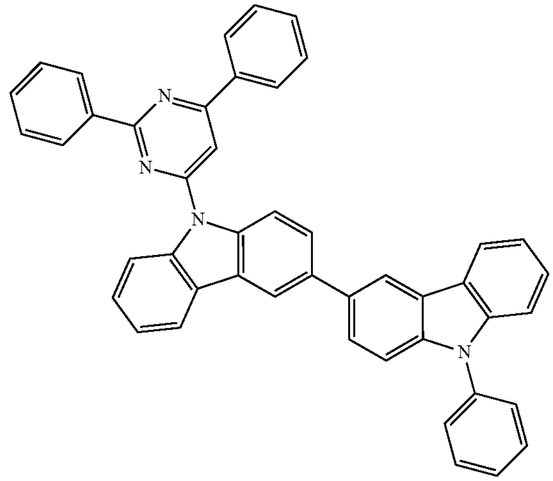
214
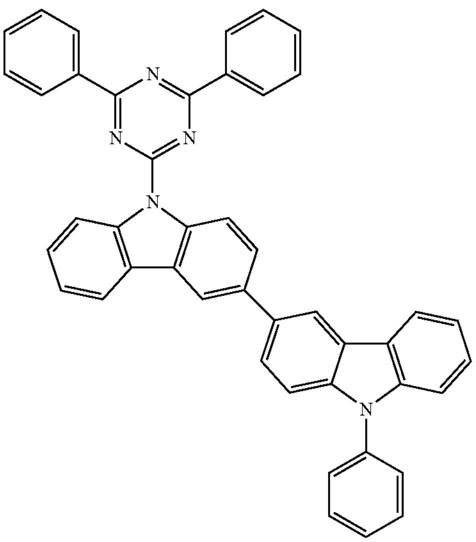
215
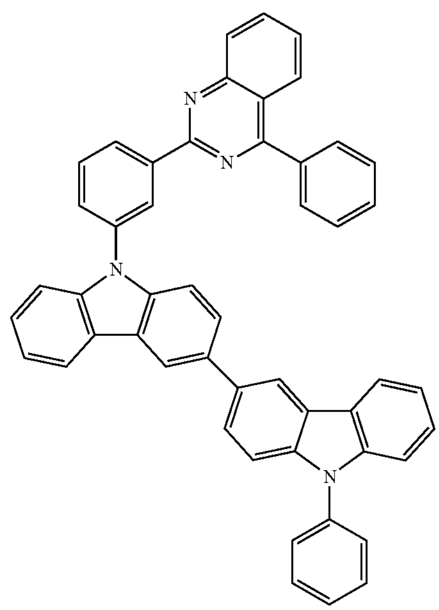

-continued
216
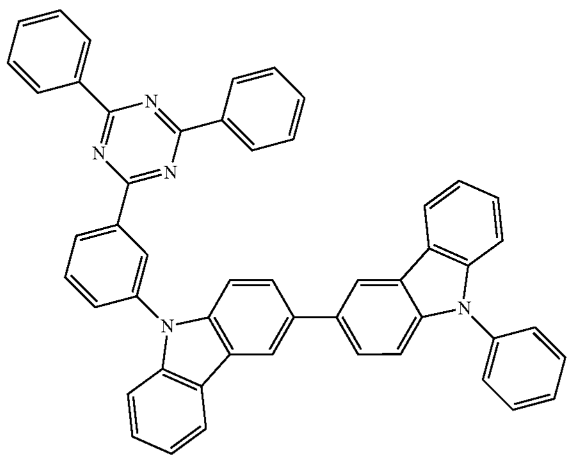
217
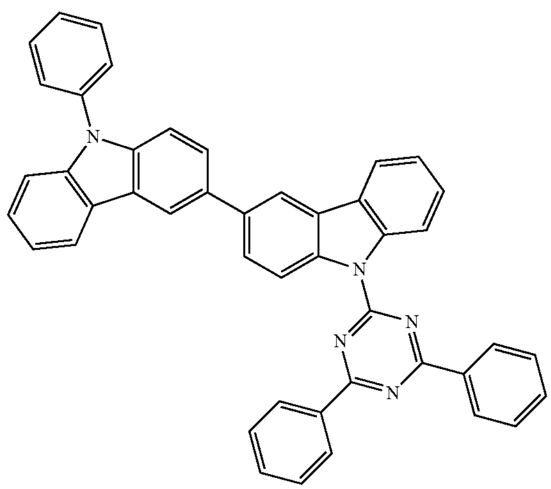
218
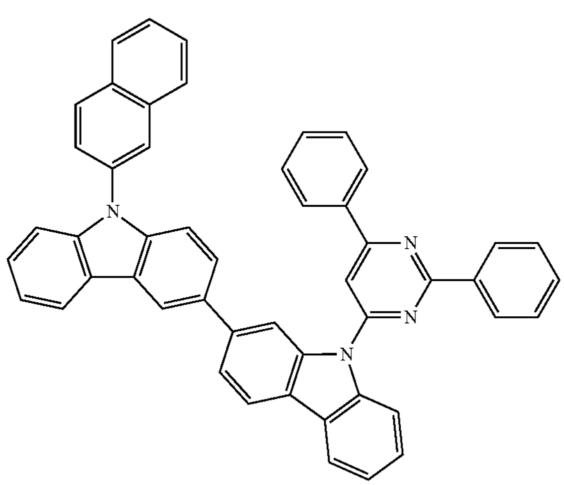
-continued
219
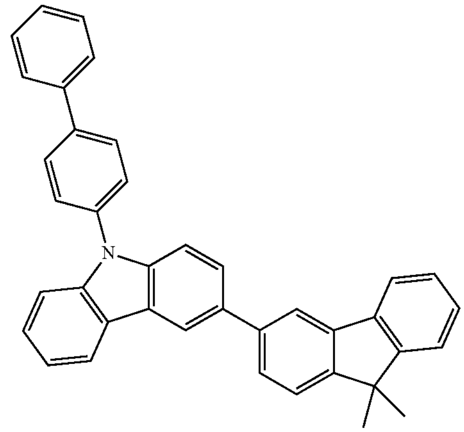
220
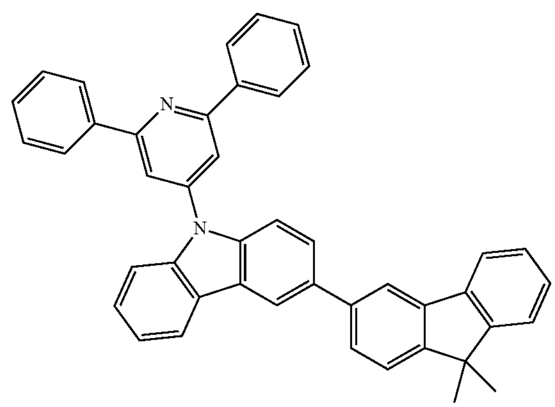
221
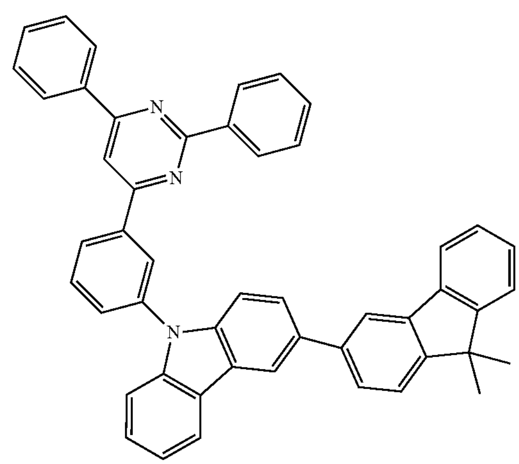

-continued
222
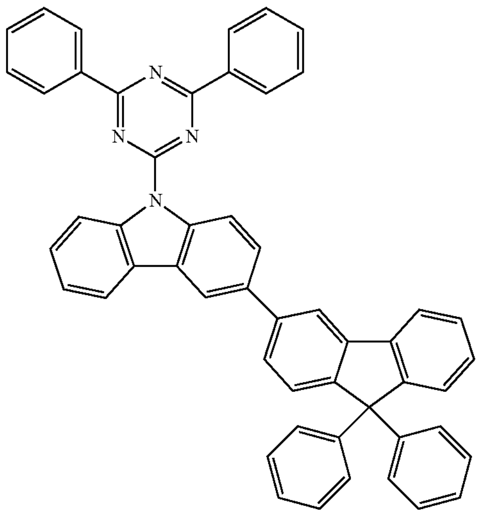
223
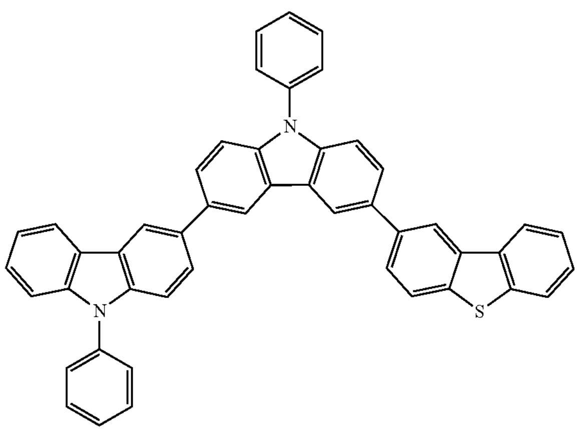
224
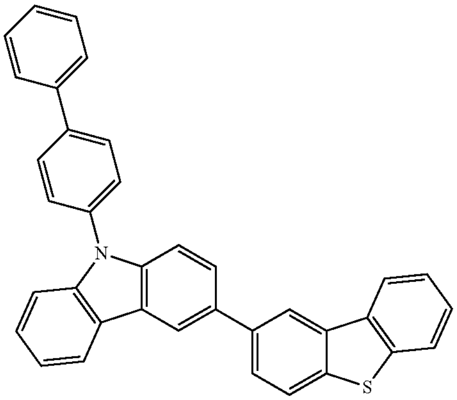
-continued
225
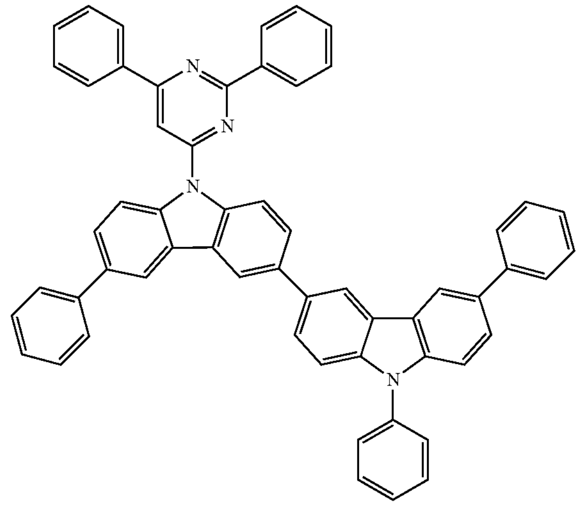
226
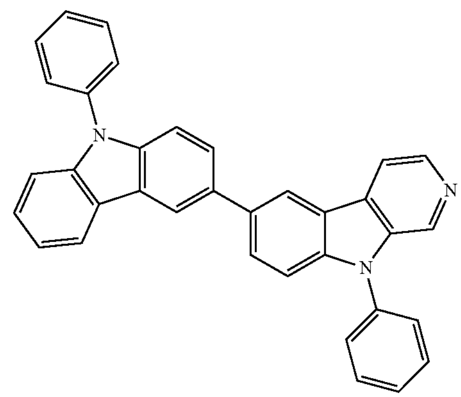
227
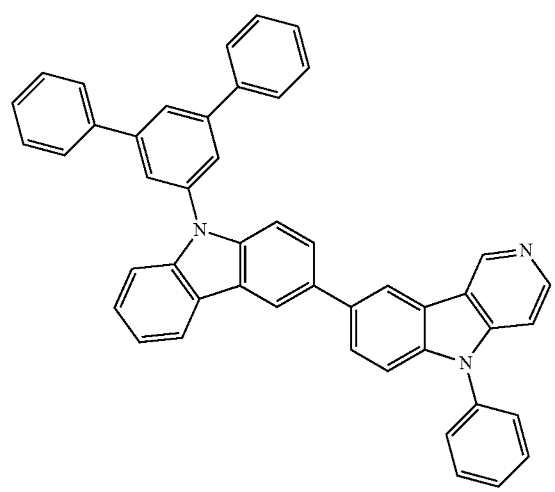

228
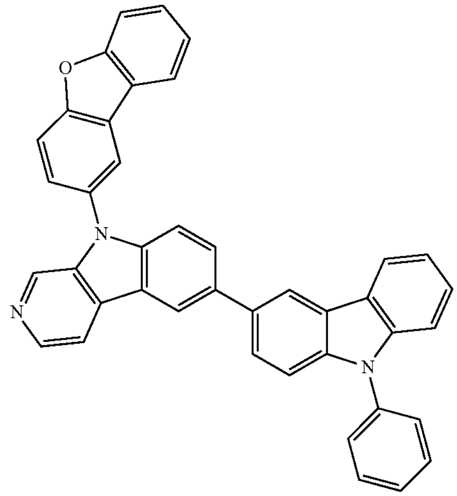
229
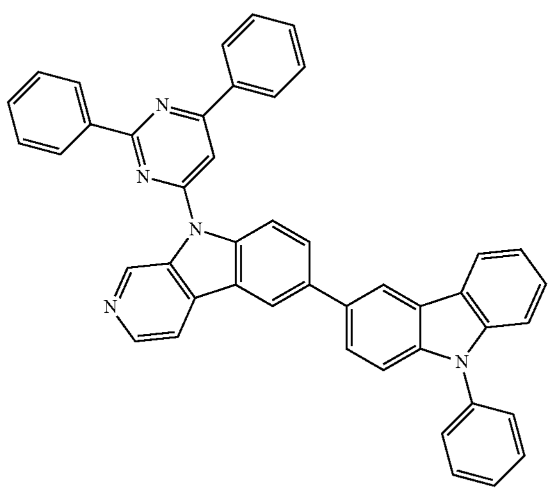
230
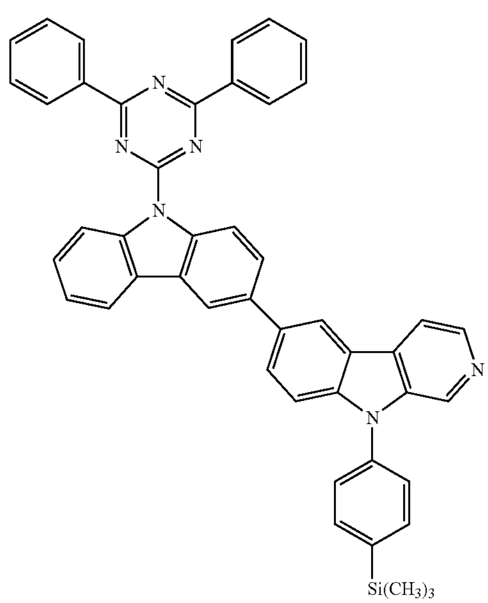
231
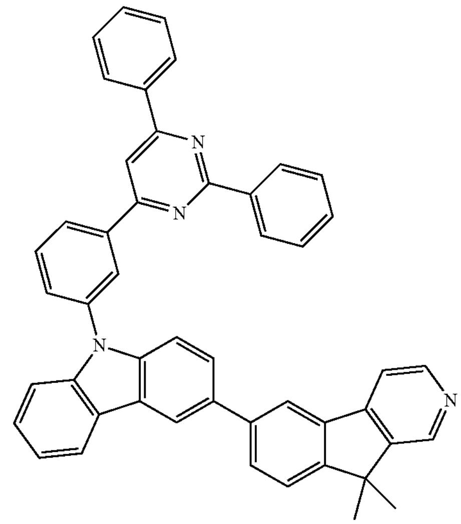
232
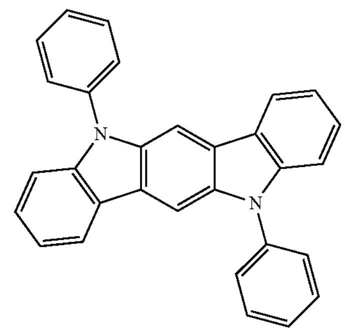
233
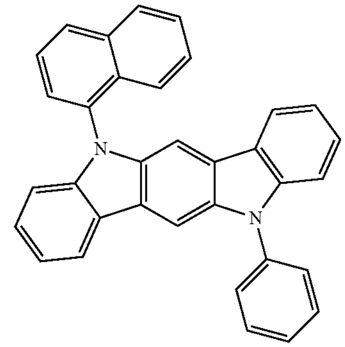

-continued
234
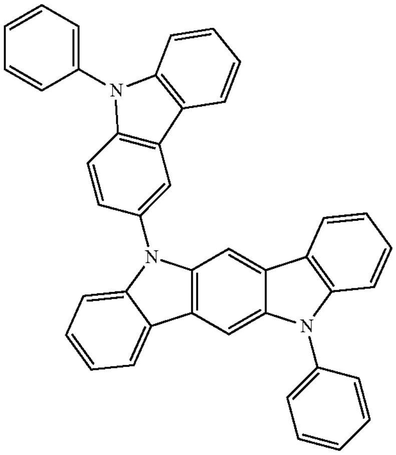
235
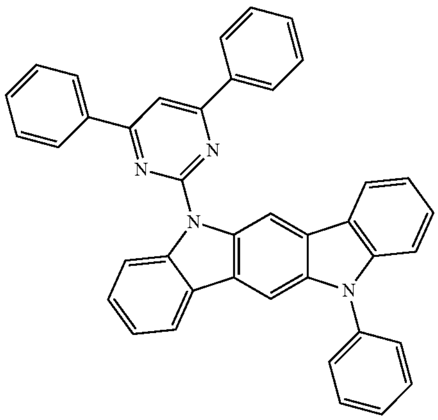
236
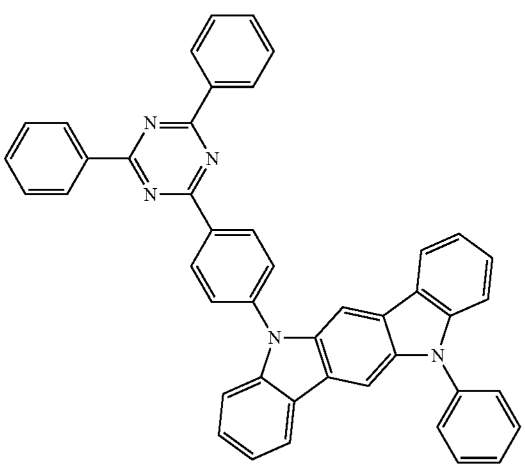
237
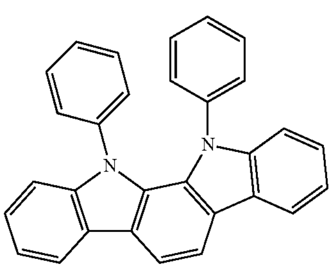
-continued
238
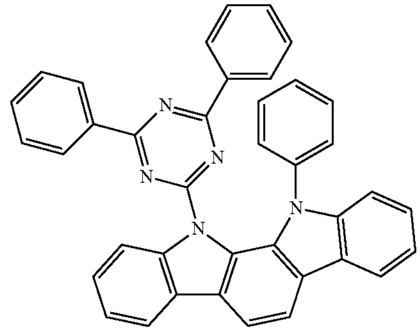
239
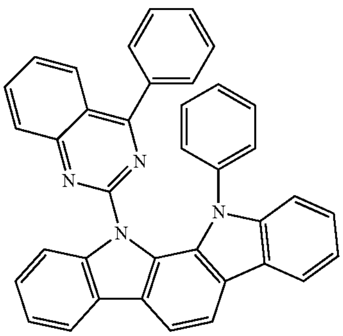
240
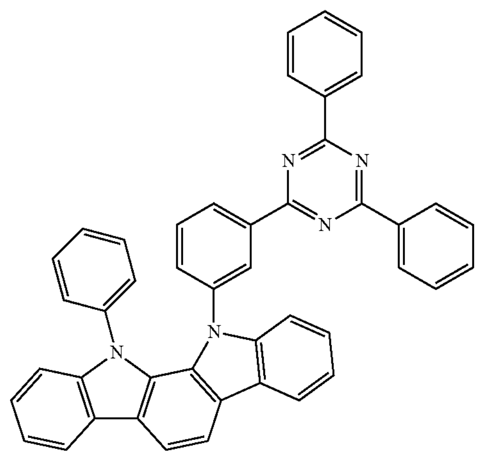
241
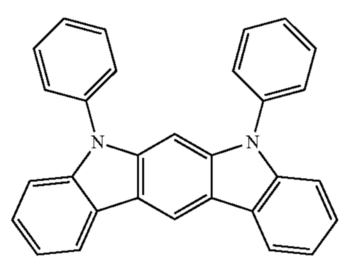

242
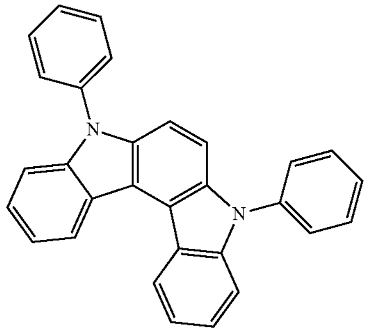
243
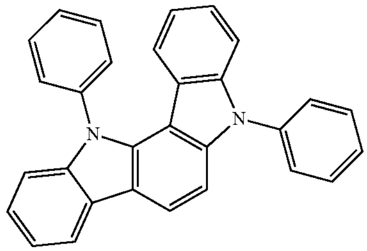
244
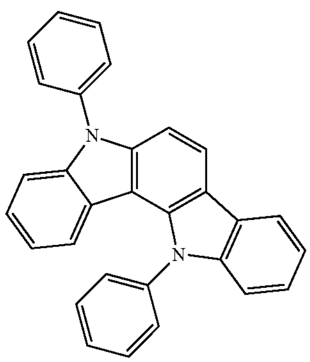
245
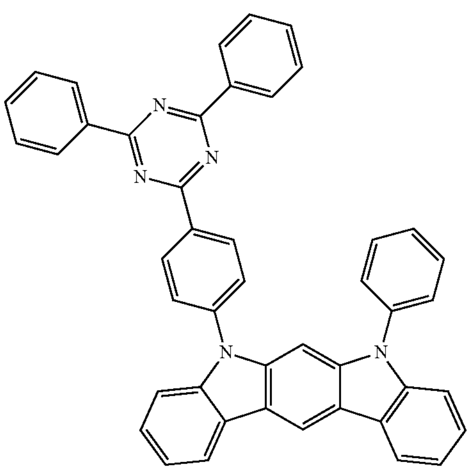
246
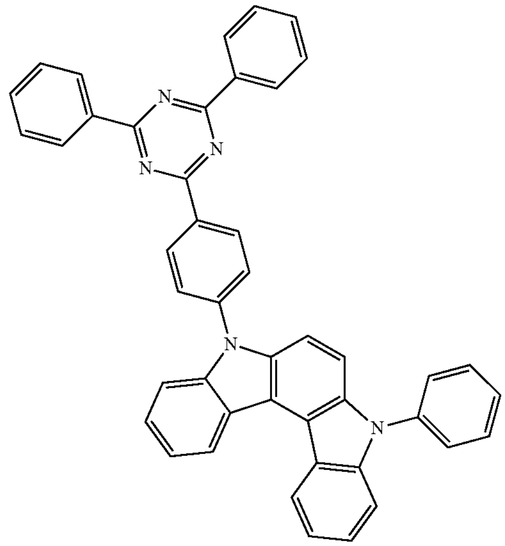
247
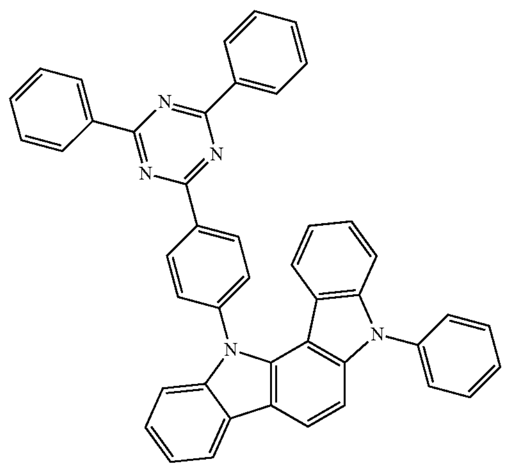
248
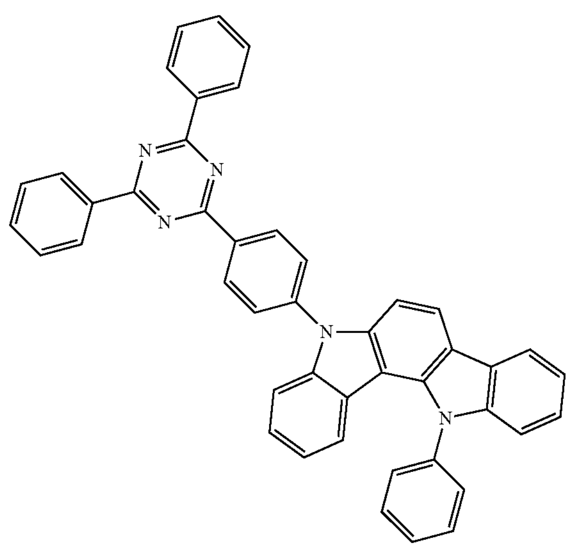

249
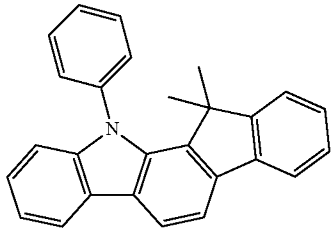
250
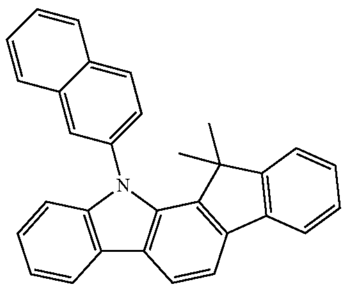
251
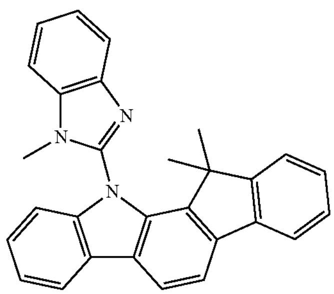
252
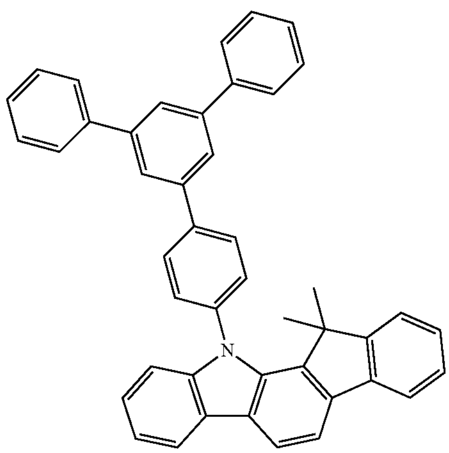
253
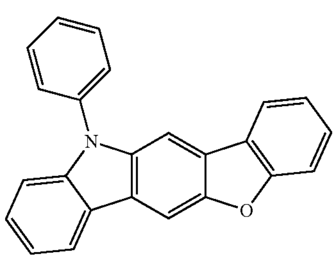
254
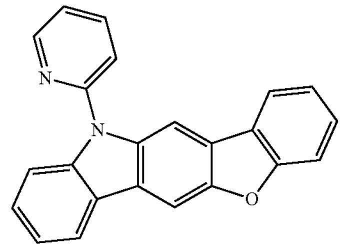
255
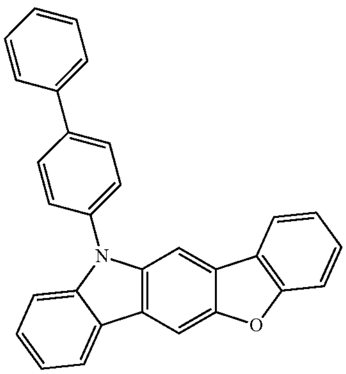
256
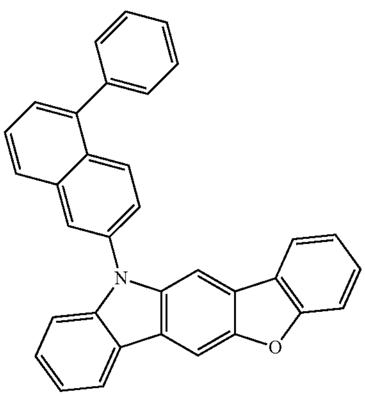
257
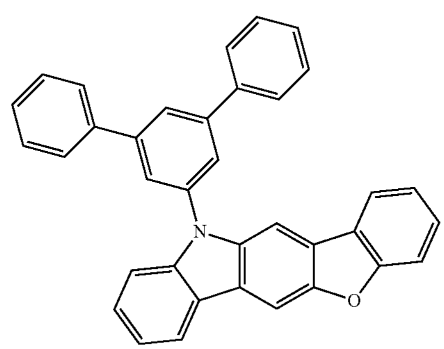

258
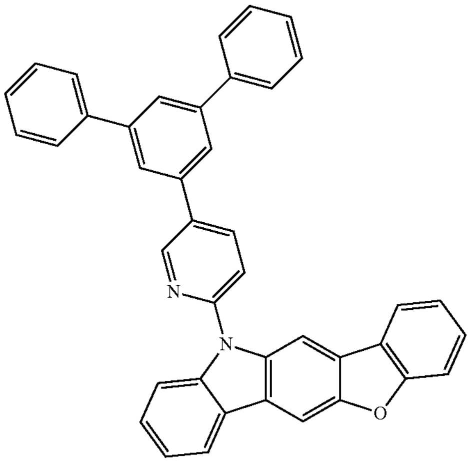
261
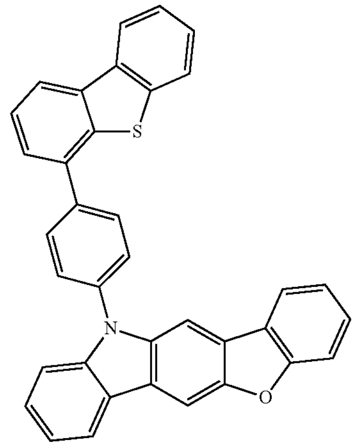
259
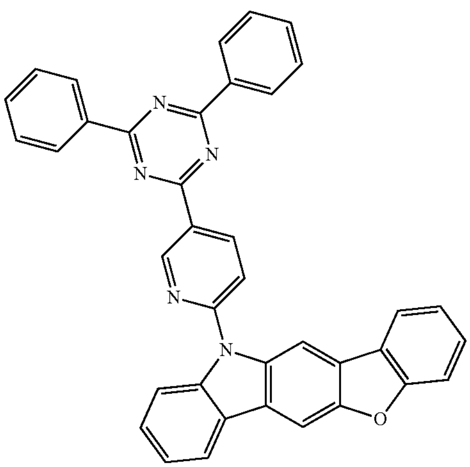
262
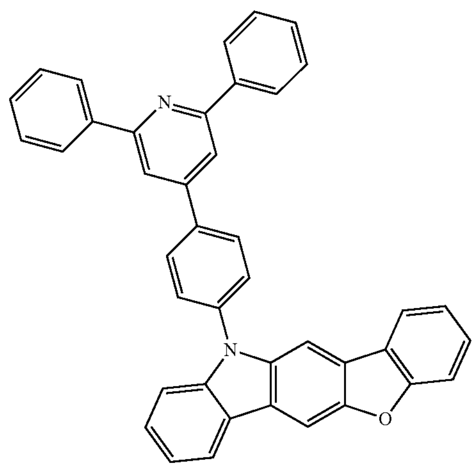
260
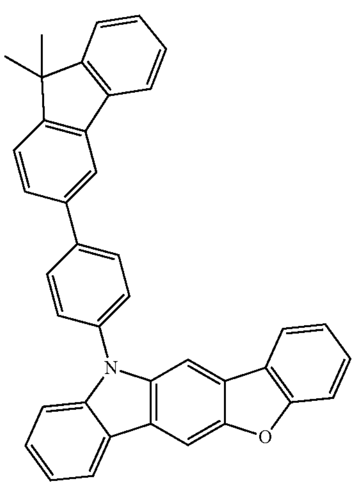
263
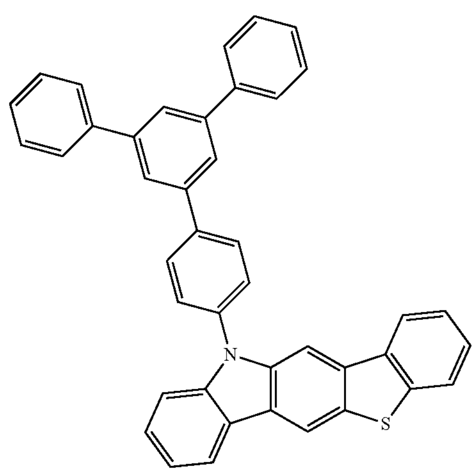

-continued
264
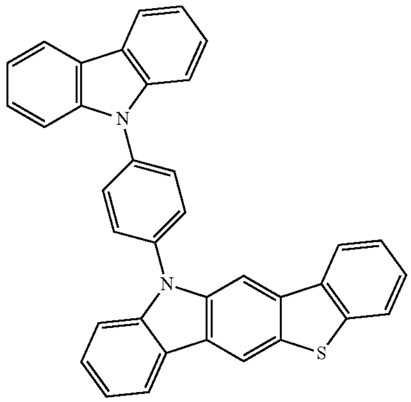
265
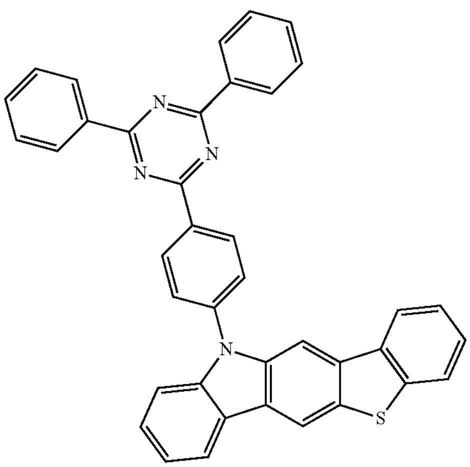
266
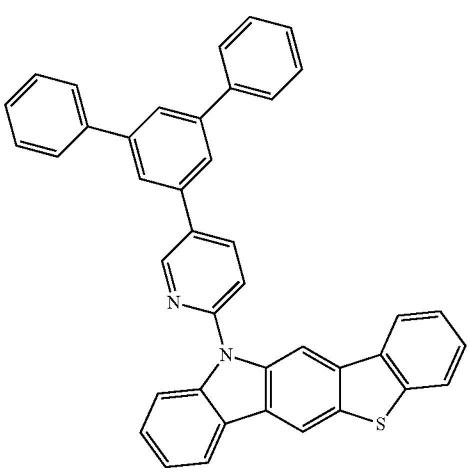
-continued
267
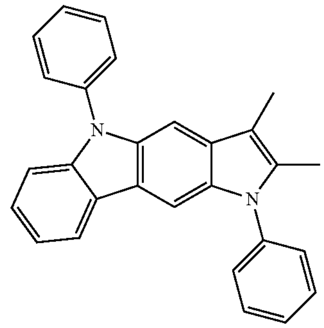
268
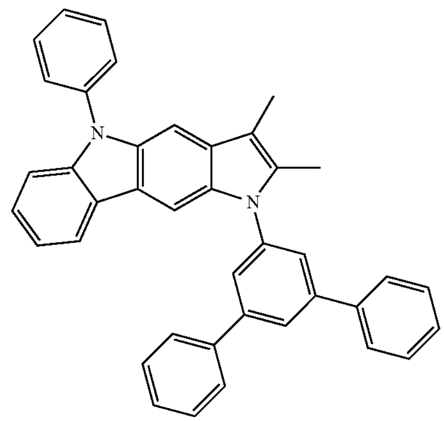
269
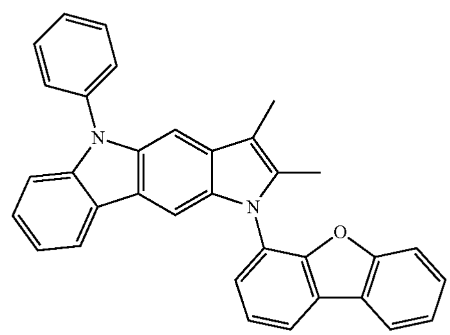
270
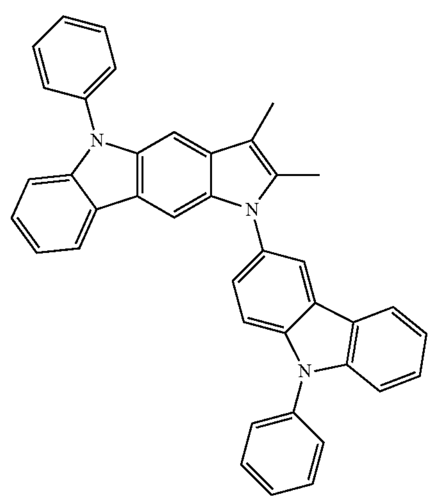

-continued
271
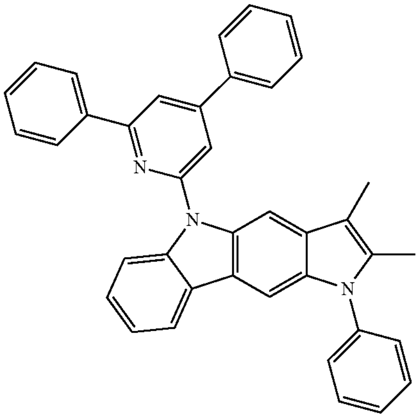
272
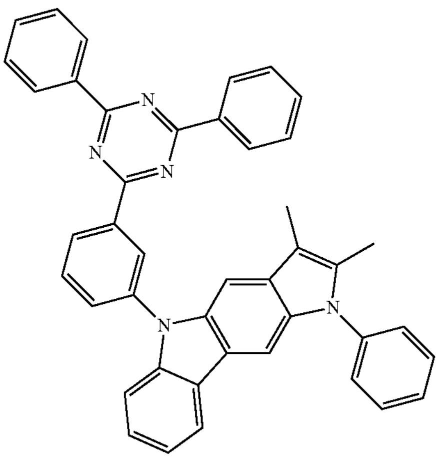
273
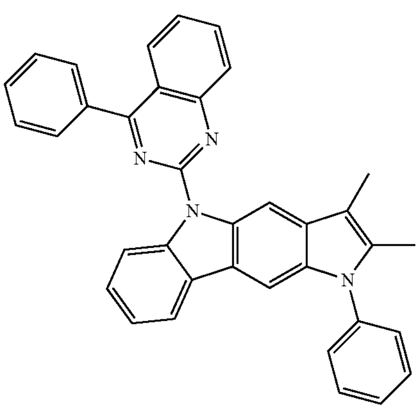
-continued
274
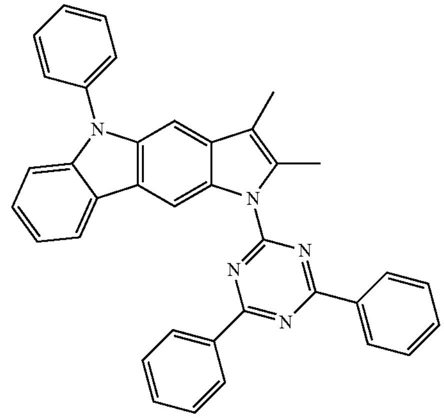
275
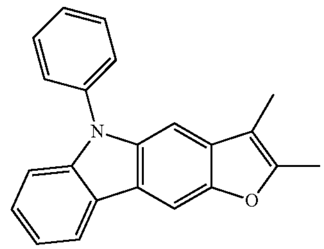
276
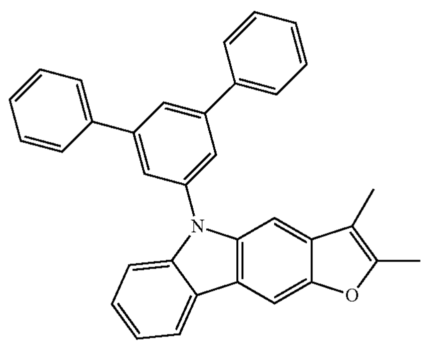
277
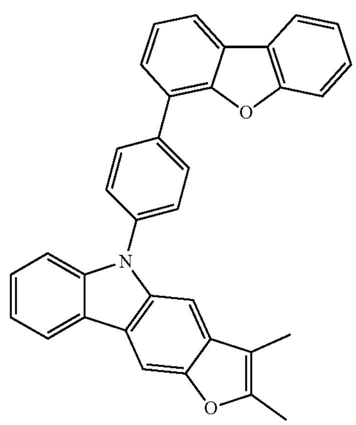

-continued
278
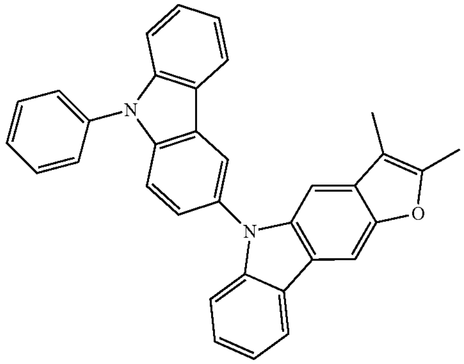
279
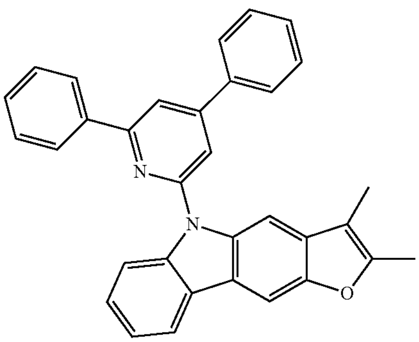
280
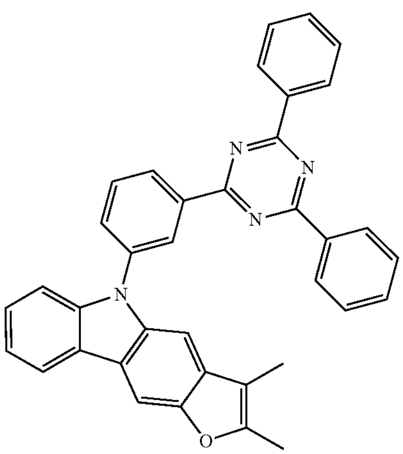
281
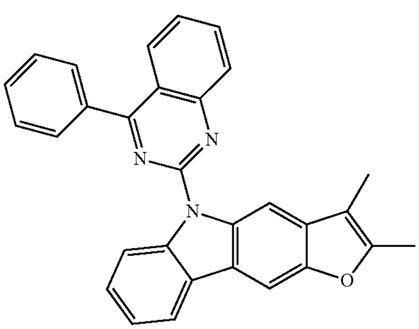
-continued
282
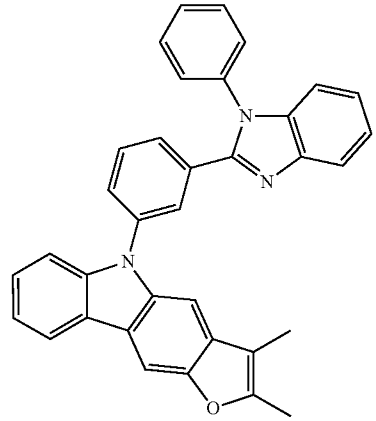
283
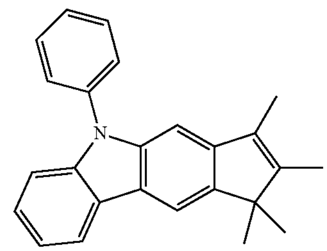
284
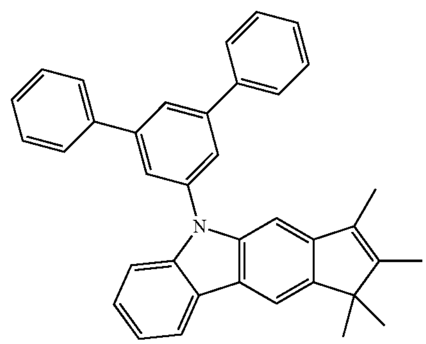
285
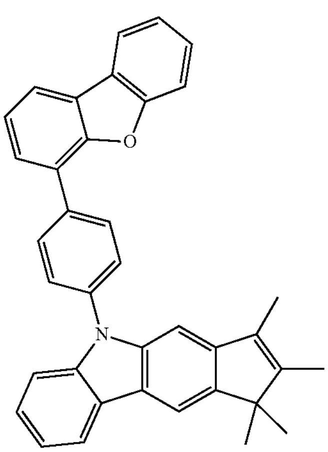

-continued
286
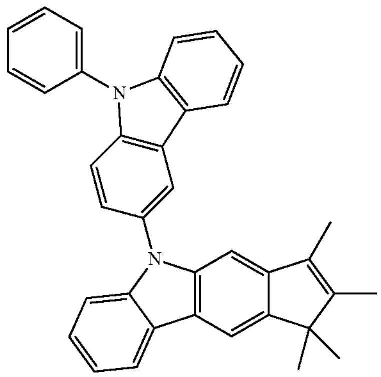
287
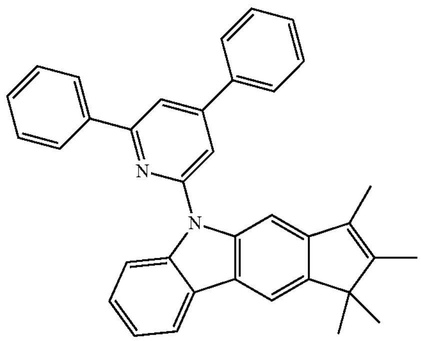
288
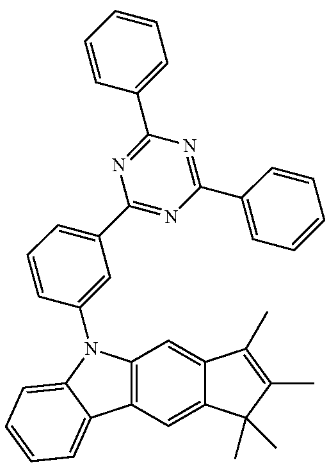
289
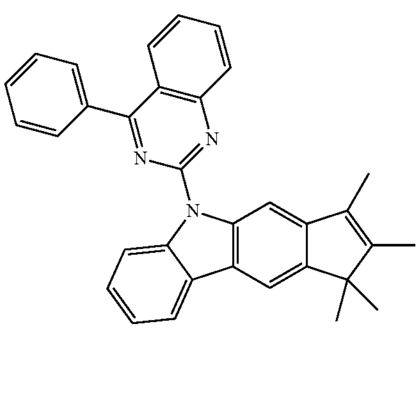
-continued
290
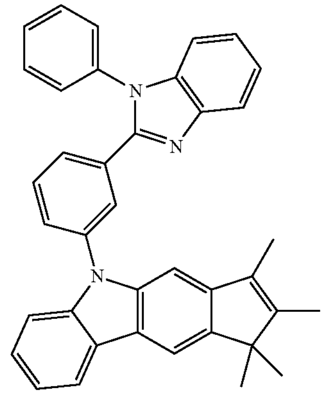
291
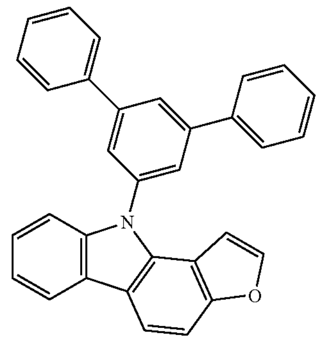
292
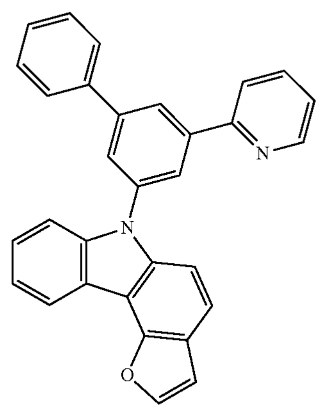
293
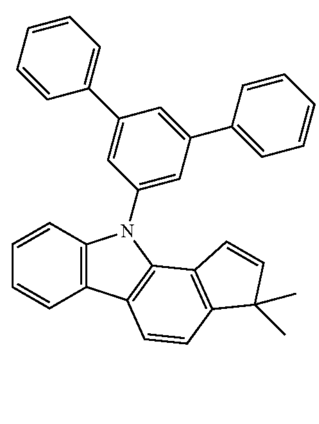

-continued
294
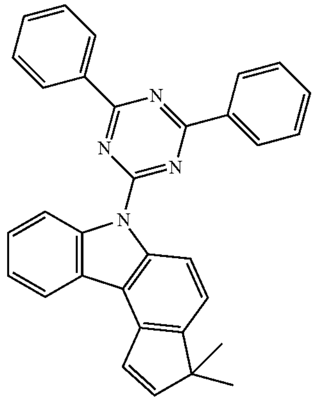
295
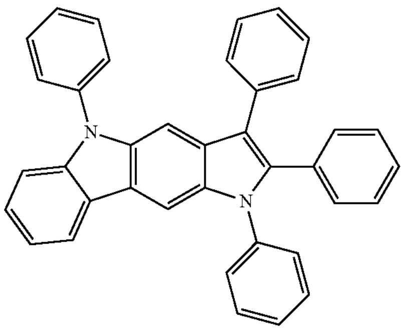
296
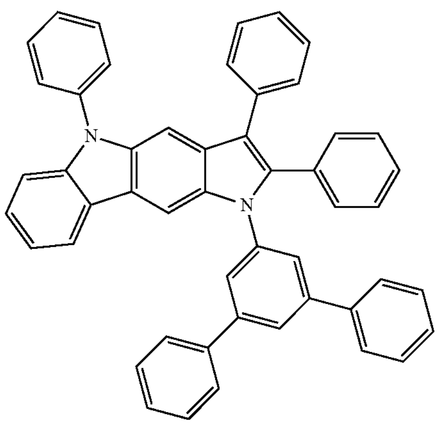
-continued
297
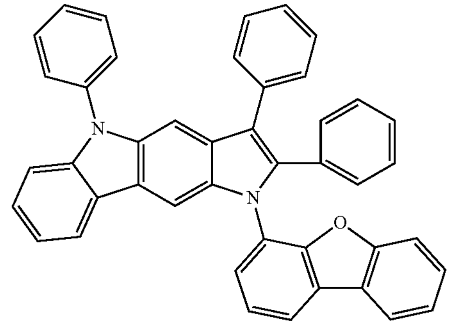
298
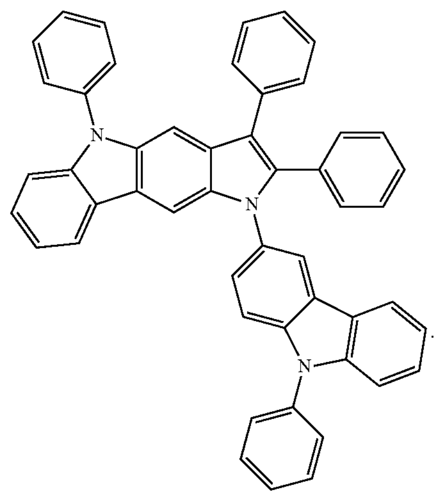
* * * * *